US012152043B2

(12) United States Patent
Hwang et al.

(10) Patent No.: US 12,152,043 B2
(45) Date of Patent: Nov. 26, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Kyuyoung Hwang, Anyang-si (KR); Byungjoon Kang, Seoul (KR); Myungsun Sim, Suwon-si (KR); Sukekazu Aratani, Hwaseong-si (KR); Kum Hee Lee, Suwon-si (KR); Banglin Lee, Suwon-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 719 days.

(21) Appl. No.: 17/241,230

(22) Filed: Apr. 27, 2021

(65) Prior Publication Data

US 2022/0127290 A1 Apr. 28, 2022

(30) Foreign Application Priority Data

Oct. 28, 2020 (KR) ........................ 10-2020-0141452

(51) Int. Cl.
*C07F 15/00* (2006.01)
*H01L 51/00* (2006.01)
(Continued)

(52) U.S. Cl.
CPC ....... *C07F 15/0086* (2013.01); *H10K 85/346* (2023.02); *H10K 50/15* (2023.02);
(Continued)

(58) Field of Classification Search
None
See application file for complete search history.

(56) References Cited

U.S. PATENT DOCUMENTS 9,306,178 B2 4/2016 Che et al.
2016/0028028 A1 1/2016 Li et al.
(Continued)

FOREIGN PATENT DOCUMENTS

EP 3461830 A1 4/2019
JP 2011054695 A 3/2011
(Continued)

OTHER PUBLICATIONS

Extended European Search Report issued Mar. 21, 2022 of EP Patent Application No. 21203079.5.

*Primary Examiner* — Jay Yang
(74) *Attorney, Agent, or Firm* — CANTOR COLBURN LLP

(57) ABSTRACT

An organometallic compound represented by Formula 1:

Formula 1

(Continued)

wherein, in Formula 1, M is a transition metal, $X_1$ to $X_4$ each independently C or N, $X_5$ is O, S, N(R'), C(R')(R''), or C(=O), wherein a bond between $X_5$ and M is a covalent bond, and one of a bond between $X_2$ and M, a bond between $X_3$ and M, and a bond between $X_4$ and M is a covalent bond, and the other two are each a coordinate bond, ring $CY_1$ to ring $CY_4$ are each independently a $C_5$-$C_{30}$ carbocyclic group or a $C_1$-$C_{30}$ heterocyclic group, and wherein $T_1$ to $T_4$, n1 to n4, $Z_1$ to $Z_4$, d1 to d4, $L_1$ to $L_4$, $R_1$ to $R_4$, a1 to a4, b1 to b4, and c1 to c4 are as provided herein.

19 Claims, 1 Drawing Sheet

(51) Int. Cl.

| | |
|---|---|
| ***H10K 85/30*** | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.

CPC .......... *H10K 50/16* (2023.02); *H10K 50/171* (2023.02); *H10K 50/18* (2023.02)

(56) References Cited

U.S. PATENT DOCUMENTS

| | | | |
|---|---|---|---|
| 2018/0023746 A1 | 1/2018 | Tjader | |
| 2019/0135844 A1 | 5/2019 | Jeon et al. | |
| 2019/0372030 A1 | 12/2019 | Hiroo et al. | |
| 2020/0115406 A1 | 4/2020 | Yi et al. | |
| 2020/0308207 A1 | 10/2020 | Kim et al. | |
| 2021/0171548 A1 | 6/2021 | Min et al. | |

FOREIGN PATENT DOCUMENTS

| | | |
|---|---|---|
| KR | 1020200026093 A | 3/2020 |
| KR | 1020210065868 A | 6/2021 |
| WO | 2019128895 A1 | 7/2019 |

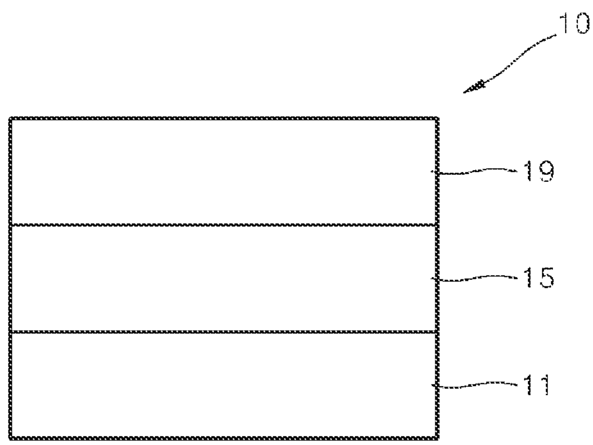
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2020-0141452, filed on Oct. 28, 2020, in the Korean Intellectual Property Office, and all the benefits accruing therefrom under 35 U.S.C. § 119, the content of which is incorporated by reference herein in its entirety.

BACKGROUND

1. Field

One or more embodiments that relate to an organometallic compound, an organic light-emitting device including the same, and an electronic apparatus including the organic light-emitting device are described herein.

2. Description of Related Art

Organic light-emitting devices (OLEDs) are self-emission devices that have improved characteristics compared to conventional devices, including wider viewing angles, faster response times, excellent brightness, driving voltage, and response speed, and the OLEDs produce full-color images.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons may then transition from an excited state to a ground state to thereby generate light, for example, visible light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to an aspect, provided is an organometallic compound represented by Formula 1.

Formula 1

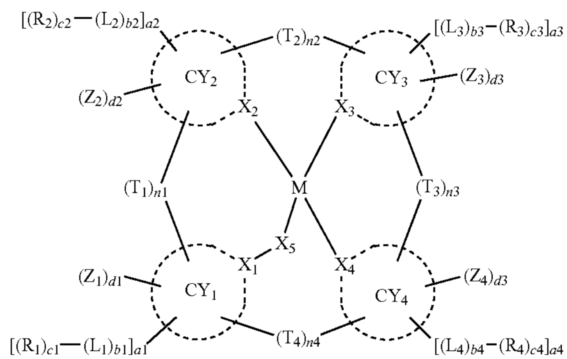

wherein, in Formula 1,

M is a transition metal, $X_1$ to $X_4$ in Formula 1 are each independently C or N, $X_5$ in Formula 1 is O, S, N(R'), C(R')(R"), or C(=O), wherein, a bond between $X_5$ and M in Formula 1 is a covalent bond, and one of a bond between $X_2$ and M in Formula 1, a bond between $X_3$ and M in Formula 1, and a bond between $X_4$ and M in Formula 1 is a covalent bond, and the other two are each a coordinate bond, ring $CY_1$ to ring $CY_4$ in Formula 1 are each independently be a $C_5$-$C_{30}$ carbocyclic group or a $C_1$-$C_{30}$ heterocyclic group, $T_1$ to $T_4$ in Formula 1 may each independently be a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*, *—S—*', *—Se—*', *—O—*', *—C(=O)—*', *—S(=O)—*', *—S(=O)$_2$—*, *—C($R_{5a}$)=*', *=C($R_{5a}$)—*, *—C($R_{5a}$)=C($R_{5b}$)—*', *—C(=S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, n1 to n4 in Formula 1 may each independently be 0 or 1, wherein at least three of n1 to n4 may each be 1, when n1 in Formula 1 is 0, $T_1$ is not present, when n2 in Formula 1 is 0, $T_2$ is not present, when n3 in Formula 1 is 0, $T_3$ is not present, and when n4 in Formula 1 is 0, $T_4$ is not present, $Z_1$ to $Z_4$ in Formula 1 may each independently be a group represented by Formula 51, Formula 51

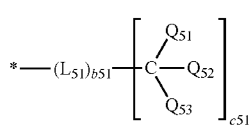

d1 to d4 in Formula 1 are each independently an integer from 0 to 20, $L_1$ to $L_4$ and $L_{51}$ in Formulae 1 and 51 are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b1 to b4 and b51 in Formulae 1 and 51 are each independently an integer from 1 to 10, $R_1$ to $R_4$, $R_{5a}$, $R_{5b}$, R', R", and $Q_{51}$ to $Q_{53}$ in Formulae 1 and 51 are each independently a group represented by Formula 51, hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and provided that none of $Q_{51}$ to $Q_{53}$ is a group represented by Formula 51, at least one of $Q_{51}$ to $Q_{53}$ in Formula 51 may each independently be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, c1 to c4 and a1 to a4 in Formula 1 may each independently be an integer from 0 to 20, c51 in Formula 51 may be an integer from 1 to 20, Formula 1 may satisfy at least one of Condition 1 and Condition 2, Condition 1 a sum of d1 to d4 in Formula 1 is 1 or more

Condition 2 at least one of $T_1$ to $T_4$ in Formula 1 is *—$N(R_{5a})$—*', *—$B(R_{5a})$—*', *—$P(R_{5a})$—*', *—$C(R_{5a})(R_{5b})$—*', *—$Si(R_{5a})(R_{5b})$—*', *—$Ge(R_{5a})(R_{5b})$—*, *—$C(R_{5a})$=*', *=$C(R_{5a})$—*', or *—$C(R_{5a})$=$C(R_{5b})$—*', and at least one of $R_{5a}$ and $R_{5b}$ is a group represented by Formula 51 two or more of a plurality of $R_1$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ to $R_4$, $R_{5a}$ and one or more of $R_1$ to $R_4$, $R_{5b}$ and one or more of $R_1$ to $R_4$, or $R_{5a}$ and $R_{5b}$ are each optionally bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ are as defined in connection with $R_1$,

* and *' each indicate a binding site to a neighboring atom, and the substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or a combination thereof, —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$), or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a heteroaryloxy group; a $C_1$-$C_{60}$ heteroarylthio group; a monovalent non-aromatic condensed polycyclic group; or a monovalent non-aromatic condensed heteropolycyclic group.

According to another aspect, provided is an organic light-emitting device including a first electrode, a second electrode, and an organic layer located between the first electrode and the second electrode, wherein the organic layer includes an emission layer, and wherein the organic layer includes at least one organometallic compound represented by Formula 1.

According to another aspect, provided is an electronic apparatus including the organic light-emitting device.

The organometallic compound may be included in the emission layer of the organic layer, and the organometallic compound included in the emission layer may act as a dopant.

BRIEF DESCRIPTION OF THE DRAWING

The above and other aspects, features, and advantages of certain embodiments of the disclosure will be more apparent from the following description taken in conjunction with the accompanying drawing, in which FIGURE is a schematic cross-sectional view of an organic light-emitting device according to aspects of one or more embodiments.

DETAILED DESCRIPTION

Reference will now be made in detail to exemplary embodiments, examples of which are illustrated in the accompanying drawing, wherein like reference numerals refer to like elements throughout. In this regard, the present exemplary embodiments may have different forms and should not be construed as being limited to the descriptions set forth herein. Accordingly, the exemplary embodiments are described below, by referring to the FIGURE, to explain one or more aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect of the present disclosure provides an organometallic compound represented by Formula 1:

Formula 1

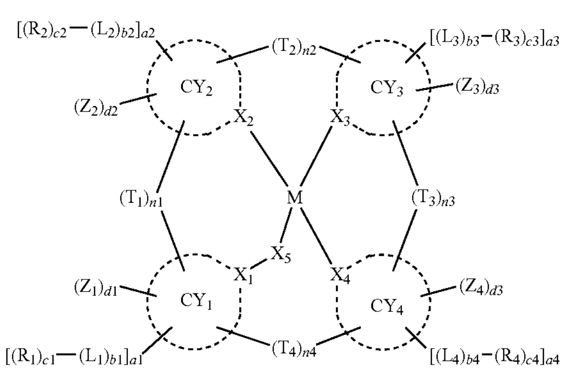

wherein M in Formula 1 is a transition metal.

In one or more embodiments, M may be Period 1 transition metal, Period 2 transition metal, or Period 3 transition metal of Periodic Table Elements.

In one or more embodiments, M may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In one or more embodiments, M in Formula 1 may be Pt, Pd, or Au.

$X_1$ to $X_4$ in Formula 1 may each independently be C or N.

In one or more embodiments, $X_1$ and $X_3$ in Formula 1 may be C, and $X_2$ and $X_4$ in Formula 1 may be N.

$X_5$ in Formula 1 is O, S, N(R'), C(R')(R"), or C(=O).

The bond between $X_5$ and M in Formula 1 may be a covalent bond.

One of a bond between $X_2$ and M in Formula 1, a bond between $X_3$ and M in Formula 1, and a bond between $X_4$ and M in Formula 1 may be a covalent bond, and the other two may each be a coordinate bond.

In one or more embodiments, a bond between $X_2$ and M in Formula 1 may be a coordinate bond.

In one or more embodiments, a bond between $X_5$ and M in Formula 1 and a bond between $X_3$ and M in Formula 1 may each be a covalent bond, and a bond between $X_2$ and M in Formula 1 and a bond between $X_4$ and M in Formula 1 may each be a coordinate bond.

Ring $CY_1$ to ring $CY_4$ in Formula 1 are each independently a $C_5$-$C_{30}$ carbocyclic group or a $C_1$-$C_{30}$ heterocyclic group.

In one or more embodiments, ring $CY_1$ to ring $CY_4$ in Formula 1 may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, ring $CY_1$ to ring $CY_4$ in Formula 1 may each independently be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_1$ and ring $CY_3$ may each independently be:

a benzene group, a naphthalene group, a fluorene group, a carbazole group, a dibenzothiophene group, or a dibenzofuran group; or a benzene group, a naphthalene group, a fluorene group, a carbazole group, a dibenzothiophene group, or a dibenzofuran group, each condensed with a cyclohexane group, a cyclohexene group, a norbornane group, or a combination thereof.

In one or more embodiments, $X_2$ may be N, and ring $CY_2$ may be:

a benzimidazole group, a pyridine group, a pyrimidine group, a pyridazine group, a pyrazine group, a triazine group, a quinoline group, an isoquinoline group, a quinoxaline group, or a quinazoline group; or a benzimidazole group, a pyridine group, a pyrimidine group, a pyridazine group, a pyrazine group, a triazine group, a quinoline group, an isoquinoline group, a quinoxaline group, or a quinazoline group, each condensed with a cyclohexane group, a cyclohexene group, a norbornane group, or a combination thereof.

In one or more embodiments, ring $CY_4$ may be:

a pyridine group, a pyrimidine group, a pyridazine group, a pyrazine group, a triazine group, a quinoline group, an isoquinoline group, a quinoxaline group, or a quinazoline group; or a pyridine group, a pyrimidine group, a pyridazine group, a pyrazine group, a triazine group, a quinoline group, an isoquinoline group, a quinoxaline group, or a quinazoline group, each condensed with a cyclohexane group, a cyclohexene group, a norbornane group, or a combination thereof.

$T_1$ to $T_4$ in Formula 1 may each independently be a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*, *—S—*', *—Se—*', *—O—*', *—C(=O)—*', *—S(=O)—*', *—S(=O)$_2$—*', *—C($R_{5a}$)=*', *=C($R_{5a}$)—*', *—C($R_{5a}$)=C($R_{5b}$)—*', *—C(=S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In one or more embodiments, $T_1$ and $T_2$ in Formula 1 may each be a single bond, and $T_3$ in Formula 1 may be a single bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', or *—O—*'.

Each of n1 to n4 in Formula 1 indicate a number for each of $T_1$ to $T_4$, respectively, and are each independently 0 or 1, wherein at least three of n1 to n4 may each be 1. In other words, a ligand of the organometallic compound represented by Formula 1 may be a tetradentate ligand. For example, a sum of n1 to n4 may be 3 or 4.

When n1 in Formula 1 is 0, $T_1$ is not present, when n2 in Formula 1 is 0, $T_2$ is not present, when n3 in Formula 1 is 0, $T_3$ is not present, and when n4 in Formula 1 is 0, $T_4$ is not present.

In one or more embodiments, n1 to n3 in Formula 1 may each be 1, and n4 in Formula 1 may be 0.

$Z_1$ to $Z_4$ in Formula 1 are each independently a group represented by Formula 51:

Formula 51

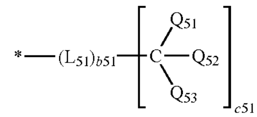

wherein Formula 51 is the same as described herein.

Each of d1 to d4 in Formula 1 indicates a number for each of $Z_1$ to $Z_4$, respectively, and are each independently an integer from 0 to 20. When d1 is 2 or more, two or more of $Z_1$(s) are identical to or different from each other, when d2 is 2 or more, two or more of $Z_2$(s) are identical to or different from each other, when d3 is 2 or more, two or more of $Z_3$(s) are identical to or different from each other, and when d4 is 2 or more, two or more of $Z_4$(s) are identical to or different from each other. In one or more embodiments, d1 to d4 may each independently be 0, 1, 2, or 3.

$L_1$ to $L_4$ and $L_{51}$ in Formulae 1 and 51 are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In one or more embodiments, $L_1$ to $L_4$ and $L_{51}$ in Formulae 1 and 51 may each independently be:

a single bond, or a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In one or more embodiments, $L_1$ to $L_4$ and $L_{51}$ in Formulae 1 and 51 may each independently be:

a single bond, or a benzene group, a naphthalene group, a pyridine group, a fluorene group, a carbazole group, a dibenzofuran group, or a dibenzothiophene group, each unsubstituted or substituted with at least one $R_{10a}$.

Each of b1 to b4 and b51 in Formulae 1 and 51 may indicate a number for each of $L_1$ to $L_4$ and $L_{51}$, respectively, and are each independently an integer from 1 to 10. When b1 is 2 or more, two or more of $L_1$(s) may be identical to or different from each other, when b2 is 2 or more, two or more of $L_2$(s) may be identical to or different from each other, when b3 is 2 or more, two or more of $L_3$(s) may be identical to or different from each other, when b4 is 2 or more, two or more of $L_4$(s) may be identical to or different from each other, and when b51 is 2 or more, two or more of $L_{51}$(s) may be identical to or different from each other. In one or more embodiments, b1 to b4 and b51 may each independently be 1, 2, or 3.

$R_1$ to $R_4$, $R_{5a}$, $R_{5b}$, R', R", and $Q_{51}$ to $Q_{53}$ in Formulae 1 and 51 are each independently a group represented by Formula 51, hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein at least one of $Q_{51}$ to $Q_{53}$ in Formula 51 are each independently a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group. $Q_1$ to $Q_9$ may each be the same as described in the present specification.

None of $Q_{51}$ to $Q_{53}$ is a group represented by Formula 51. In other words, each of $Q_{51}$ to $Q_{53}$ is not a group represented by Formula 51.

In one or more embodiments, $R_1$ to $R_4$, R' and R" Formula 1 and $Q_{51}$ to $Q_{53}$ may not be a group represented by Formula 51.

In one or more embodiments, $R_1$ to $R_4$, $R_{5a}$, $R_{5b}$, R', R", and $Q_{51}$ to $Q_{53}$ in Formulae 1 and 51 may each independently be:

a group represented by Formula 51, hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_1$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group (a ($C_1$-$C_{20}$ alkyl)bicyclo[2.2.1]heptyl group), a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof; a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a deuterated phenyl group, a fluorinated phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or $-N(Q_1)(Q_2)$, $-Si(Q_3)(Q_4)(Q_5)$, $-Ge(Q_3)(Q_4)(Q_5)$, $-B(Q_6)(Q_7)$, $-P(=O)(Q_8)(Q_9)$, or $-P(Q_8)(Q_9)$, wherein $Q_1$ to $Q_9$ may each independently be:

deuterium, —F, $-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, $-CD_2CDH_2$, $-CF_3$, $-CF_2H$, $-CFH_2$, $-CH_2CF_3$, $-CH_2CF_2H$, $-CH_2CFH_2$, $-CHFCH_3$, $-CHFCF_2H$, $-CHFCFH_2$, $-CHFCF_3$, $-CF_2CF_3$, $-CF_2CF_2H$, or $-CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or a combination thereof, provided that none of $Q_{51}$ to $Q_{53}$ is a group represented by Formula 51.

In one or more embodiments, $R_1$ to $R_4$, $R_{5a}$, $R_{5b}$, R', and R" in Formula 1 may each independently be:

a group represented by Formula 51, hydrogen, deuterium, —F, or a cyano group;

a $C_1$-$C_{20}$ alkyl group that is unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, or a combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or a combination thereof; or $-Si(Q_3)(Q_4)(Q_5)$ or $-Ge(Q_3)(Q_4)(Q_5)$.

In one or more embodiments, in Formula 51, $Q_{51}$ to $Q_{53}$ may each independently be:

hydrogen, deuterium, —F, or a cyano group;

a $C_1$-$C_{20}$ alkyl group that is unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, or a combination thereof; or a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or a combination thereof, wherein at least one of $Q_{51}$ to $Q_{53}$ (for example, $Q_{53}$) may be a phenyl group, a biphenyl group, a naphthyl group, a pyridinyl group, a fluorenyl group, a carbazolyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or a combination thereof.

In one or more embodiments, in Formula 51, i) $Q_{51}$ and $Q_{52}$ may each independently be hydrogen or deuterium, ii) $Q_{51}$ may be hydrogen or deuterium, and $Q_{52}$ may be neither hydrogen nor deuterium, or iii) both of $Q_{51}$ and $Q_{52}$ may be neither hydrogen nor deuterium.

In one or more embodiments, $R_1$ to $R_4$, $R_{5a}$, $R_{5b}$, R', R'', and $Q_{51}$ to $Q_{53}$ in Formulae 1 and 51 may each independently be a group represented by Formula 51, hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-227, a group represented by one of Formulae 9-201 to 9-227 in which at least one hydrogen is substituted with deuterium, a group represented by one of Formulae 9-201 to 9-227 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —Si($Q_3$)($Q_4$)($Q_5$), or —Ge($Q_3$)($Q_4$)($Q_5$) (wherein $Q_3$ to $Q_5$ may each be the same as described in the present specification), and provided that none of $Q_{51}$ to $Q_{53}$ is a group represented by Formula 51.

In one or more embodiments, in Formula 51, $Q_{51}$ and $Q_{52}$ may each independently be hydrogen or deuterium, and $Q_{53}$ may be a group represented by one of Formulae 10-12 to 10-129, a group represented by one of Formulae 10-12 to 10-129 in which at least one hydrogen is substituted with deuterium, a group represented by one of Formulae 10-12 to 10-129 in which at least one hydrogen is substituted with —F, a group represented by one of Formulae 10-201 to 10-350, a group represented by one of Formulae 10-201 to 10-350 in which at least one hydrogen is substituted with deuterium, or a group represented by one of Formulae 10-201 to 10-350 in which at least one hydrogen is substituted with —F.

In one or more embodiments, in Formula 51, $Q_{51}$ may be hydrogen or deuterium, and $Q_{52}$ may be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, or a group represented by one of Formulae 9-1 to 9-39 in which at least one hydrogen is substituted with —F, and $Q_{53}$ may be a group represented by one of Formulae 10-12 to 10-129, a group represented by one of Formulae 10-12 to 10-129 in which at least one hydrogen is substituted with deuterium, a group represented by one of Formulae 10-12 to 10-129 in which at least one hydrogen is substituted with —F, a group represented by one of Formulae 10-201 to 10-350, a group represented by one of Formulae 10-201 to 10-350 in which at least one hydrogen is substituted with deuterium, or a group represented by one of Formulae 10-201 to 10-350 in which at least one hydrogen is substituted with —F.

In one or more embodiments, in Formula 51, $Q_{51}$ and $Q_{52}$ may each independently be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, or a group represented by one of Formulae 9-1 to 9-39 in which at least one hydrogen is substituted with —F, and $Q_{53}$ may be a group represented by one of Formulae 10-12 to 10-129, a group represented by one of Formulae 10-12 to 10-129 in which at least one hydrogen is substituted with deuterium, a group represented by one of Formulae 10-12 to 10-129 in which at least one hydrogen is substituted with —F, a group represented by one of Formulae 10-201 to 10-350, a group represented by one of Formulae 10-201 to 10-350 in which at least one hydrogen is substituted with deuterium, or a group represented by one of Formulae 10-201 to 10-350 in which at least one hydrogen is substituted with —F.

In one or more embodiments, at least one of $Q_{51}$ to $Q_{53}$ in Formula 51 (for example, one of $Q_{51}$ to $Q_{53}$) may be a group represented by one of Formulae 10-12 to 10-129, a group represented by one of Formulae 10-12 to 10-129 in which at least one hydrogen is substituted with deuterium, a group represented by one of Formulae 10-12 to 10-129 in which at least one hydrogen is substituted with —F, a group represented by one of Formulae 10-201 to 10-350, a group represented by one of Formulae 10-201 to 10-350 in which at least one hydrogen is substituted with deuterium, or a group represented by one of Formulae 10-201 to 10-350 in which at least one hydrogen is substituted with —F:

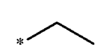
9-1

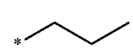
9-2

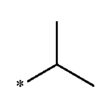
9-3

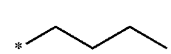
9-4

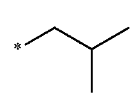
9-5

-continued
9-6
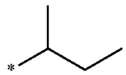
9-7
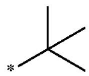
9-8
9-9
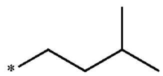
9-10
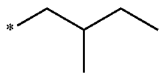
9-11
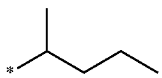
9-12
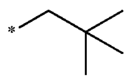
9-13
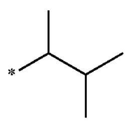
9-14
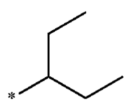
9-15
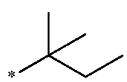
9-16
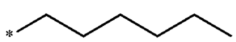
9-17
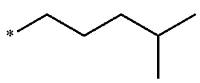
9-18
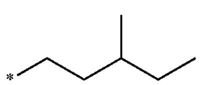
9-19
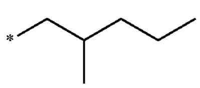
9-20
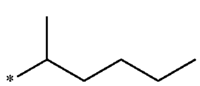
9-21
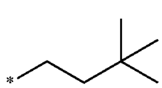
9-22
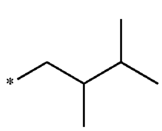
-continued
9-23
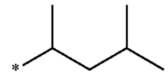
9-24
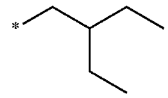
9-25
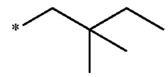
9-26
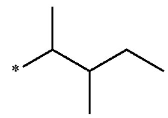
9-27
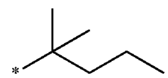
9-28
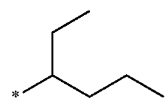
9-29
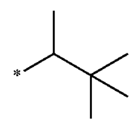
9-30
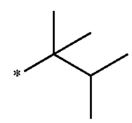
9-31
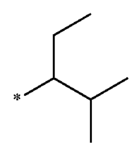
9-32
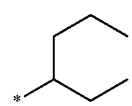
9-33
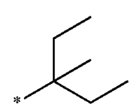
9-34
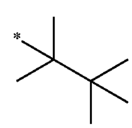
9-35
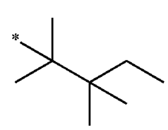

-continued
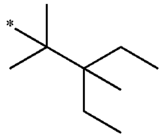
9-36
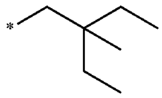
9-37
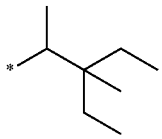
9-38
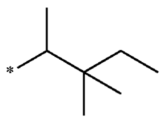
9-39
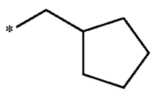
9-201
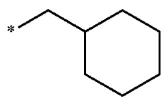
9-202
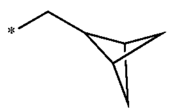
9-203
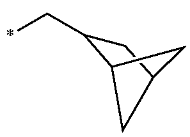
9-204
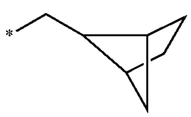
9-205
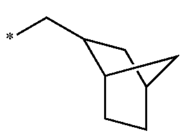
9-206
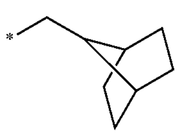
9-207
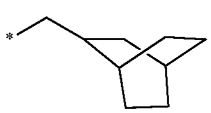
9-208
-continued
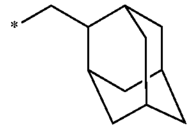
9-209
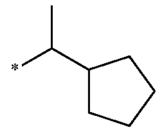
9-210
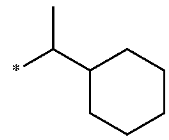
9-211
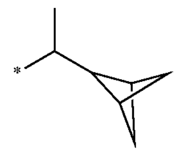
9-212
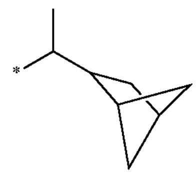
9-213
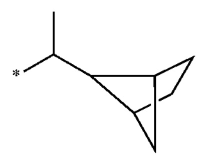
9-214
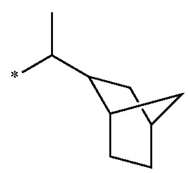
9-215
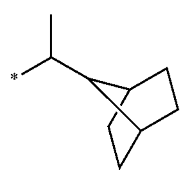
9-216
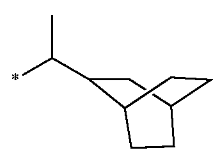
9-217
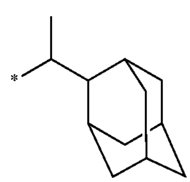
9-218

-continued
9-219
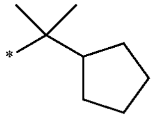
9-220
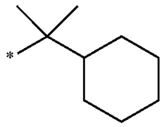
9-221
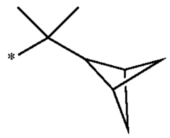
9-222
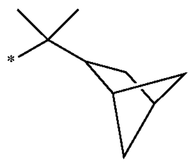
9-223
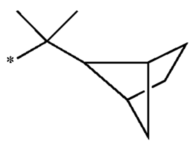
9-224
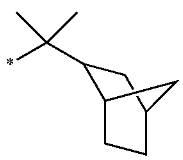
9-225
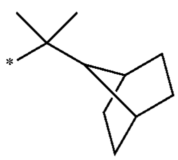
9-226
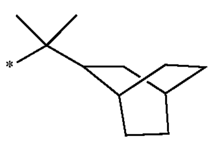
9-227
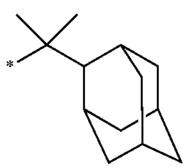
10-1
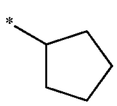
10-2
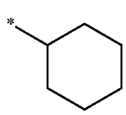
-continued
10-3
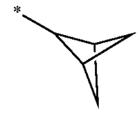
10-4
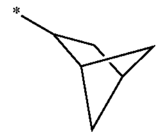
10-5
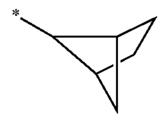
10-6
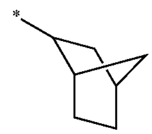
10-7
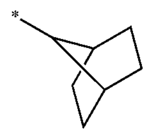
10-8
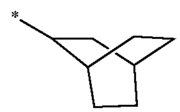
10-9
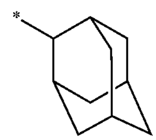
10-10
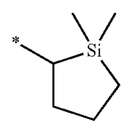
10-11
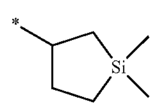
10-12
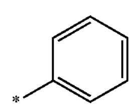
10-13
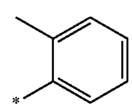
10-14
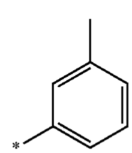

-continued
10-15
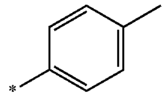
10-16
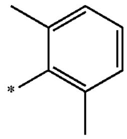
10-17
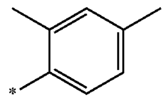
10-18
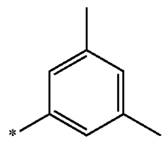
10-19
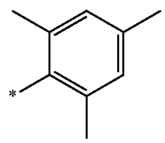
10-20
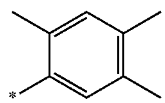
10-21
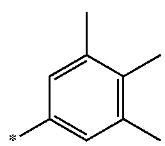
10-22
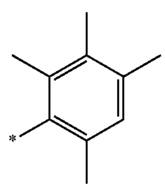
10-23
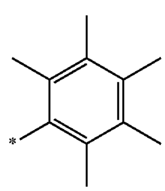
10-24
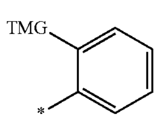
10-25
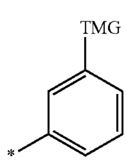
-continued
10-26
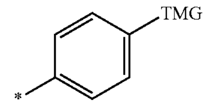
10-27
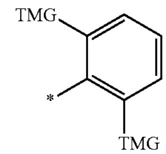
10-28
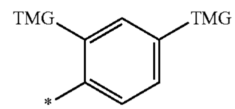
10-29
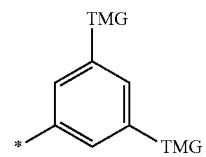
10-30
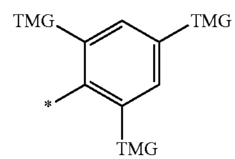
10-31
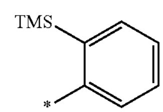
10-32
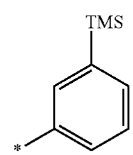
10-33
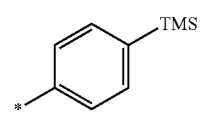
10-34
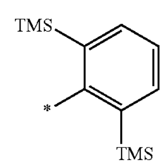
10-35
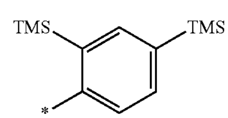
10-36
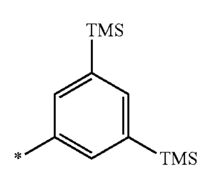

-continued
10-37
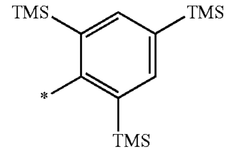
10-38
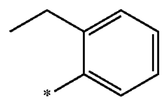
10-39
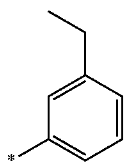
10-40
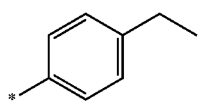
10-41
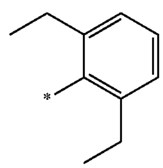
10-42
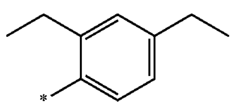
10-43
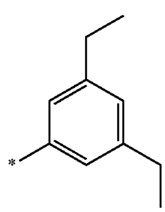
10-44
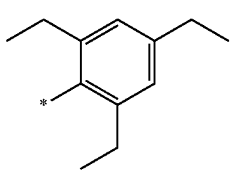
10-45
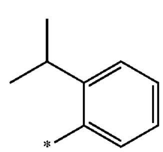
10-46
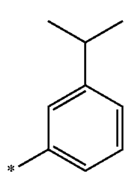
-continued
10-47
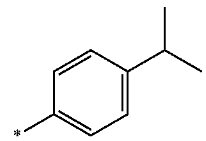
10-48
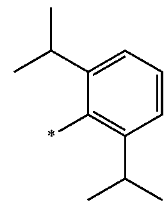
10-49
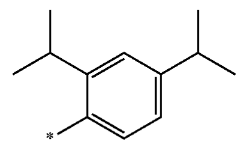
10-50
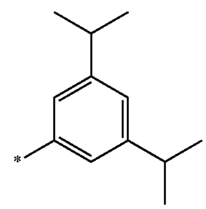
10-51
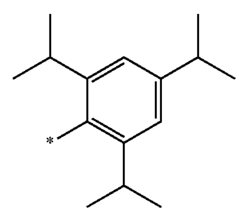
10-52
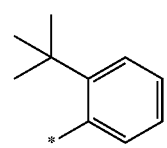
10-53
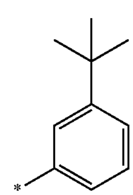
10-54
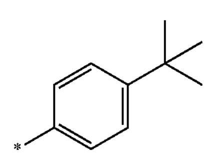

-continued
10-55
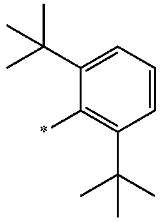
10-56
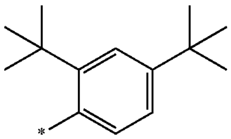
10-57
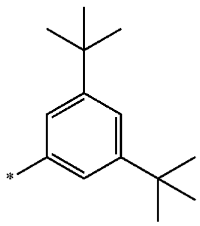
10-58
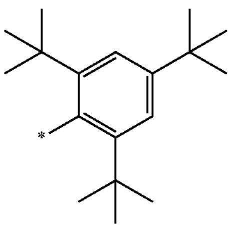
10-59
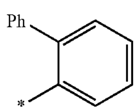
10-60
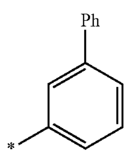
10-61
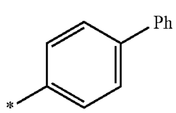
10-62
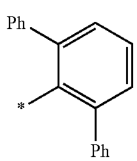
10-63
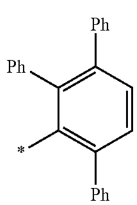
-continued
10-64
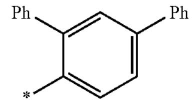
10-65
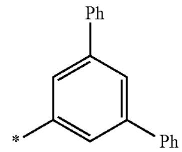
10-66
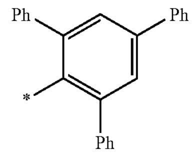
10-67
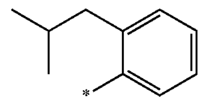
10-68
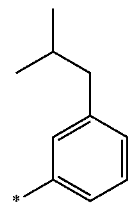
10-69
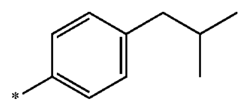
10-70
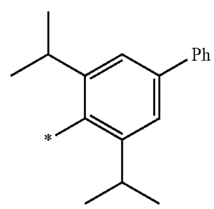
10-71
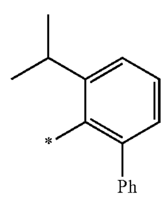
10-72
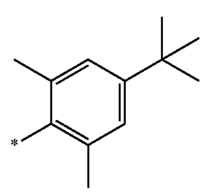

-continued
10-73
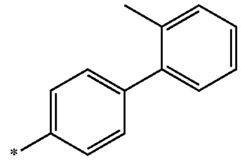
10-74
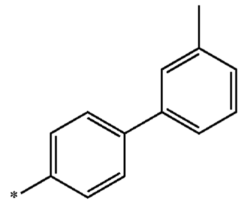
10-75
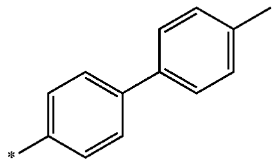
10-76
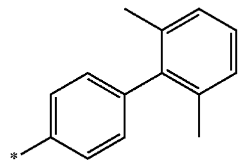
10-77
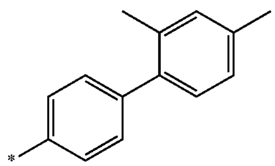
10-78
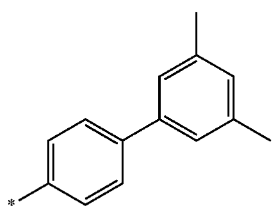
10-79
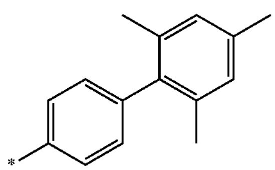
10-80
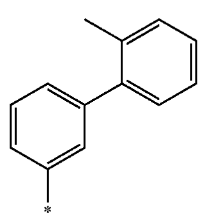
-continued
10-81
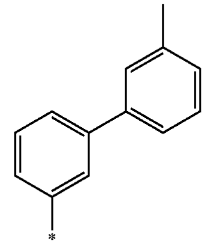
10-82
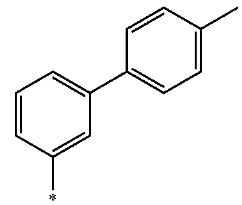
10-83
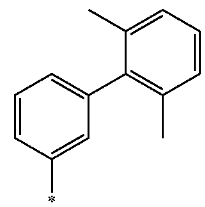
10-84
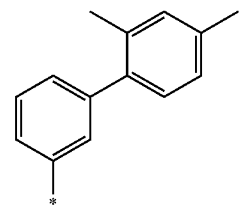
10-85
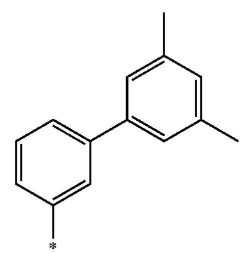
10-86
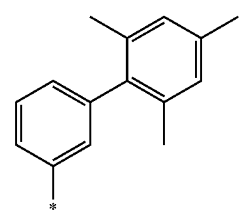
10-87
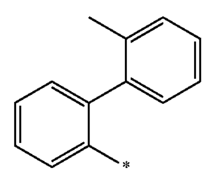

-continued
10-88
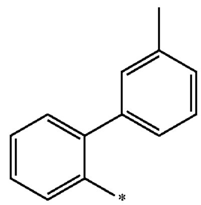
10-89
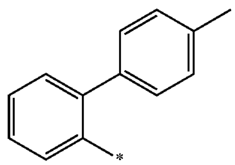
10-90
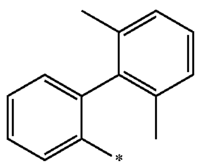
10-91
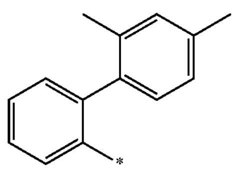
10-92
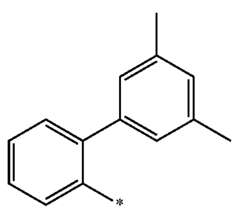
10-93
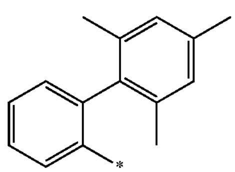
10-94
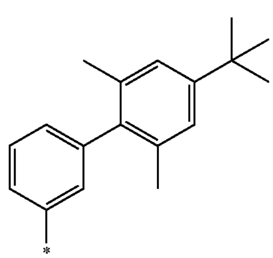
10-95
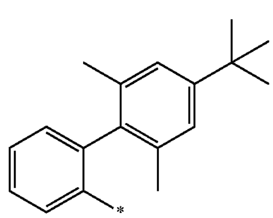
-continued
10-96
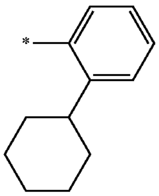
10-97
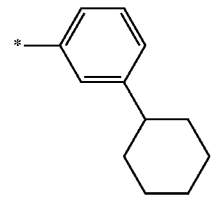
10-98
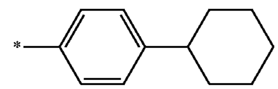
10-99
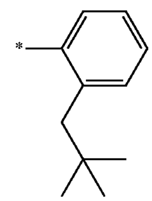
10-100
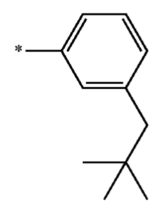
10-101
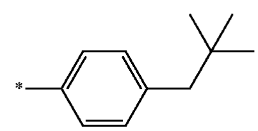
10-102
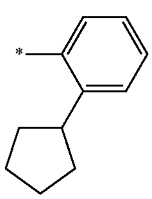
10-103
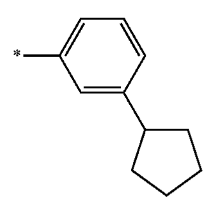
10-104
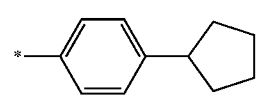

-continued
10-105
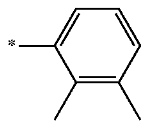
10-106
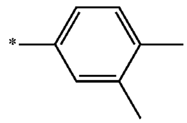
10-107
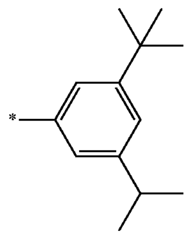
10-108
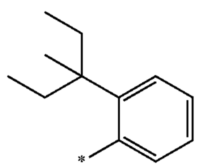
10-109
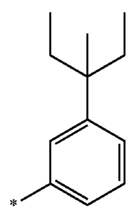
10-110
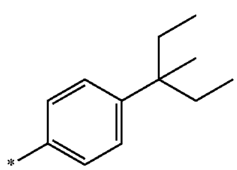
10-111
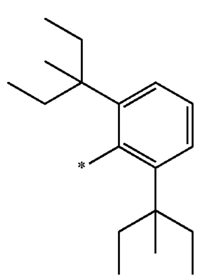
10-112
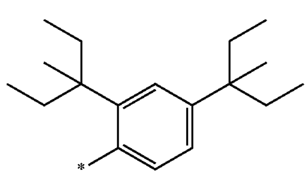
-continued
10-113
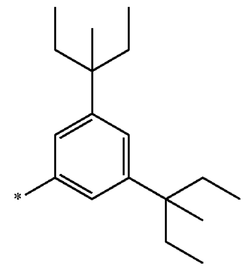
10-114
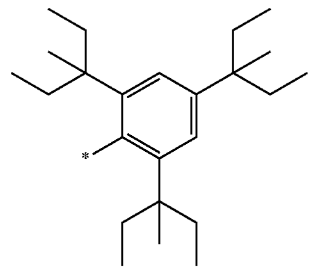
10-115
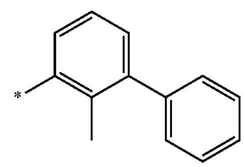
10-116
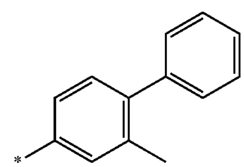
10-117
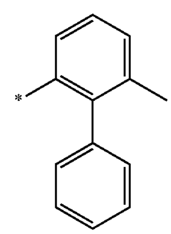
10-118
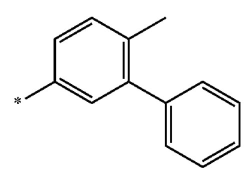
10-119
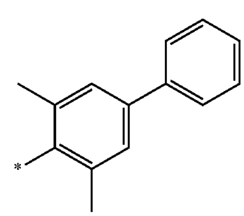

-continued
10-120
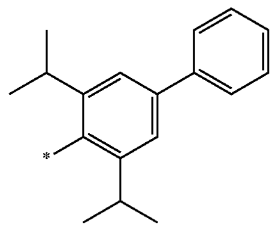
10-121
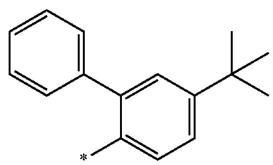
10-122
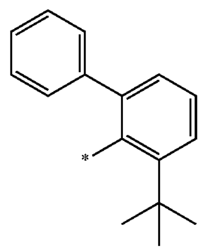
10-123
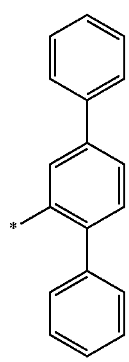
10-124
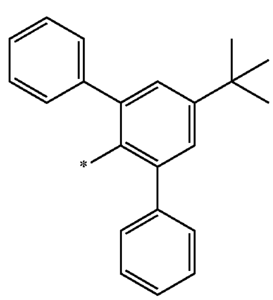
10-125
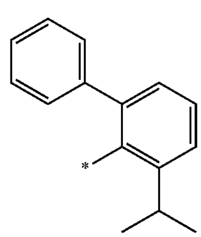
-continued
10-126
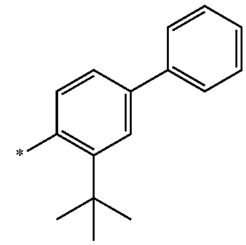
10-127
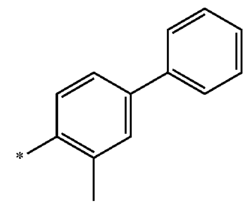
10-128
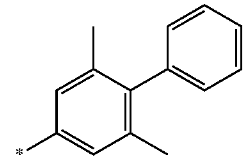
10-129
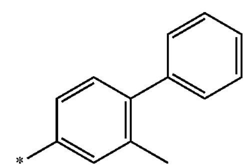
10-201
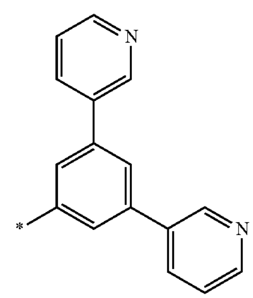
10-202
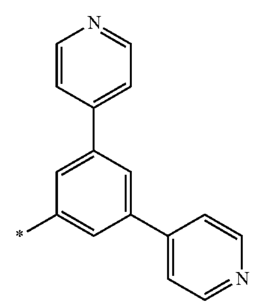

-continued
10-203
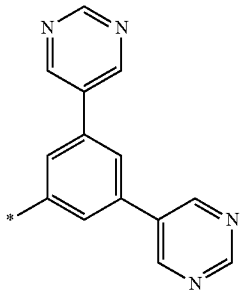
10-204
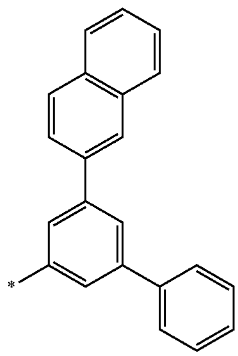
10-205
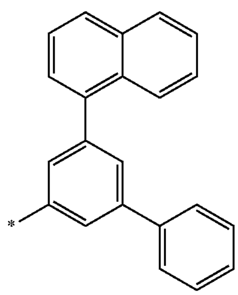
10-206
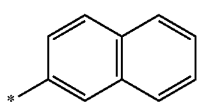
10-207
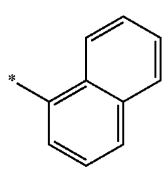
10-208
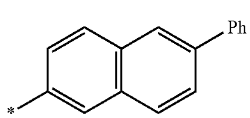
10-209
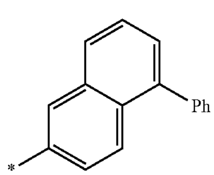
-continued
10-210
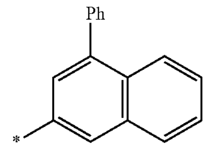
10-211
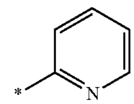
10-212
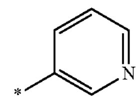
10-213
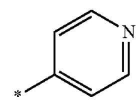
10-214
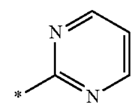
10-215
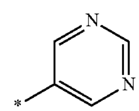
10-216
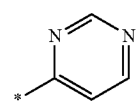
10-217
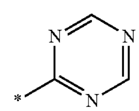
10-218
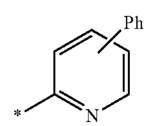
10-219
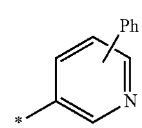
10-220
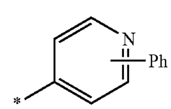
10-221
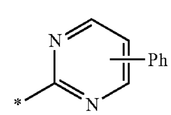
10-222
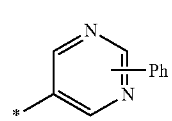

-continued
10-223
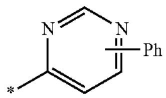
10-224
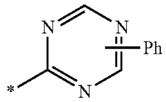
10-225
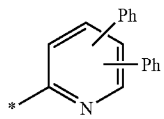
10-226
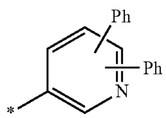
10-227
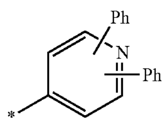
10-228
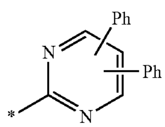
10-229
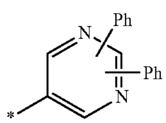
10-230
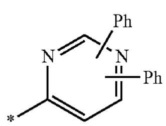
10-231
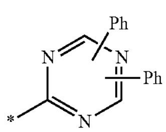
10-232
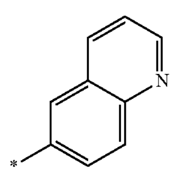
10-233
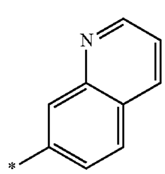
-continued
10-234
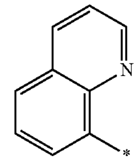
10-235
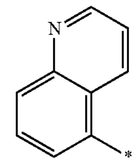
10-236
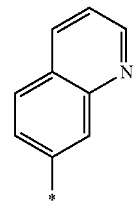
10-237
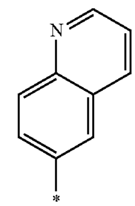
10-238
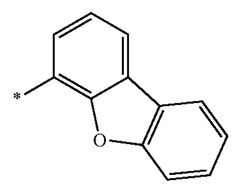
10-239
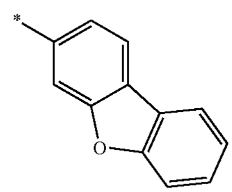
10-240
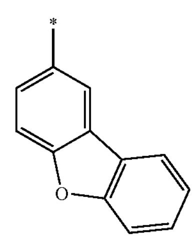
10-241
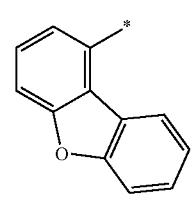

-continued
10-242
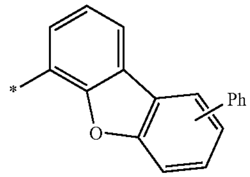
10-243
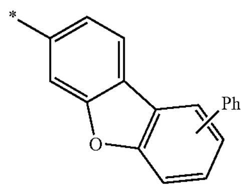
10-244
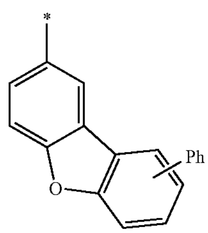
10-245
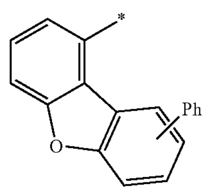
10-246
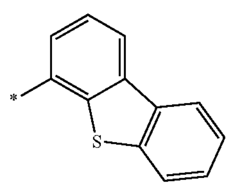
10-247
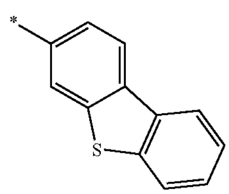
10-248
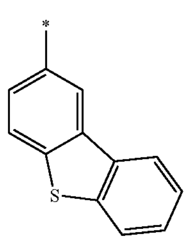
10-249
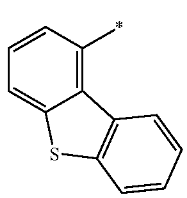
-continued
10-250
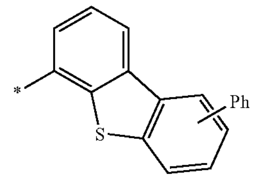
10-251
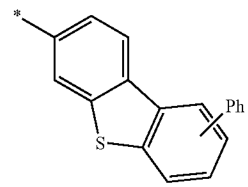
10-252
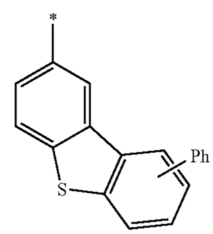
10-253
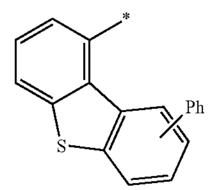
10-254
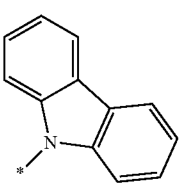
10-255
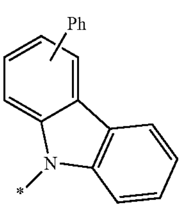
10-256
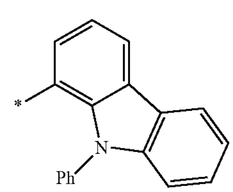
10-257
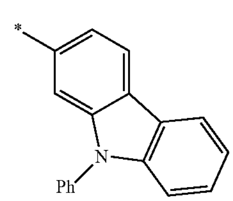

-continued
10-258
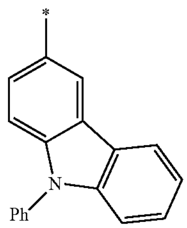
10-259
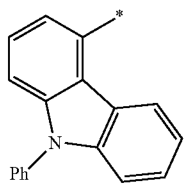
10-260
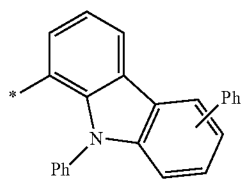
10-261
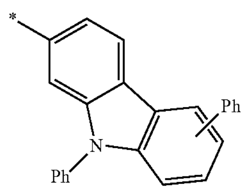
10-262
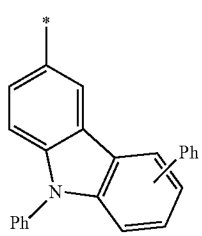
10-263
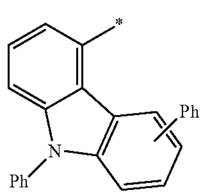
10-264
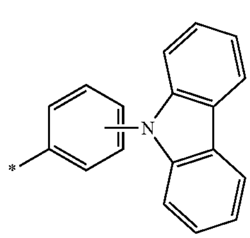
-continued
10-265
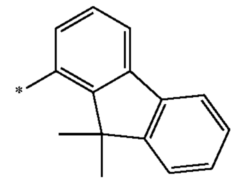
10-266
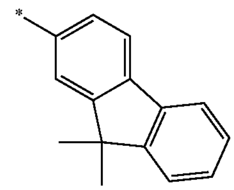
10-267
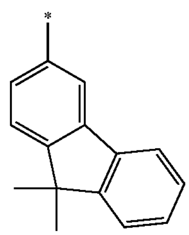
10-268
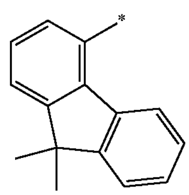
10-269
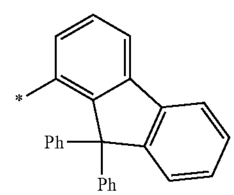
10-270
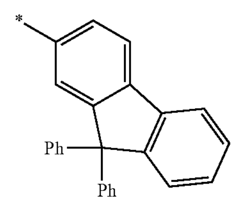
10-271
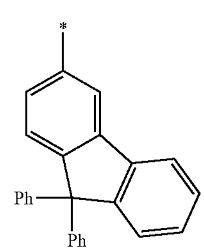

-continued
10-272
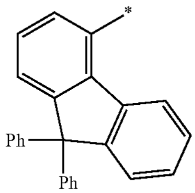
10-273
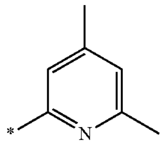
10-274
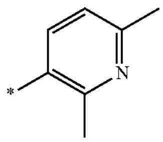
10-275
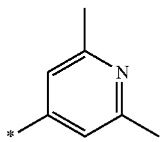
10-276
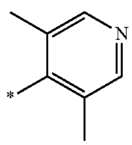
10-277
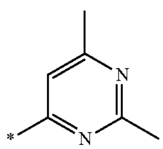
10-278
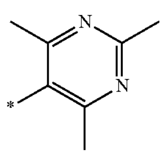
10-279
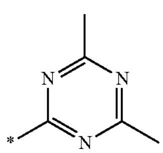
10-280
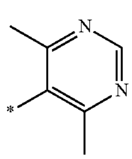
10-281
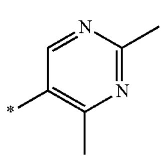
-continued
10-282
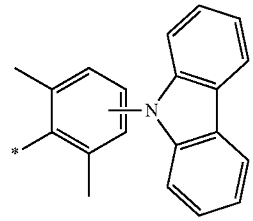
10-283
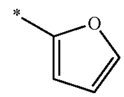
10-284
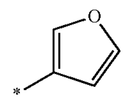
10-285
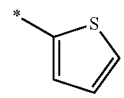
10-286
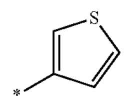
10-287
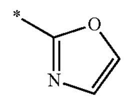
10-288
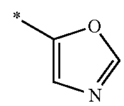
10-289
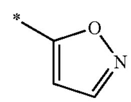
10-290
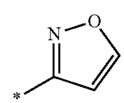
10-291
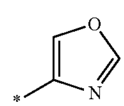
10-292
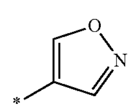
10-293
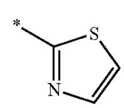
10-294
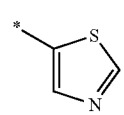

-continued
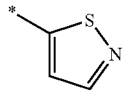
10-295
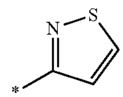
10-296
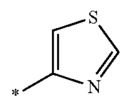
10-297
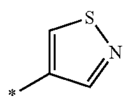
10-298
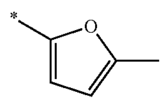
10-299
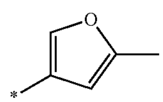
10-300
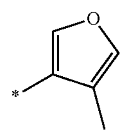
10-301
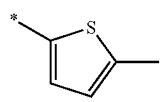
10-302
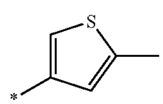
10-303
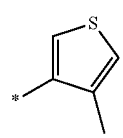
10-304
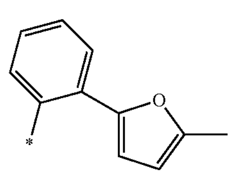
10-305
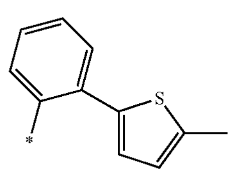
10-306
-continued
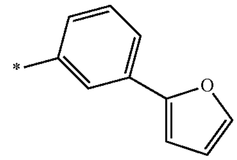
10-307
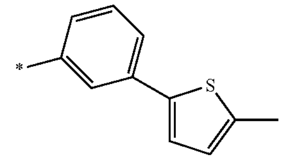
10-308
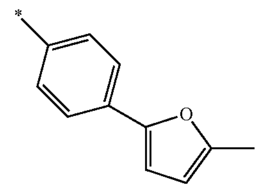
10-309
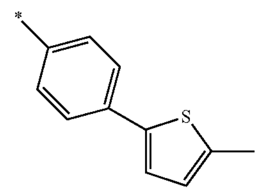
10-310
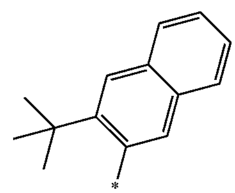
10-311
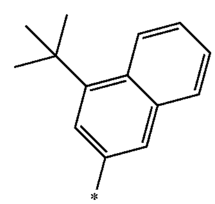
10-312
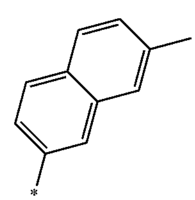
10-313
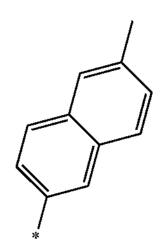
10-314

-continued
10-315
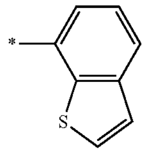
10-316
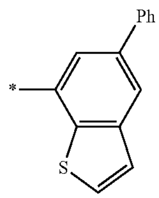
10-317
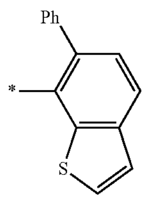
10-318
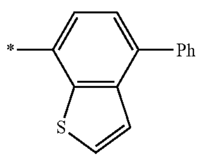
10-319
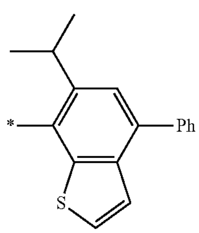
10-320
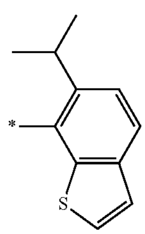
10-321
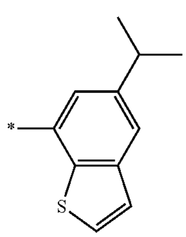
10-322
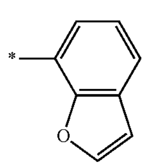
-continued
10-323
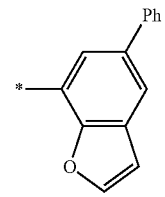
10-324
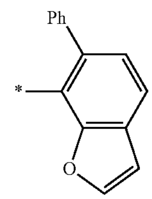
10-325
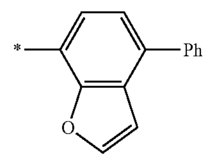
10-326
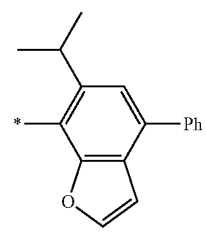
10-327
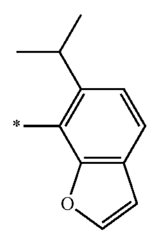
10-328
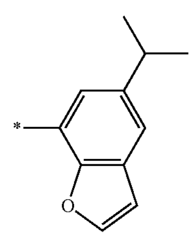
10-329
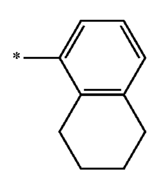

10-330
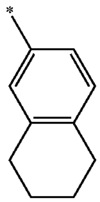
10-331
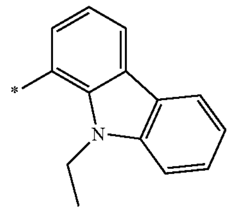
10-332
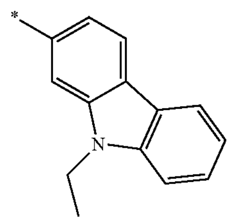
10-333
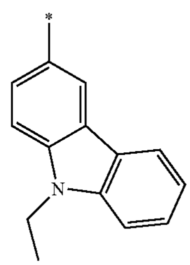
10-334
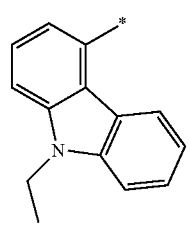
10-335
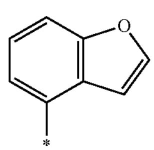
10-336
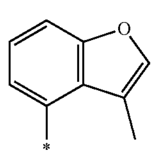
10-337
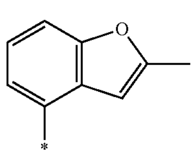
10-338
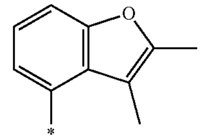
10-339
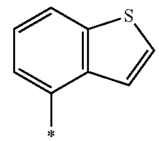
10-340
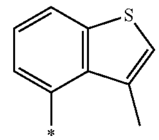
10-341
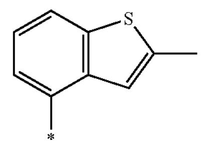
10-342
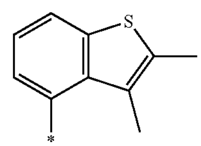
10-343
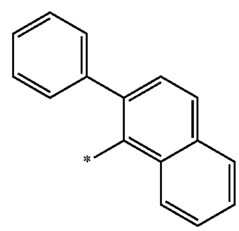
10-344
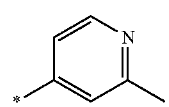
10-345
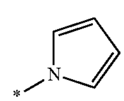
10-346
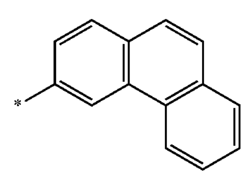
10-347
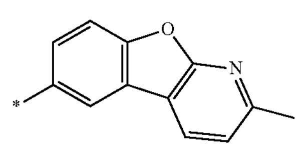

-continued 10-348

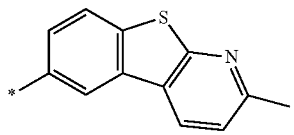

10-349

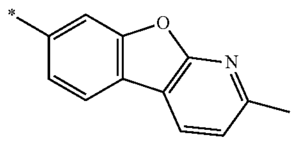

10-350

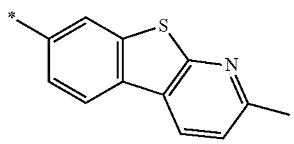

wherein * in Formulae 9-1 to 9-39, 9-201 to 9-227, 10-1 to 10-129, and 10-201 to 10-350 indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-227 in which at least one hydrogen is substituted with deuterium" may be, for example, a group represented by one of Formulae 9-501 to 9-514 and 9-601 to 9-636:

9-501

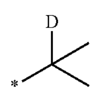

9-502

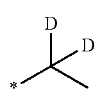

9-503

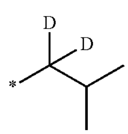

9-504

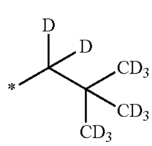

9-505

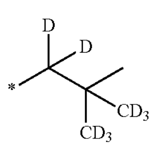

9-506

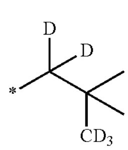

-continued 9-507

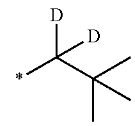

9-508

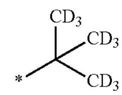

9-509

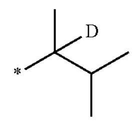

9-510

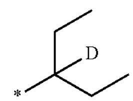

9-511

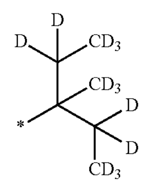

9-512

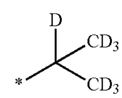

9-513

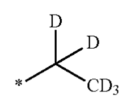

9-514

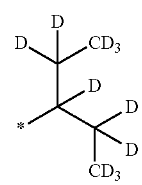

9-601

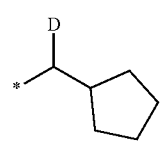

9-602

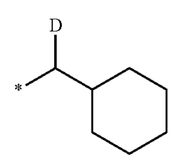

9-603

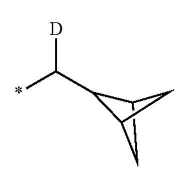

-continued
9-604
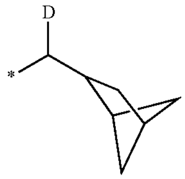
9-605
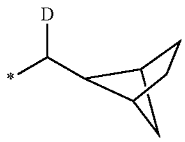
9-606
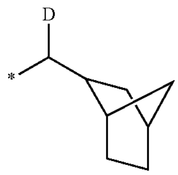
9-607
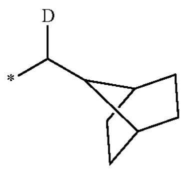
9-608
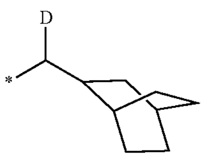
9-609
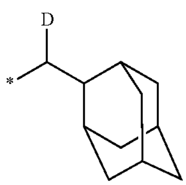
9-610
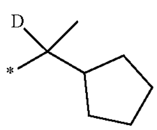
9-611
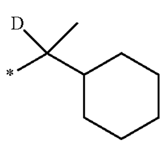
9-612
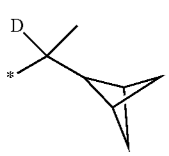
-continued
9-613
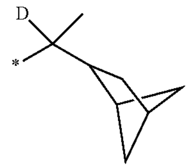
9-614
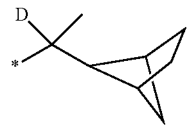
9-615
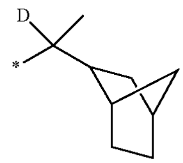
9-616
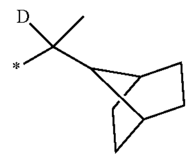
9-617
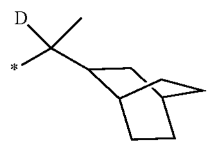
9-618
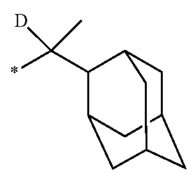
9-619
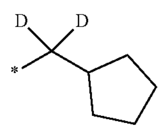
9-620
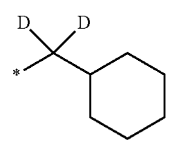
9-621
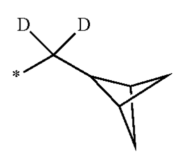
9-622
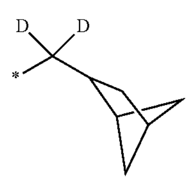

-continued
9-623
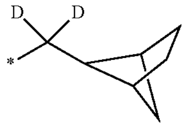
9-624
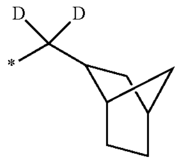
9-625
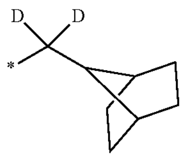
9-626
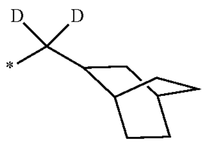
9-627
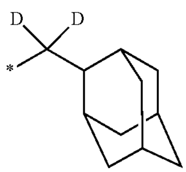
9-628
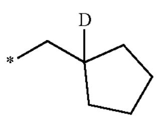
9-629
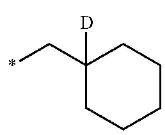
9-630
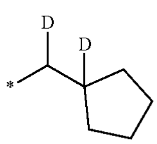
9-631
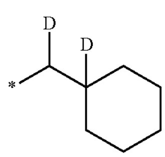
9-632
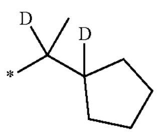
-continued
9-633
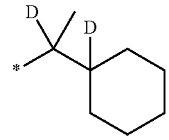
9-634
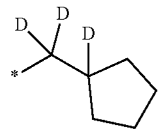
9-635
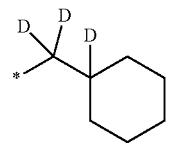
9-636
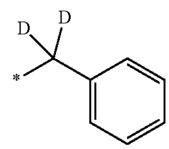
The “group represented by one of Formulae 9-1 to 9-39 in which at least one hydrogen is substituted with —F” and the “group represented by one of Formulae 9-201 to 9-227 in which at least one hydrogen is substituted with —F” may be, for example, a group represented by one of Formulae 9-701 to 9-710:
9-701
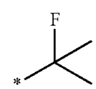
9-702
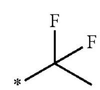
9-703
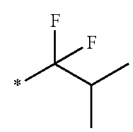
9-704
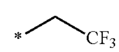
9-705
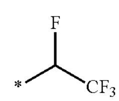
9-706
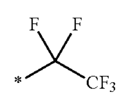
9-707
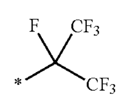
9-708
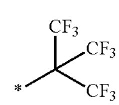

-continued
9-709
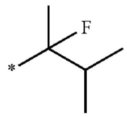
9-710
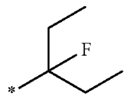
The "group represented by one of Formulae 10-1 to 10-129 in which at least one hydrogen is substituted with deuterium" and "the group represented by one of Formulae 10-201 to 10-350 in which at least one hydrogen is substituted with deuterium" may be, for example, a group represented by one of Formulae 10-501 to 10-553:
10-501
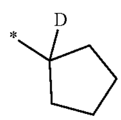
10-502
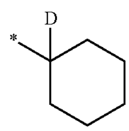
10-503
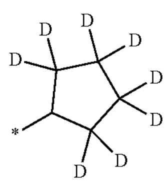
10-504
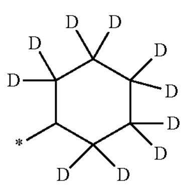
10-505
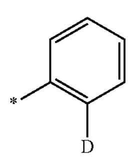
10-506
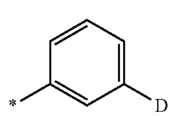
10-507
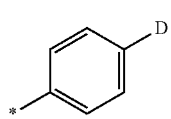
-continued
10-508
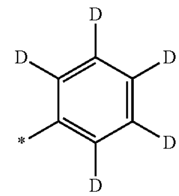
10-509
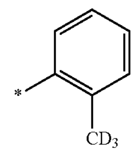
10-510
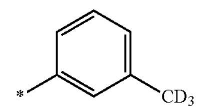
10-511
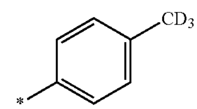
10-512
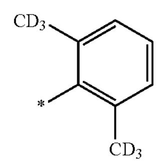
10-513
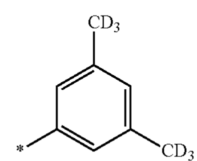
10-514
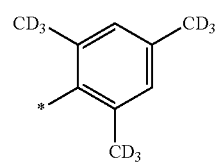
10-515
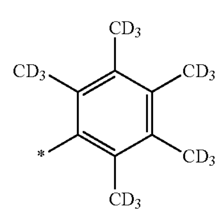
10-516
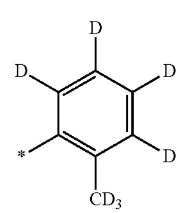

-continued
10-517
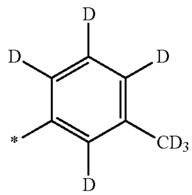
10-518
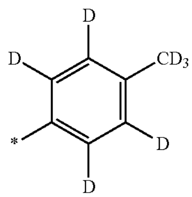
10-519
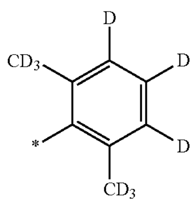
10-520
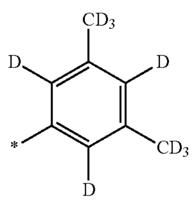
10-521
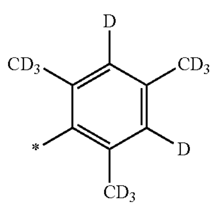
10-522
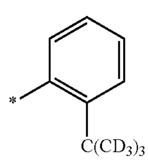
10-523
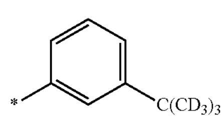
10-524
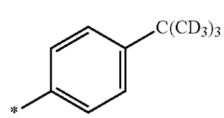
10-525
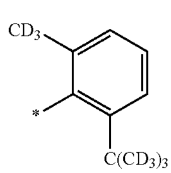
-continued
10-526
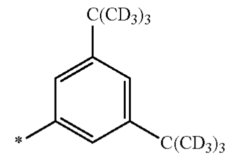
10-527
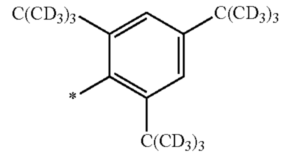
10-528
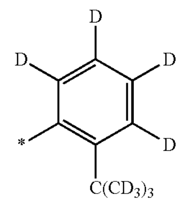
10-529
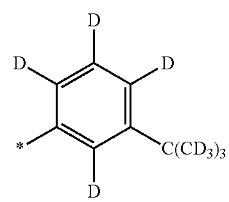
10-530
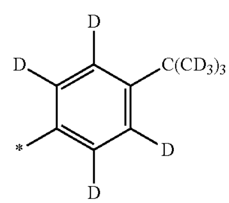
10-531
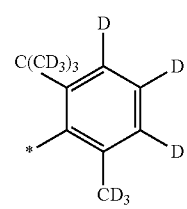
10-532
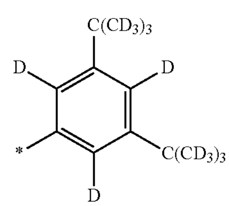
10-533
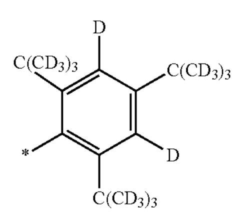

-continued
10-534
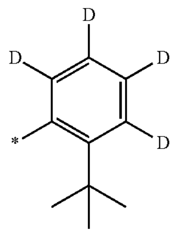
10-535
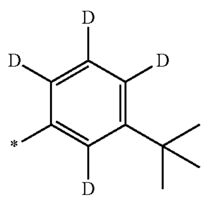
10-536
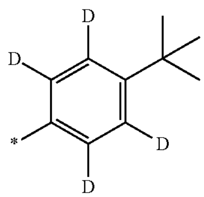
10-537
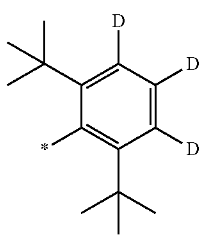
10-538
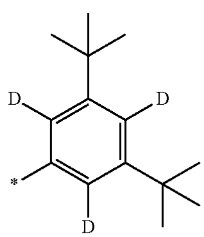
10-540
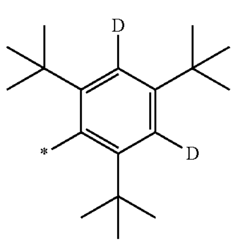
10-541
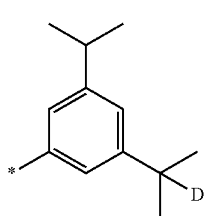
-continued
10-542
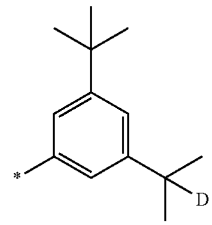
10-543
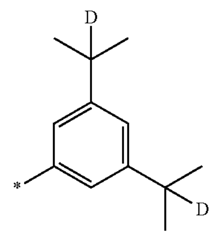
10-544
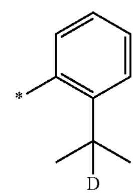
10-545
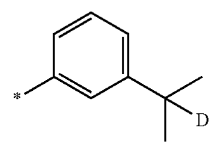
10-546
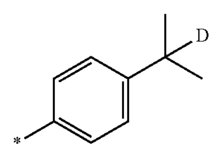
10-547
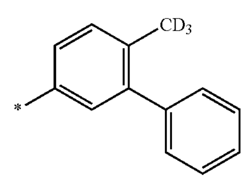
10-548
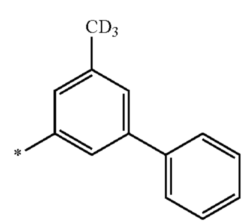
10-549
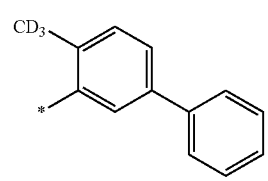

-continued
10-550
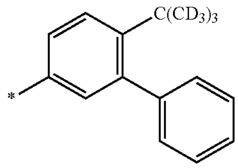
10-551
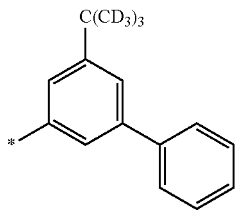
10-552
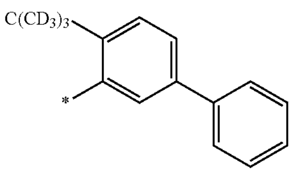
10-553
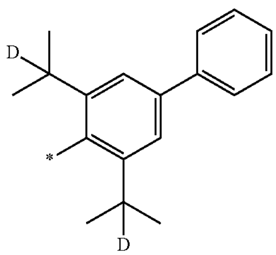
The "group represented by one of Formulae 10-1 to 10-129 in which at least one hydrogen is substituted with —F" and "the group represented by one of Formulae 10-201 to 10-350 in which at least one hydrogen is substituted with —F" may be, for example, a group represented by one of Formulae 10-601 to 10-617:
10-601
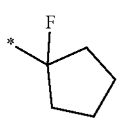
10-602
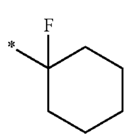
10-603
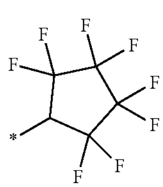
-continued
10-604
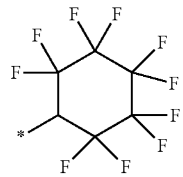
10-605
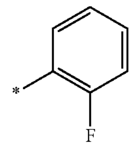
10-606
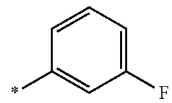
10-607
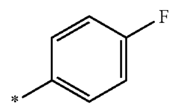
10-608
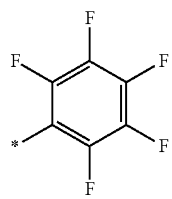
10-609
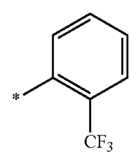
10-610
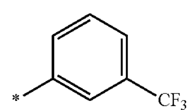
10-611
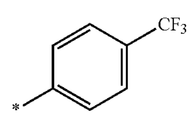
10-612
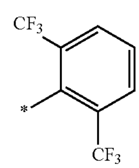
10-613
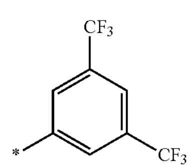

-continued 10-614

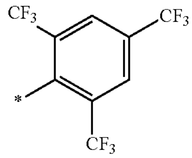

10-615

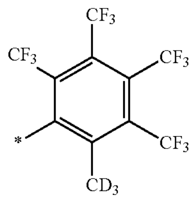

10-616

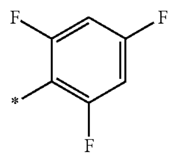

10-617

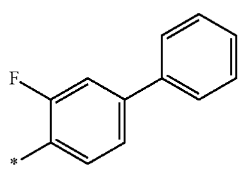

wherein c1 to c4 and a1 to a4 in Formula 1 may indicate numbers of $R_1$ to $R_4$, a group represented by *-[$(L_1)_{b1}$-$(R_1)_{c1}$], a group represented by *-[$(L_2)_{b2}$-$(R_2)_{c2}$], a group represented by *-[$(L_3)_{b3}$-$(R_3)_{c3}$], and a group represented by *-[$(L_4)_{b4}$-$(R_4)_{c4}$], respectively, and may each independently be an integer from 0 to 20. When c1 is 2 or more, two or more of $R_1$(s) may be identical to or different from each other, when c2 is 2 or more, two or more of $R_2$(s) may be identical to or different from each other, when c3 is 2 or more, two or more of $R_3$(s) may be identical to or different from each other, when c4 is 2 or more, two or more of $R_4$(s) may be identical to or different from each other, when a1 is 2 or more, two or more of groups represented by *-[$(L_1)_{b1}$-$(R_1)_{c1}$] may be identical to or different from each other, when a2 is 2 or more, two or more of groups represented by *-[$(L_2)_{b2}$-$(R_2)_{c2}$] may be identical to or different from each other, when a3 is 2 or more, two or more of groups represented by *-[$(L_3)_{b3}$-$(R_3)_{c3}$] may be identical to or different from each other, and when a4 is 2 or more, two or more of groups represented by *-[$(L_4)_{b4}$-$(R_4)_{c4}$] may be identical to or different from each other. In one or more embodiments, c1 to c4 and a1 to a4 in Formula 1 may each independently be 0, 1, 2, or 3.

c51 in Formula 51 may indicate the number of groups represented by *—C($Q_{51}$)($Q_{52}$)($Q_{53}$) and may be an integer from 1 to 20. When c51 is 2 or more, two or more groups represented by *—C($Q_{51}$)($Q_{52}$)($Q_{53}$) may be identical to or different from each other. In one or more embodiments, c51 may be 1 or 2.

The organometallic compound represented by Formula 1 may satisfy at least one of Condition 1 and Condition 2:

Condition 1 the sum of d1 to d4 in Formula 1 is 1 or more

Condition 2 at least one of $T_1$ to $T_4$ in Formula 1 is *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—C($R_{5a}$)=*', *=C($R_{5a}$)—*', or *—C($R_{5a}$)=C($R_{5b}$)—*', and at least one of $R_{5a}$ and $R_{5b}$ is a group represented by Formula 51

In other words, the organometallic compound represented by Formula 1 may include at least one group represented by Formula 51.

In one or more embodiments, the organometallic compound represented by Formula 1 may satisfy at least one of Condition 1A and Condition 2A:

Condition 1A in Formula 1, i) d1 is 1, and each of d2, d3, and d4 is 0;
ii) d2 is 1, and each of d1, d3, and d4 is 0;
iii) d3 is 1, and each of d1, d2, and d4 is 0;
iv) d4 is 1, and each of d1, d2, and d3 is 0;
v) each of d1 and d2 is 1, and each of d3 and d4 is 0;
vi) each of d2 and d3 is 1, and each of d1 and d4 is 0; or
vii) each of d2 and d4 is 1, and each of d1 and d3 is 0.

Condition 2A in Formula 1, n3 is 1, and i) $T_3$ is *—N($R_{5a}$)—*', *—B($R_{5a}$)—*', *—P($R_{5a}$)—*', *—C($R_{5a}$)=*', or *=C($R_{5a}$)—*', and $R_{5a}$ is a group represented by Formula 51; or
ii) $T_3$ is *—C($R_{5a}$)($R_{5b}$)—*', *—Si($R_{5a}$)($R_{5b}$)—*', *—Ge($R_{5a}$)($R_{5b}$)—*', or *—C($R_{5a}$)=C($R_{5b}$)—*, and at least one of $R_{5a}$ and $R_{5b}$ is a group represented by Formula 51, wherein * and *' may each indicate a binding site to a neighboring atom.

In Formula 1, i) two or more of a plurality of $R_2$(s) may optionally be bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, ii) two or more of a plurality of $R_3$(s) may optionally be bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, iii) two or more of a plurality of $R_4$(s) may optionally be bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, and iv) two or more of $R_1$ to $R_4$, one or more of $R_1$ to $R_4$ and $R_{5a}$, one or more of $R_1$ to $R_4$ and $R_{5b}$, or $R_{5a}$ and $R_{5b}$ may each optionally be bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

$R_{10a}$ may be the same as described in connection with $R_1$.

In one or more embodiments, a group represented by *—C($Q_{51}$)($Q_{52}$)($Q_{53}$) in Formula 51 may be a group represented by one of Formulae 51-1 to 51-25:

51-1

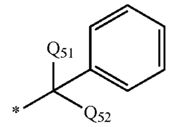

51-2

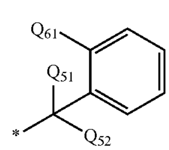

-continued
51-3
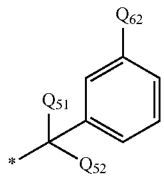
51-4
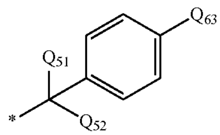
51-5
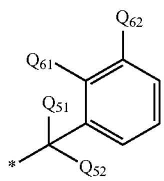
51-6
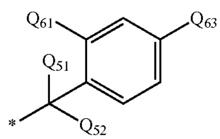
51-7
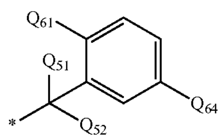
51-8
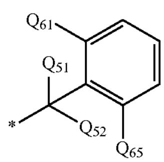
51-9
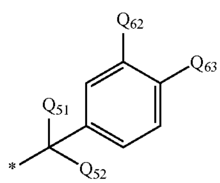
51-10
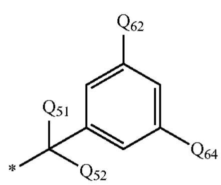
51-11
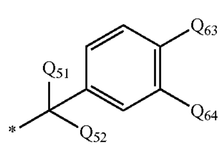
-continued
51-12
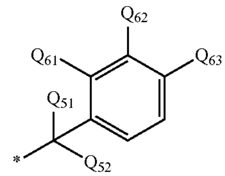
51-13
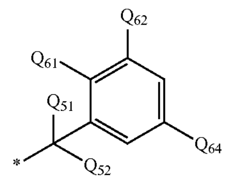
51-14
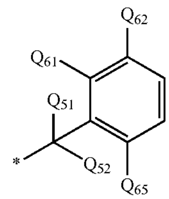
51-15
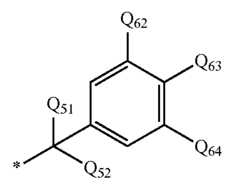
51-16
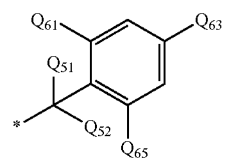
51-17
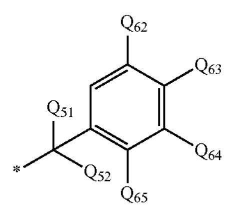
51-18
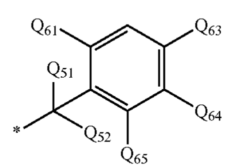
51-19
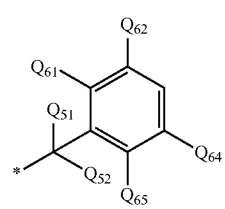

-continued 51-20

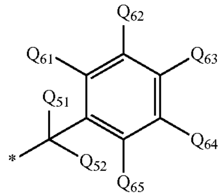

51-21

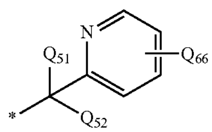

51-22

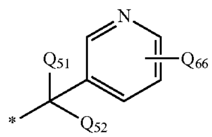

51-23

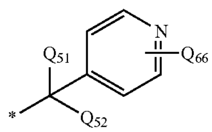

51-24

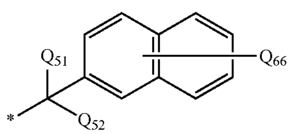

51-25

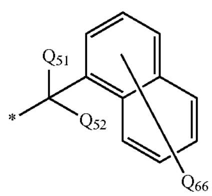

$Q_{51}$ and $Q_{52}$ in Formulae 51-1 to 51-25 may each be the same as described in the present specification, and $Q_{61}$ to $Q_{66}$ in Formulae 51-1 to 51-25 may each be the same as described in connection with $R_{10a}$ in the present specification, wherein each of $Q_{61}$ to $Q_{65}$ in Formulae 51-1 to 51-25 may not be hydrogen, and * in Formulae 51-1 to 51-25 indicates a binding site to $L_{51}$ in Formula 51.

In one or more embodiments, in Formulae 51-1 to 51-20, i) $Q_{51}$ and $Q_{52}$ may each be hydrogen, and $Q_{61}$ to $Q_{65}$ may each independently be deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, or a ($C_1$-$C_{20}$ alkyl)phenyl group, ii) $Q_{51}$ may be hydrogen, and $Q_{52}$ and $Q_{61}$ to $Q_{65}$ may each independently be deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, or a ($C_1$-$C_{20}$ alkyl)phenyl group, or iii) $Q_{51}$, $Q_{52}$, and $Q_{61}$ to $Q_{65}$ may each independently be deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, or a ($C_1$-$C_{20}$ alkyl)phenyl group.

In one or more embodiments, $L_{51}$ in Formula 51 may be a single bond.

In one or more embodiments, in a group represented by Formula 51, $L_{51}$ may be a single bond, and thus, the group represented by Formula 51 may be a group represented by one of Formulae 51-1 to 51-25, for example, one of Formulae 51-1 to 51-20.

In one or more embodiments, a group represented by Formula 51 may be a group represented by one of Formulae 51(1) to 51(19):

51(1)

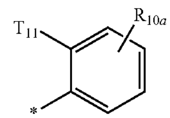

51(2)

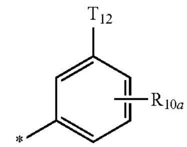

51(3)

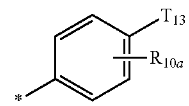

51(4)

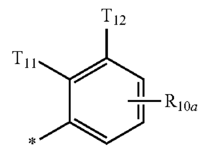

51(5)

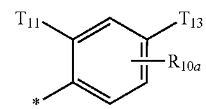

51(6)

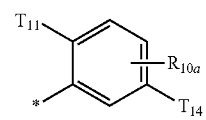

51(7)

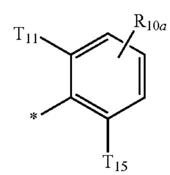

51(8)

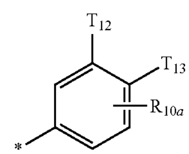

51(9)

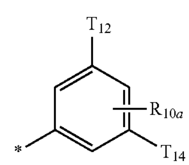

-continued

51(10)

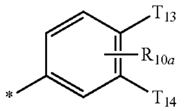

51(11)

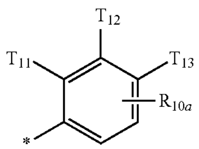

51(12)

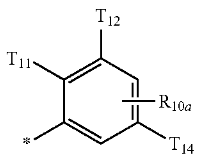

51(13)

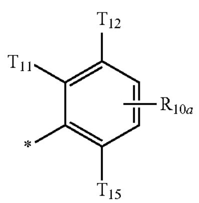

51(14)

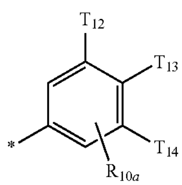

51(15)

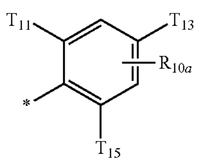

51(16)

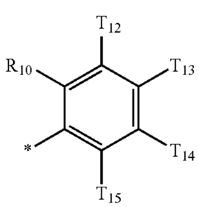

51(17)

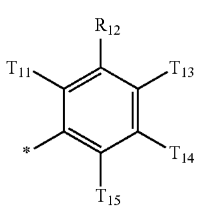

51(18)

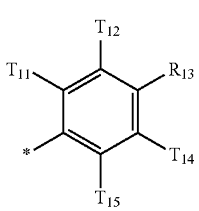

-continued

51(19)

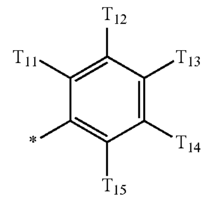

$T_{11}$ to $T_{15}$ in Formulae 51(1) to 51(19) may each be a group represented by *—C($Q_{51}$)($Q_{52}$)($Q_{53}$) in Formula 51, $T_{11}$ to $T_{15}$ in Formulae 51(1) to 51(19) may be identical to or different from each other, $R_{10a}$ in Formulae 51(1) to 51(19) may be the same as described in connection with $R_1$ in the present specification, and * in Formulae 51(1) to 51(19) indicates a binding site to a neighboring atom.

In one or more embodiments, in Formula 1, n1 may be 1, n4 may be 0, and a group represented by

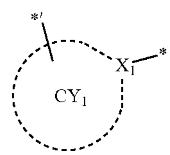

may be a group represented by one of Formulae CY1(1) to CY1(20):

CY1(1)

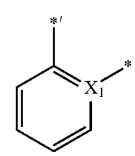

CY1(2)

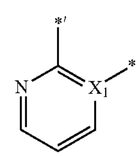

CY1(3)

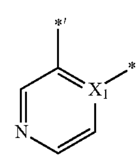

CY1(4)

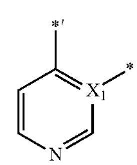

CY1(5)

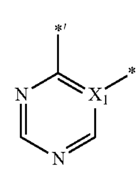

-continued
CY1(6)
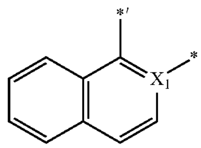
CY1(7)
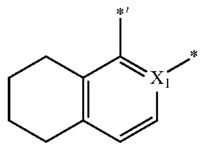
CY1(8)
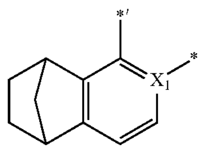
CY1(9)
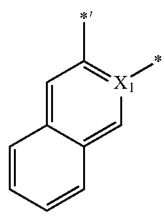
CY1(10)
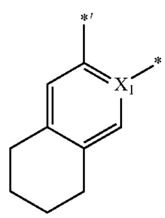
CY1(11)
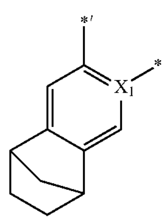
CY1(12)
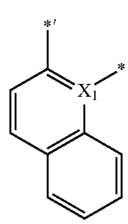
CY1(13)
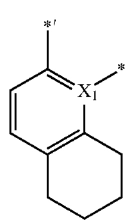
-continued
CY1(14)
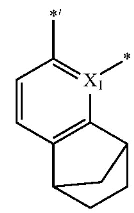
CY1(15)
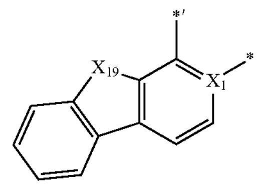
CY1(16)
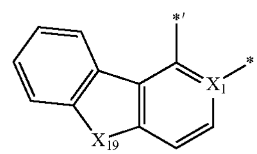
CY1(17)
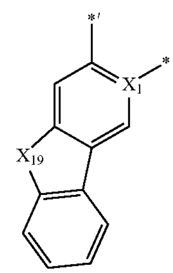
CY1(18)
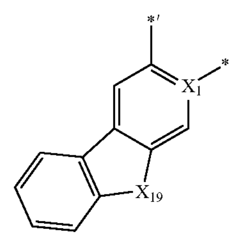
CY1(19)
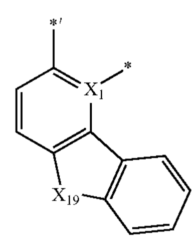
CY1(20)
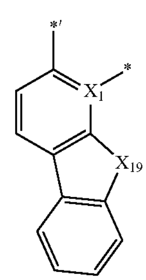

In Formulae CY1(1) to CY1(20), $X_1$ may be the same as described in the present specification, $X_{19}$ may be O, S, $N(R_{19a})$, $C(R_{19a})(R_{19b})$, or $Si(R_{19a})(R_{19b})$, $R_{19a}$ and $R_{19b}$ may each be the same as described in connection with $R_1$ in the present specification,

*indicates a binding site to $X_5$ in Formula 1, and

*' indicates a binding site to $T_1$ in Formula 1.

In one or more embodiments, in Formula 1, n1 may be 1, n4 may be 0, and a group represented by

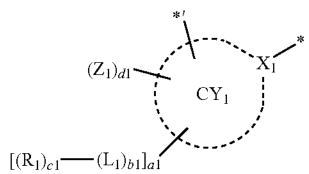

may be a group represented by one of Formulae CY1-1 to CY1-18 and ZCY1-1 to ZCY1-32:

CY1-1

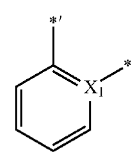

CY1-2

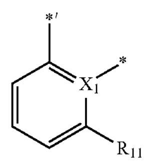

CY1-3

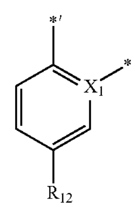

CY1-4

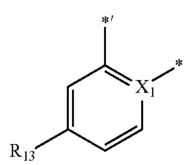

CY1-5

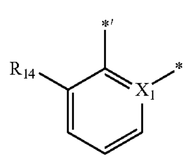

CY1-6

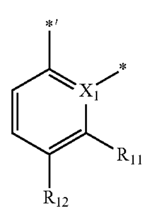

-continued

CY1-7

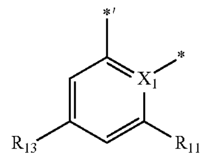

CY1-8

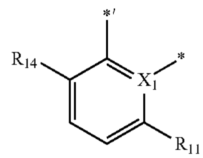

CY1-9

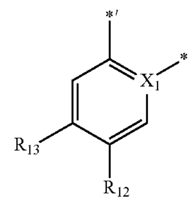

CY1-10

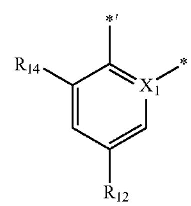

CY1-11

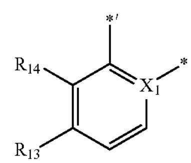

CY1-12

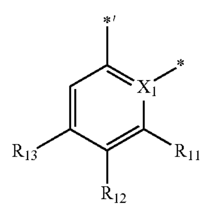

CY1-13

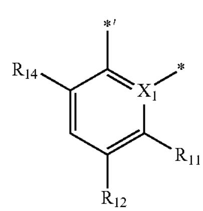

CY1-14

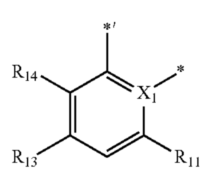

-continued
CY1-15
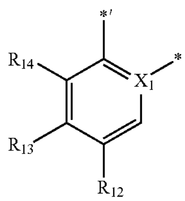
CY1-16
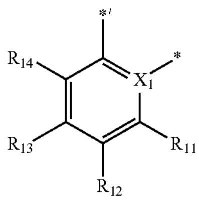
CY1-17
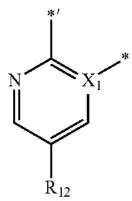
CY1-18
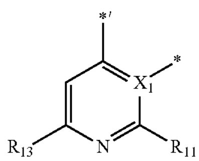
ZCY1-1
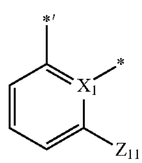
ZCY1-2
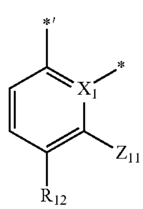
ZCY1-3
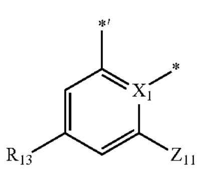
ZCY1-4
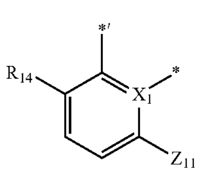
-continued
ZCY1-5
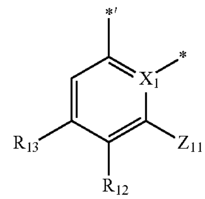
ZCY1-6
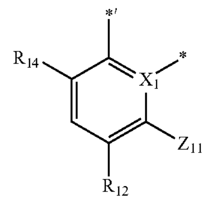
ZCY1-7
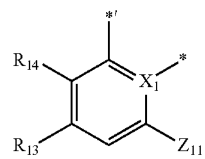
ZCY1-8
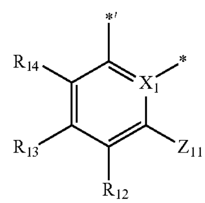
ZCY1-9
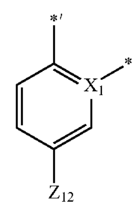
ZCY1-10
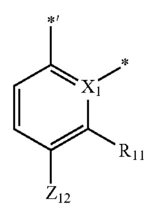
ZCY1-11
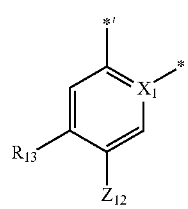
ZCY1-12
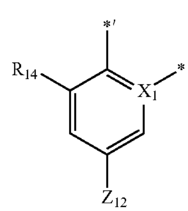

-continued
ZCY1-13
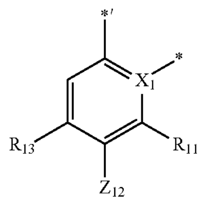
ZCY1-14
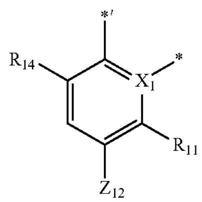
ZCY1-15
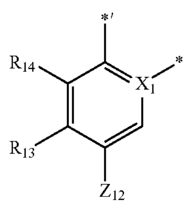
ZCY1-16
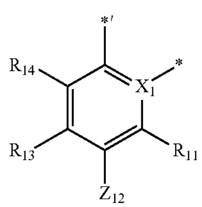
ZCY1-17
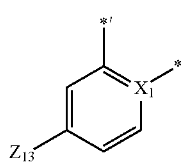
ZCY1-18
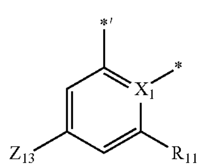
ZCY1-19
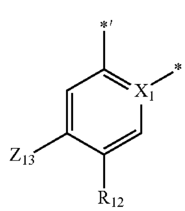
ZCY1-20
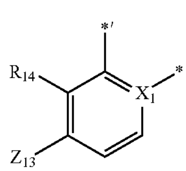
-continued
ZCY1-21
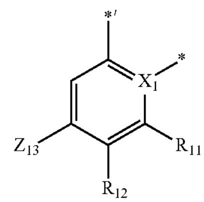
ZCY1-22
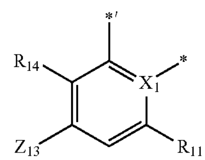
ZCY1-23
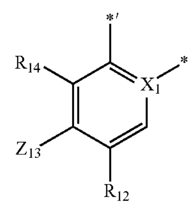
ZCY1-24
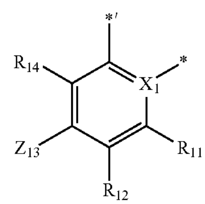
ZCY1-25
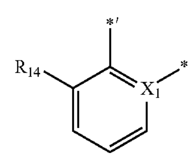
ZCY1-26
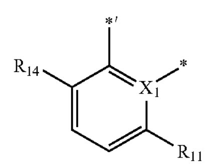
ZCY1-27
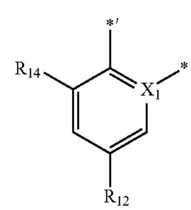
ZCY1-28
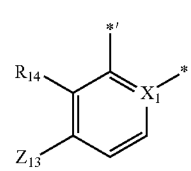

-continued

ZCY1-29

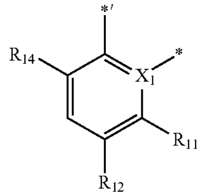

ZCY1-30

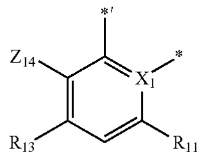

ZCY1-31

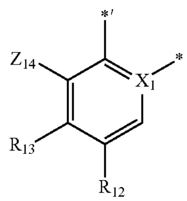

ZCY1-32

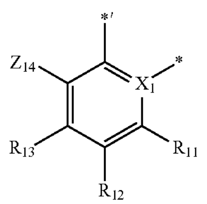

In Formulae CY1-1 to CY1-18 and ZCY1-1 to ZCY1-32, $X_1$ may be the same as described in the present specification, $R_{11}$ to $R_{14}$ may each be the same as described in connection with $R_1$ in the present specification, wherein each of $R_{11}$ to $R_{14}$ may not be hydrogen, $Z_1$ to $Z_{14}$ may each be the same as described in connection with $Z_1$ in the present specification,

*indicates a binding site to $X_5$ in Formula 1, and

*' indicates a binding site to $T_1$ in Formula 1.

In one or more embodiments, in Formula 1, each of n1 and n2 may be 1, and ring $CY_2$ may be a group represented by Formula CY2A or CY2B:

CY2A

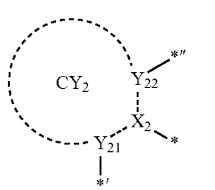

CY2B

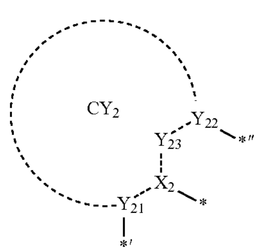

In Formulae CY2A and CY2B, $X_2$ and ring $CY_2$ may each be the same as described in the present specification, $Y_{21}$ to $Y_{23}$ may each independently be O, S, N, C, or Si, a bond between $X_2$ and $Y_{21}$, a bond between $X_2$ and $Y_{22}$, a bond between $X_2$ and $Y_{23}$, and a bond between $Y_{22}$ and $Y_{23}$ may each be a chemical bond,

*' indicates a binding site to $T_1$ in Formula 1,

*indicates a binding site to M in Formula 1, and

*" indicates a binding site to $T_2$ in Formula 1.

In one or more embodiments, in Formula 1, each of n1 and n2 may be 1, and a group represented by

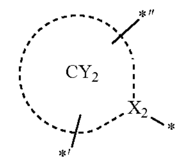

may be a group represented by one of Formulae CY2(1) to CY2(16):

CY2(1)

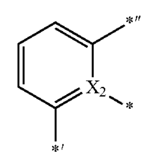

CY2(2)

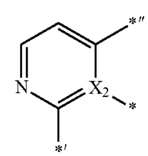

CY2(3)

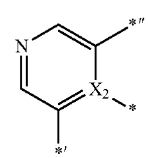

CY2(4)

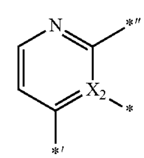

CY2(5)

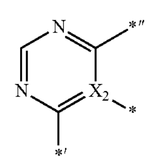

CY2(6)

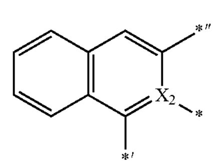

-continued

CY2(7)

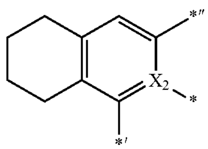

CY2(8)

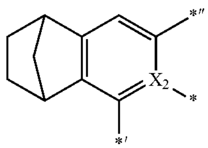

CY2(9)

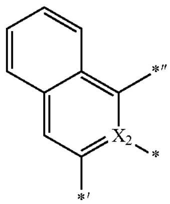

CY2(10)

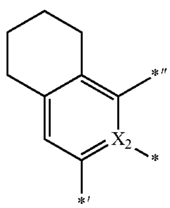

CY2(11)

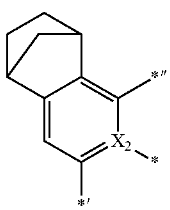

CY2(12)

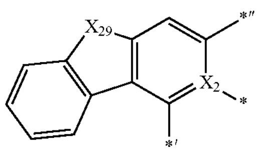

CY2(13)

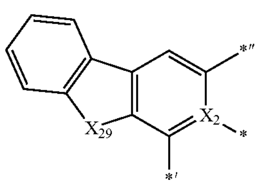

CY2(14)

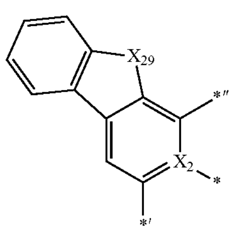

-continued

CY2(15)

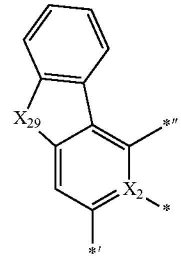

CY2(16)

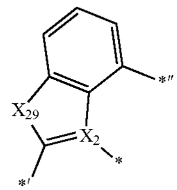

In Formulae CY2(1) to CY2(16), $X_2$ may be the same as described in the present specification, $X_{29}$ may be O, S, N-[$(L_2)_{b2}$-$(R_2)_{c2}$], N($Z_{24}$), C($R_{29a}$)($R_{29b}$), or Si($R_{29a}$)($R_{29b}$), $L_2$, b2, $R_2$, and c2 may each be the same as described in the present specification, $Z_{24}$ may be the same as described in connection with $Z_2$ in the present specification, $R_{29a}$ and $R_{29b}$ may each be the same as described in connection with $R_2$ in the present specification,

*' indicates a binding site to $T_1$ in Formula 1,

*indicates a binding site to M in Formula 1, and

*" indicates a binding site to $T_2$ in Formula 1.

In one or more embodiments, in Formula 1, each of n1 and n2 may be 1, and a group represented by

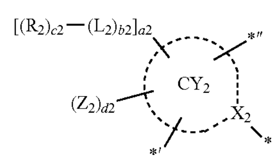

may be a group represented by one of Formulae CY2-1 to CY2-16 and ZCY2-1 to ZCY2-19:

CY2-1

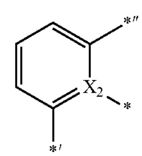

CY2-2

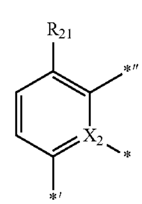

-continued
CY2-3
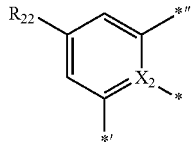
CY2-4
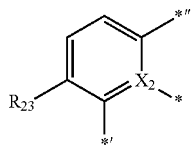
CY2-5
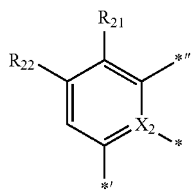
CY2-6
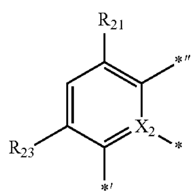
CY2-7
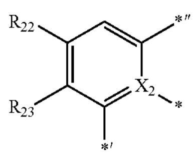
CY2-8
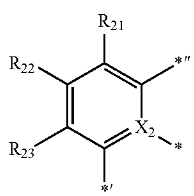
CY2-9
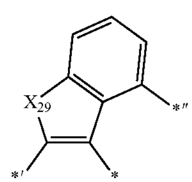
CY2-10
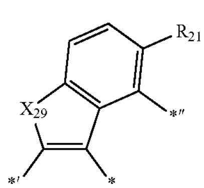
-continued
CY2-11
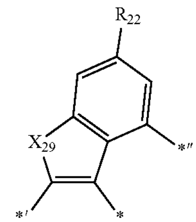
CY2-12
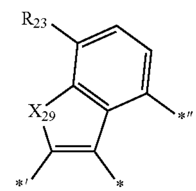
CY2-13
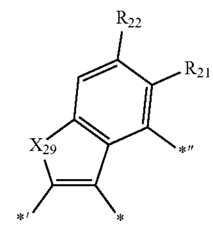
CY2-14
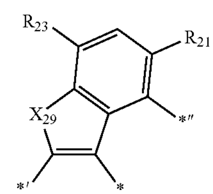
CY2-15
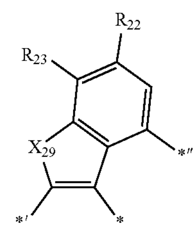
CY2-16
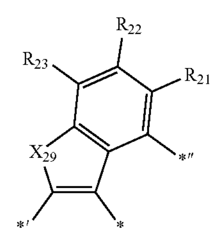
ZCY2-1
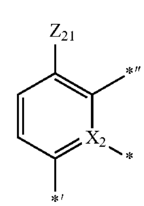

-continued
ZCY2-2
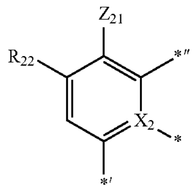
ZCY2-3
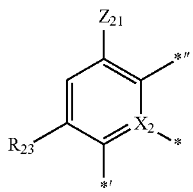
ZCY2-4
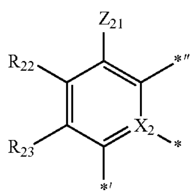
ZCY2-5
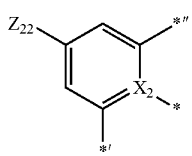
ZCY2-6
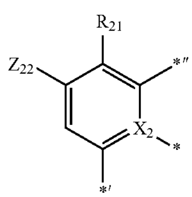
ZCY2-7
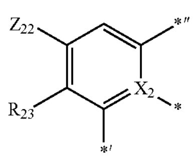
ZCY2-8
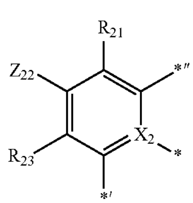
ZCY2-9
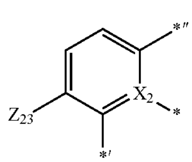
-continued
ZCY2-10
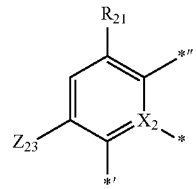
ZCY2-11
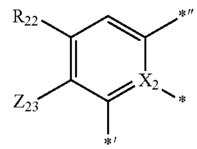
ZCY2-12
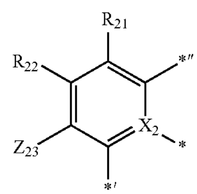
ZCY2-13
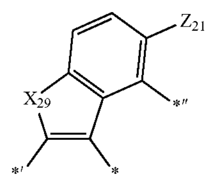
ZCY2-14
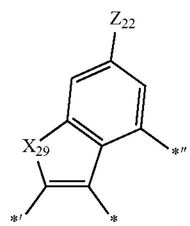
ZCY2-15
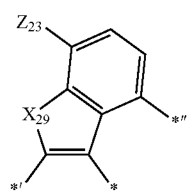
ZCY2-16
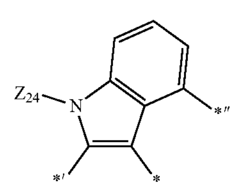
ZCY2-17
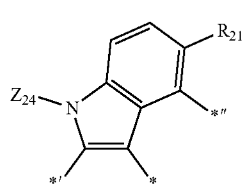

-continued

ZCY2-18

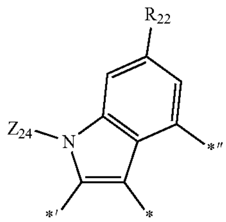

ZCY2-19

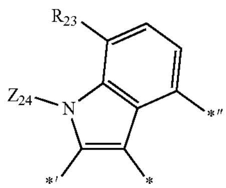

In Formulae CY2-1 to CY2-16 and ZCY2-1 to ZCY2-19, $X_2$ may be the same as described in the present specification, $X_{29}$ may be O, S, N-[$(L_2)_{b2}$-$(R_2)_{c2}$], $C(R_{29a})(R_{29b})$, or $Si(R_{29a})(R_{29b})$, $L_2$, b2, $R_2$, and c2 may each be the same as described in the present specification, $Z_{21}$ to $Z_{24}$ may each be the same as described in connection with $Z_2$ in the present specification, $R_{21}$ to $R_{23}$, $R_{29a}$, and $R_{29b}$ may each be the same as described in connection with $R_2$ in the present specification, wherein each of $R_{21}$ to $R_{23}$ may not be hydrogen,

*' indicates a binding site to $T_1$ in Formula 1,

* indicates a binding site to M in Formula 1, and

*" indicates a binding site to $T_2$ in Formula 1.

In one or more embodiments, in Formula 1, each of n2 and n3 may be 1, and a group represented by

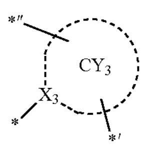

may be a group represented by one of Formulae CY3(1) to CY3(15):

CY3(1)

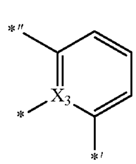

CY3(2)

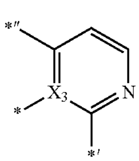

-continued

CY3(3)

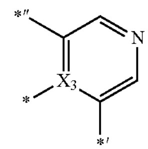

CY3(4)

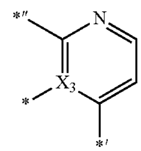

CY3(5)

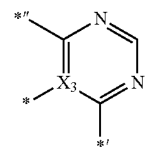

CY3(6)

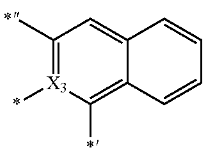

CY3(7)

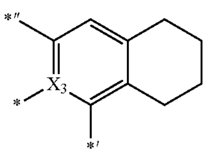

CY3(8)

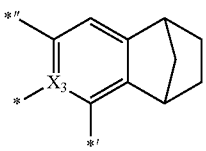

CY3(9)

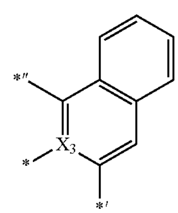

CY3(10)

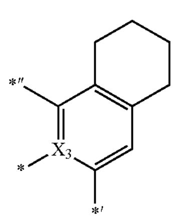

CY3(11)

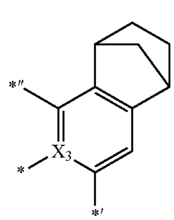

-continued

CY3(12)

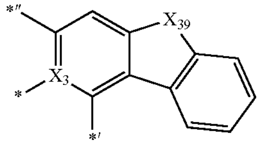

CY3(13)

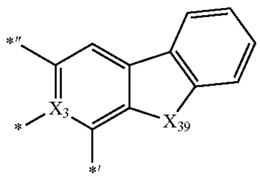

CY3(14)

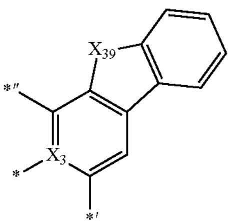

CY3(15)

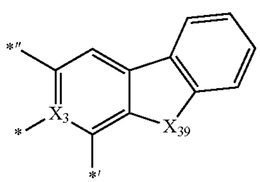

In Formulae CY3(1) to CY3(15), $X_3$ may be the same as described in the present specification, $X_{39}$ may be O, S, $N(Z_{39a})$, $C(R_{39a})(R_{39b})$, or $Si(R_{39a})(R_{39b})$, $R_{39a}$ and $R_{39b}$ may each be the same as described in connection with $R_3$ in the present specification,

*" indicates a binding site to $T_2$ in Formula 1,

* indicates a binding site to M in Formula 1, and

*' indicates a binding site to $T_3$ in Formula 1.

In one or more embodiments, in Formula 1, each of n2 and n3 may be 1, and a group represented by

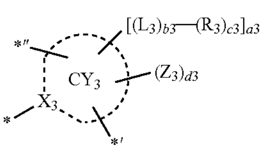

may be a group represented by one of Formulae CY3-1 to CY3-13 and ZCY3-1 to ZCY3-12-:

CY3-1

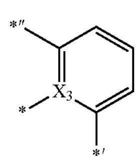

-continued

CY3-2

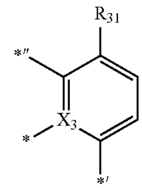

CY3-3

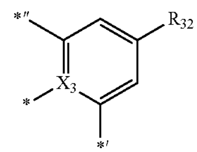

CY3-4

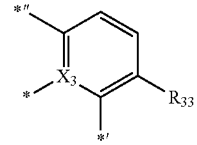

CY3-5

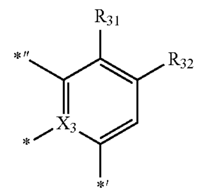

CY3-6

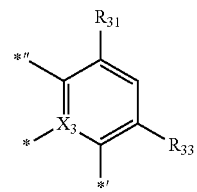

CY3-7

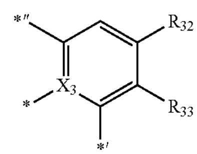

CY3-8

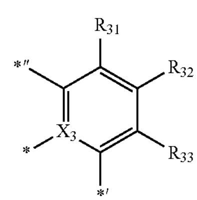

CY3-8

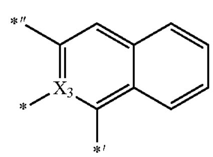

CY3-9

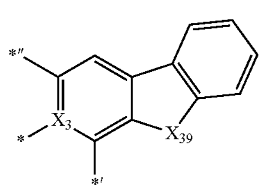

-continued
CY3-10
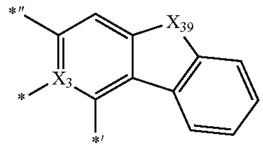
CY3-11
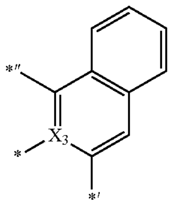
CY3-12
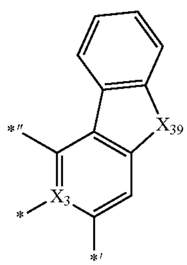
CY3-13
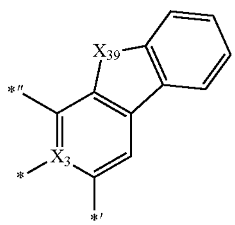
ZCY3-1
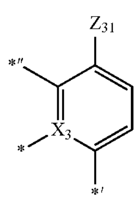
ZCY3-2
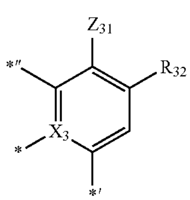
ZCY3-3
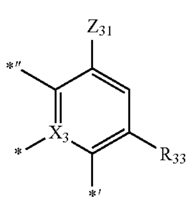
-continued
ZCY3-4
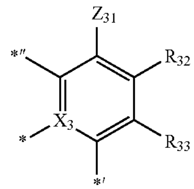
ZCY3-5
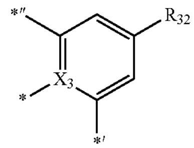
ZCY3-6
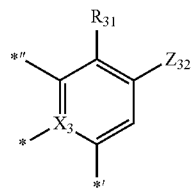
ZCY3-7
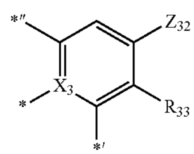
ZCY3-8
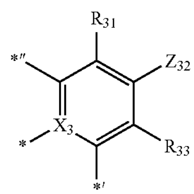
ZCY3-9
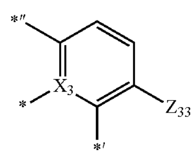
ZCY3-10
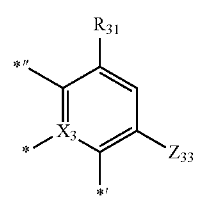
ZCY3-11
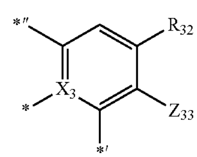
ZCY3-12
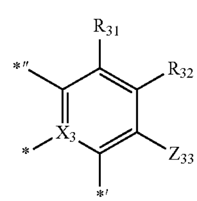

In Formulae CY3-1 to CY3-13 and ZCY3-1 to ZCY3-12, $X_3$ may be the same as described in the present specification, $X_{39}$ may be O, S, N-$[(L_3)_{b3}$-$(R_3)_{c3}]$, $C(R_{39a})(R_{39b})$, or $Si(R_{39a})(R_{39b})$, $L_3$, b3, $R_3$, and c3 may each be the same as described in the present specification, $R_{31}$ to $R_{33}$, $R_{39a}$, and $R_{39b}$ may each be the same as described in connection with $R_3$ in the present specification, wherein each of $R_{31}$ to $R_{33}$ may not be hydrogen, $Z_{31}$ to $Z_{33}$ may each be the same as described in connection with $Z_3$ in the present specification,

*" indicates a binding site to $T_2$ in Formula 1,

* indicates a binding site to M in Formula 1, and

*' indicates a binding site to $T_3$ in Formula 1.

In one or more embodiments, in Formula 1, n3 may be 1, n4 may be 0, and a group represented by

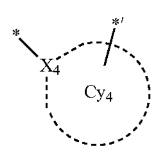

may be a group represented by one of Formulae CY4(1) to CY4(20):

CY4(1)

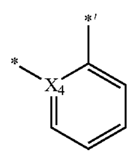

CY4(2)

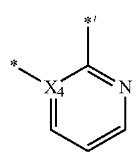

CY4(3)

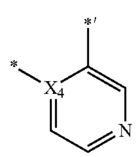

CY4(4)

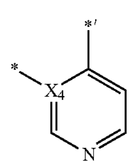

CY4(5)

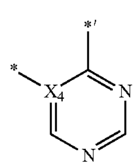

-continued

CY4(6)

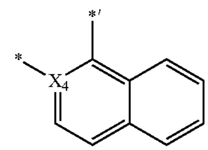

CY4(7)

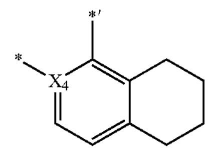

CY4(8)

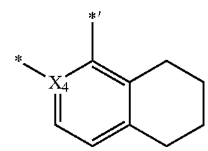

CY4(9)

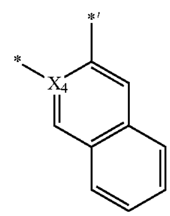

CY4(10)

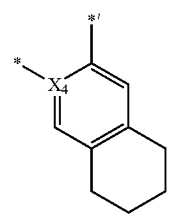

CY4(11)

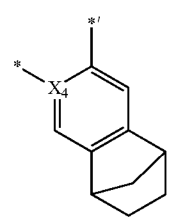

CY4(12)

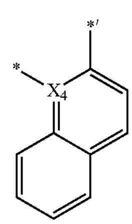

CY4(13)

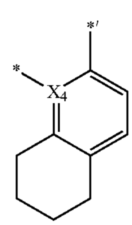

-continued

CY4(14)

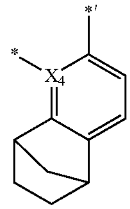

CY4(15)

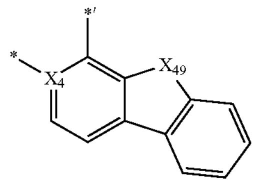

CY4(16)

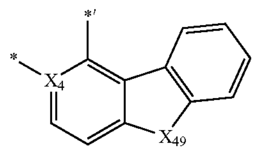

CY4(17)

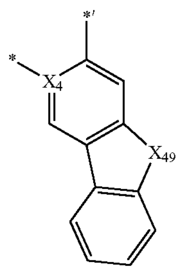

CY4(18)

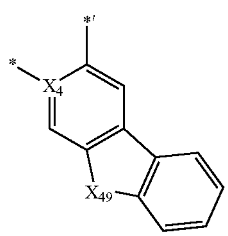

CY4(19)

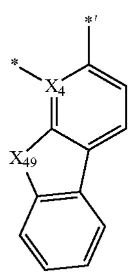

CY4(20)

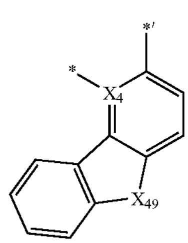

In Formulae CY4(1) to CY4(20), $X_4$ may be the same as described in the present specification, $X_{49}$ may be O, S, $N(R_{49a})$, $C(R_{49a})(R_{49b})$, or $Si(R_{49a})(R_{49b})$, $R_{49a}$ and $R_{49b}$ may each be the same as described in connection with $R_4$ in the present specification,

*' indicates a binding site to $T_3$ in Formula 1, and

* indicates a binding site to M in Formula 1.

In one or more embodiments, in Formula 1, n3 may be 1, n4 may be 0, and a group represented by

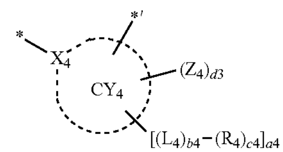

may be a group represented by one of Formulae CY4-1 to CY4-16 and ZCY4-1 to ZCY4-32:

CY4-1

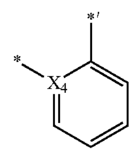

CY4-2

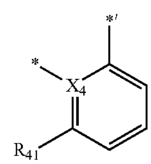

CY4-3

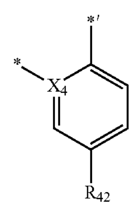

CY4-4

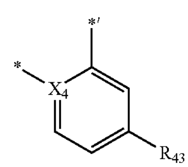

CY4-5

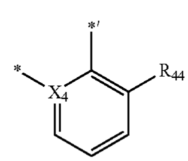

CY4-6

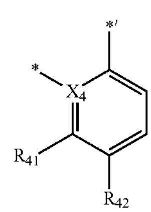

-continued
CY4-7
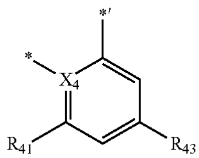
CY4-8
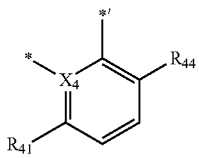
CY4-9
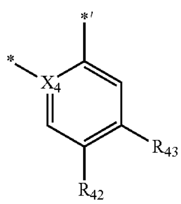
CY4-10
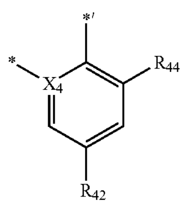
CY4-11
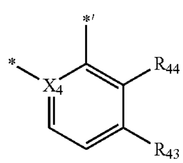
CY4-12
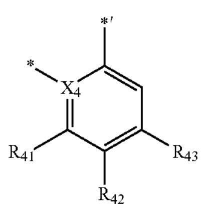
CY4-13
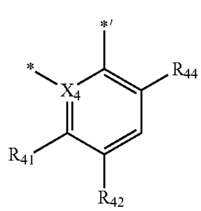
CY4-14
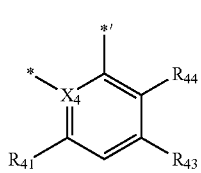
-continued
CY4-15
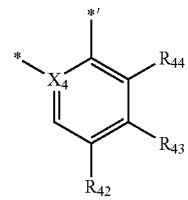
CY4-16
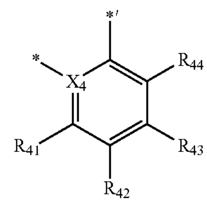
ZCY4-1
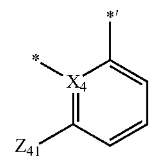
ZCY4-2
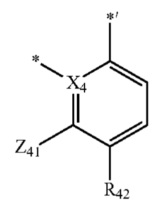
ZCY4-3
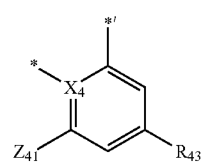
ZCY4-4
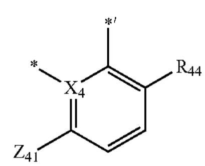
CZY4-5
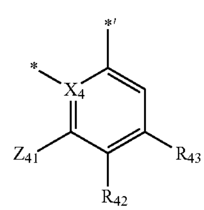
ZCY4-6
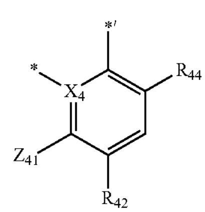

-continued
ZCY4-7
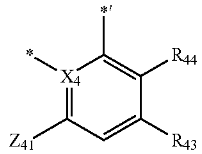
ZCY4-8
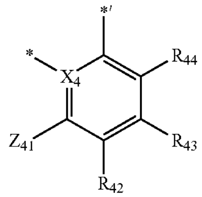
ZCY4-9
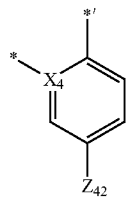
ZCY4-10
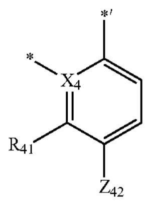
ZCY4-11
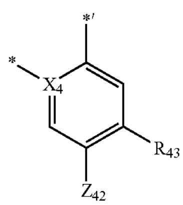
ZCY4-12
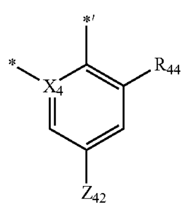
ZCY4-13
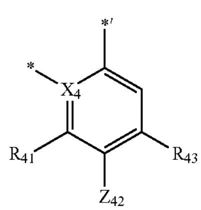
ZCY4-14
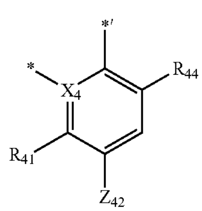
-continued
ZCY4-15
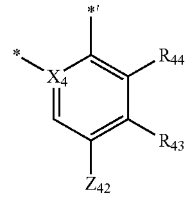
ZCY4-16
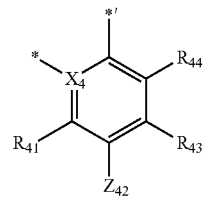
ZCY4-17
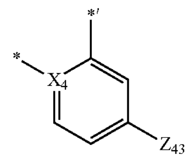
ZCY4-18
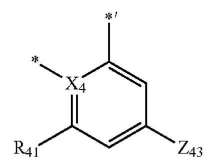
ZCY4-19
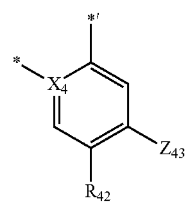
ZCY4-20
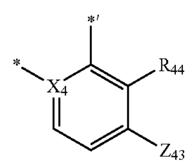
ZCY4-21
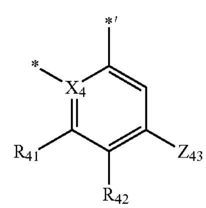
ZCY4-22
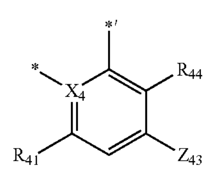

-continued

ZCY4-23

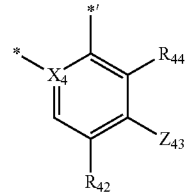

ZCY4-24

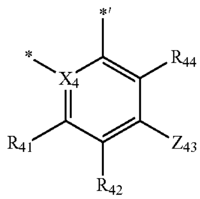

ZCY4-25

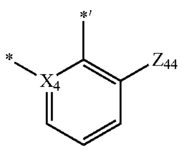

ZCY4-26

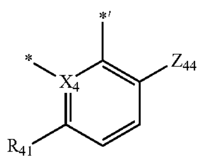

ZCY4-27

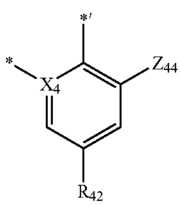

ZCY4-28

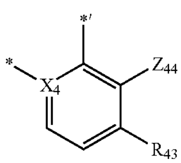

ZCY4-29

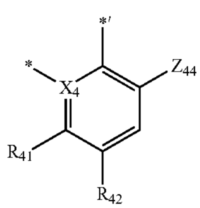

ZCY4-30

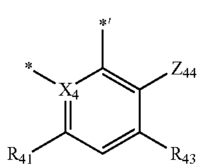

-continued

ZCY4-31

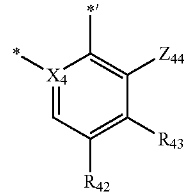

ZCY4-32

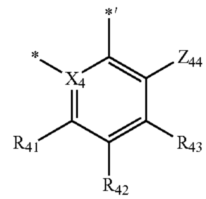

In Formulae CY4-1 to CY4-16 and ZC4-1 to ZCY4-32, $X_4$ may be the same as described in the present specification, $R_{41}$ to $R_{44}$ may each be the same as described in connection with $R_4$ in the present specification, wherein each of $R_{41}$ to $R_{44}$ may not be hydrogen, $Z_{41}$ to $Z_{44}$ may each be the same as described in connection with $Z_4$ in the present specification,

*' indicates a binding site to $T_3$ in Formula 1, and

* indicates a binding site to M in Formula 1.

In one or more embodiments, the organometallic compound may be represented by one of Formulae 1-1 to 1-4:

1-1

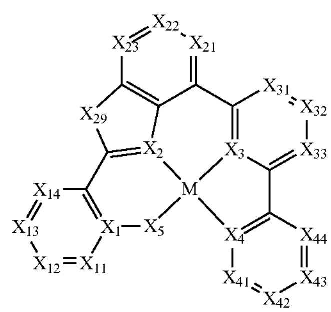

1-2

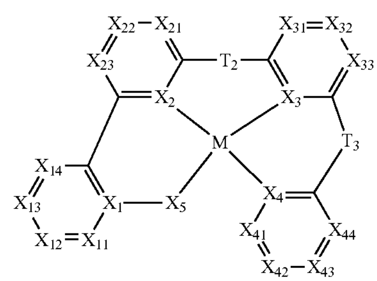

-continued 1-3

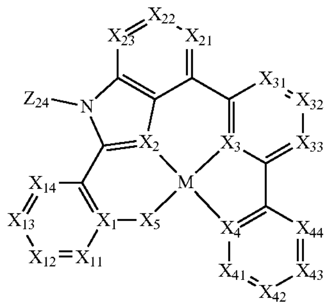

1-4

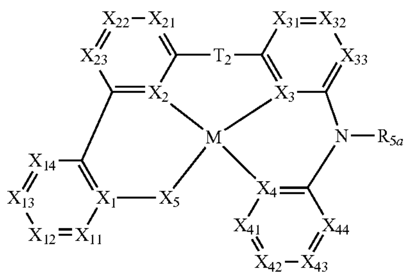

In Formulae 1-1 to 1-4,

M, $X_1$ to $X_5$, $T_2$, and $T_3$ may each be the same as described in the present specification, $X_{11}$ may be N, $C(R_{11})$, or $C(Z_{11})$, $X_{12}$ may be N, $C(R_{12})$, or $C(Z_{12})$, $X_{13}$ may be N, $C(R_{13})$, or $C(Z_{13})$, and $X_{14}$ may be N, $C(R_{14})$, or $C(Z_{14})$, $R_{11}$ to $R_{14}$ may each be the same as described in connection with $R_1$ in the present specification, $Z_{11}$ to $Z_{14}$ may each be the same as described in connection with $Z_1$ in the present specification, two or more of $R_{11}$ to $R_{14}$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{21}$ may be N, $C(R_{21})$, or $C(Z_{21})$, $X_{22}$ may be N, $C(R_{22})$, or $C(Z_{22})$, and $X_{23}$ may be N, $C(R_{23})$, or $C(Z_{23})$, $X_{29}$ may be O, S, N-$[(L_2)_{b2}$-$(R_2)_{c2}]$, $C(R_{29a})(R_{29b})$, or $Si(R_{29a})(R_{29b})$, $L_2$, b2, $R_2$, and c2 may each be the same as described in the present specification, $R_{21}$ to $R_{23}$, $R_{29a}$, and $R_{29b}$ may each be the same as described in connection with $R_2$ in the present specification, $Z_{21}$ to $Z_{24}$ may each be the same as described in connection with $Z_2$ in the present specification, two or more of $R_{21}$ to $R_{23}$ may optionally be bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $X_{31}$ may be N, $C(R_{31})$, or $C(Z_{31})$, $X_{32}$ may be N, $C(R_{32})$, or $C(Z_{32})$, and $X_{33}$ may be N, $C(R_{33})$, or $C(Z_{33})$, $R_{31}$ to $R_{33}$ may each be the same as described in connection with $R_3$ in the present specification, $Z_{31}$ to $Z_{33}$ may each be the same as described in connection with $Z_3$ in the present specification, two or more of $R_{31}$ to $R_{33}$ may optionally be bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $X_{41}$ may be N, $C(R_{41})$, or $C(Z_{41})$, $X_{42}$ may be N, $C(R_{42})$, or $C(Z_{42})$, $X_{43}$ may be N, $C(R_{43})$, or $C(Z_{43})$, $X_{44}$ may be N, $C(R_{44})$, or $C(Z_{44})$, $R_{41}$ to $R_{44}$ may each be the same as described in connection with $R_4$ in the present specification, $Z_{41}$ to $Z_{44}$ may each be the same as described in connection with $Z_4$ in the present specification, two or more of $R_{41}$ to $R_{44}$ may optionally be bonded together to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, Formulae 1-1 and 1-2 may each include one of $Z_{11}$ to $Z_{14}$, one of $Z_{21}$ to $Z_{23}$, one of $Z_{31}$ to $Z_{33}$, one of $Z_{41}$ to $Z_{44}$, or a combination thereof, and $R_{5a}$ in Formula 1-4 may be a group represented by Formula 51.

In one or more embodiments, i) the organometallic compound may be represented by Formula 1-1 or 1-2, and Formulae 1-1 and 1-2 may each satisfy at least one of Condition (1') to Condition (3');

ii) the organometallic compound may be represented by Formula 1-3 or 1-4; or iii) the organometallic compound may be represented by Formula 1-3 or 1-4, and Formulae 1-3 and 1-4 may each satisfy at least one of Condition (1') to Condition (3'):

Condition (1')

$X_{22}$ is $C(Z_{22})$

Condition (2')

$X_{32}$ is $C(Z_{32})$

Condition (3')

$X_{43}$ is $C(Z_{43})$.

In one or more embodiments, $Z_1$ to $Z_4$, $Z_{11}$ to $Z_{14}$, $Z_{21}$ to $Z_{24}$, $Z_{31}$ to $Z_{33}$, and $Z_{41}$ to $Z_{44}$ in the present specification may each independently be a group represented by one of Formulae 51-1 to 51-25.

In one or more embodiments, $Z_1$ to $Z_4$, $Z_{11}$ to $Z_{14}$, $Z_{21}$ to $Z_{24}$, $Z_{31}$ to $Z_{33}$, and $Z_{41}$ to $Z_{44}$ in the present specification may each independently be a group represented by one of Formulae 51(1) to 51(19).

In one or more embodiments, the organometallic compound represented by Formula 1 may satisfy at least one of Condition A to Condition E:

Condition A n1 in Formula 1 is 1, n4 in Formula 1 is 0, and a group represented by

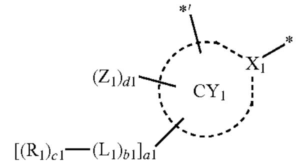

in Formula 1 is a group represented by one of Formulae ZCY1-1 to ZCY1-32

Condition B each of n1 and n2 in Formula 1 is 1, and a group represented by

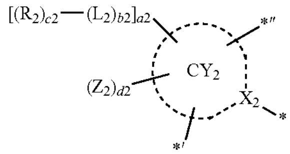

in Formula 1 is a group represented by one of Formulae ZCY2-1 to ZCY2-19.

Condition C each of n2 and n3 in Formula 1 is 1, and a group represented by

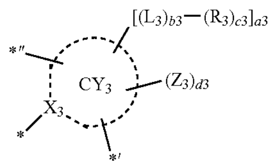

in Formula 1 is a group represented by one of Formulae ZCY3-1 to ZCY3-12

Condition D n3 in Formula 1 is 1, n4 in Formula 1 is 0, and a group represented by

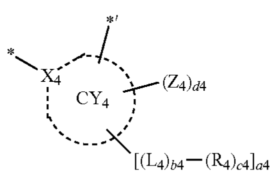

in Formula 1 is a group represented by one of Formulae ZCY4-1 to ZCY4-32

Condition E n3 in Formula 1 is 1, $T_3$ in Formula 1 is *—N($R_{5a}$)—*', and $R_{5a}$ in Formula 1 is a group represented by Formula 51.

In one or more embodiments, the organometallic compound represented by Formula 1 may emit green light.

In one or more embodiments, the organometallic compound represented by Formula 1 may be one of Compounds 1 to 750:

1

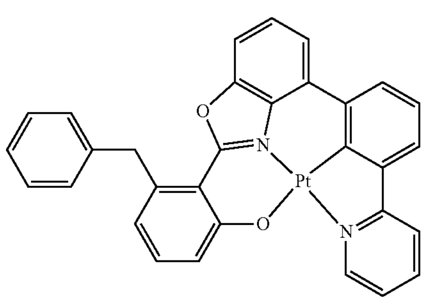

-continued

2

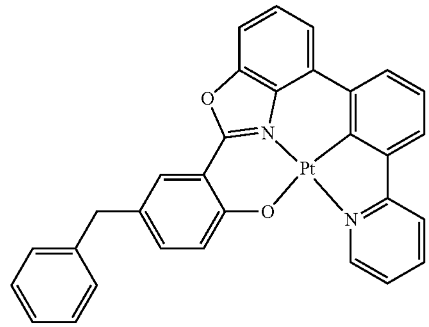

3

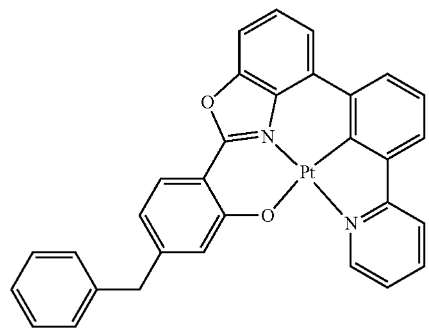

4

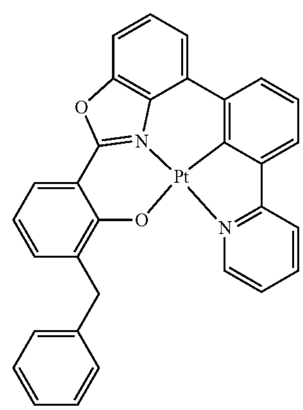

6

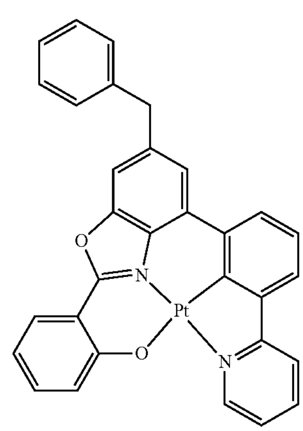

7
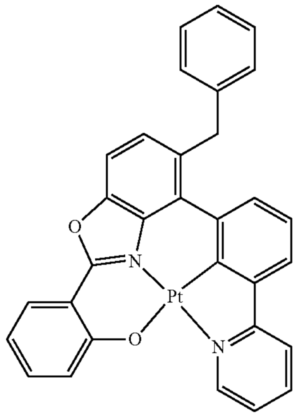
8
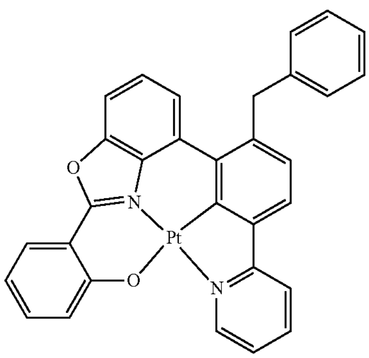
5
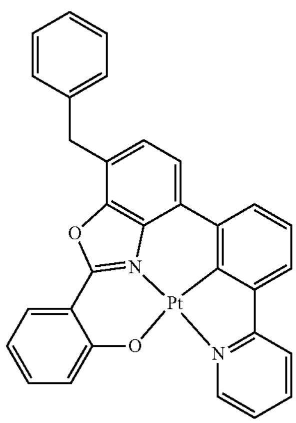
9
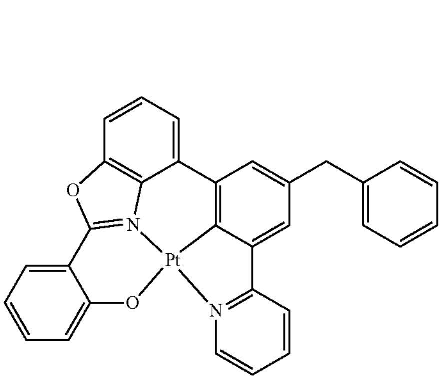
10
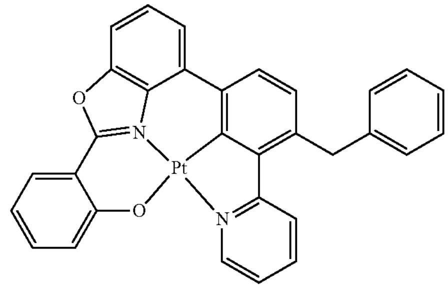
11
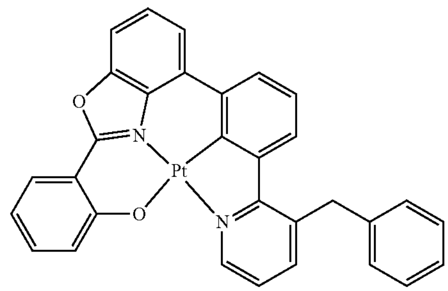
12
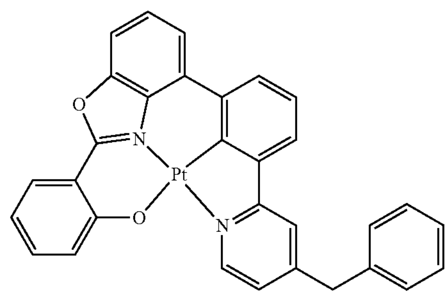
13
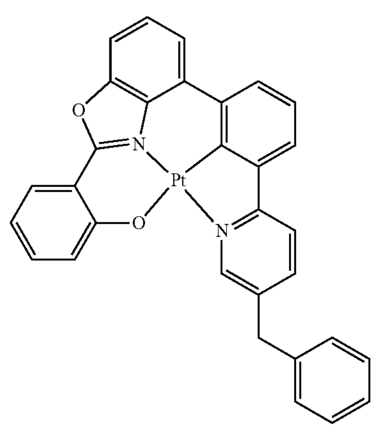

-continued
14
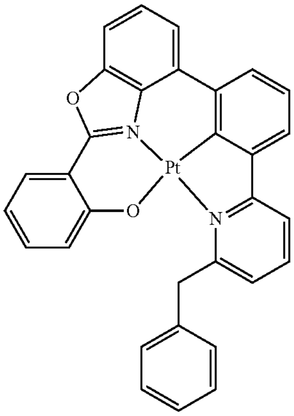
15
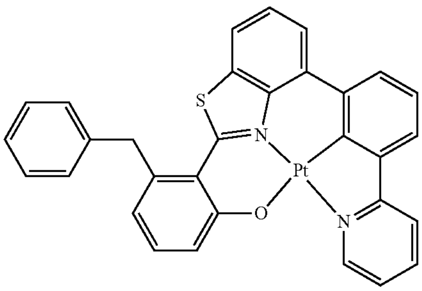
16
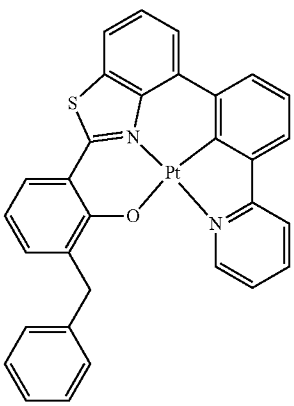
17
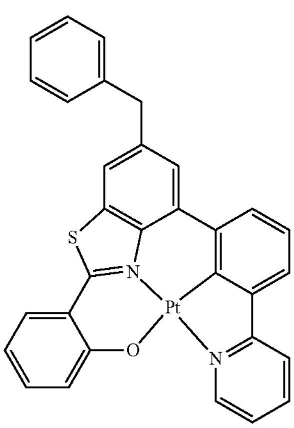
-continued
18
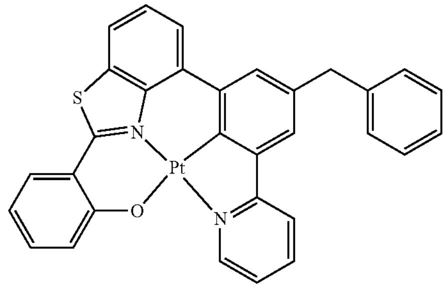
19
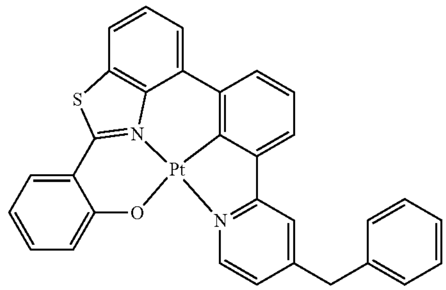
20
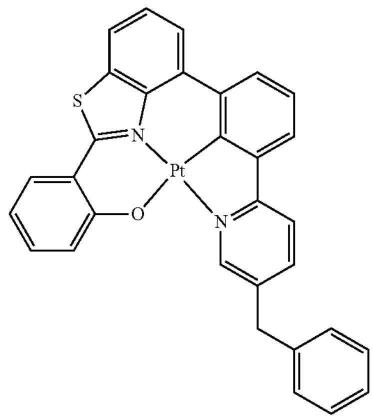
21
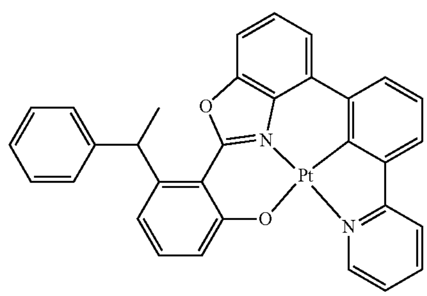
22
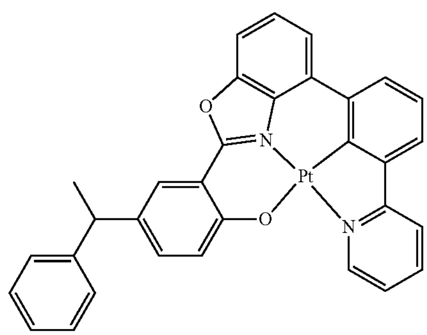

23
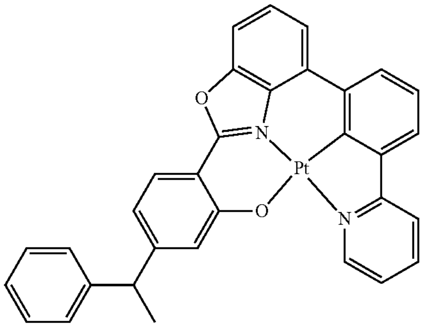
24
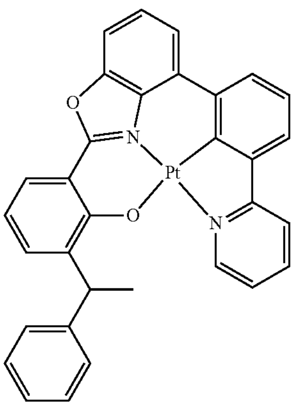
25
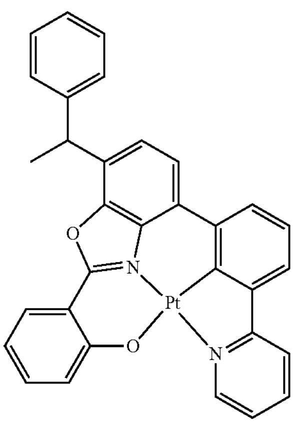
26
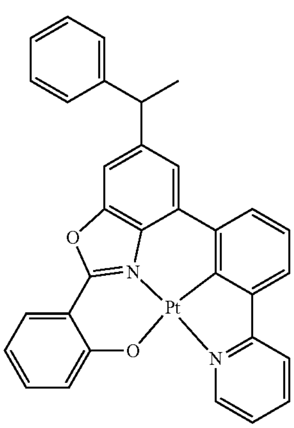
27
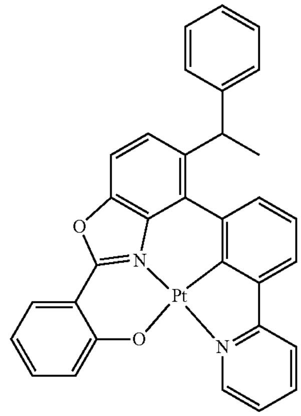
28
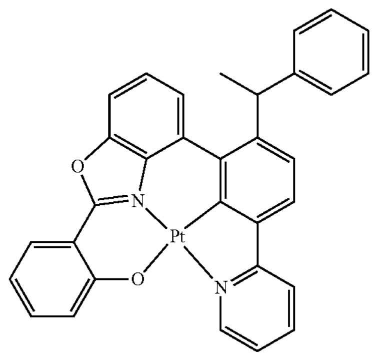
29
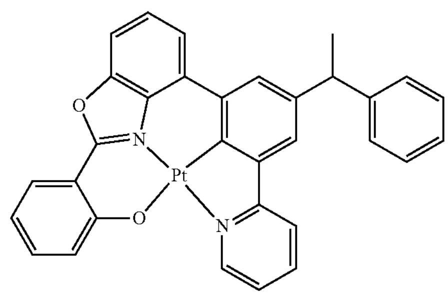
30
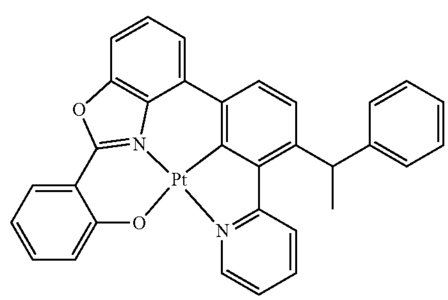
31
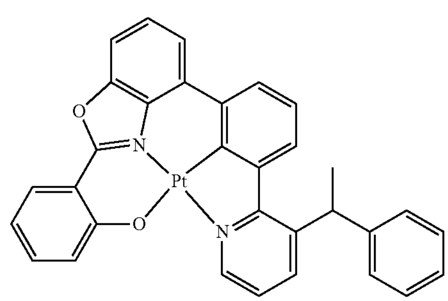

-continued
32
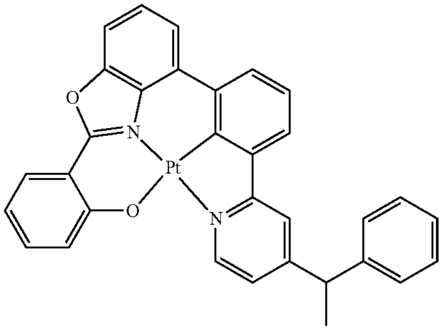
33
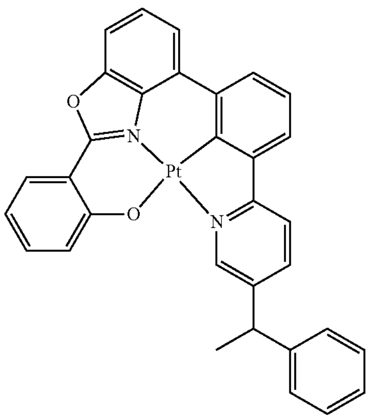
34
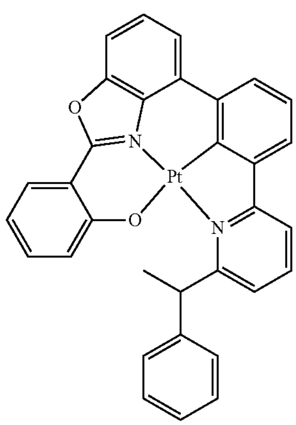
35
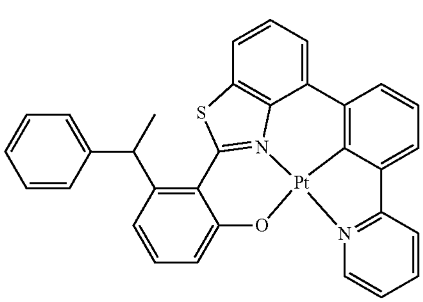
-continued
36
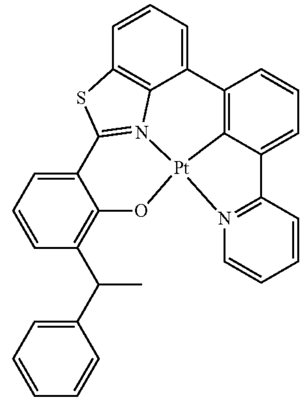
37
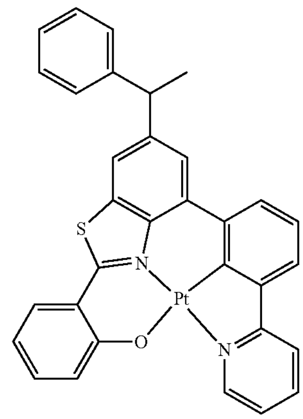
38
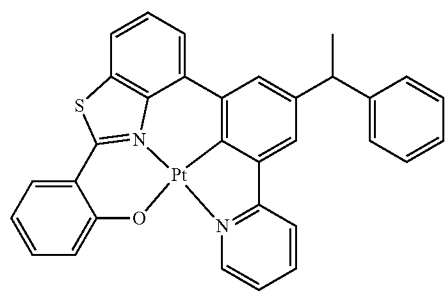
39
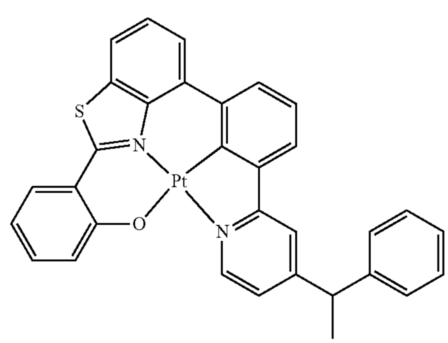

-continued
40
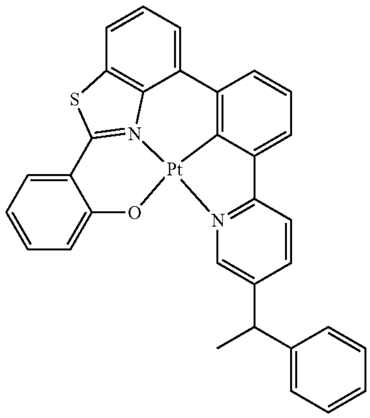
41
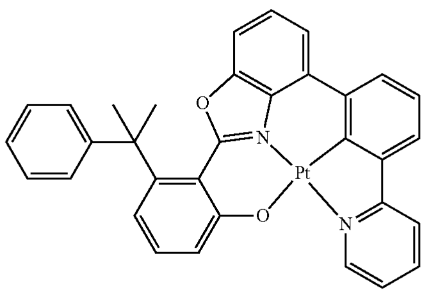
42
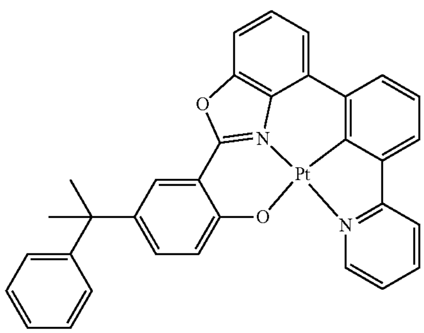
43
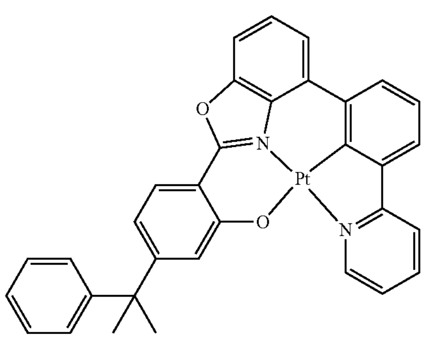
-continued
44
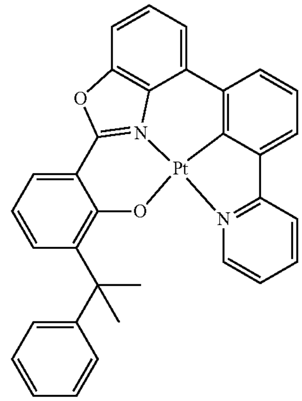
45
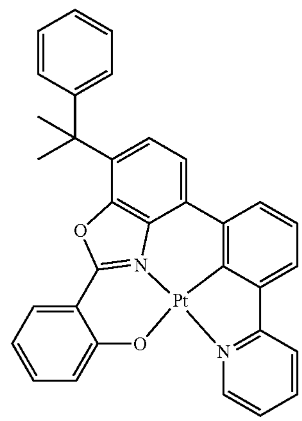
46
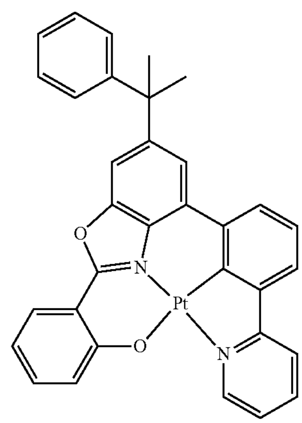
47
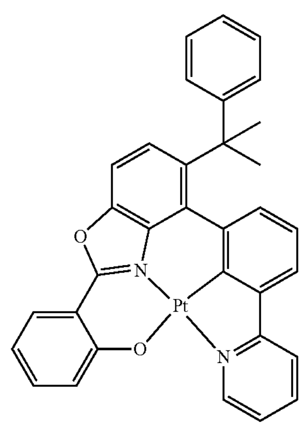

48
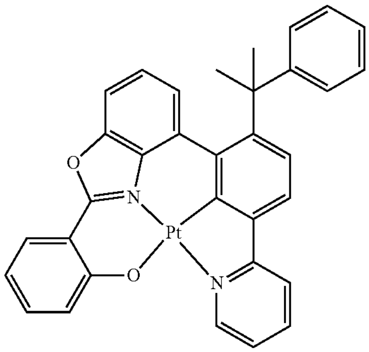
49
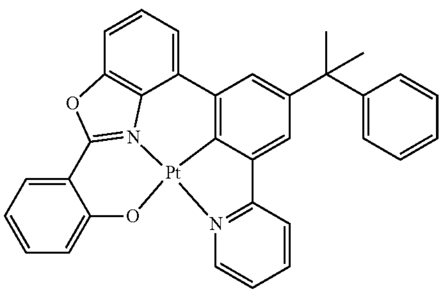
50
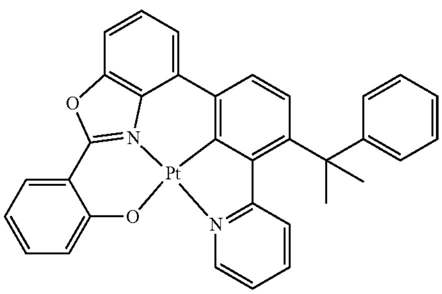
51
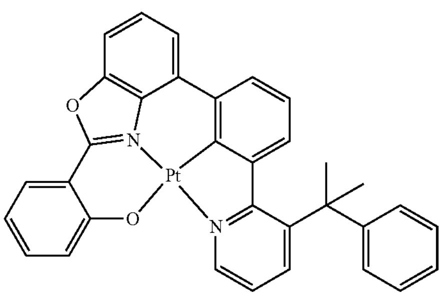
52
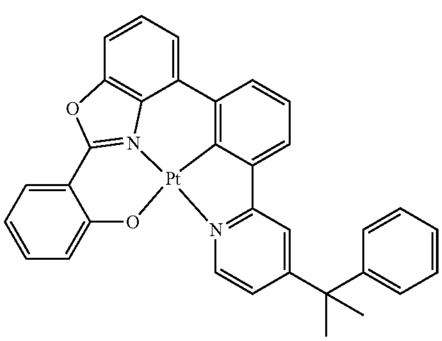
53
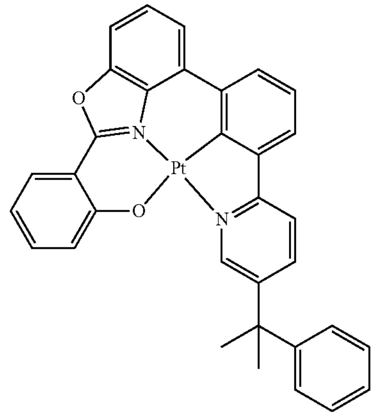
54
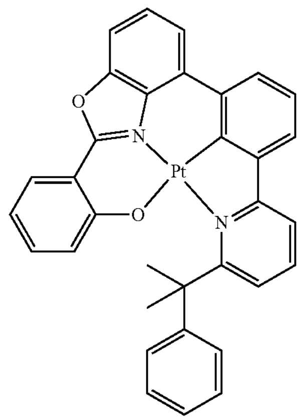
55
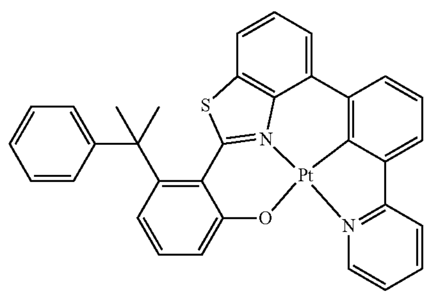
56
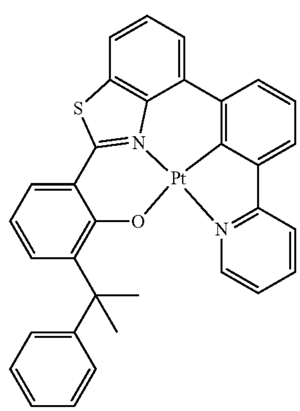

-continued
57
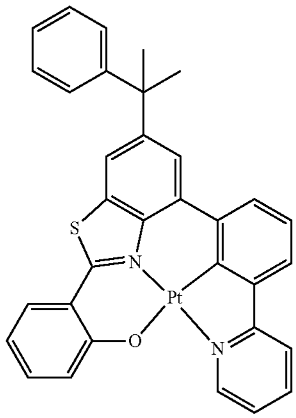
58
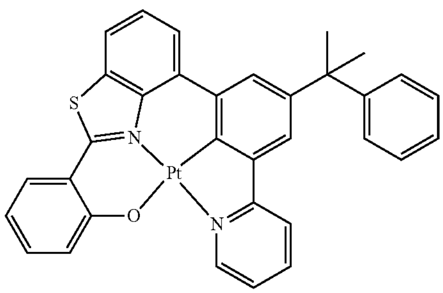
59
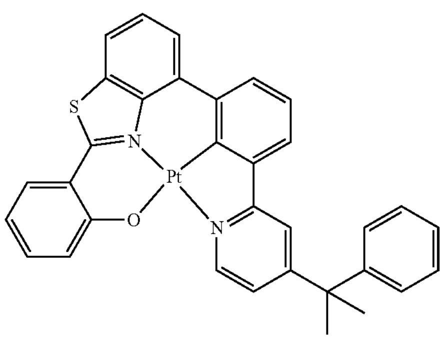
60
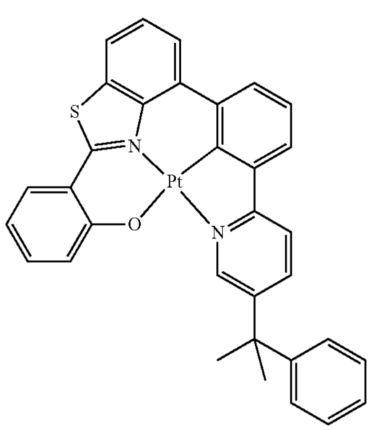
-continued
61
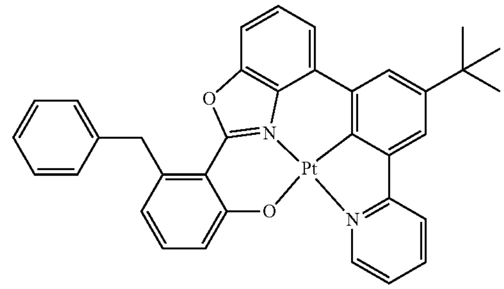
62
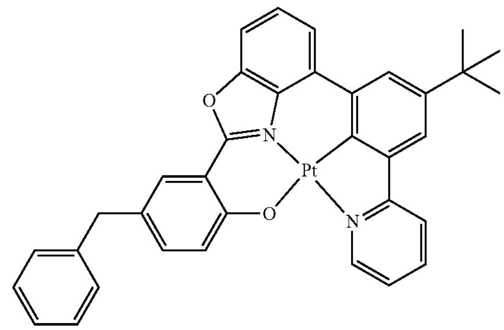
63
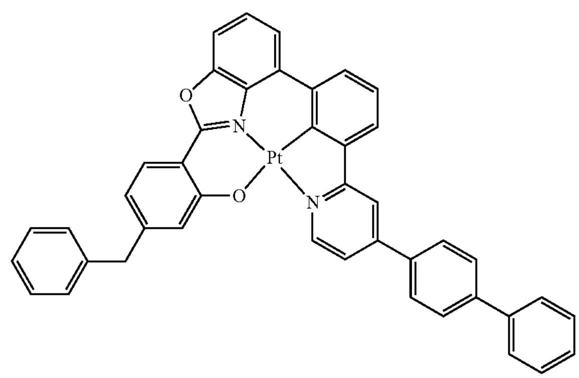
64
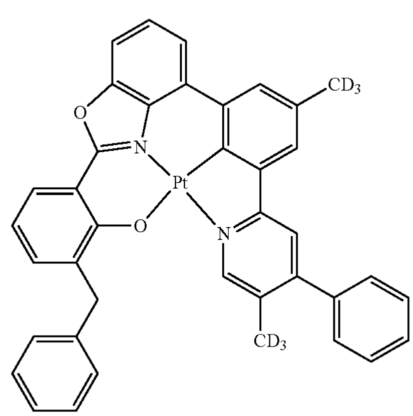

-continued
65
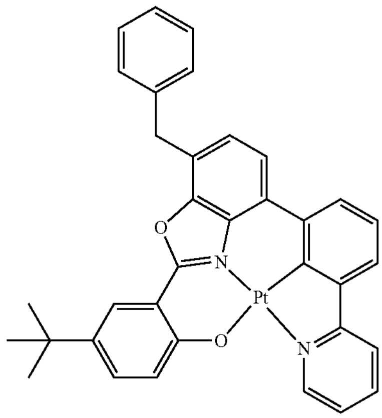
66
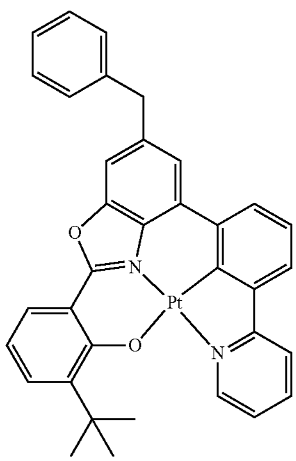
67
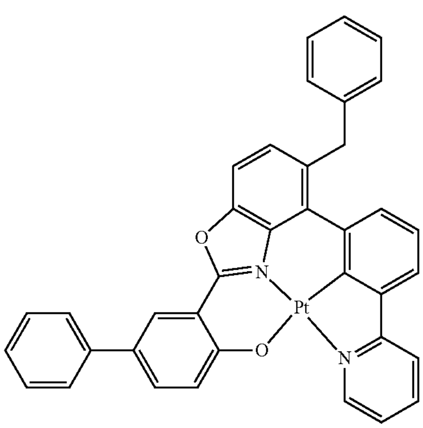
-continued
68
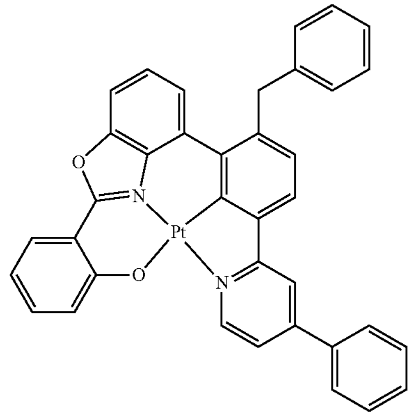
69
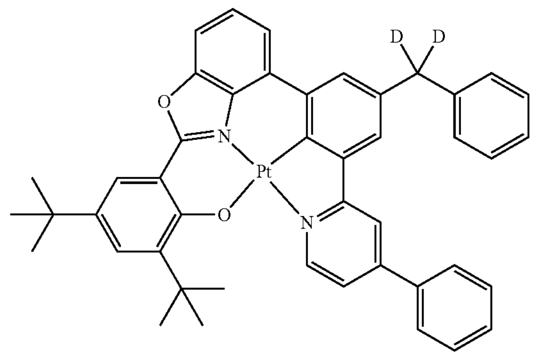
70
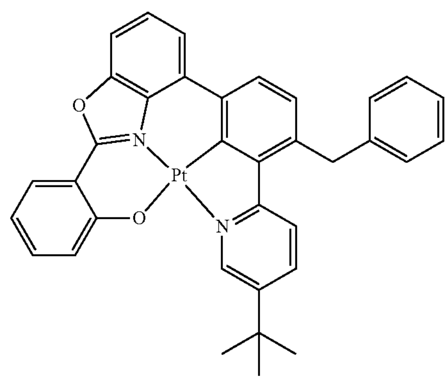
71
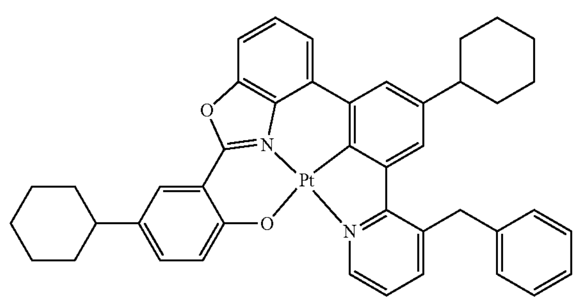

-continued
72
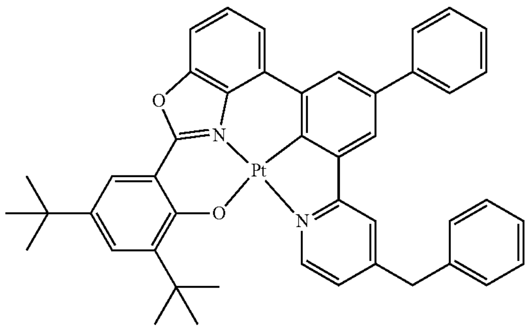
73
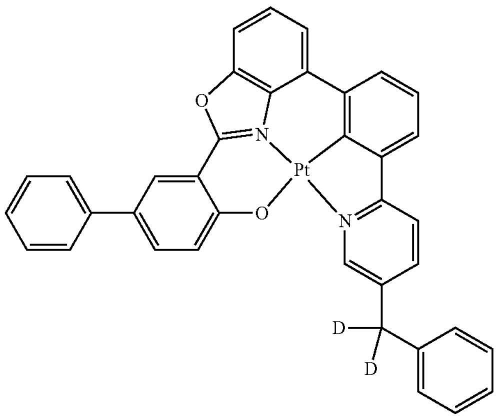
74
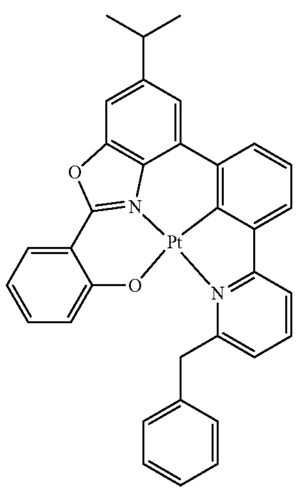
75
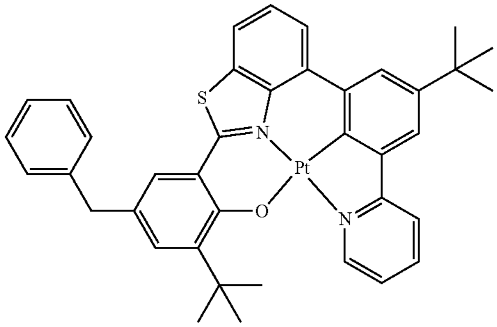
-continued
76
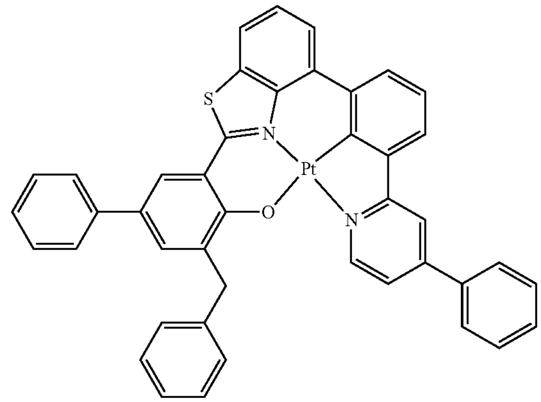
77
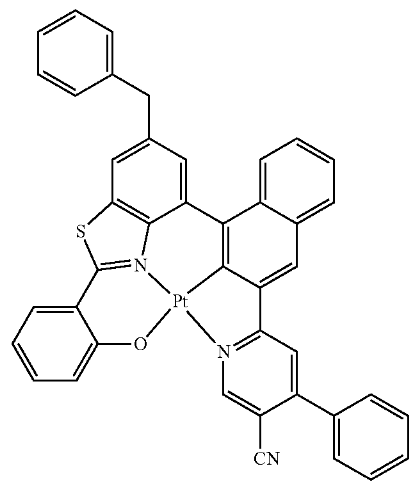
78
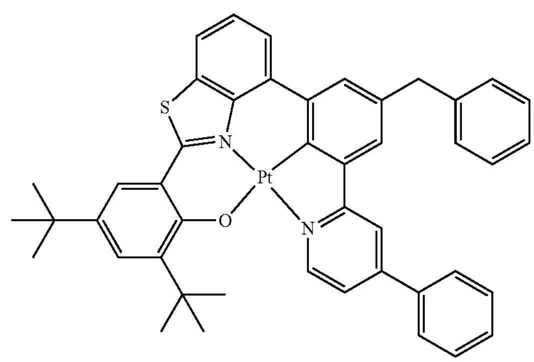
79
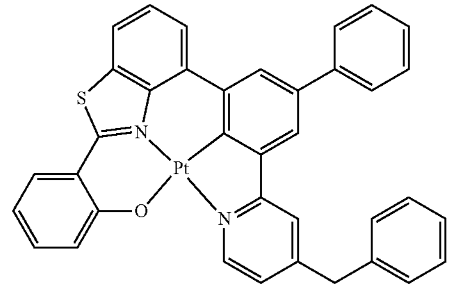

-continued
80
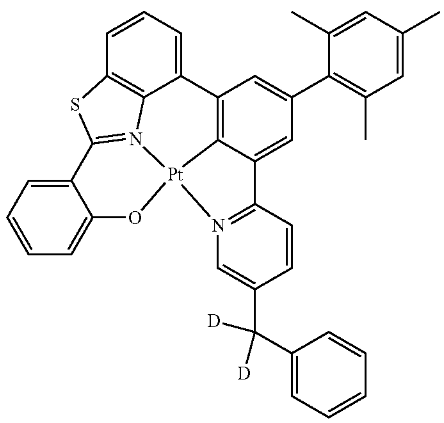
81
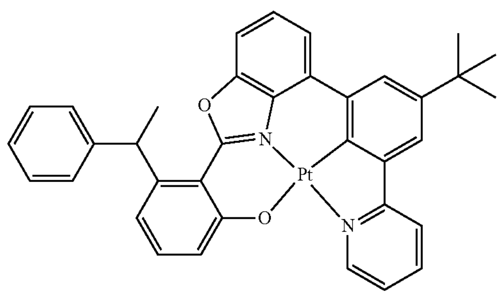
82
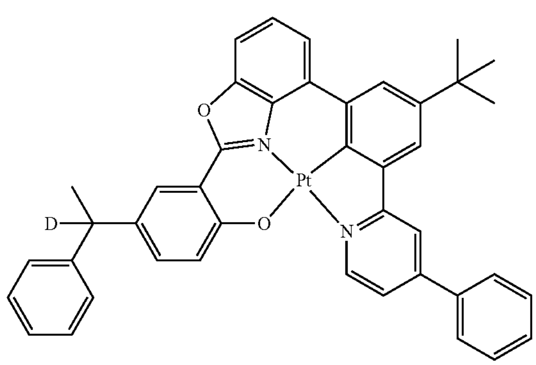
83
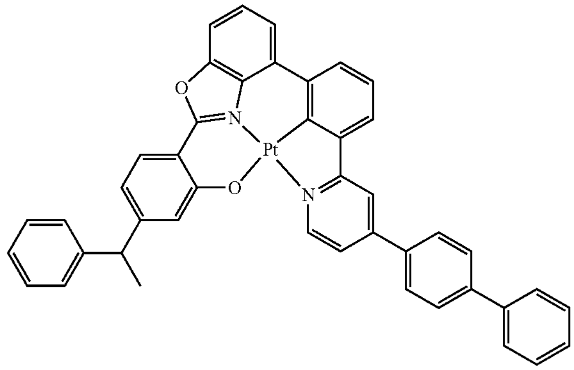
-continued
84
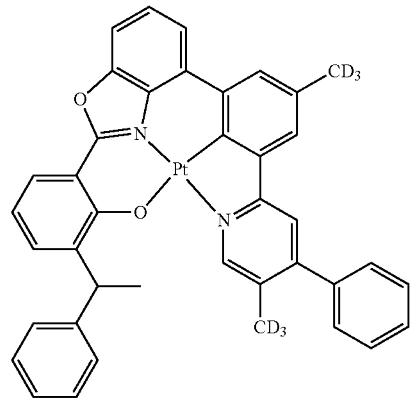
85
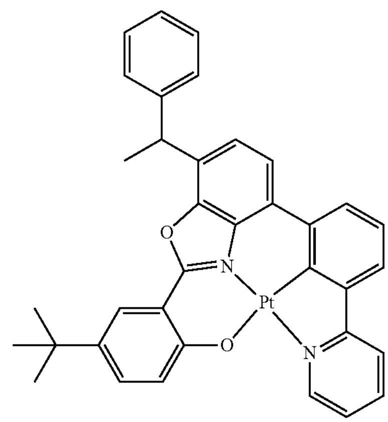
86
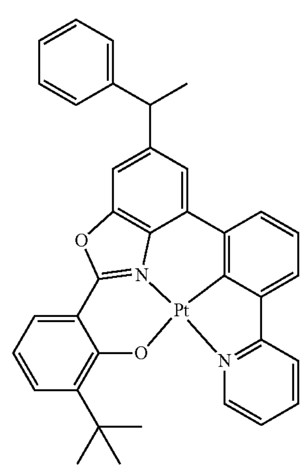

87
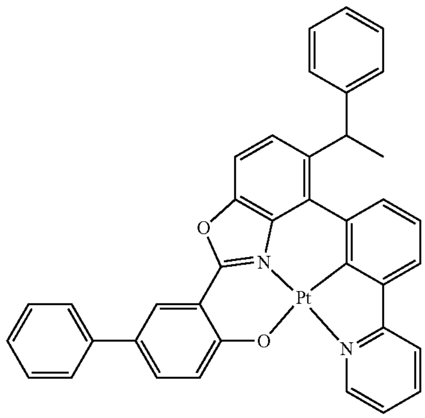
88
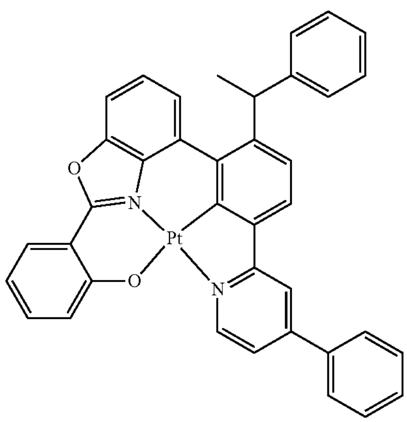
89
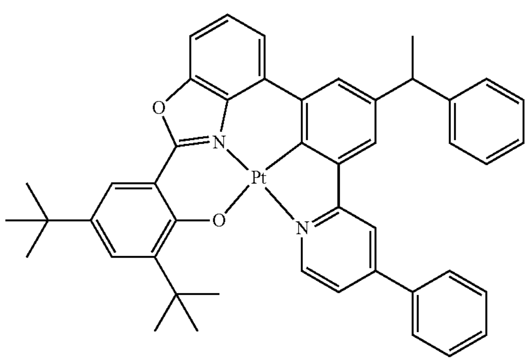
90
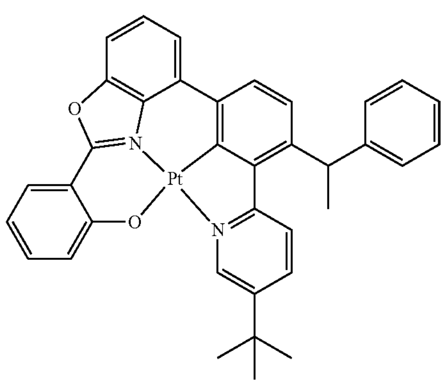
91
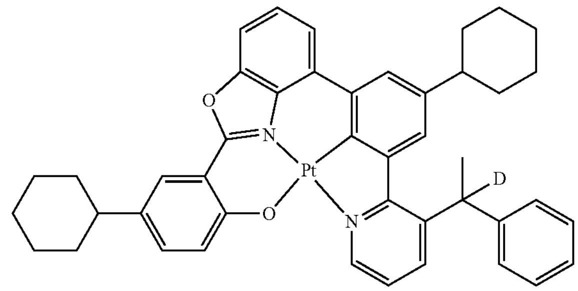
92
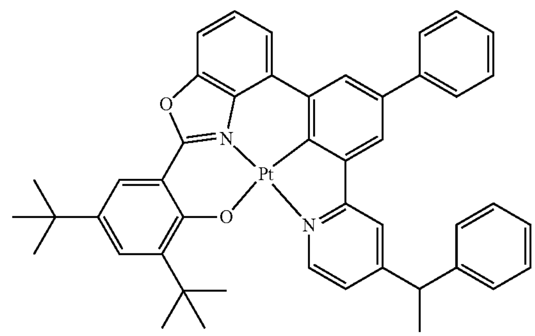
93
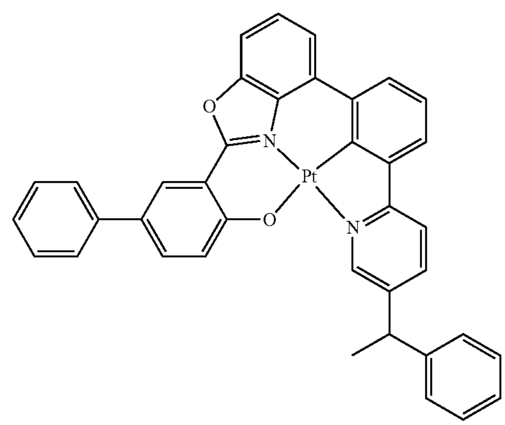
94
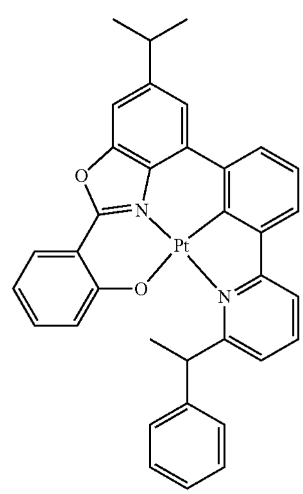

-continued
95
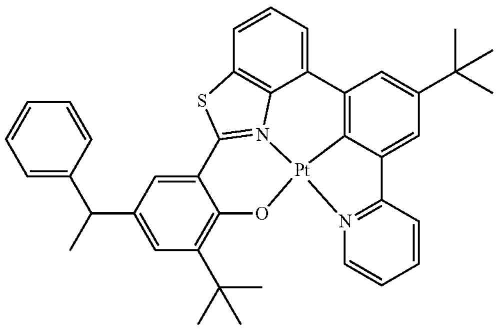
96
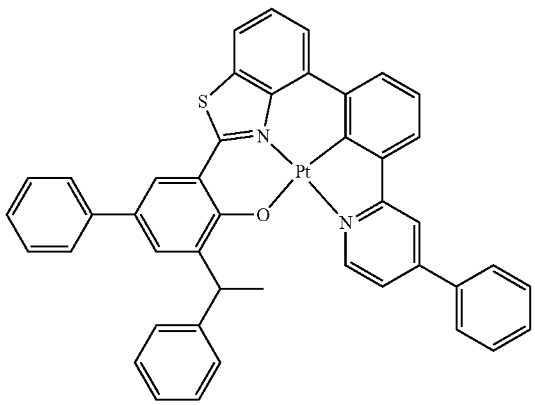
97
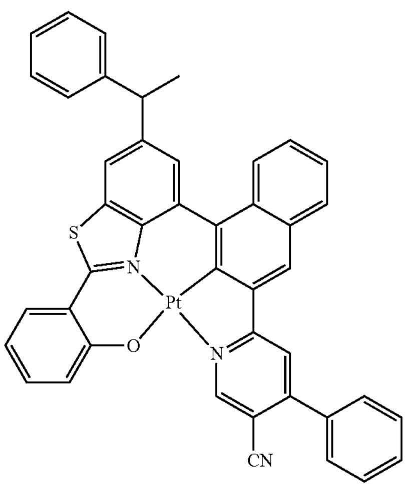
98
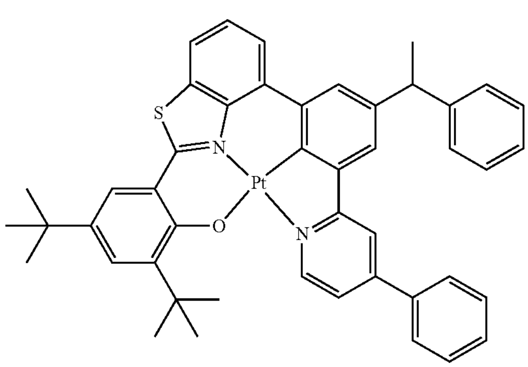
-continued
99
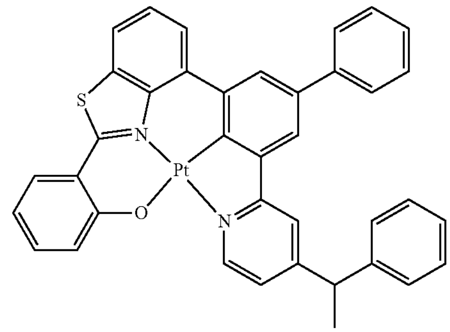
100
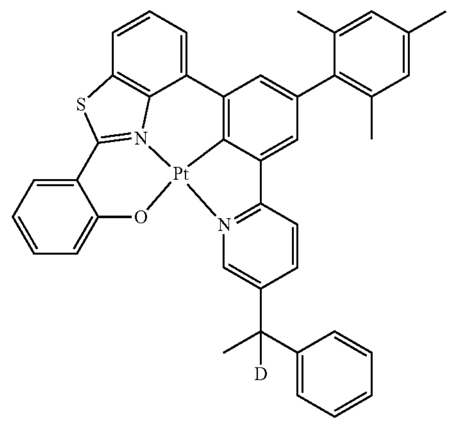
101
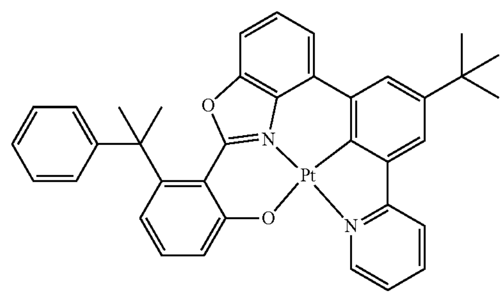
102
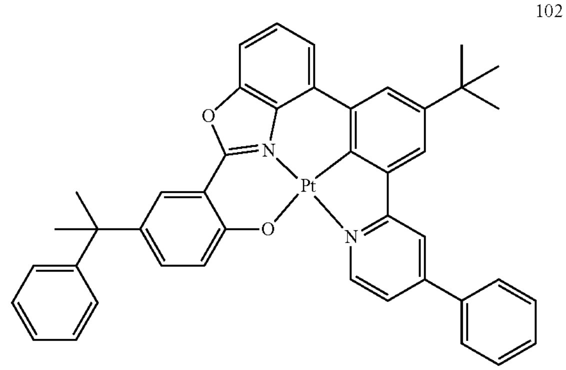

-continued
103
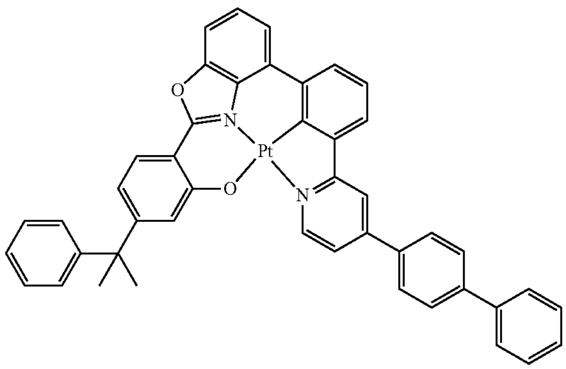
104
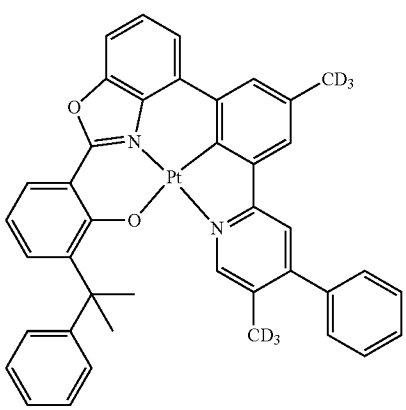
105
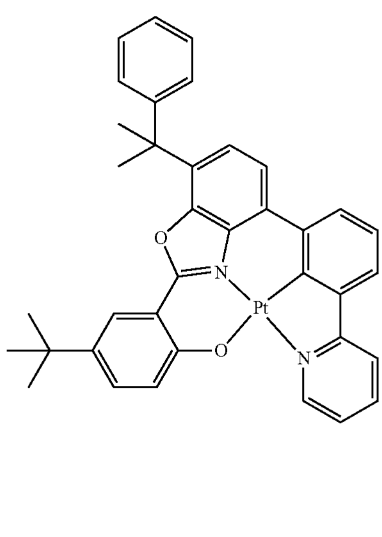
-continued
106
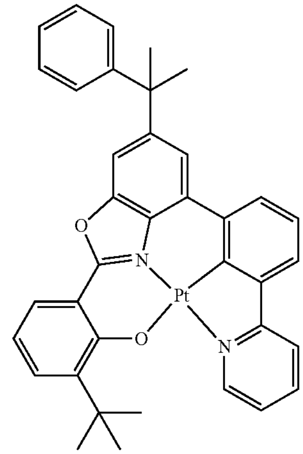
107
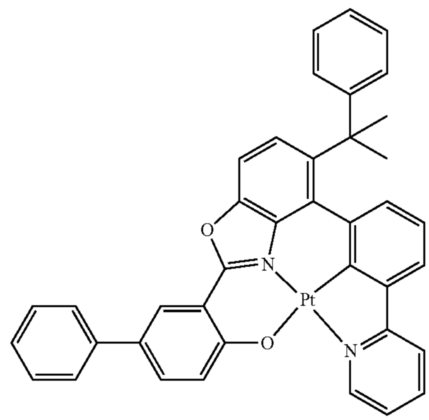
108
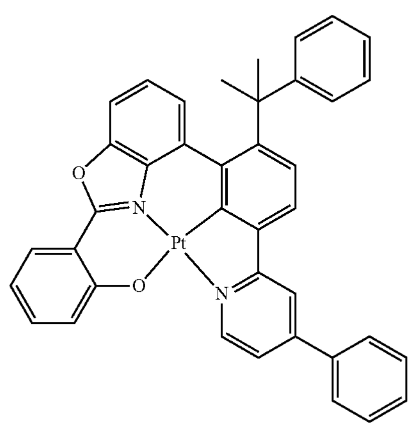
109
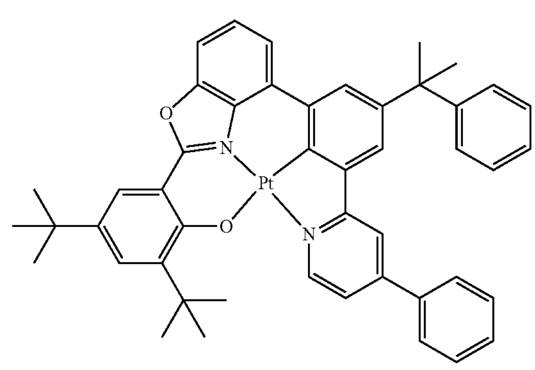

-continued
110
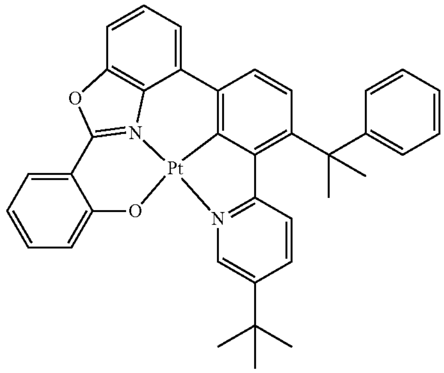
111
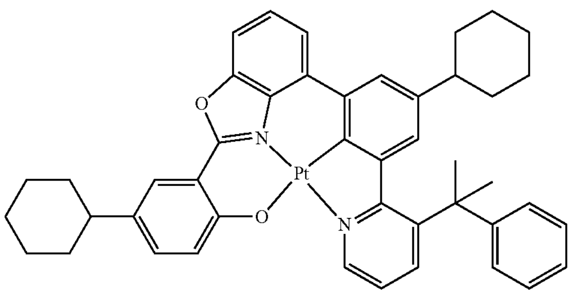
112
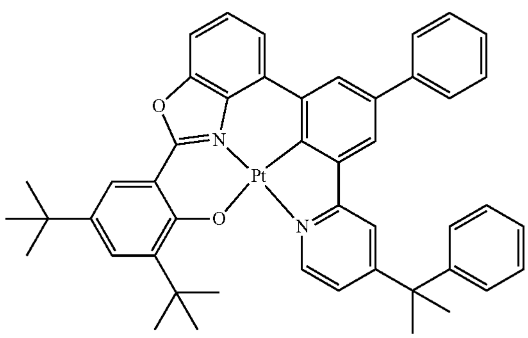
113
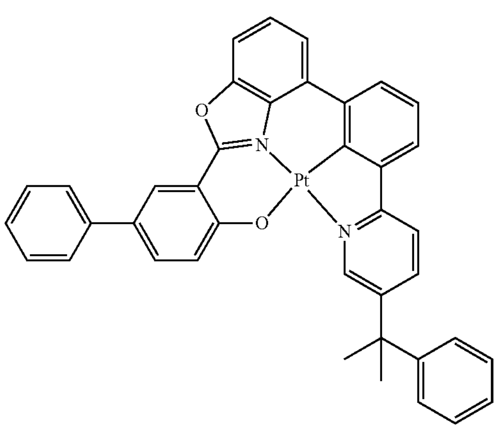
-continued
114
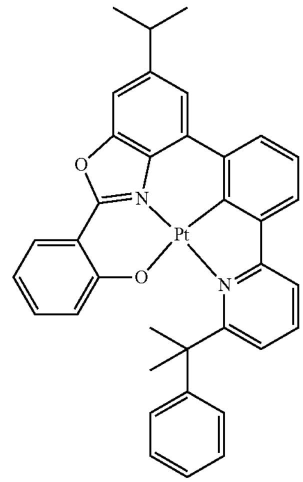
115
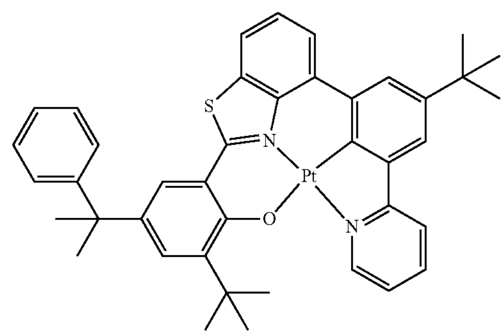
116
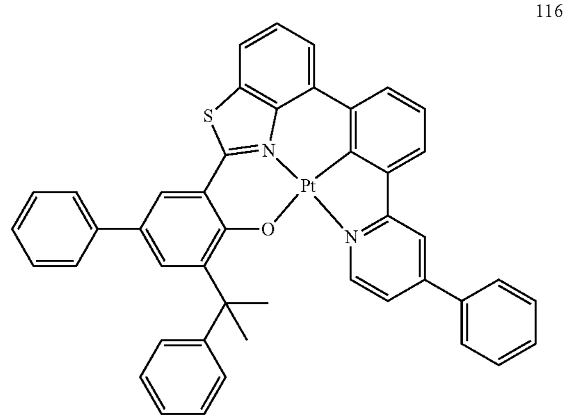

117
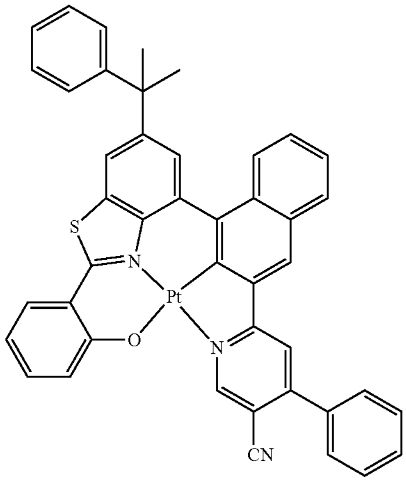
118
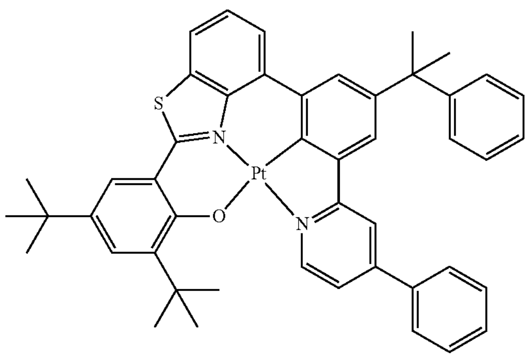
119
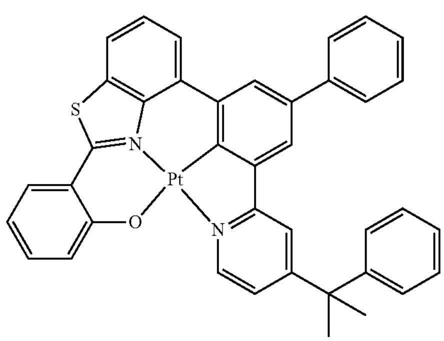
120
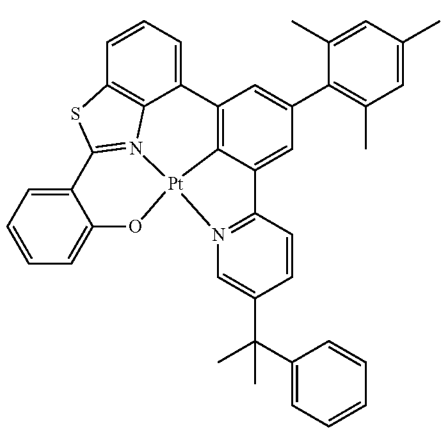
121
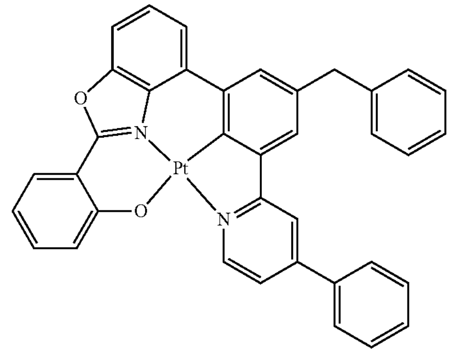
122
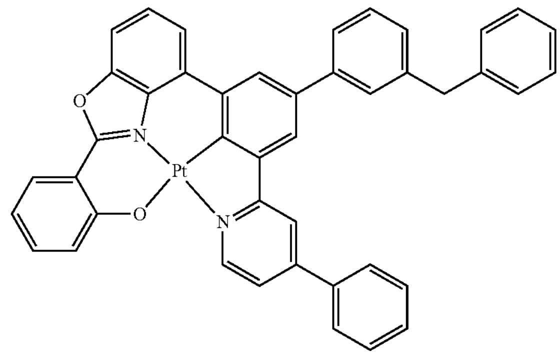
123
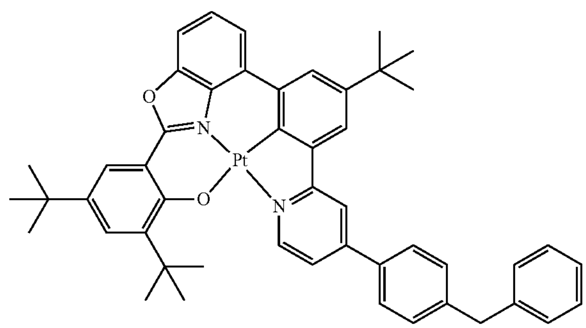
124
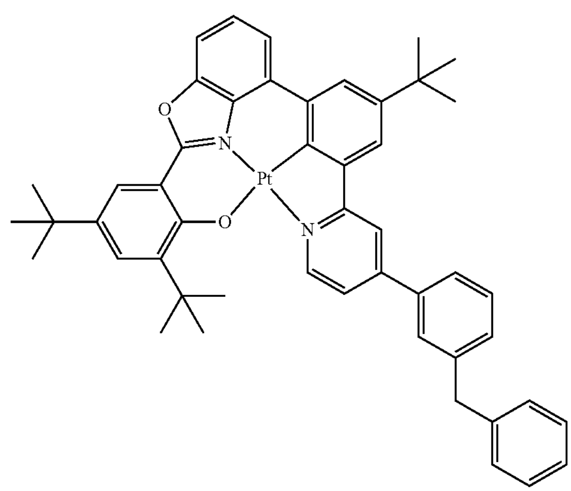

-continued
125
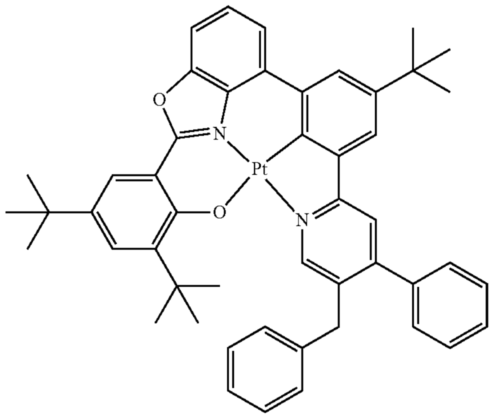
126
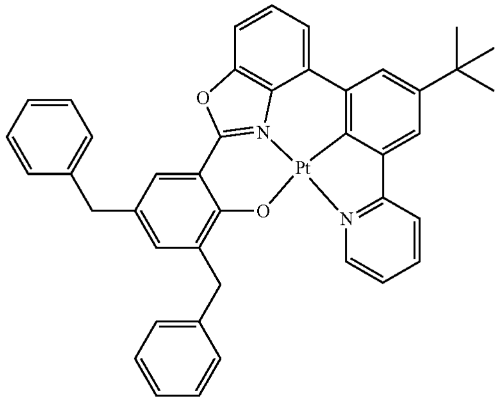
127
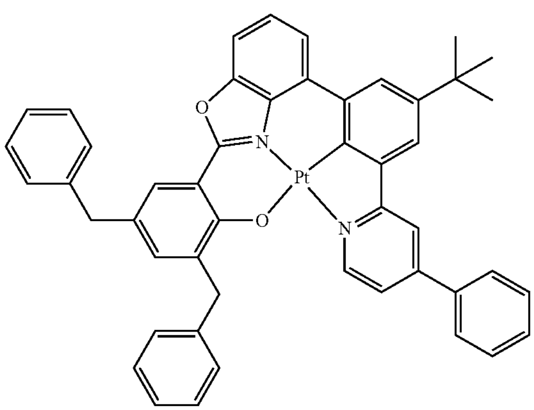
128
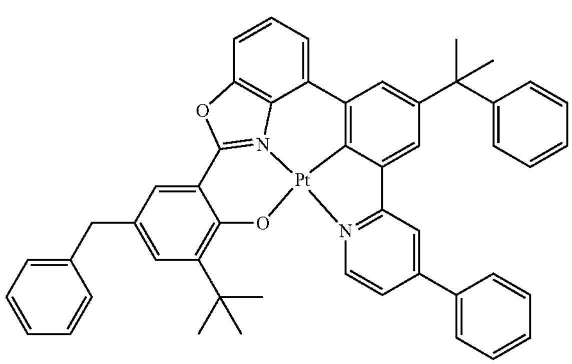
-continued
129
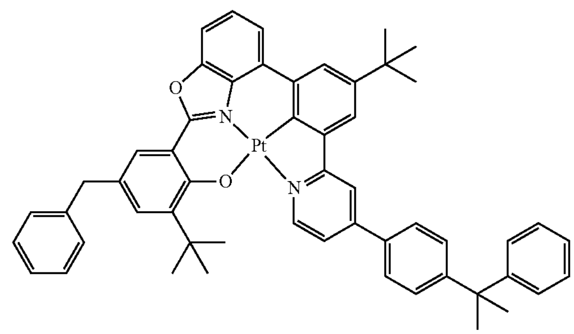
130
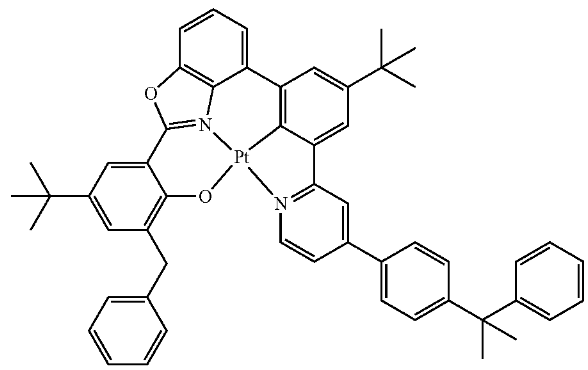
131
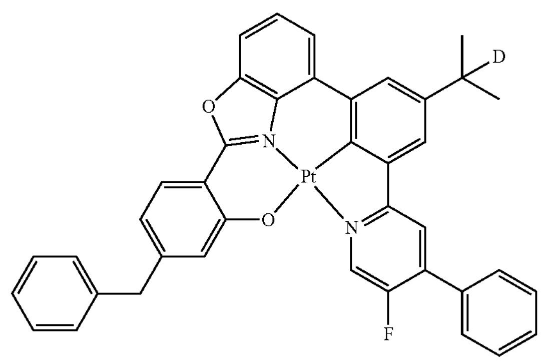
132
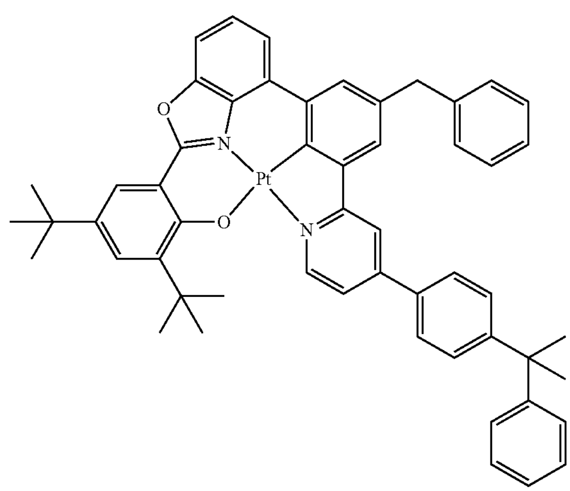

133
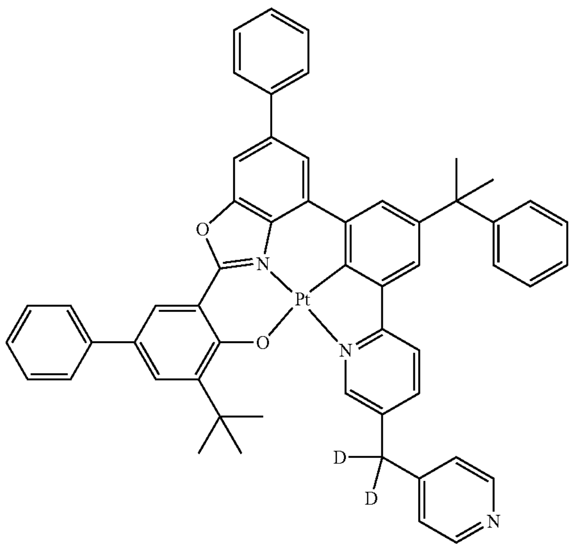
134
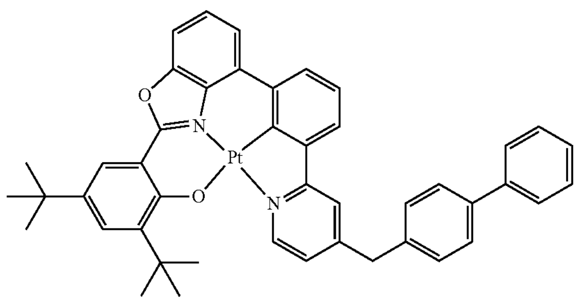
135
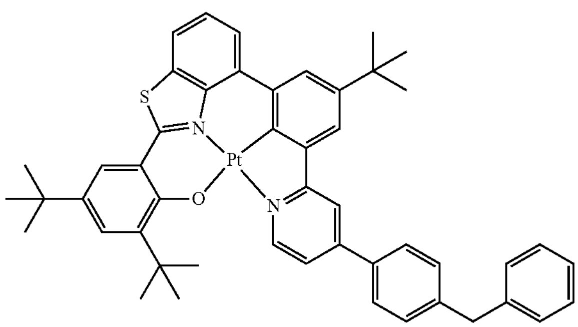
136
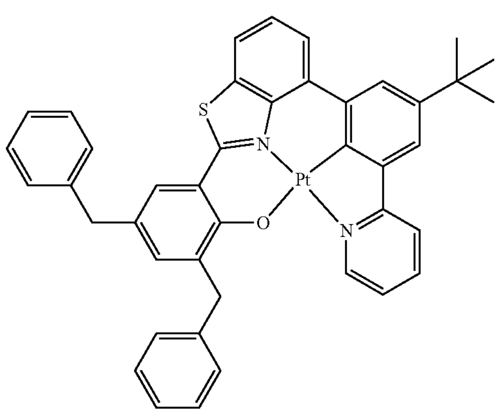
137
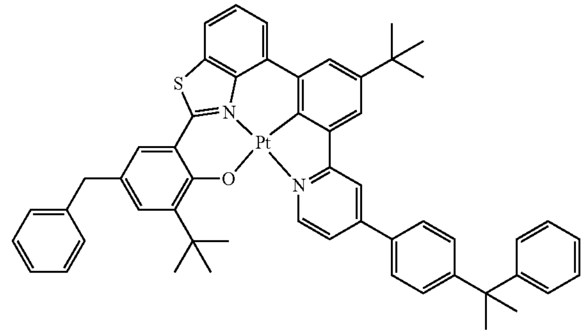
138
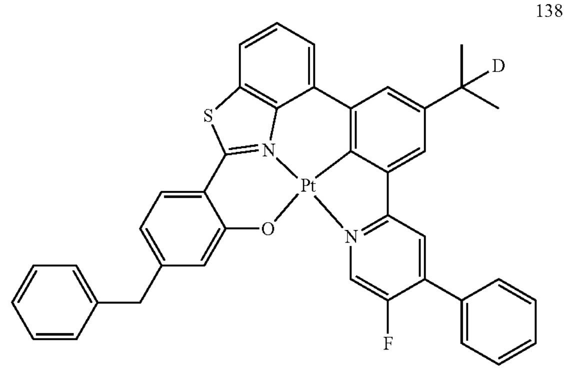
139
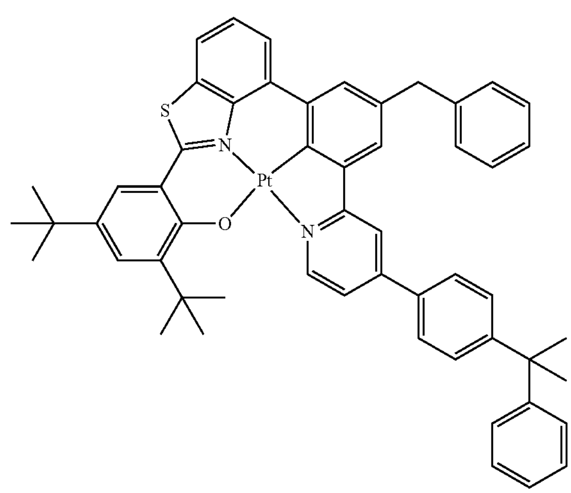

-continued
140
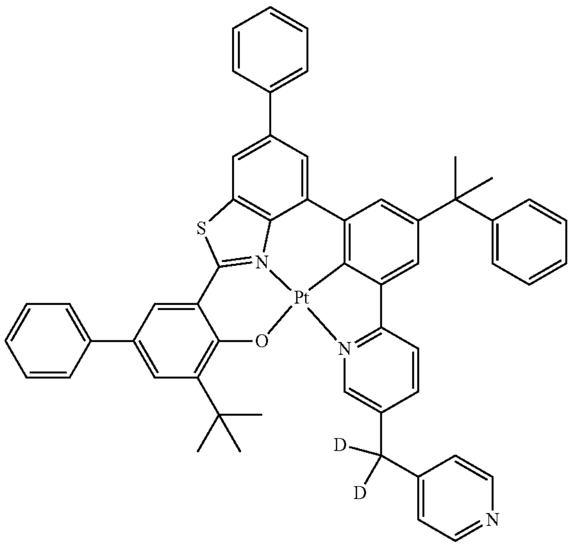
141
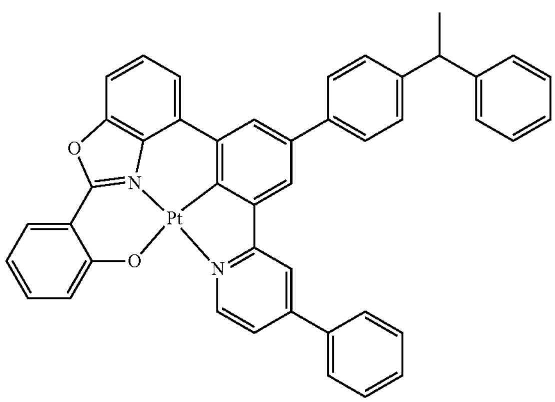
142
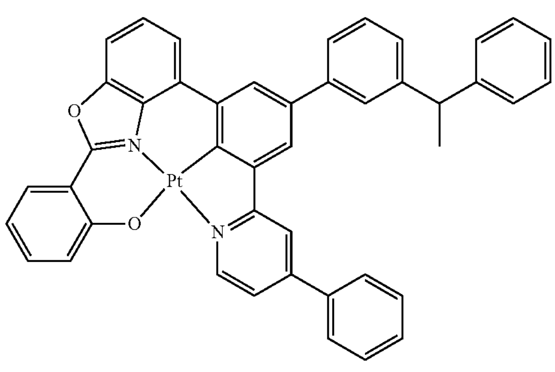
-continued
143
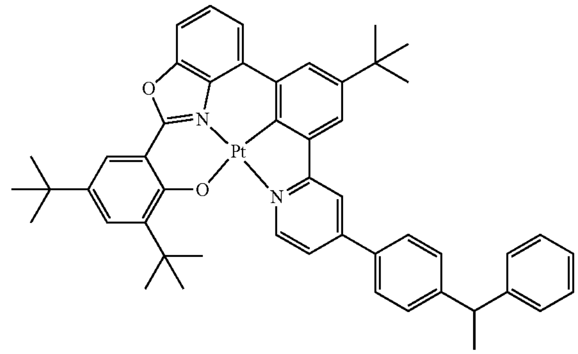
144
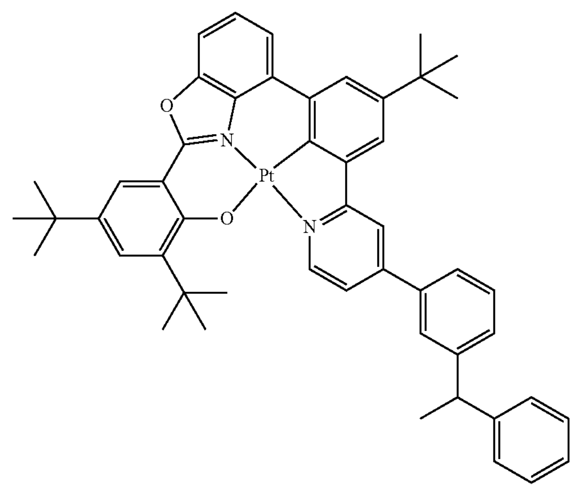
145
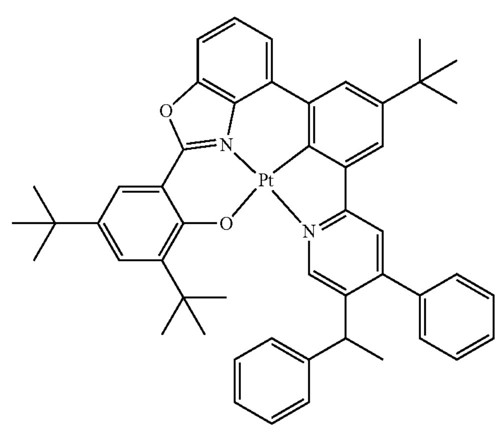

146
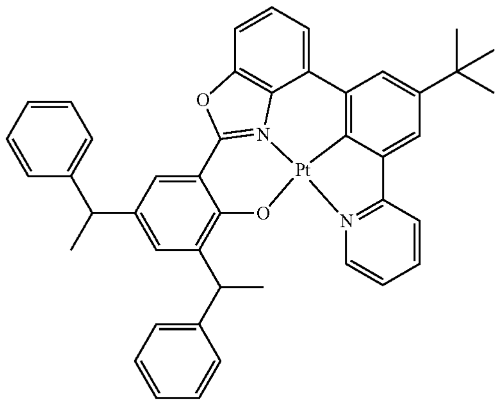
147
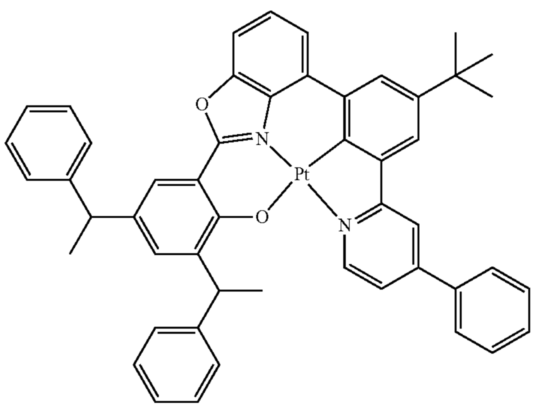
148
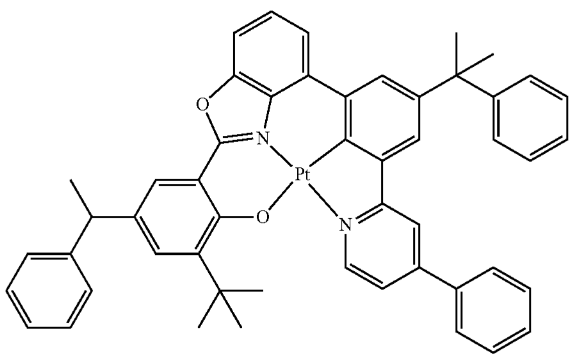
149
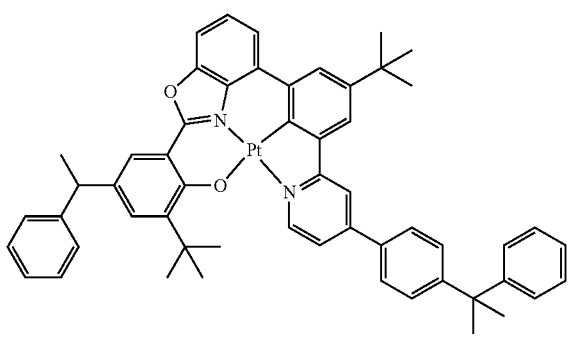
150
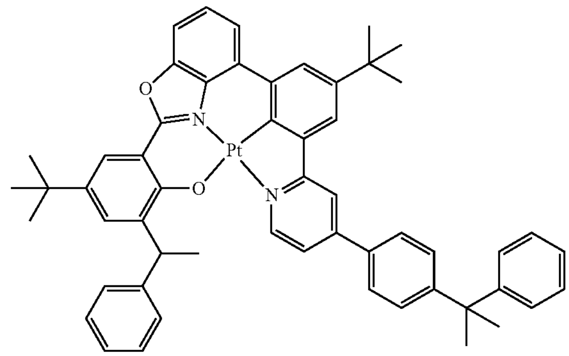
151
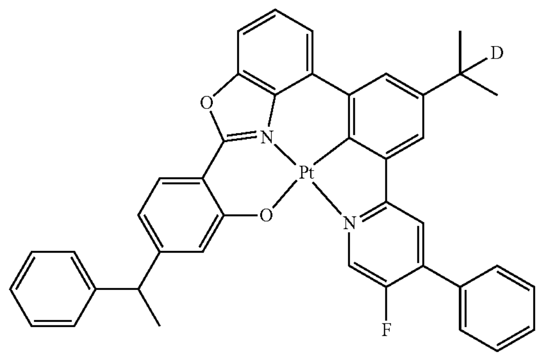
152
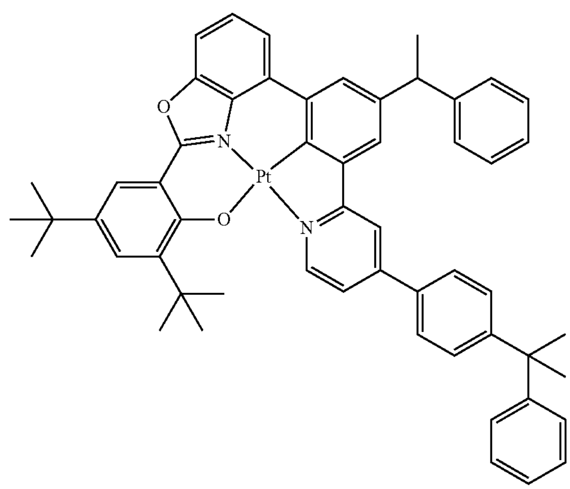

-continued
153
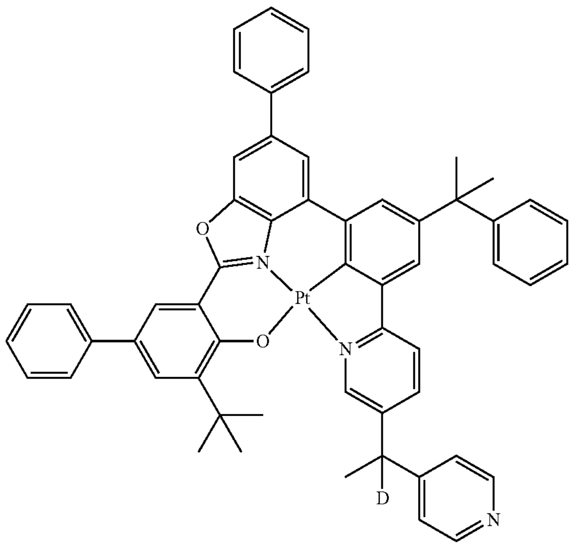
154
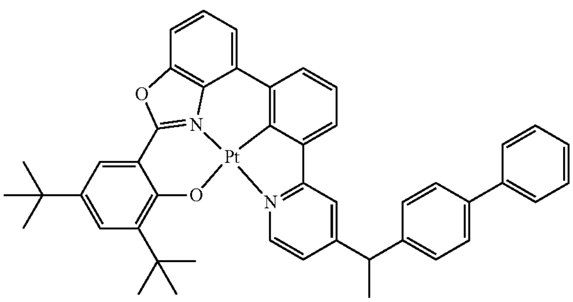
155
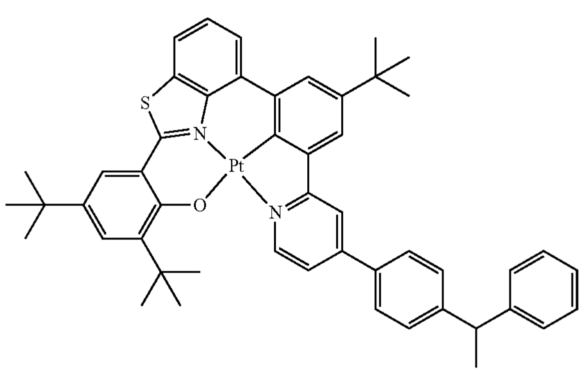
-continued
156
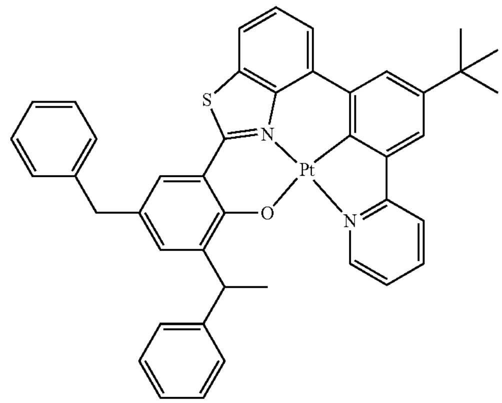
157
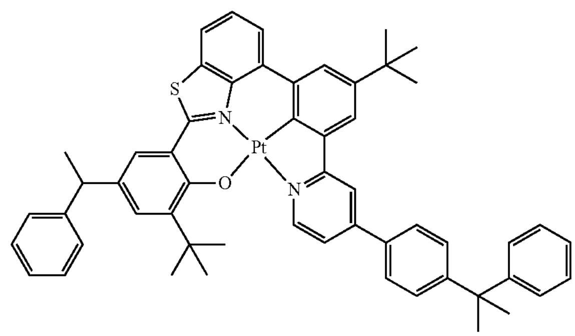
158
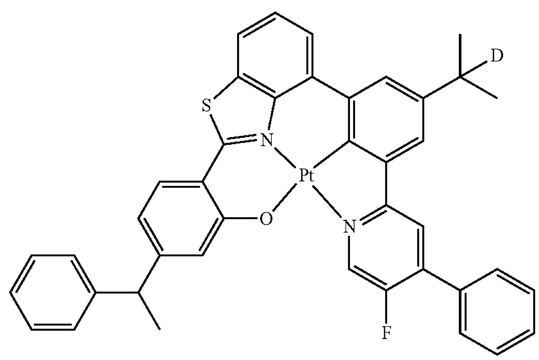
159
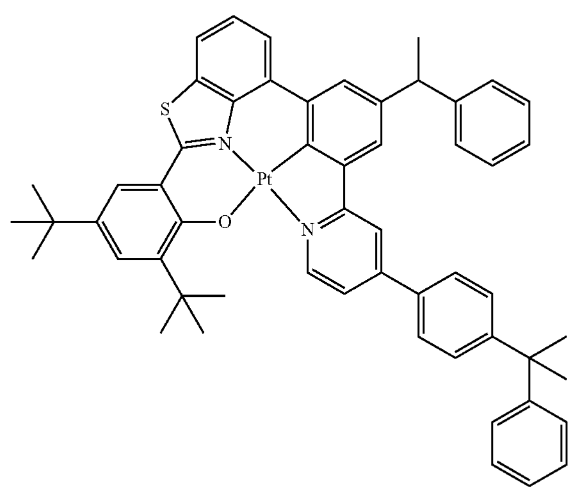

-continued
160
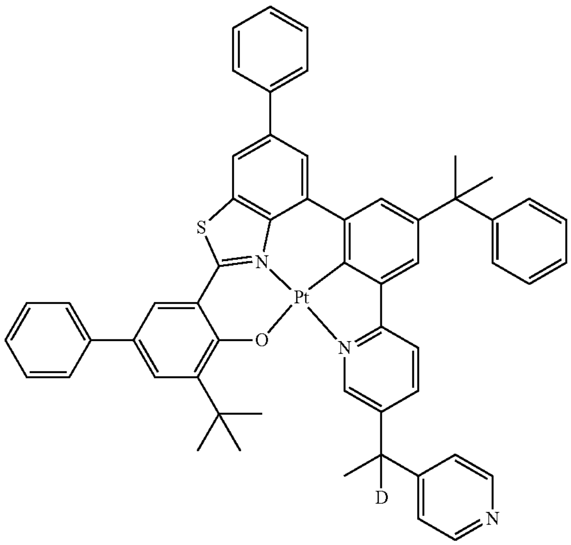
161
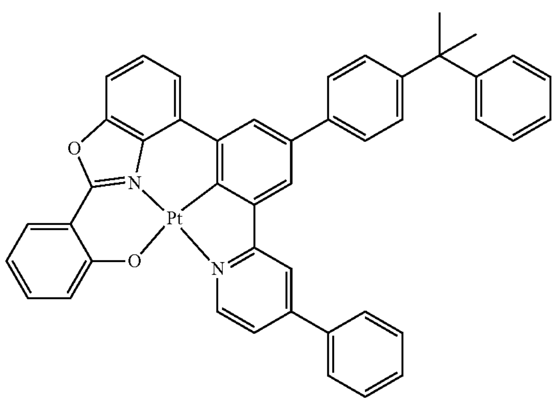
162
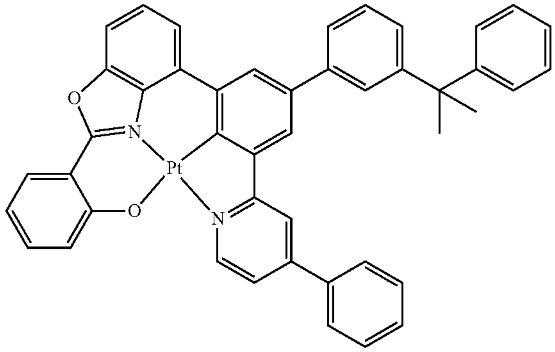
-continued
163
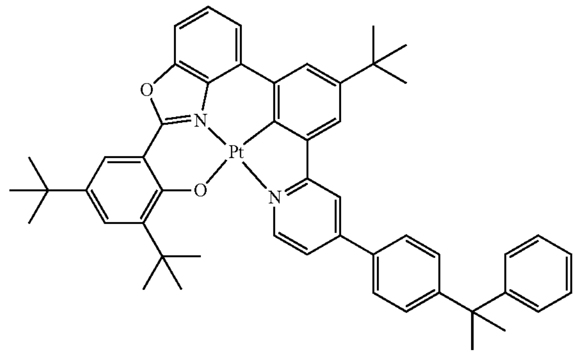
164
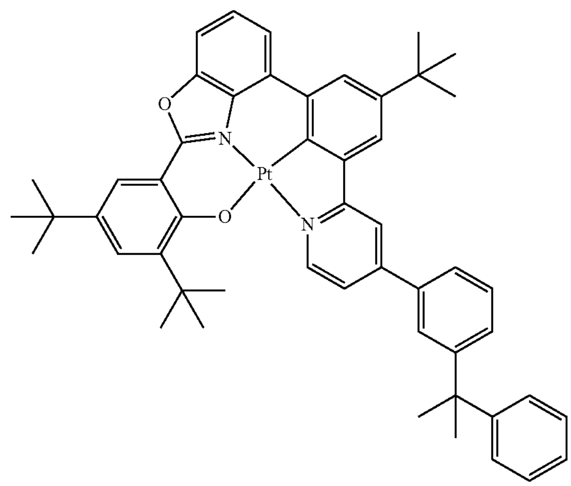
165
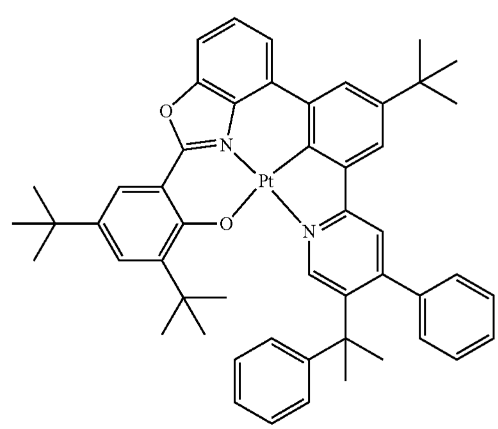

-continued
166
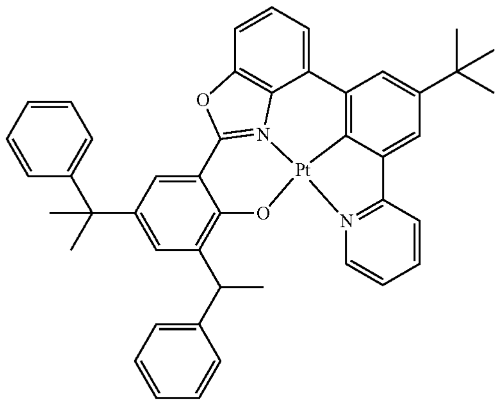
167
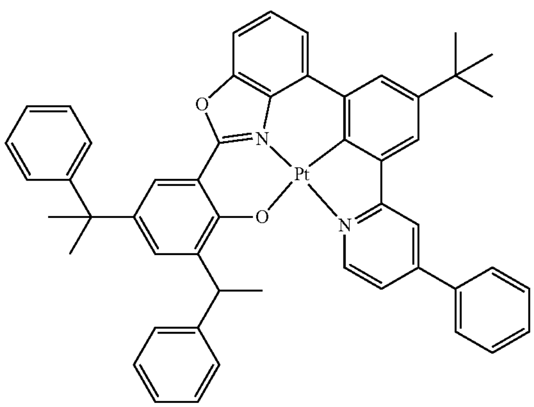
168
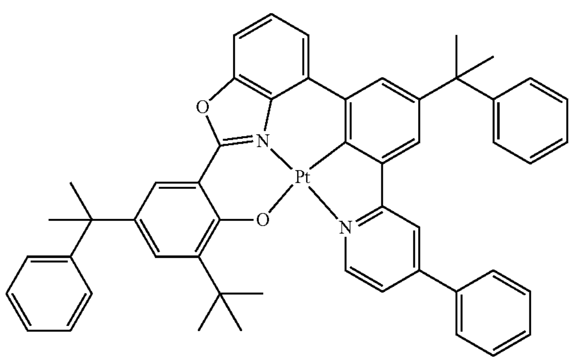
169
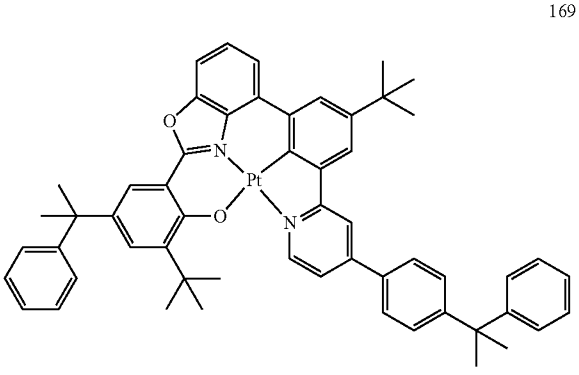
-continued
170
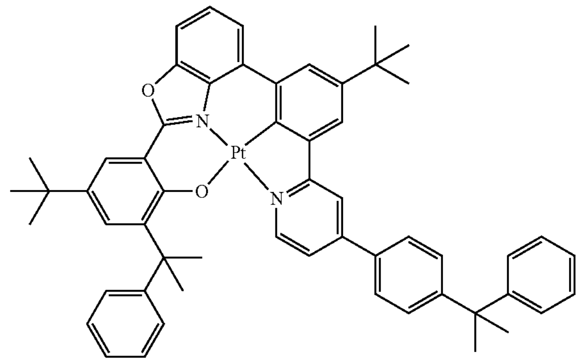
171
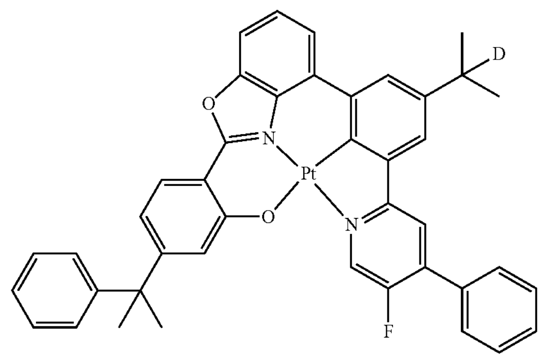
172
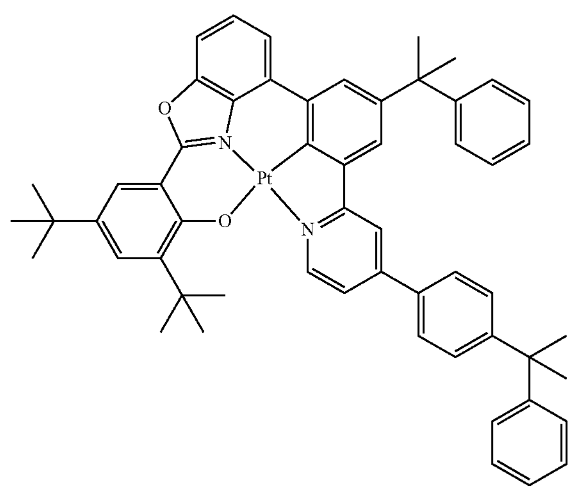

-continued
173
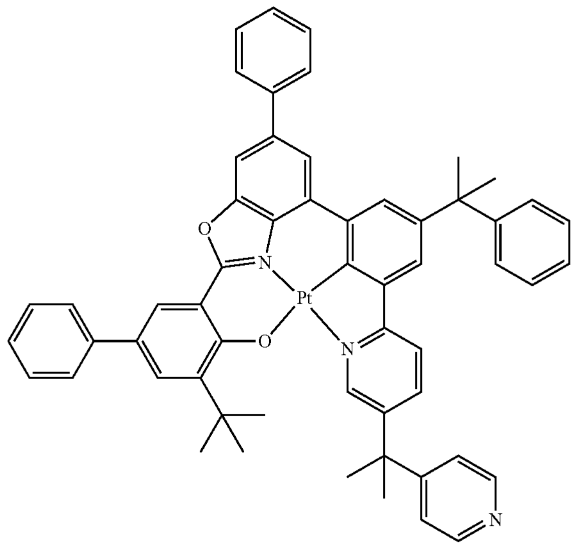
174
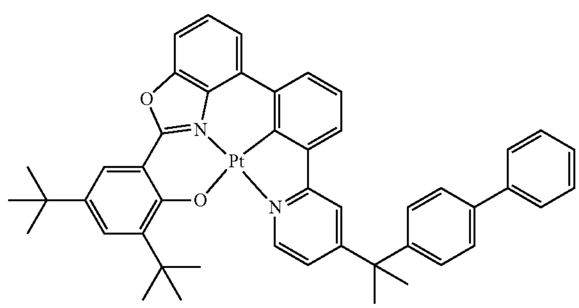
175
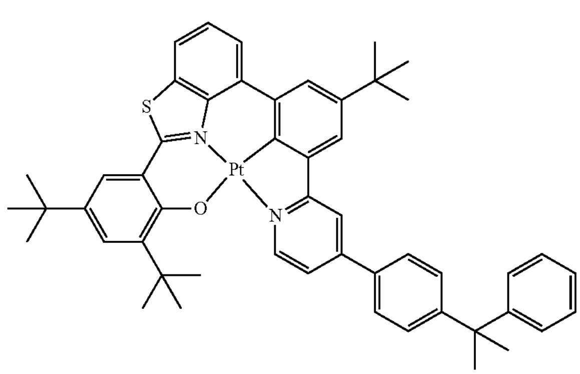
-continued
176
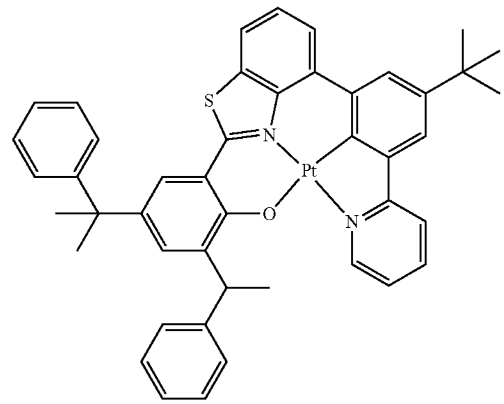
177
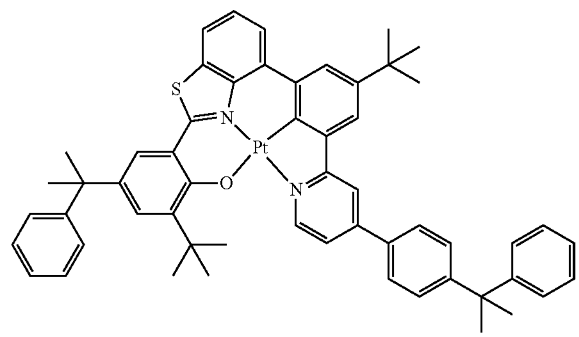
178
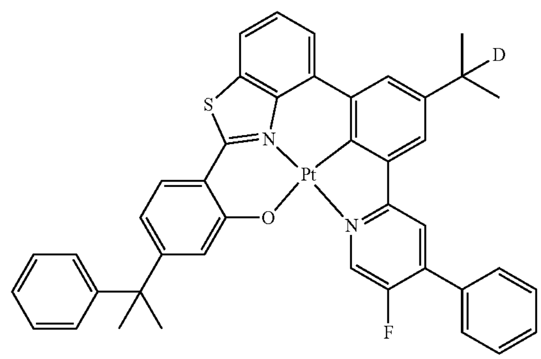
179
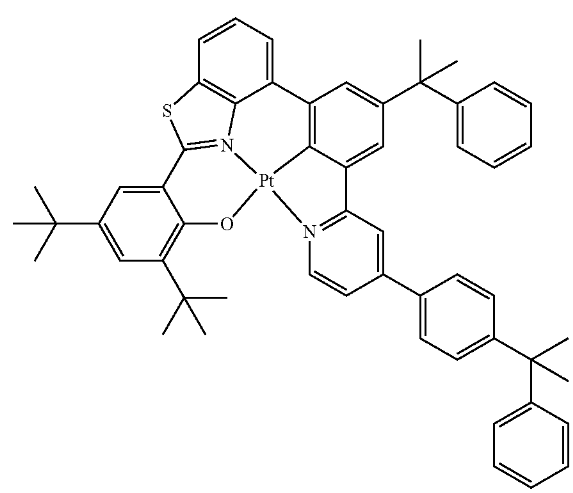

-continued
180
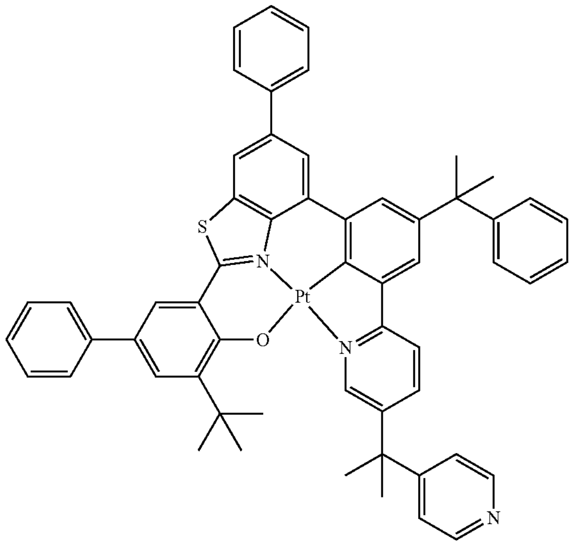
181
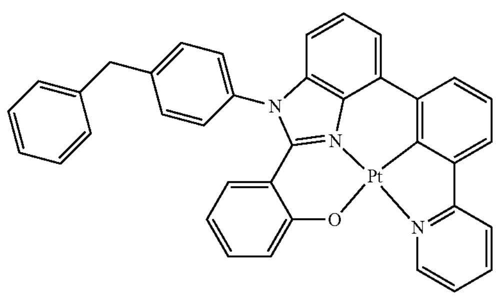
182
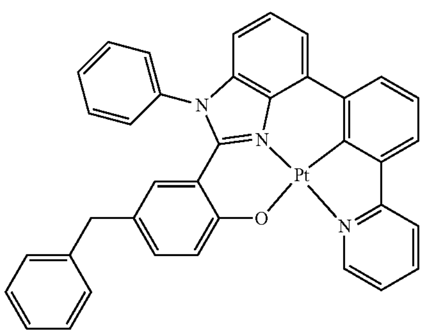
183
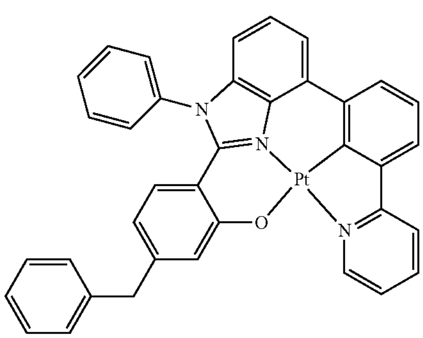
-continued
184
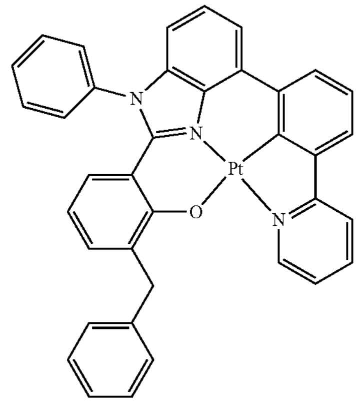
185
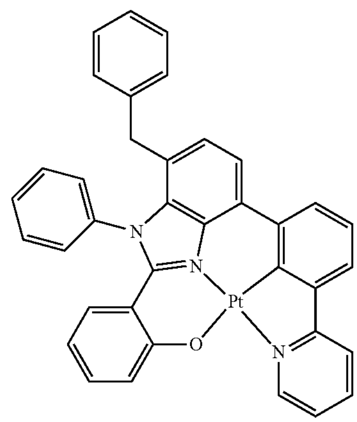
186
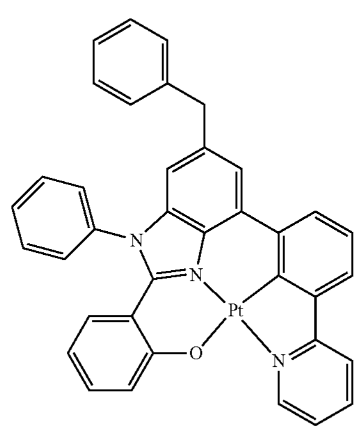

-continued
187
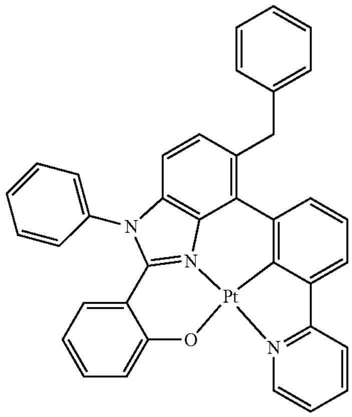
188
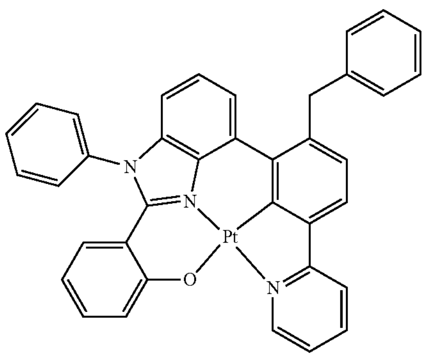
189
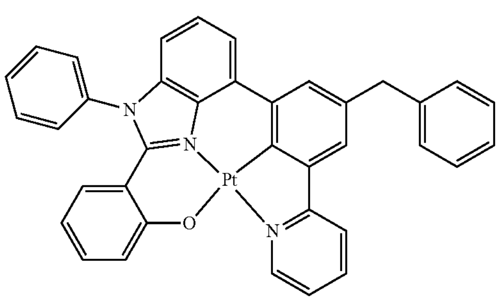
190
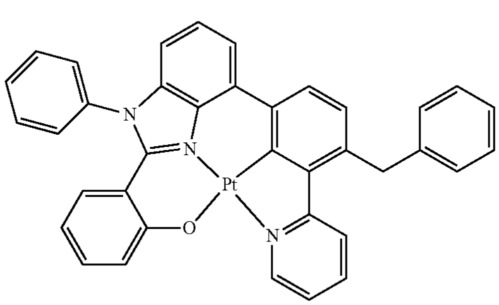
-continued
191
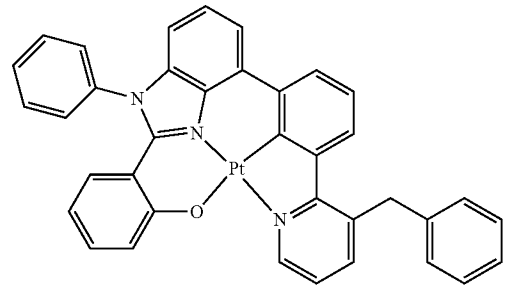
192
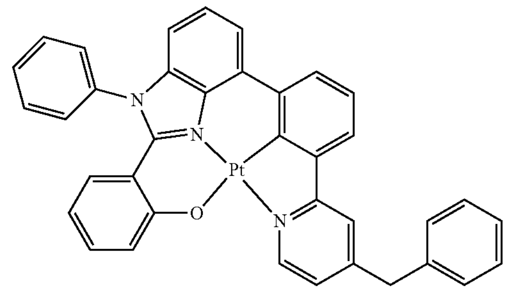
193
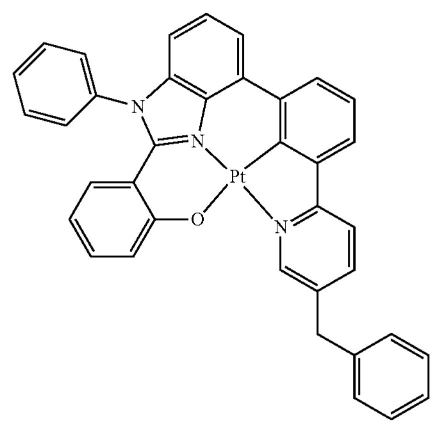
194
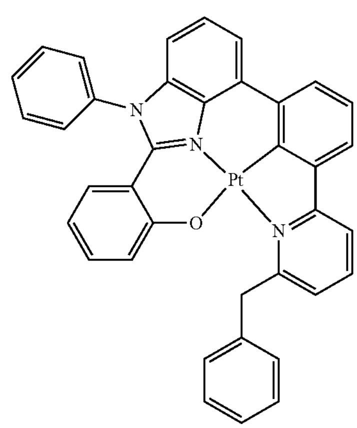

-continued
195
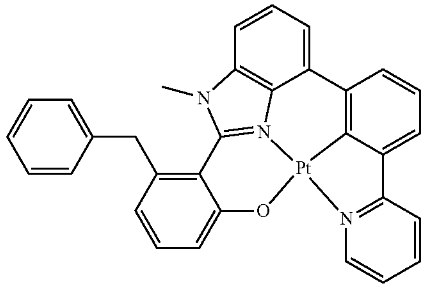
196
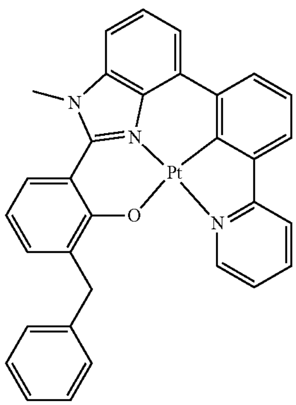
197
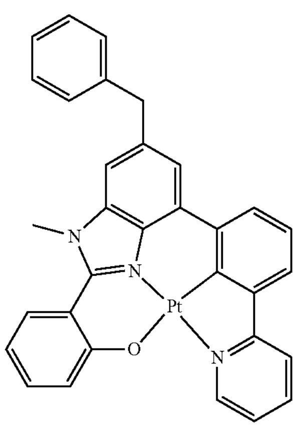
198
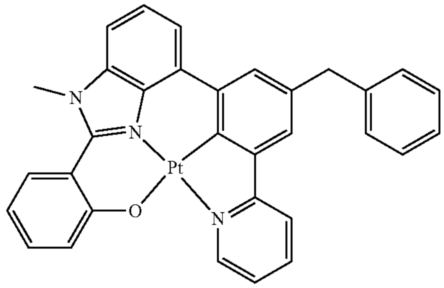
-continued
199
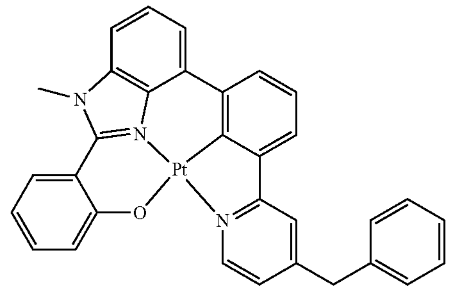
200
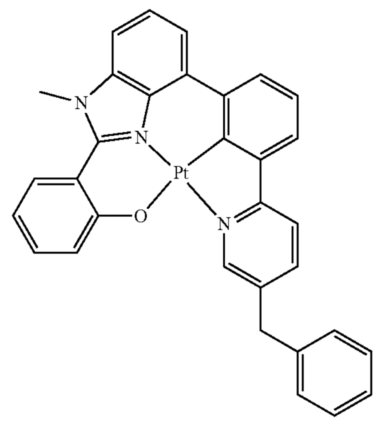
201
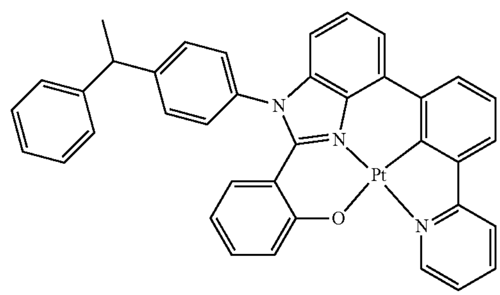
202
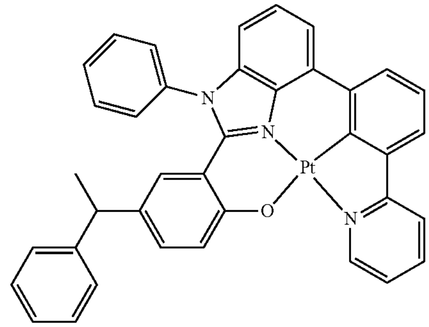

-continued
203
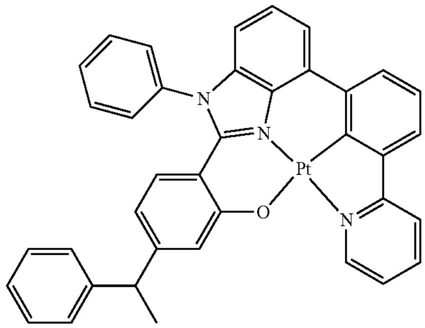
204
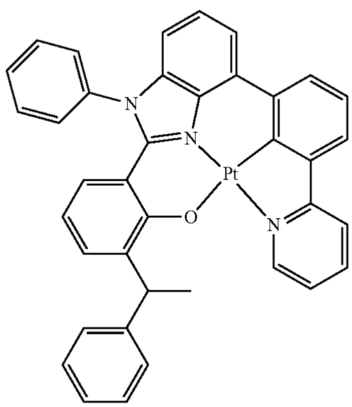
205
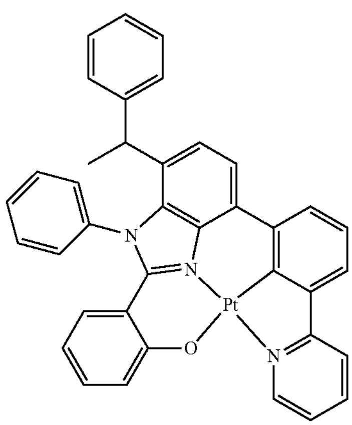
206
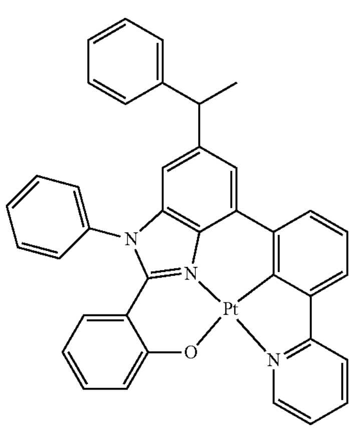
-continued
207
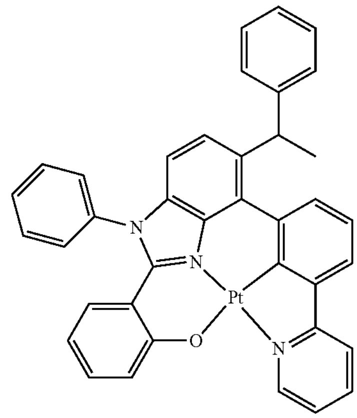
208
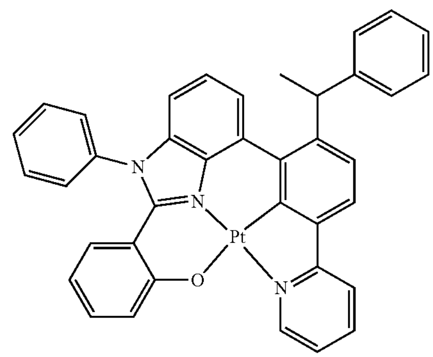
209
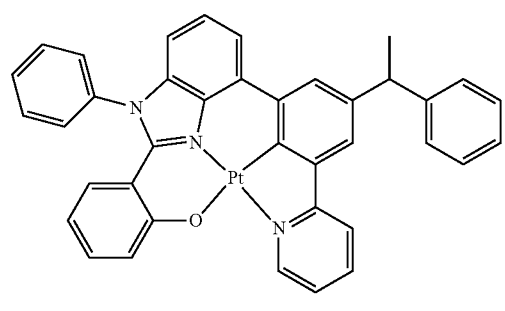
210
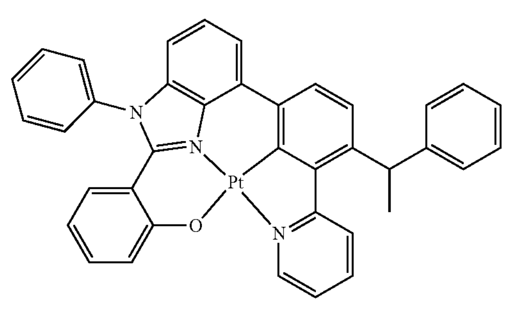

-continued
211
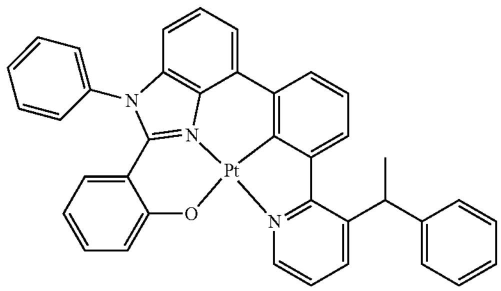
212
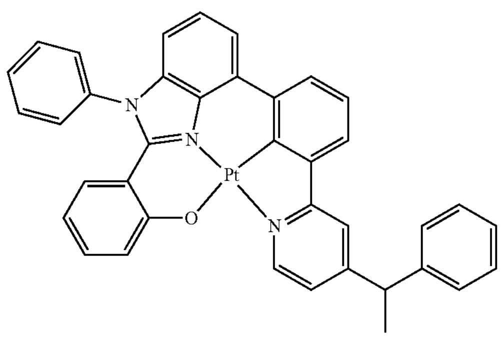
213
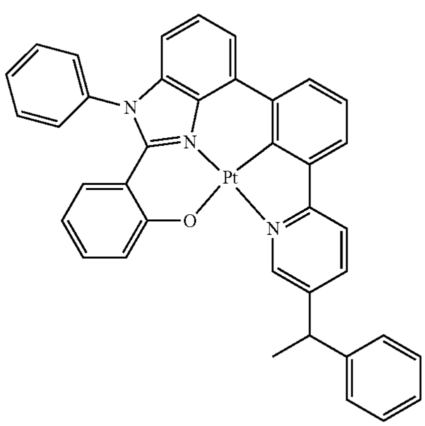
214
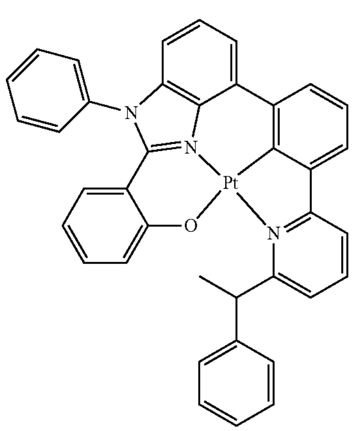
-continued
215
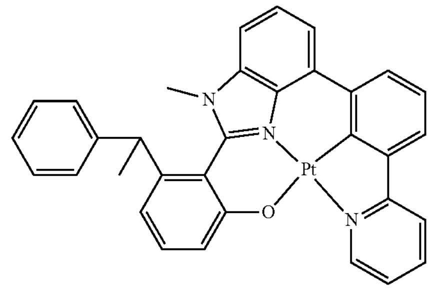
216
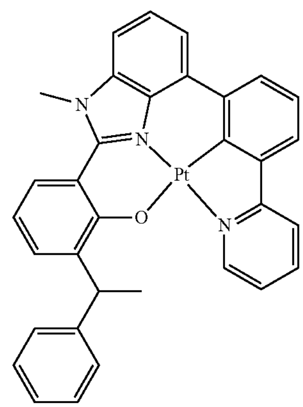
217
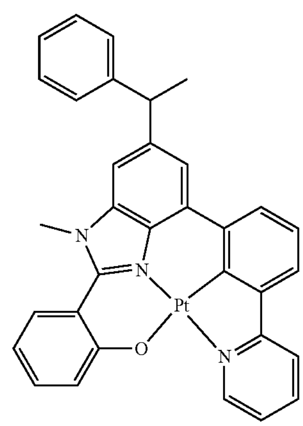
218
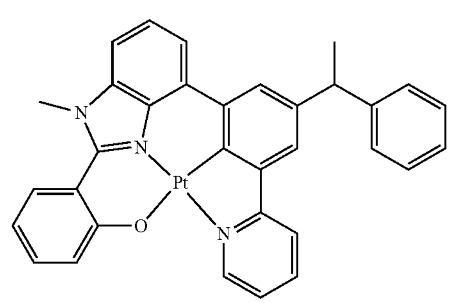

-continued
219
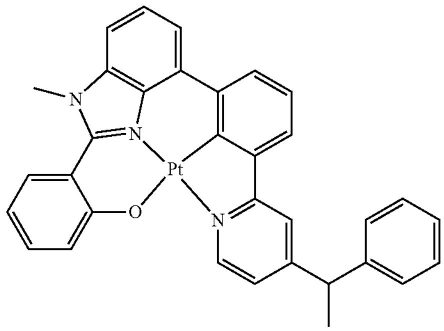
220
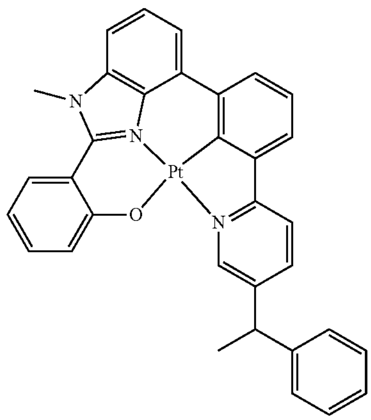
221
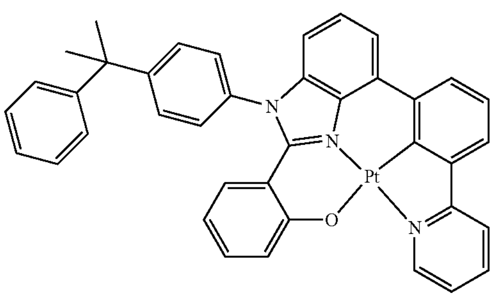
222
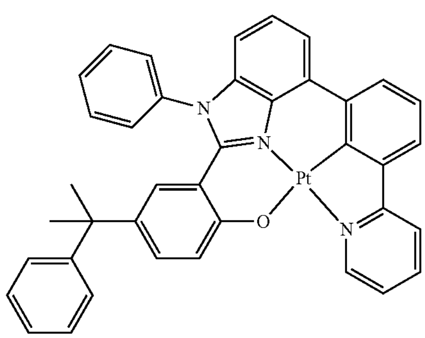
-continued
223
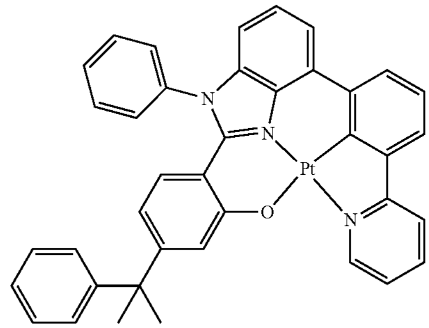
224
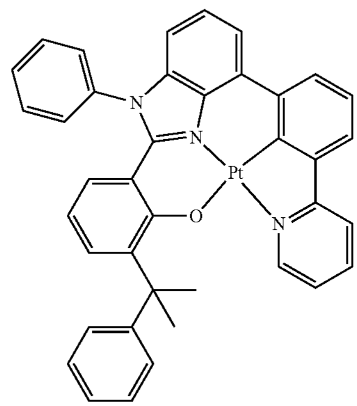
225
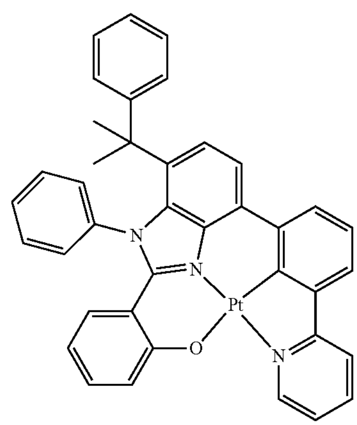
226
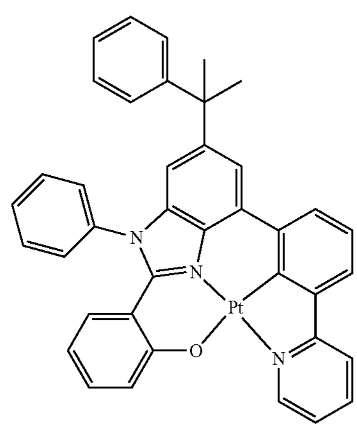

227
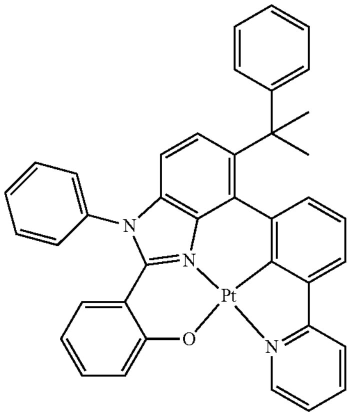
228
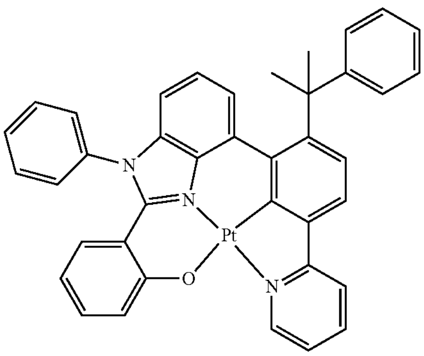
229
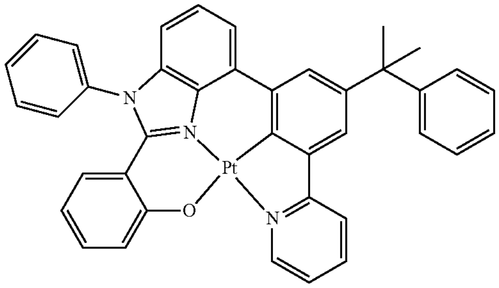
230
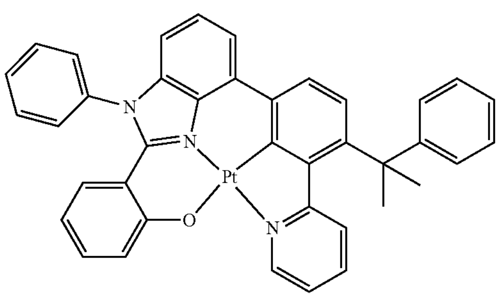
231
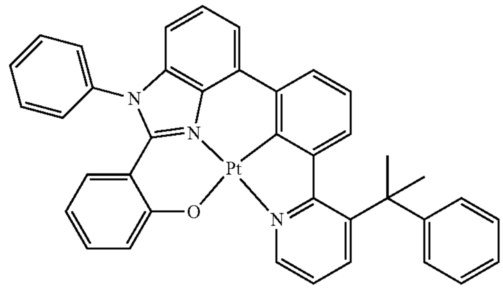
232
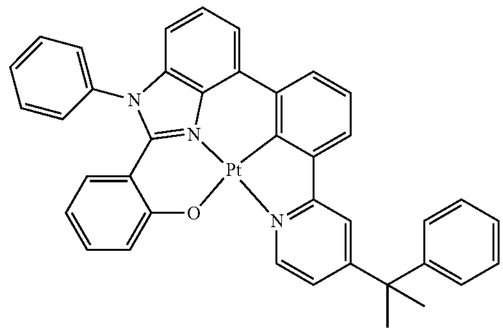
233
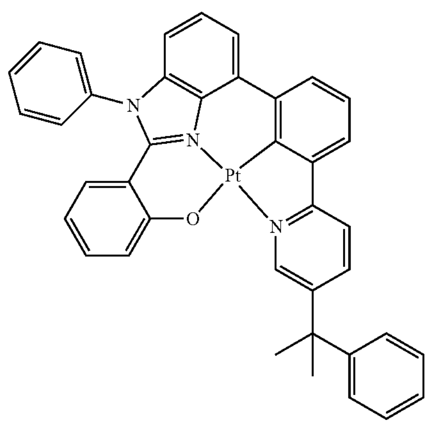
234
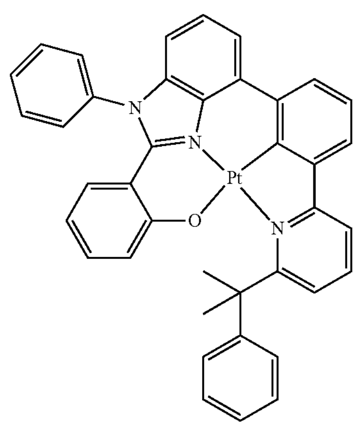

-continued
235
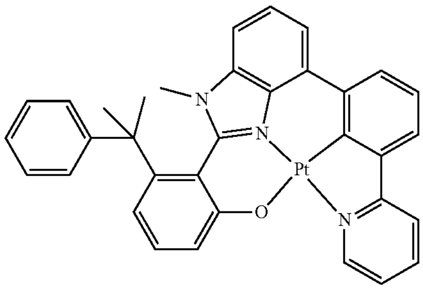
236
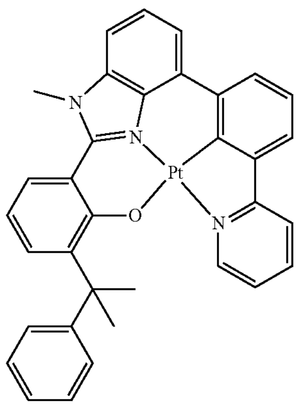
237
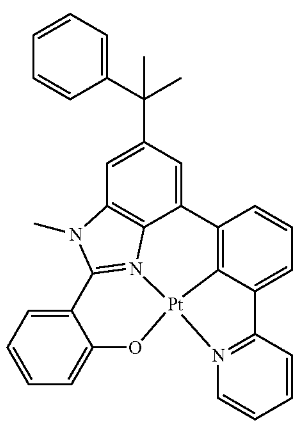
238
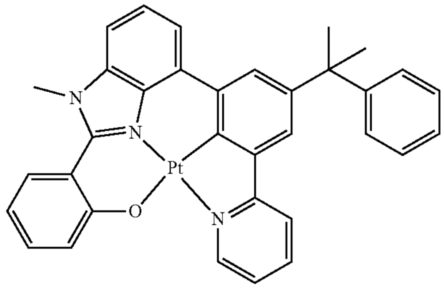
-continued
239
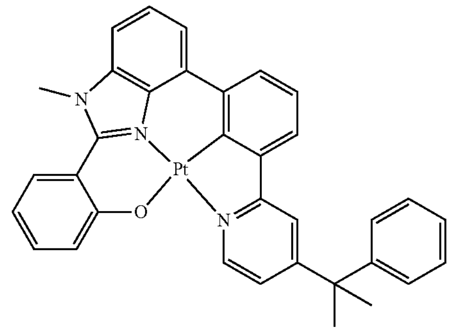
240
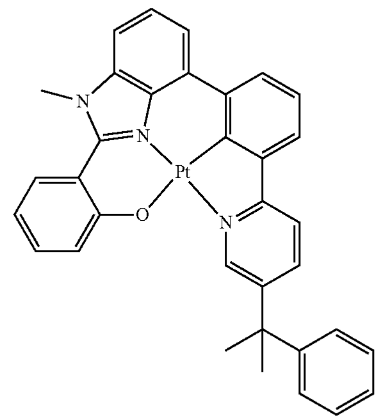
241
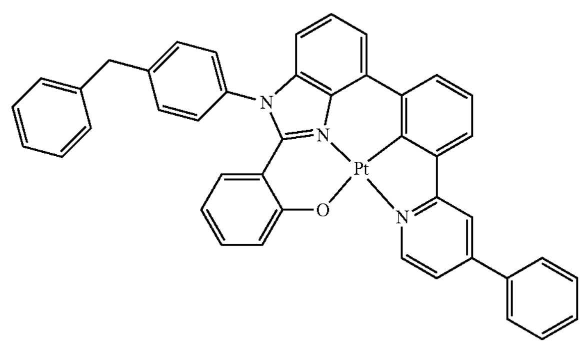
242
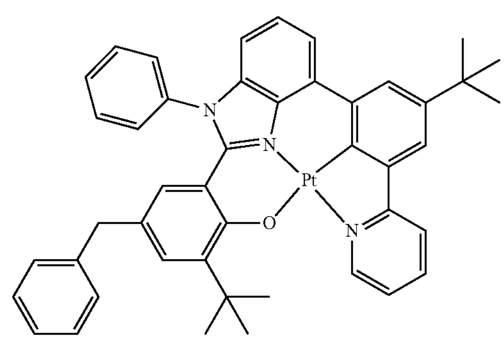

243
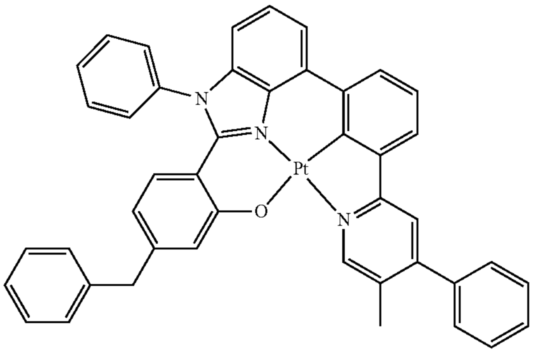
244
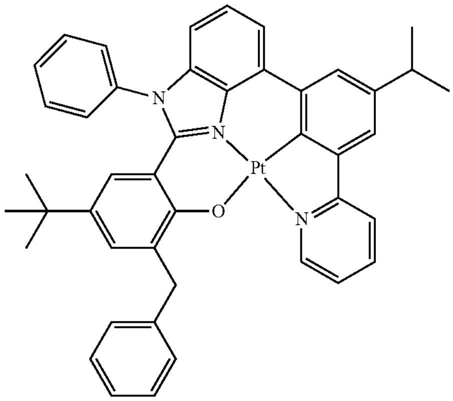
245
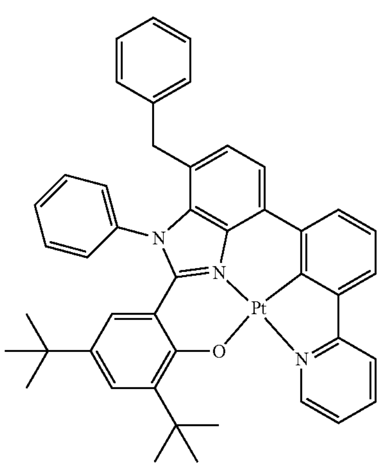
246
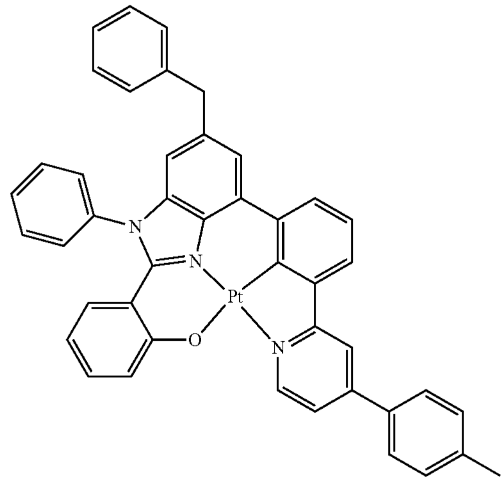
247
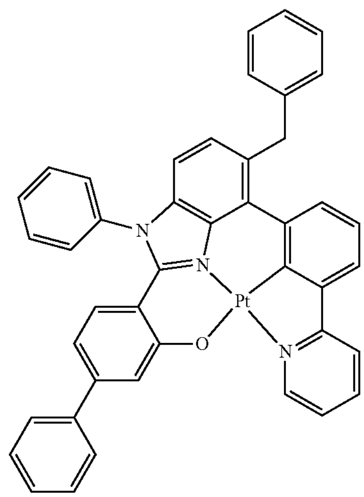
248
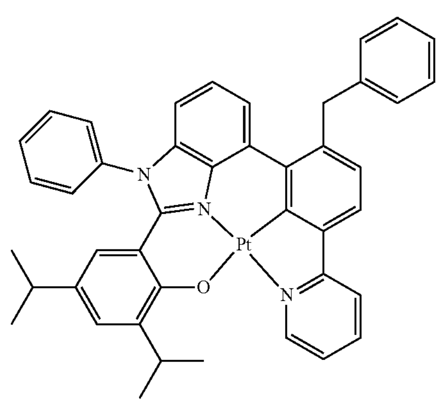

-continued
249
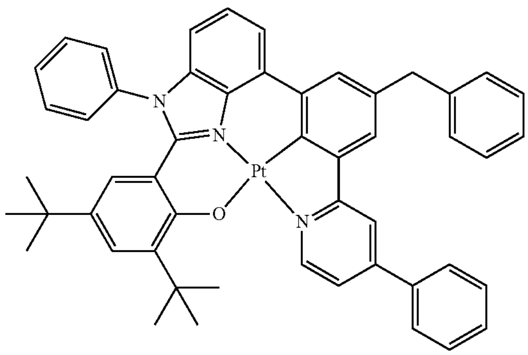
250
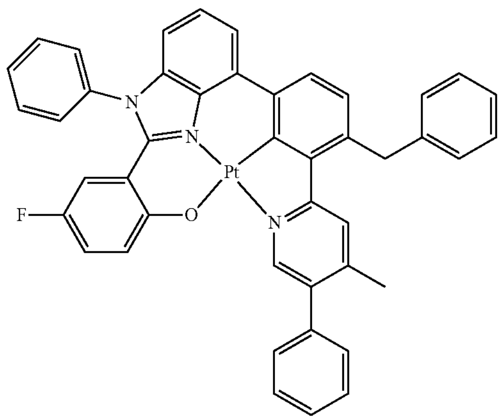
251
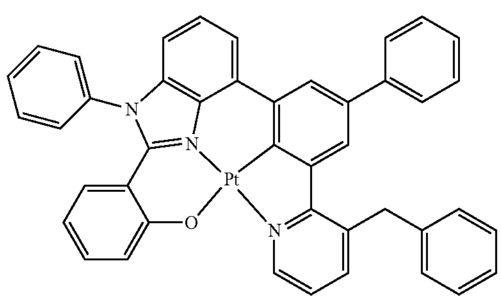
252
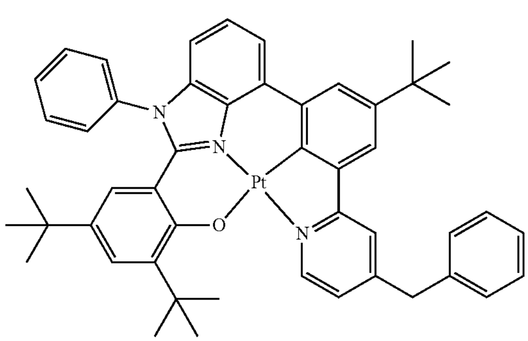
-continued
253
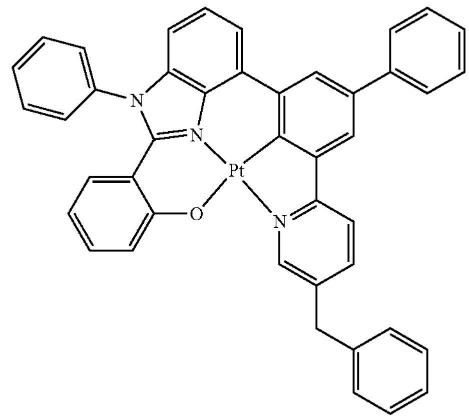
254
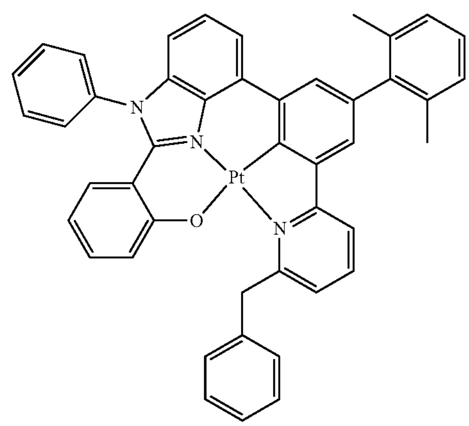
255
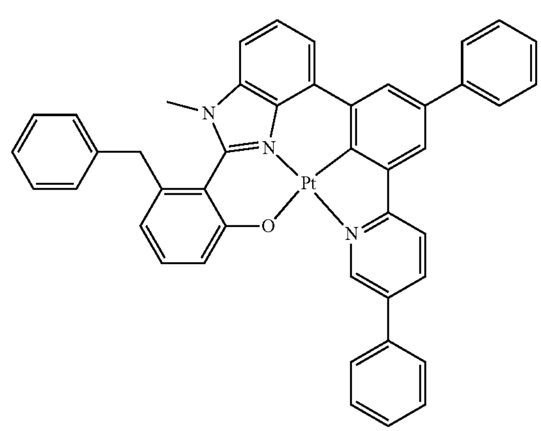

-continued
256
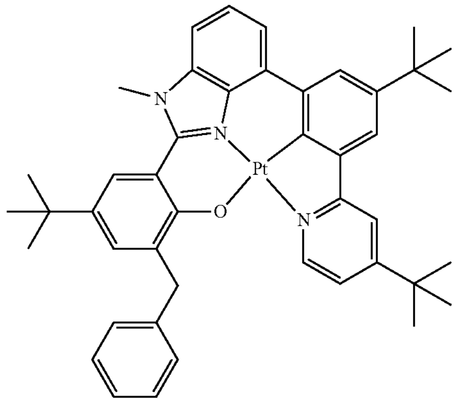
257
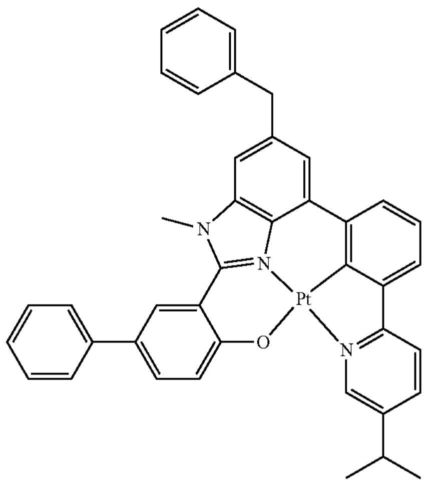
258
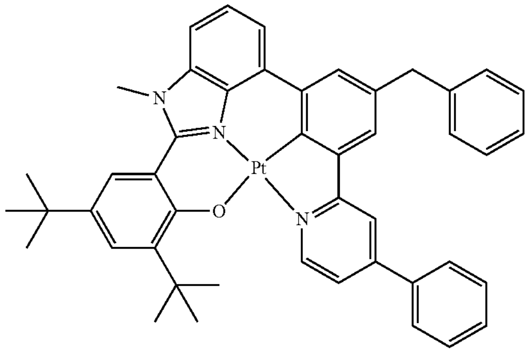
259
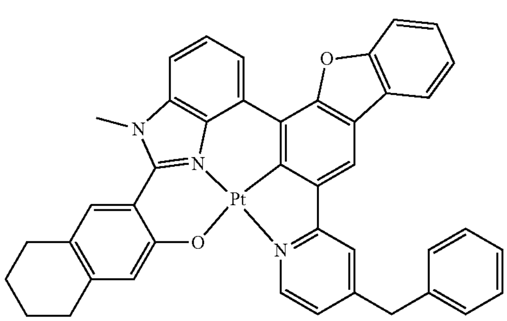
-continued
260
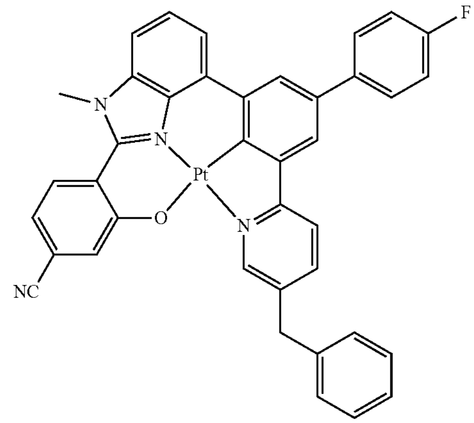
261
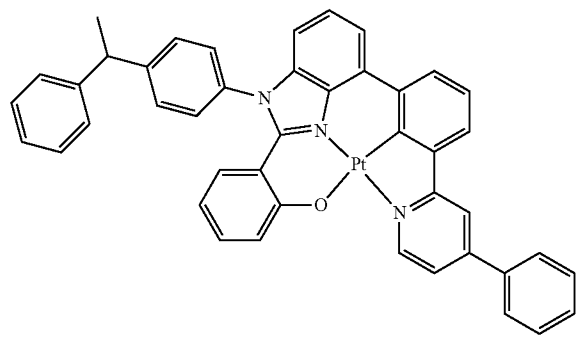
262
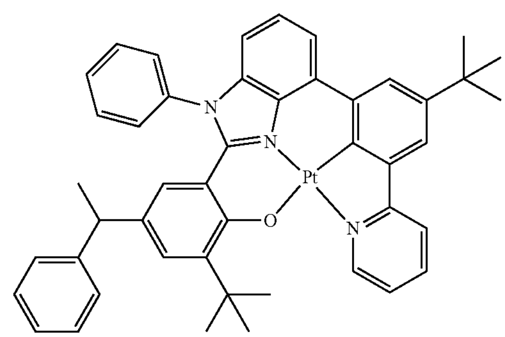
263
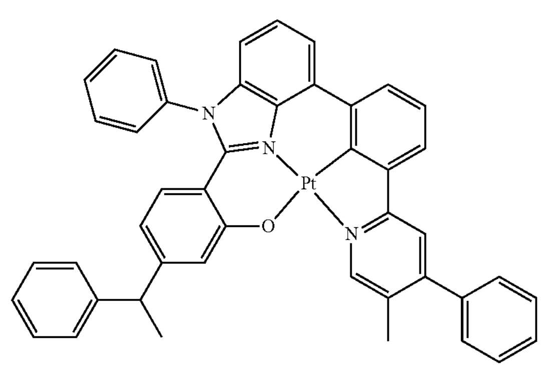

264
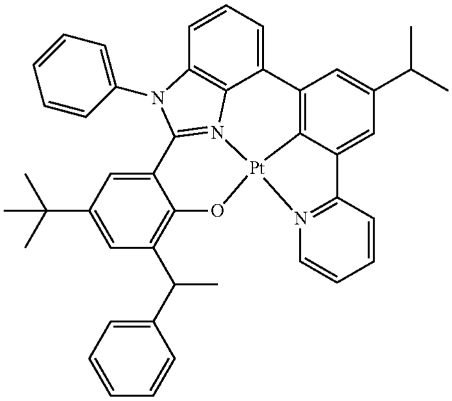
265
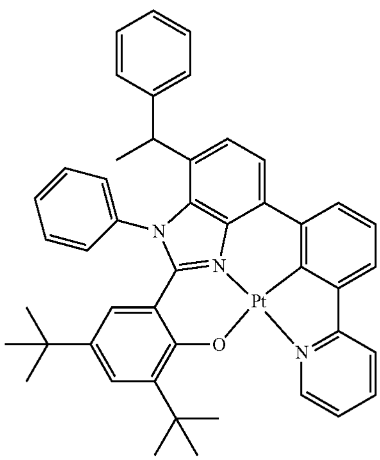
266
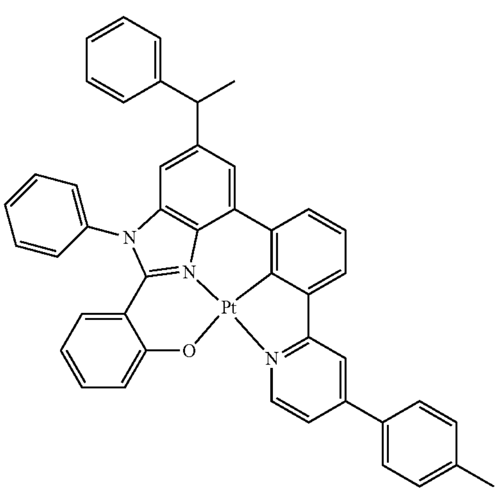
267
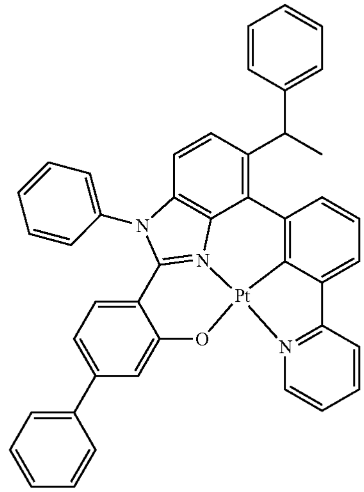
268
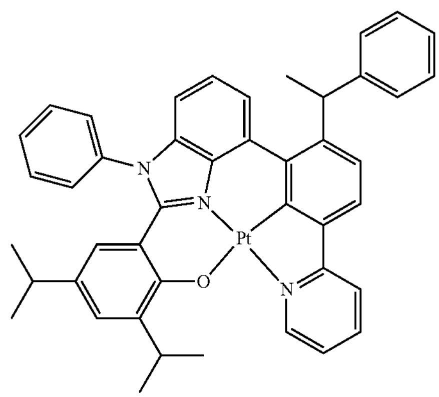
269
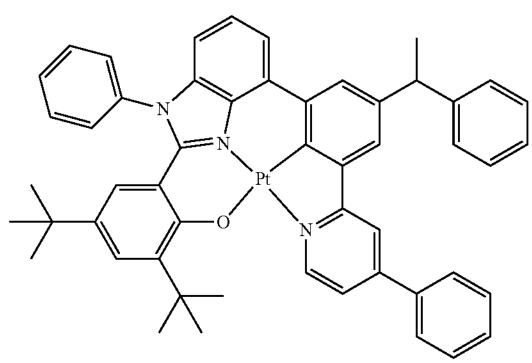

270
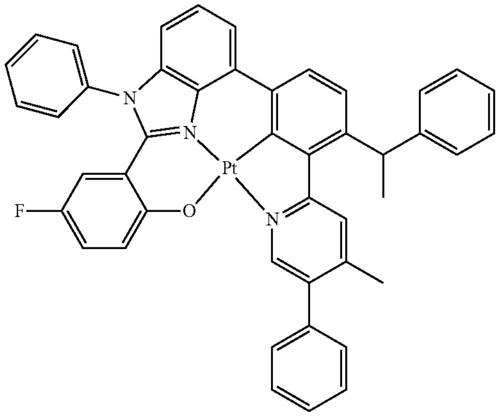
271
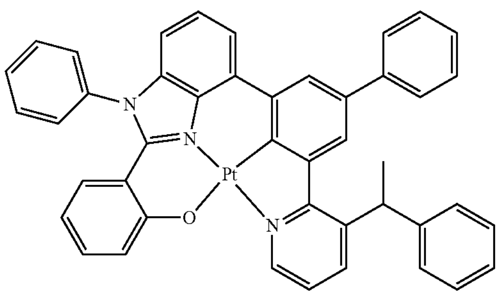
272
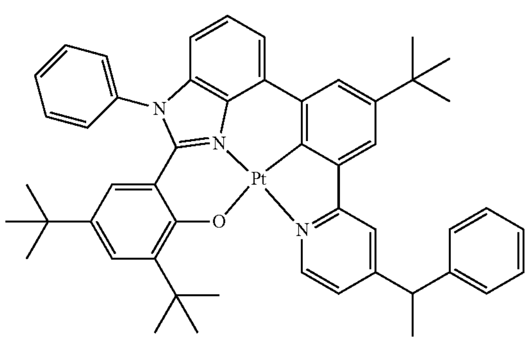
273
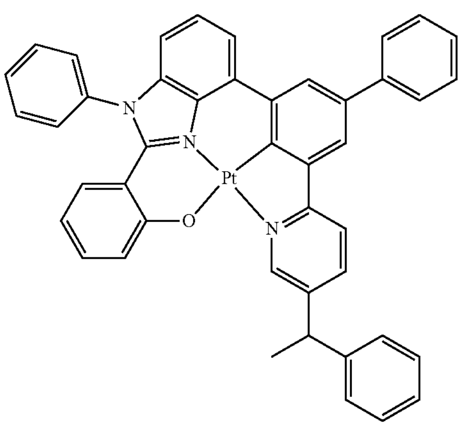
274
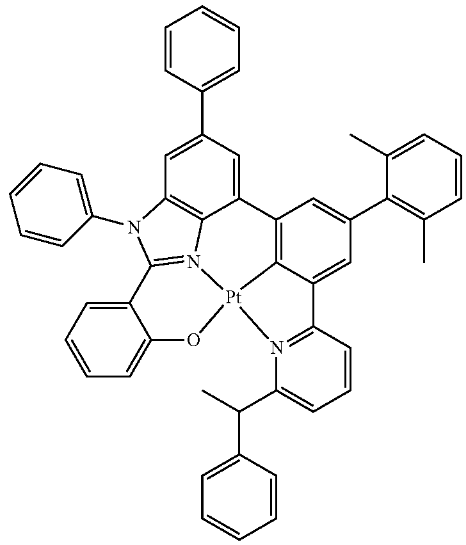
275
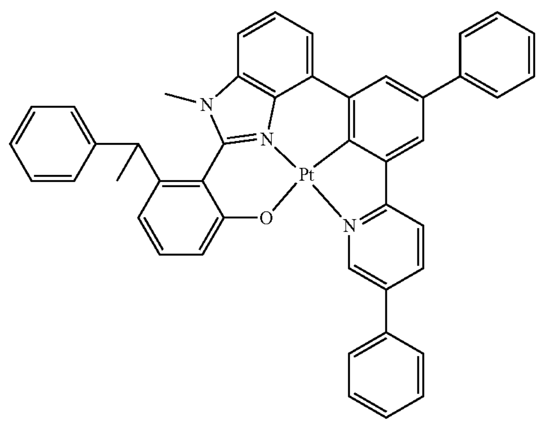
276
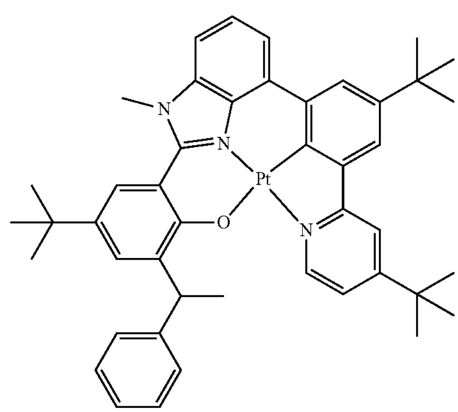

-continued
277
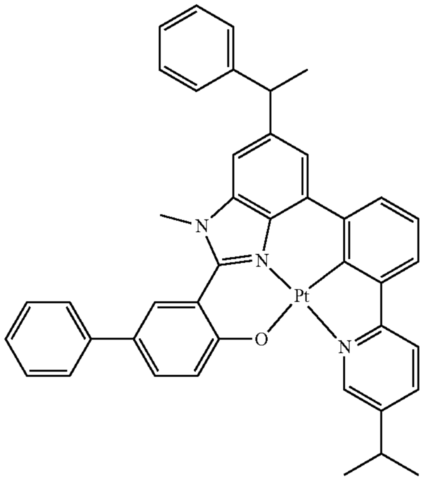
278
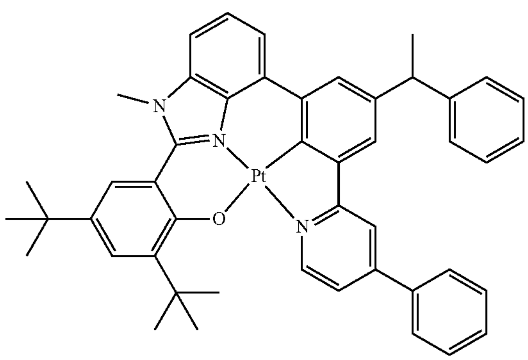
279
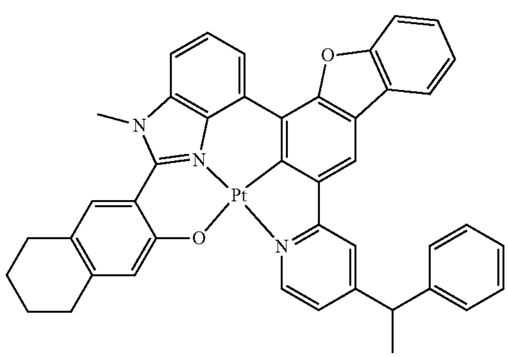
280
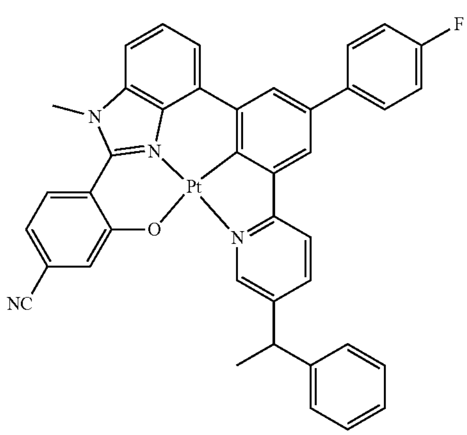
-continued
281
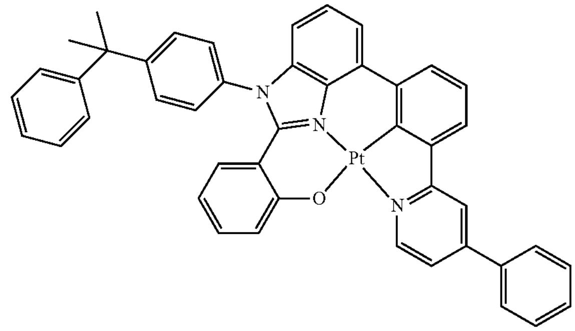
282
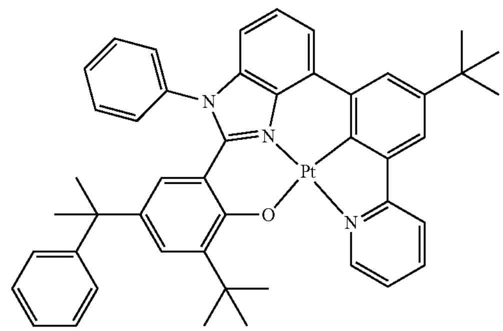
283
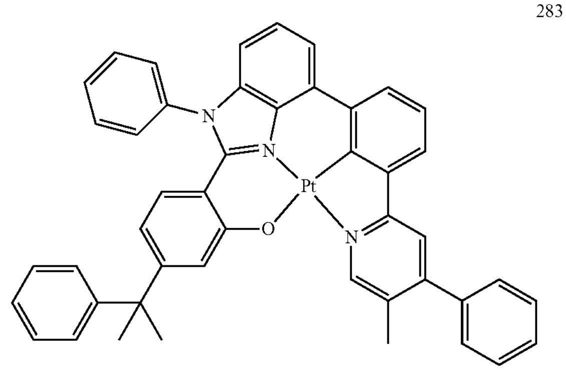
284
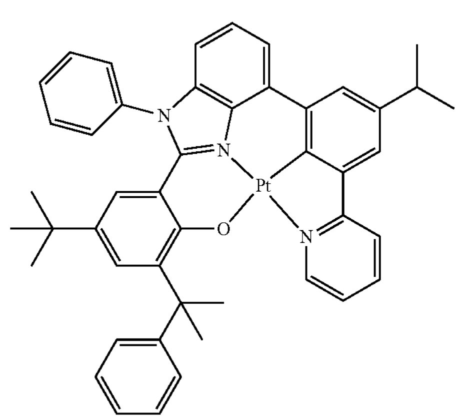

-continued
285
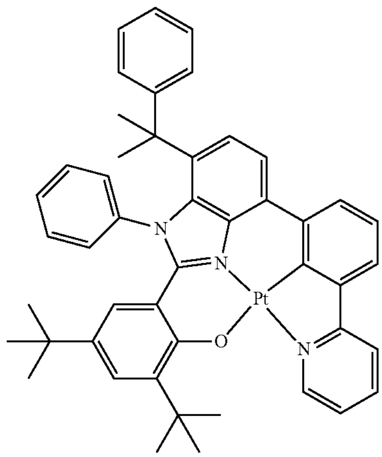
286
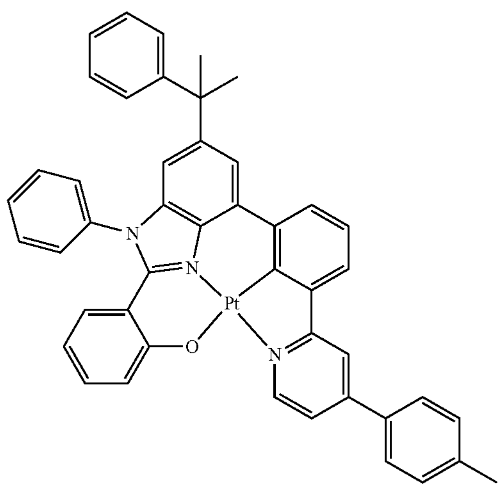
287
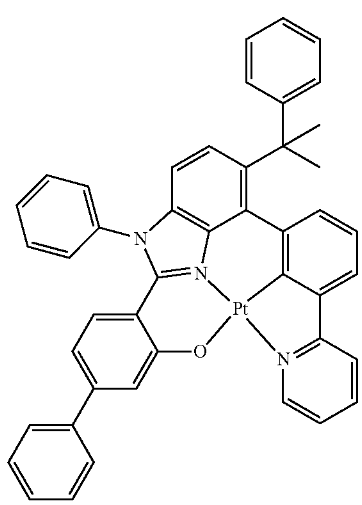
-continued
288
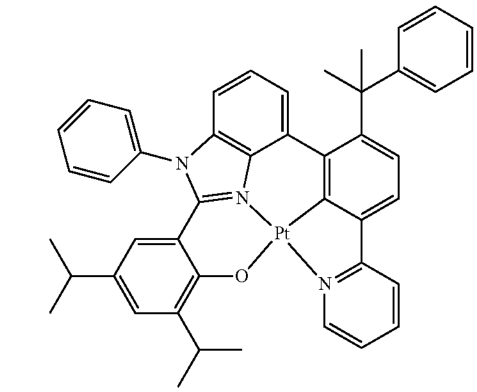
289
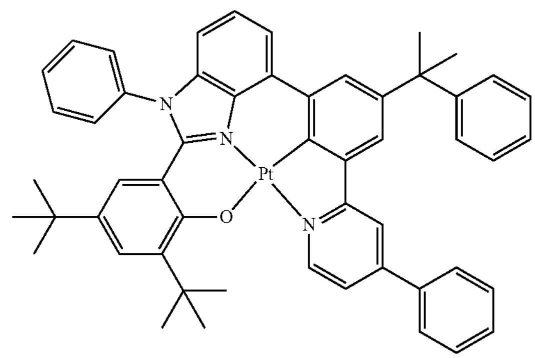
290
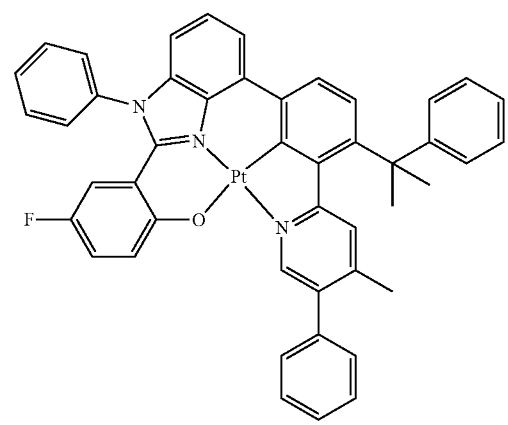
291
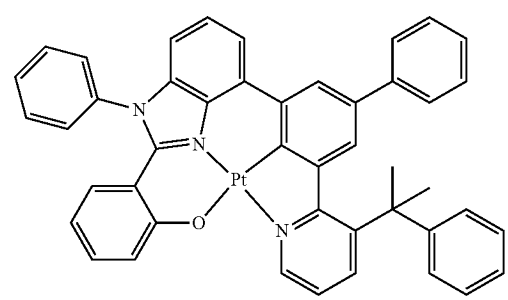

-continued
292
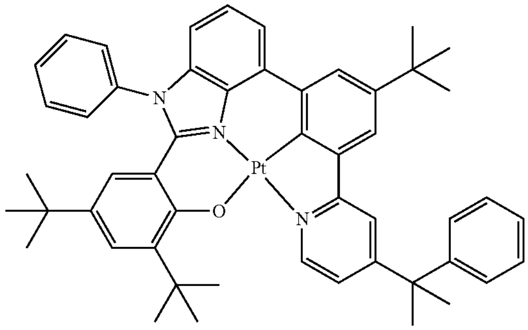
293
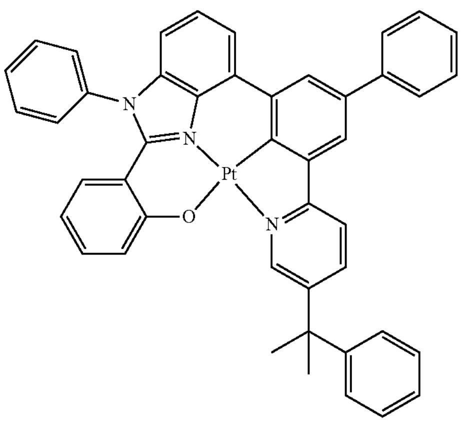
294
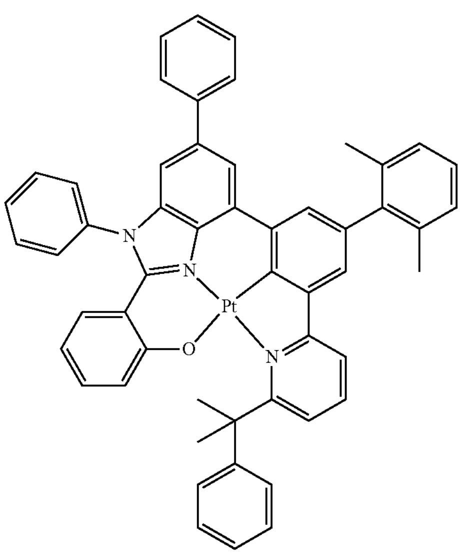
-continued
295
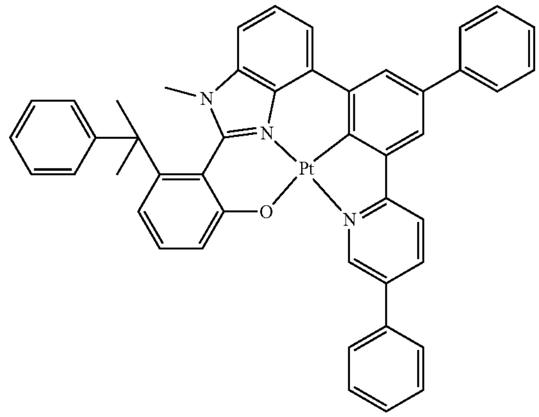
296
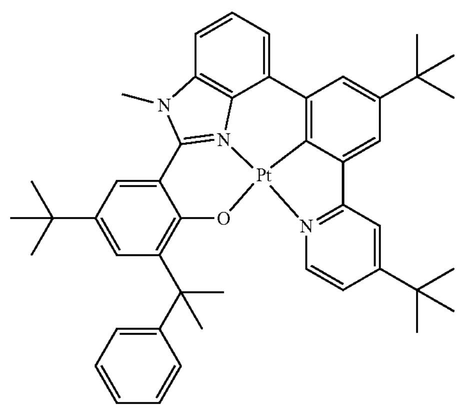
297
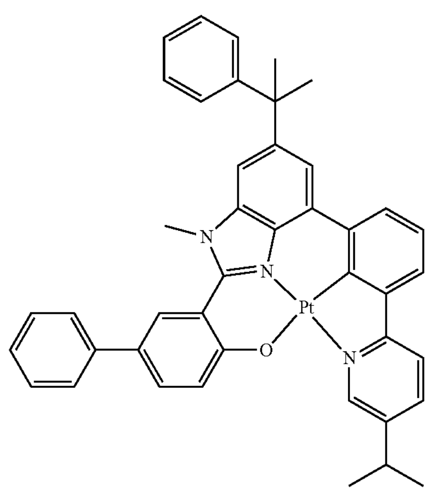

-continued
298
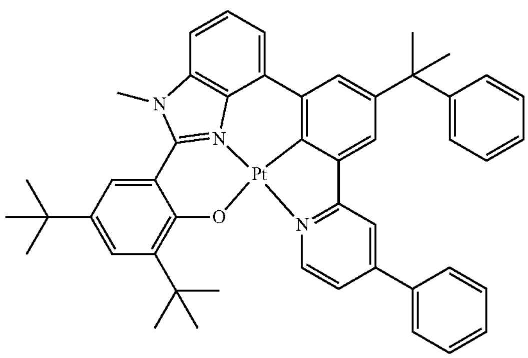
299
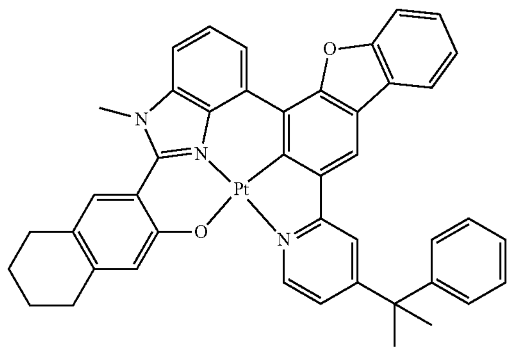
300
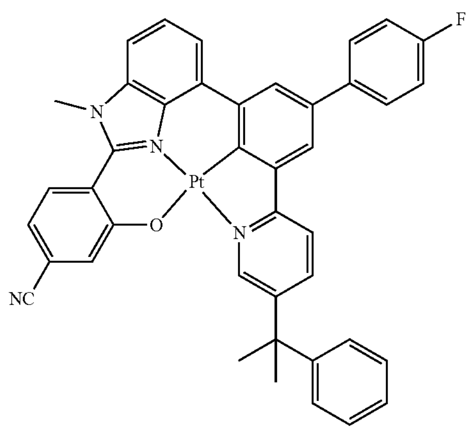
301
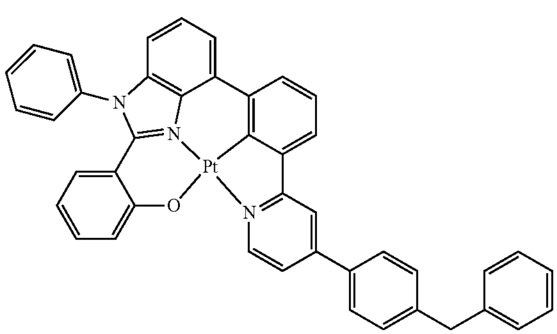
-continued
302
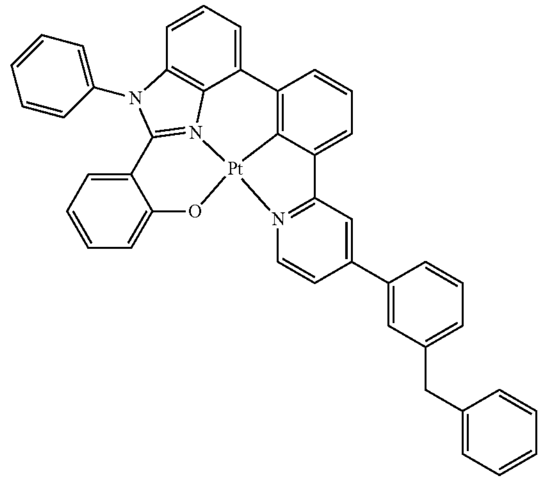
303
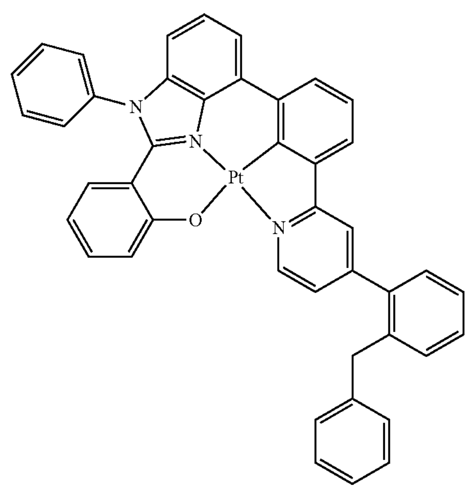
304
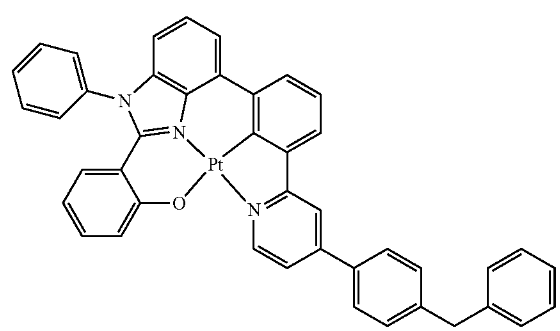

305
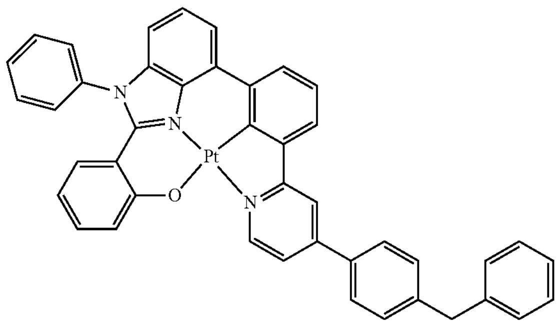
306
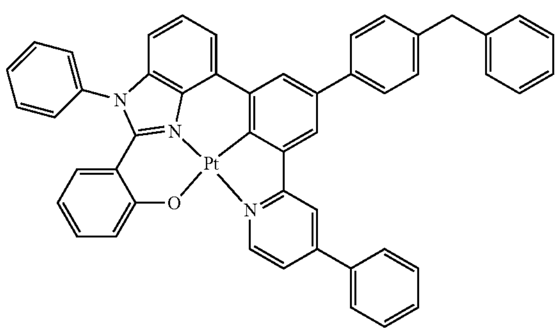
307
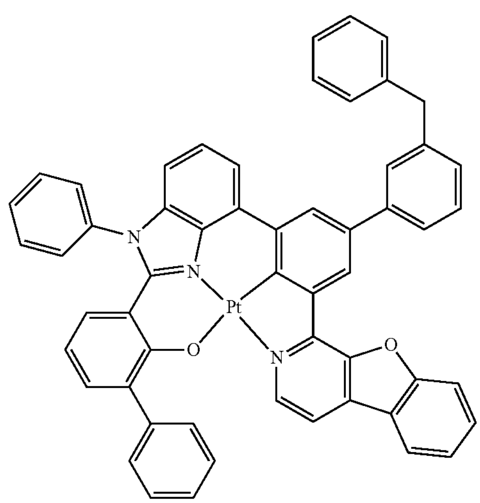
308
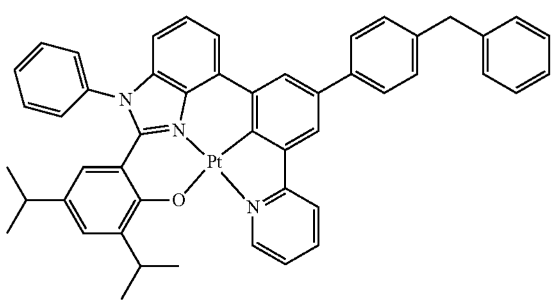
309
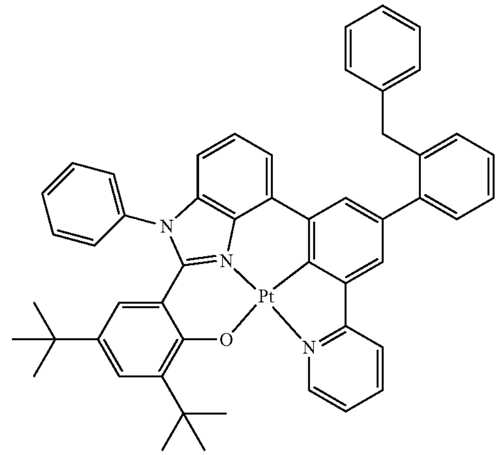
310
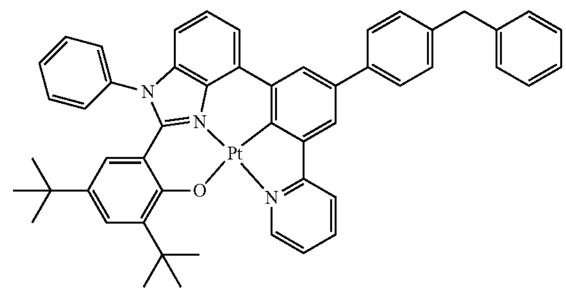
311
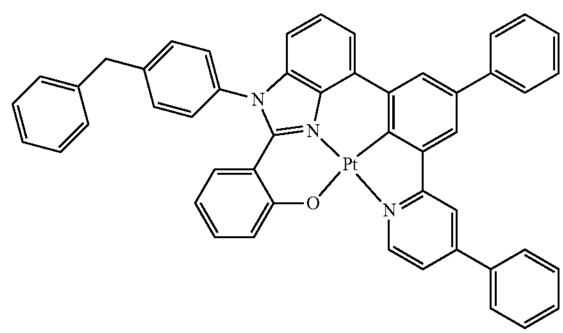
312
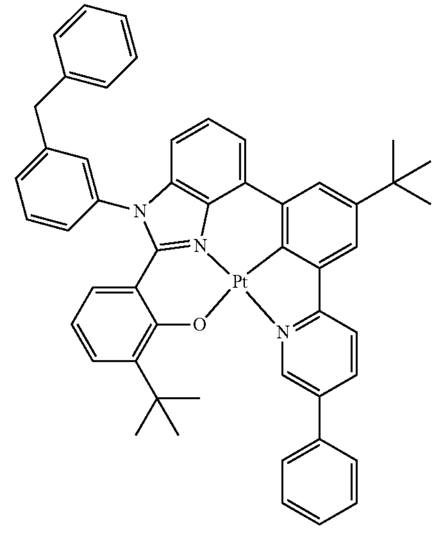

-continued
313
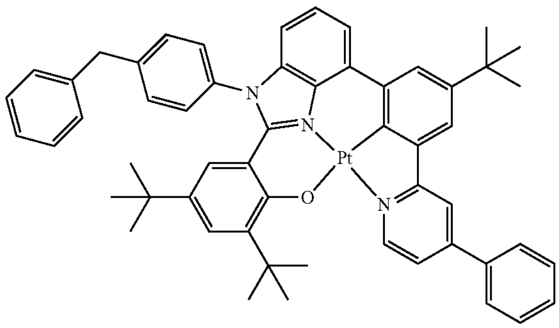
314
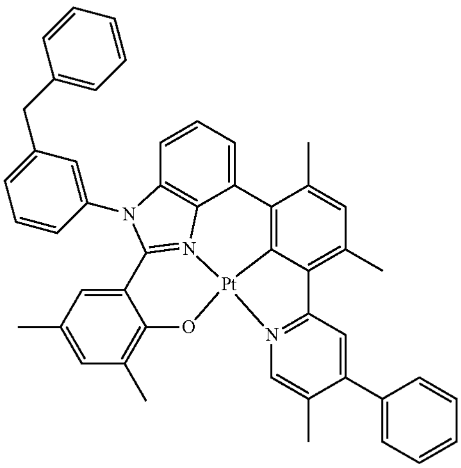
315
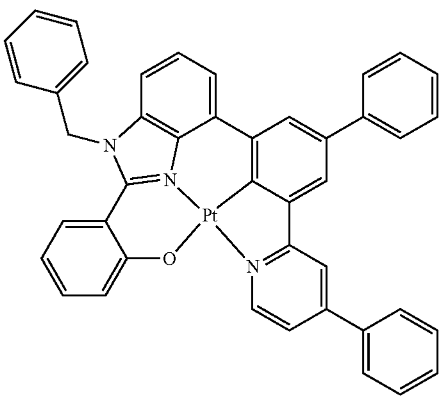
316
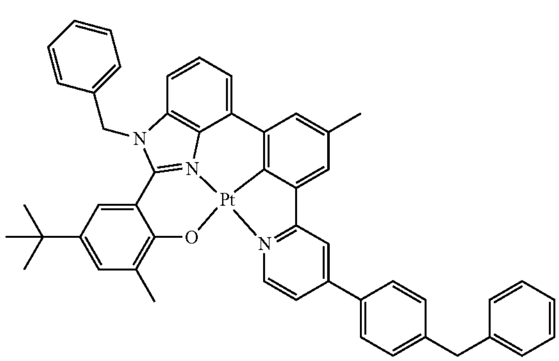
-continued
317
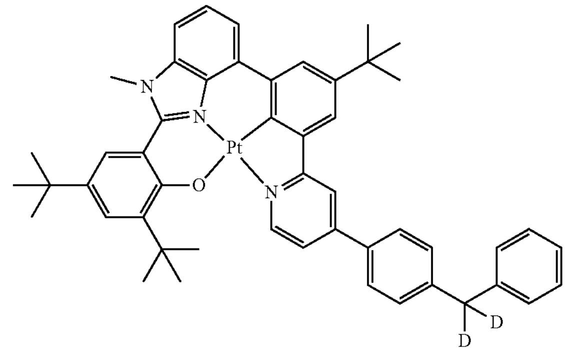
318
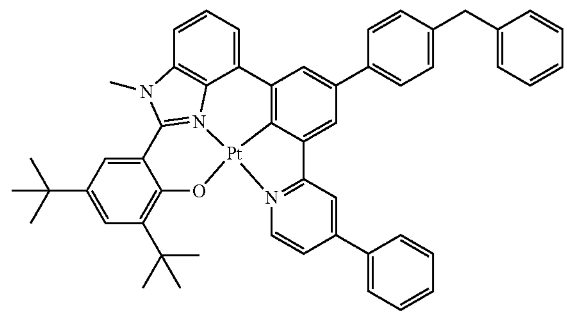
319
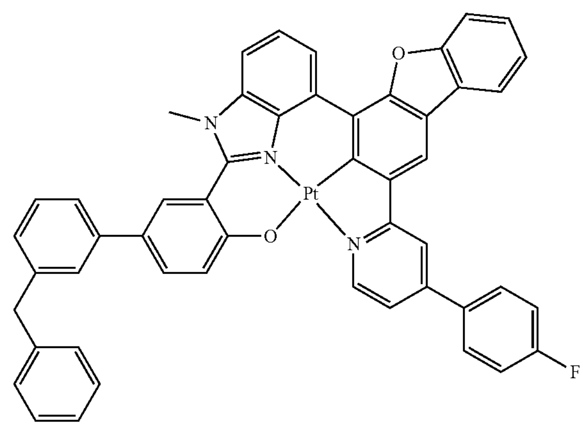
320
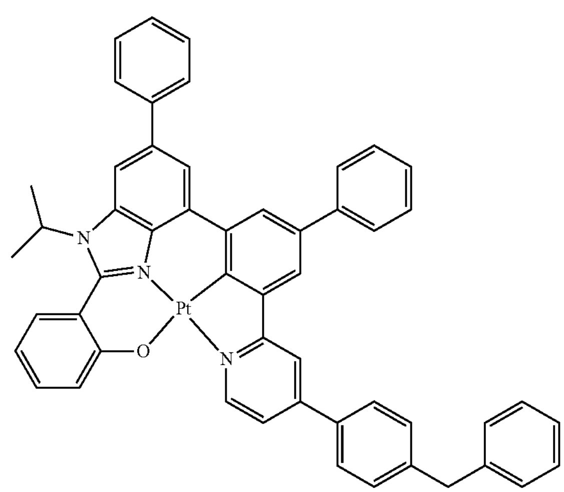

-continued
321
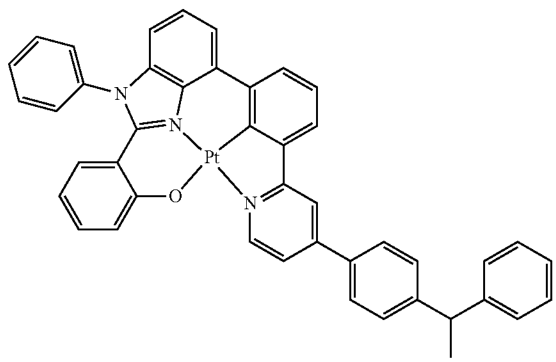
322
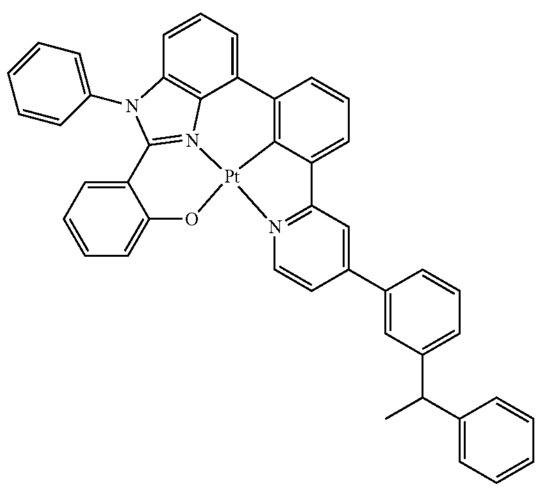
323
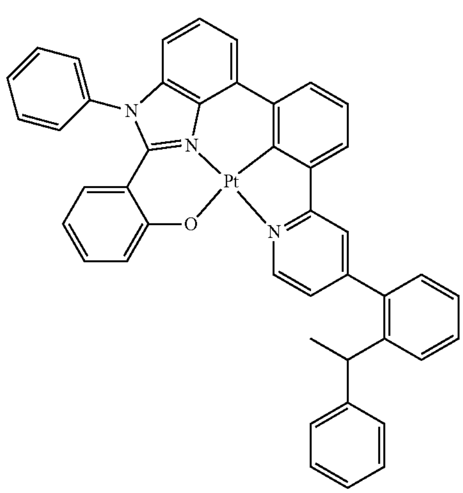
-continued
324
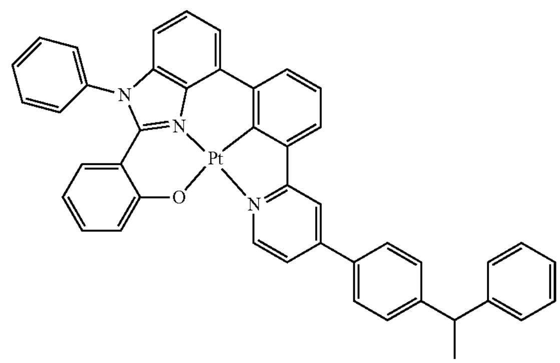
325
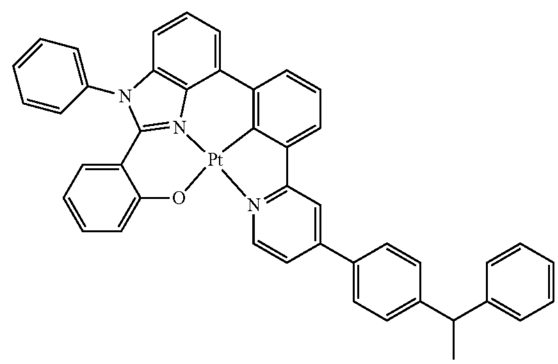
326
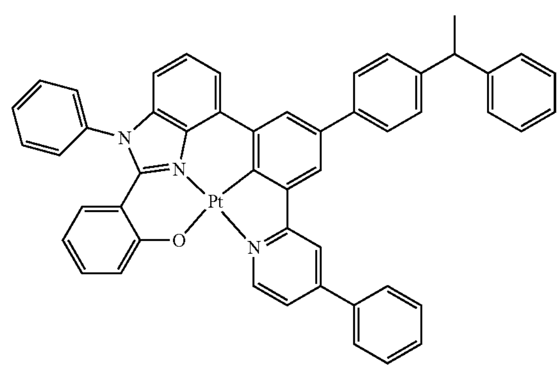
327
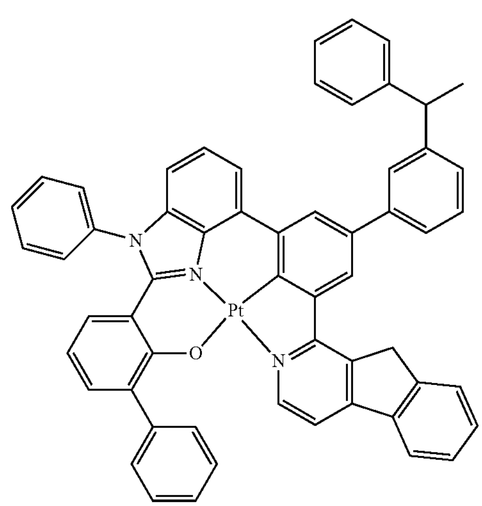

-continued
328
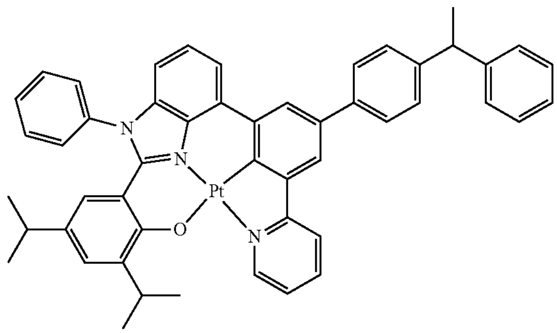
329
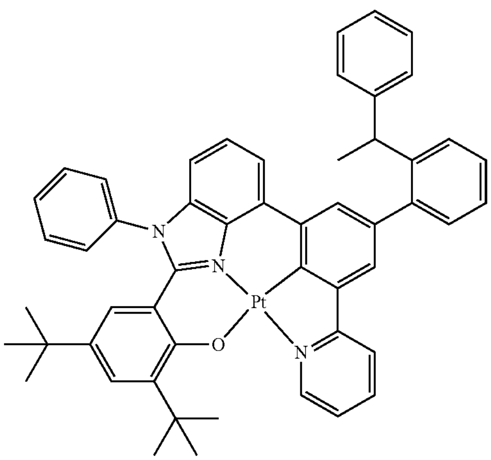
330
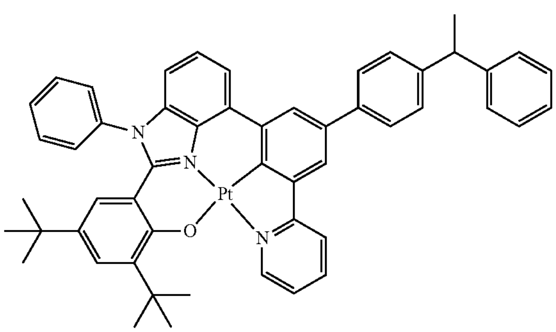
331
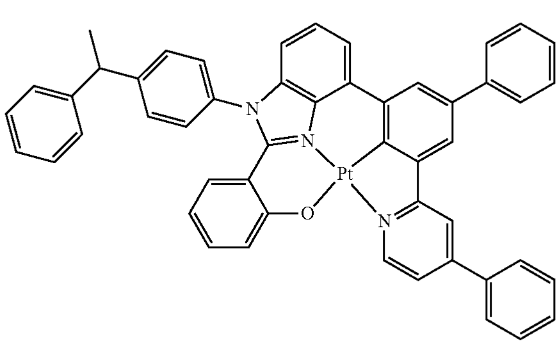
-continued
332
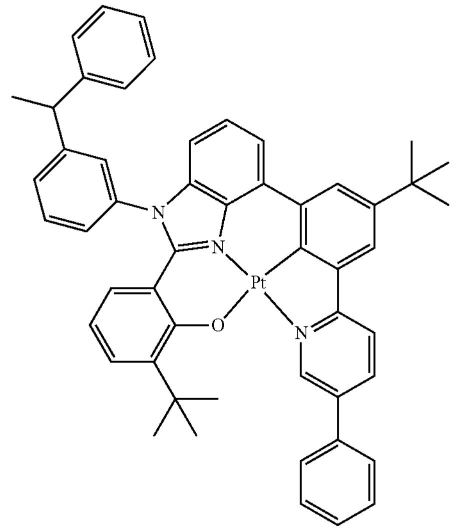
333
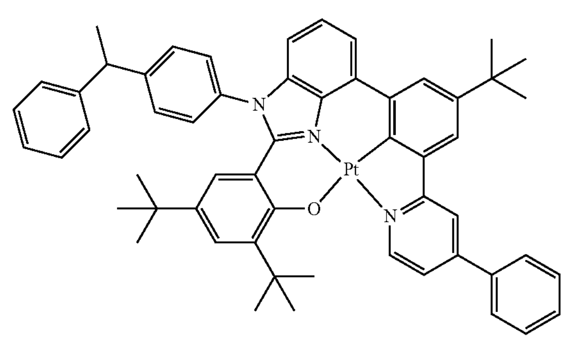
334
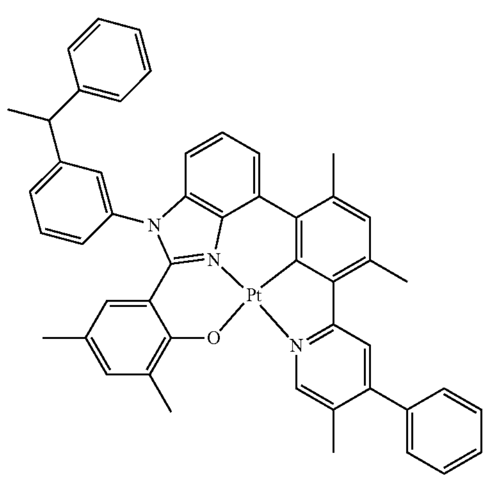

-continued
335
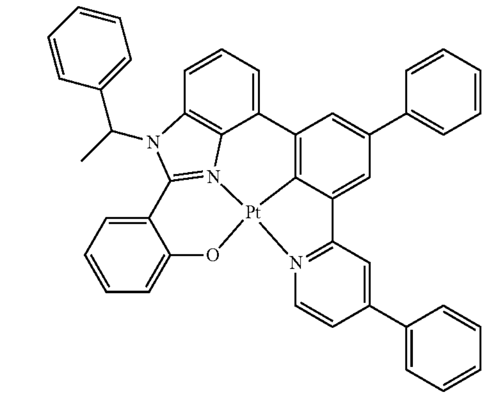
336
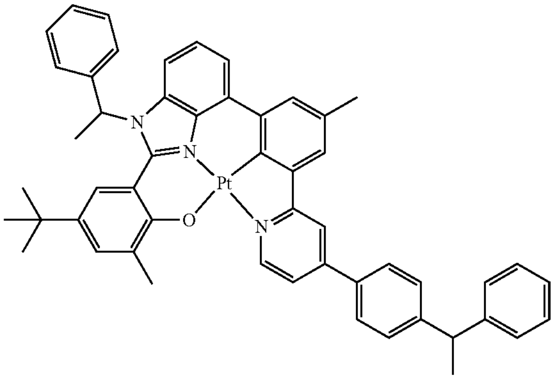
337
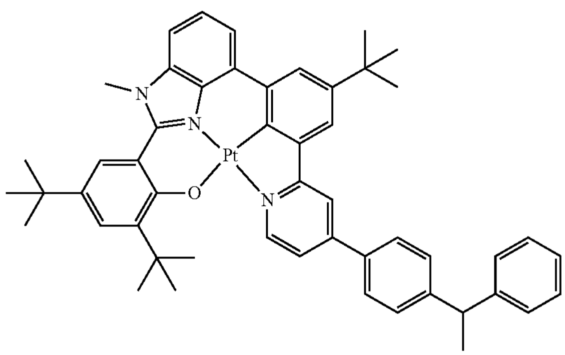
338
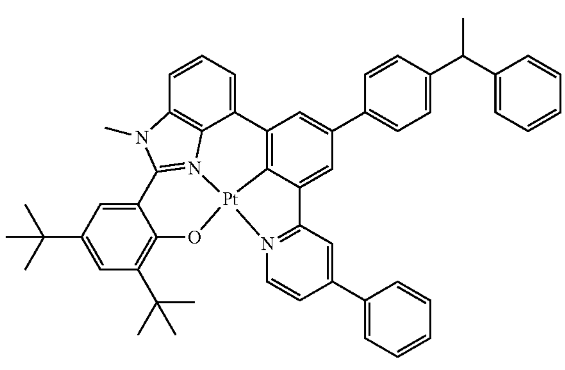
-continued
339
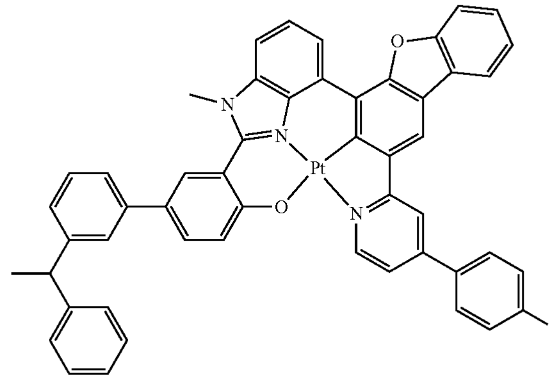
340
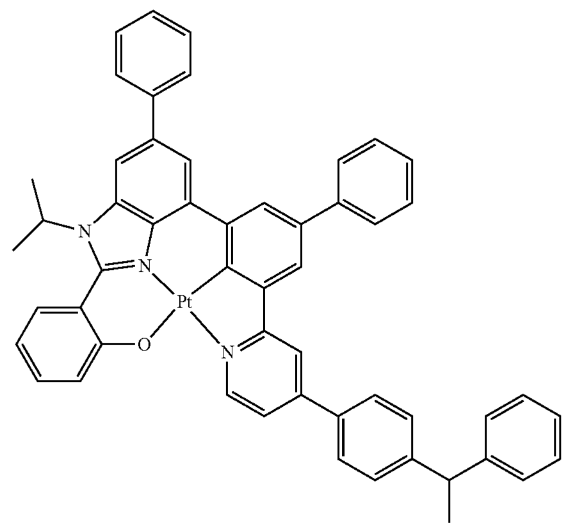
341
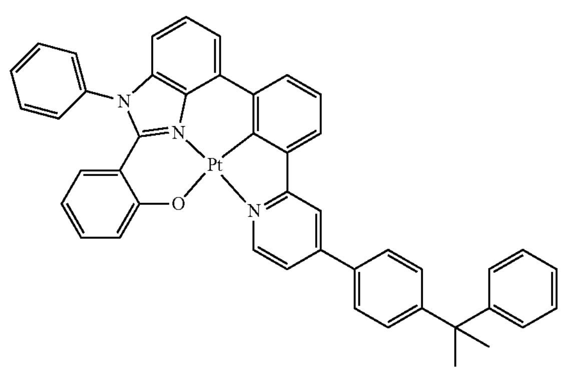

-continued
342
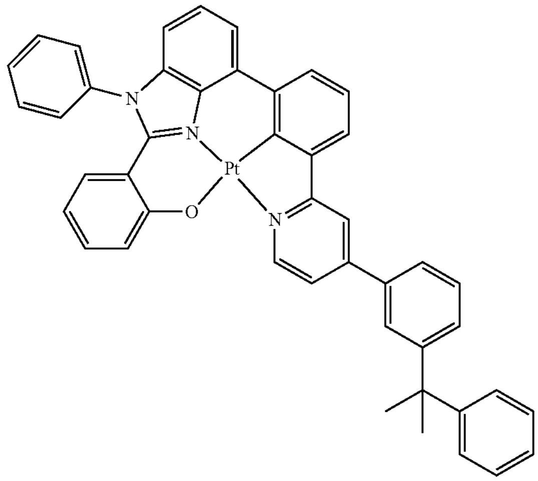
343
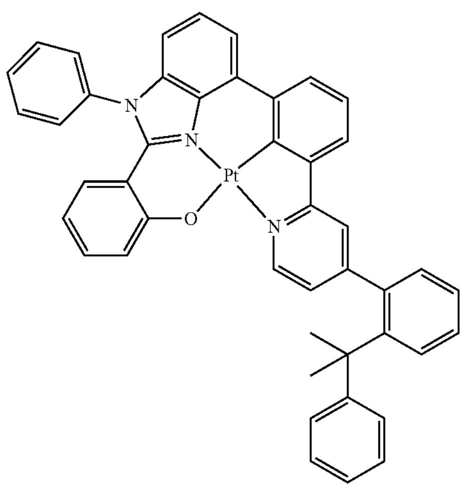
344
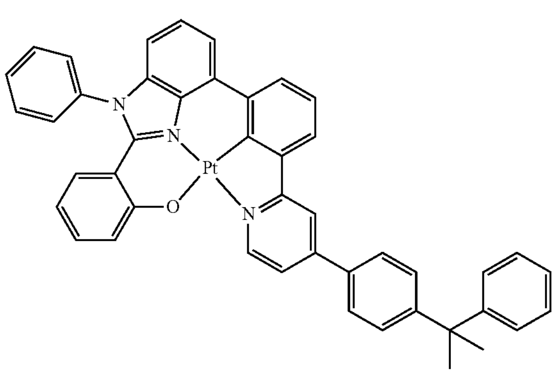
-continued
345
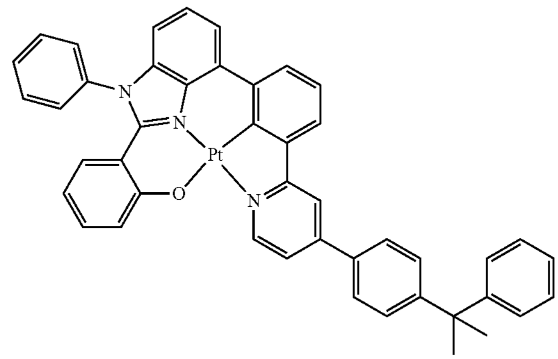
346
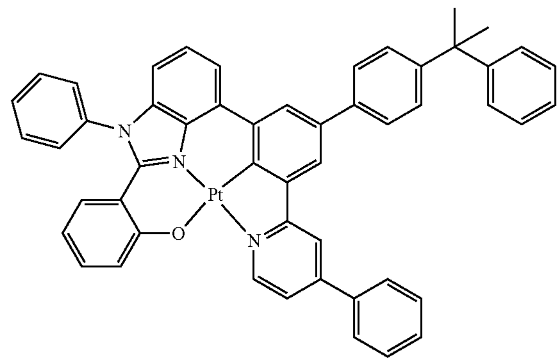
347
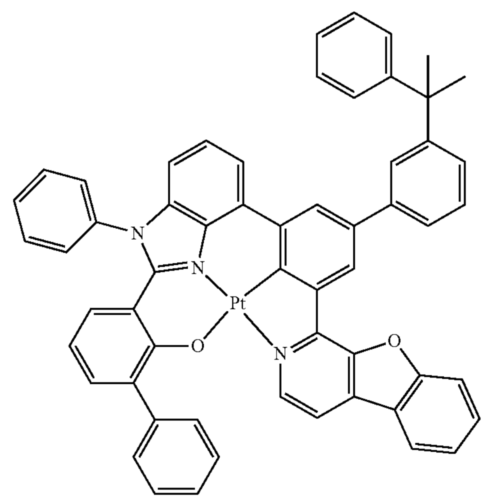
348
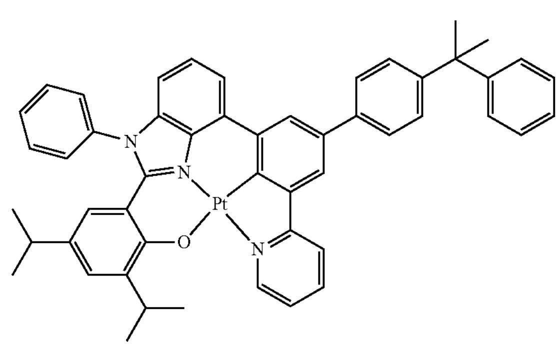

349
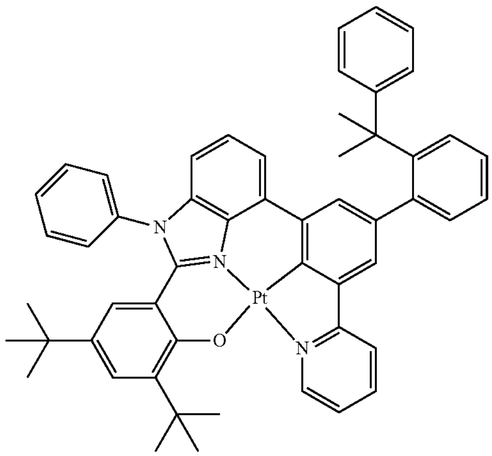
350
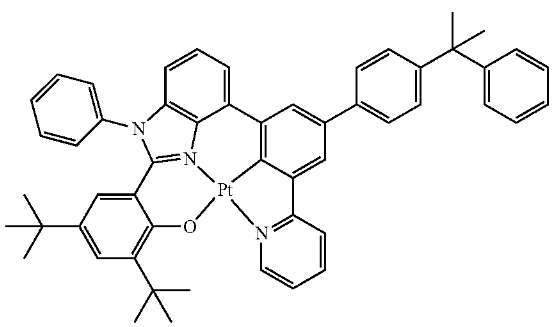
351
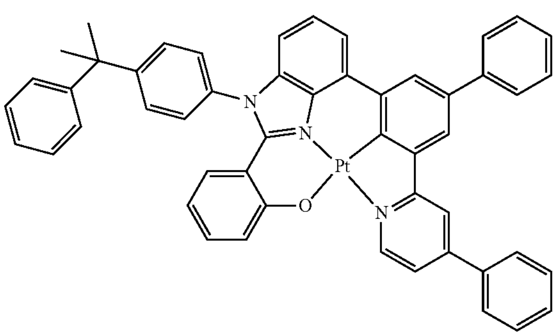
352
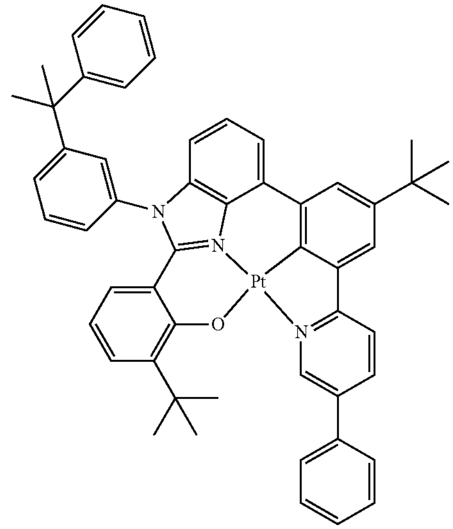
353
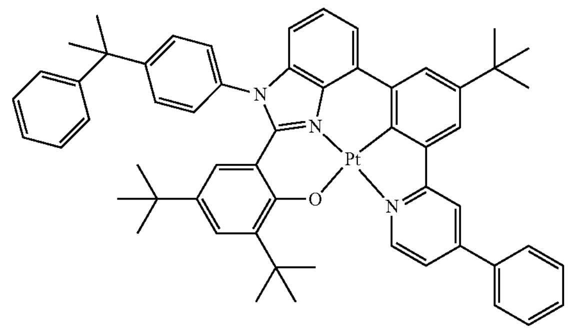
354
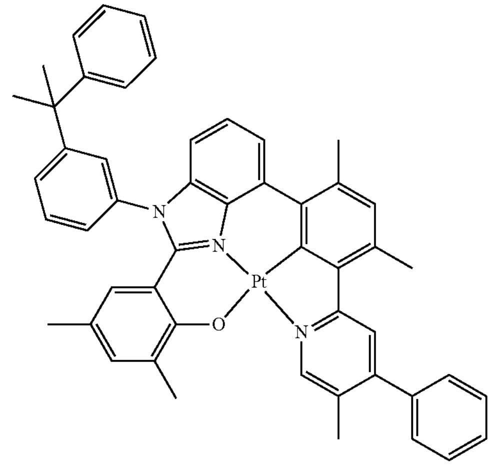

355
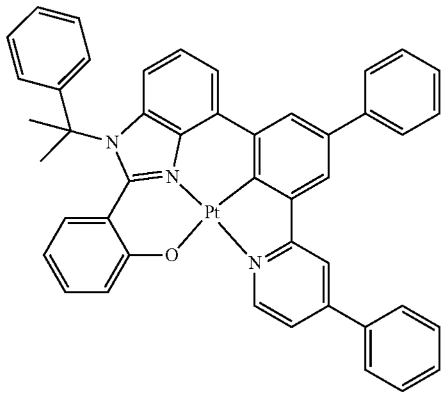
356
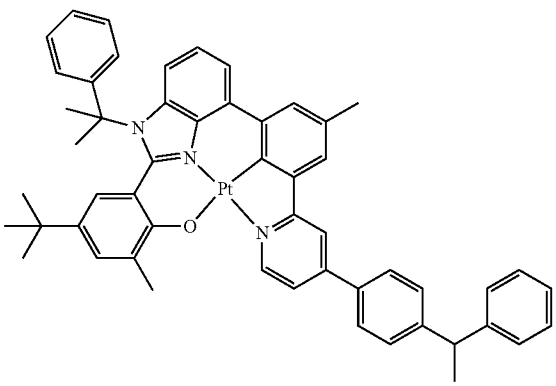
357
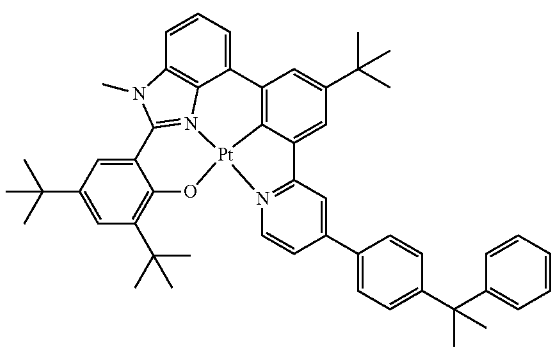
358
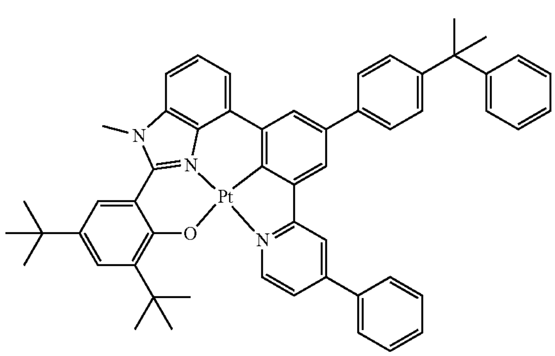
359
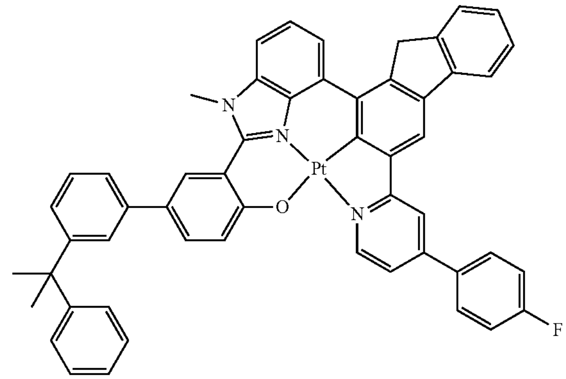
360
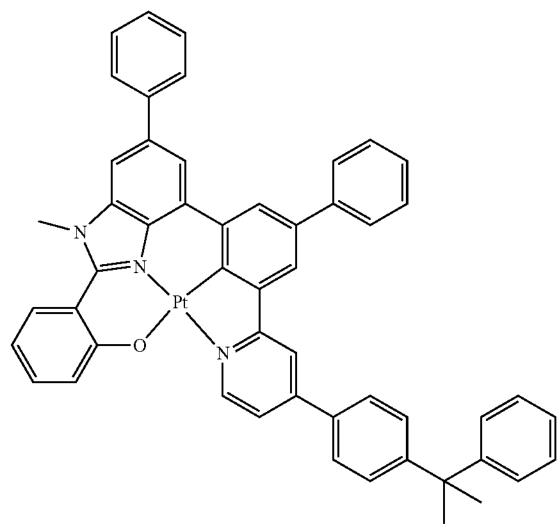
361
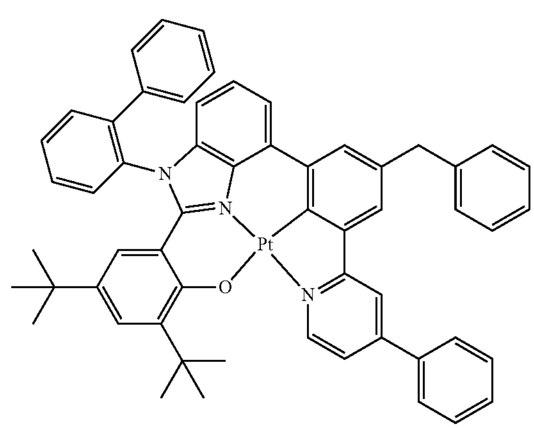

-continued
362
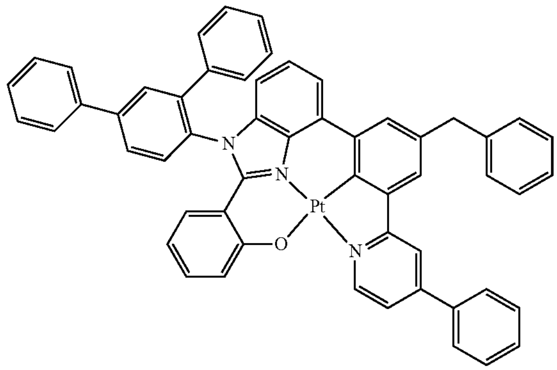
363
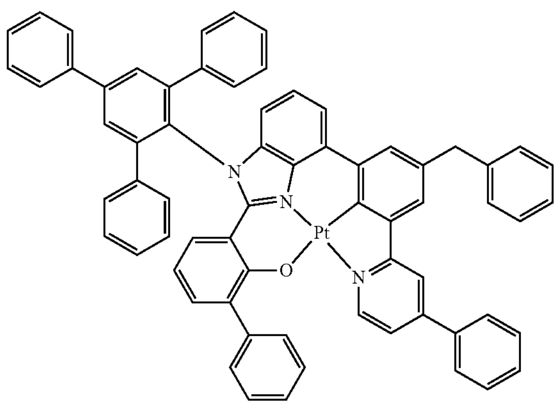
364
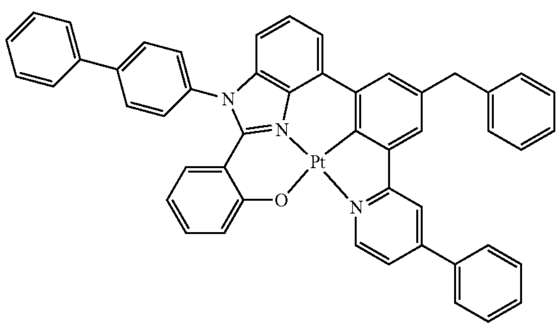
365
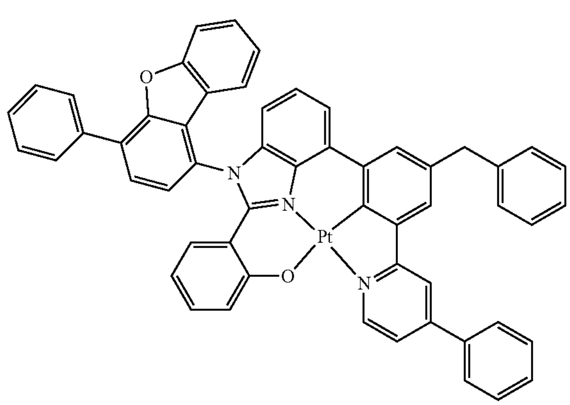
-continued
366
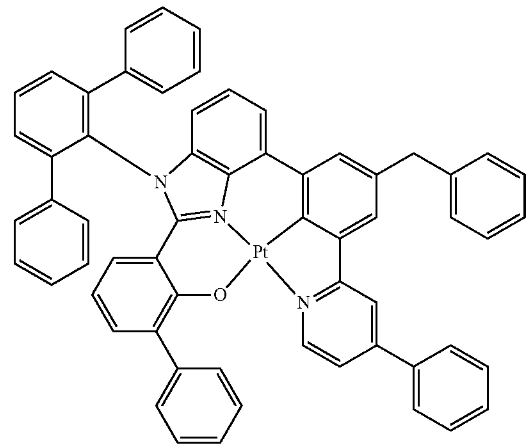
367
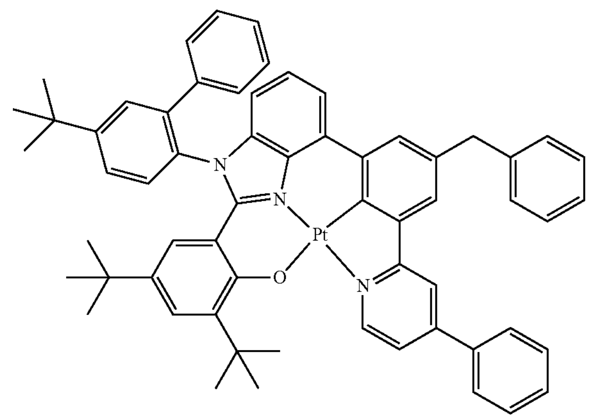
368
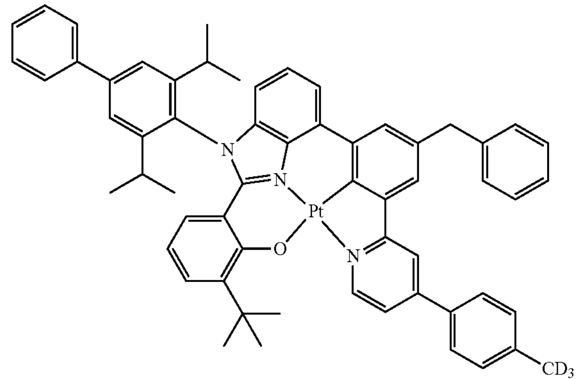

-continued
369
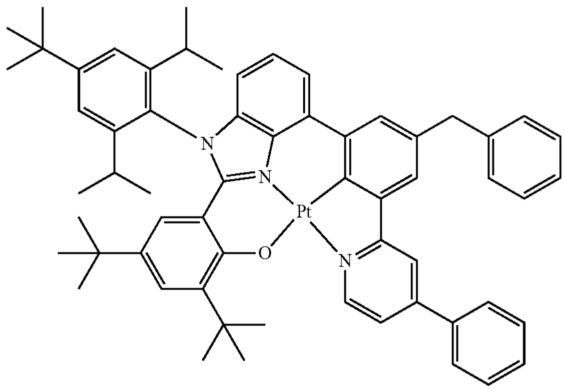
370
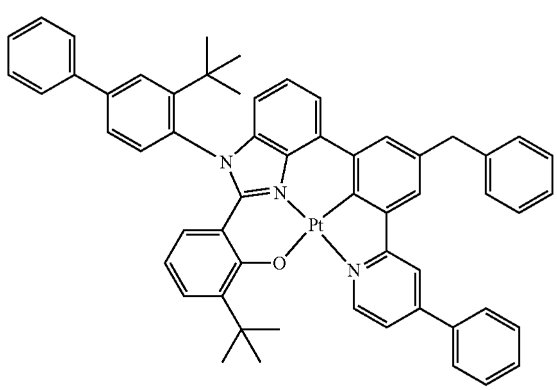
371
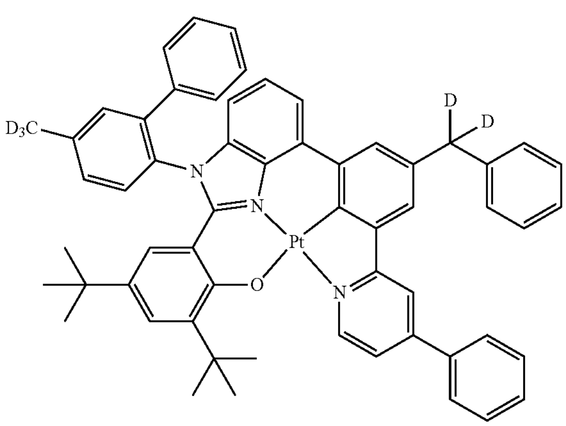
-continued
372
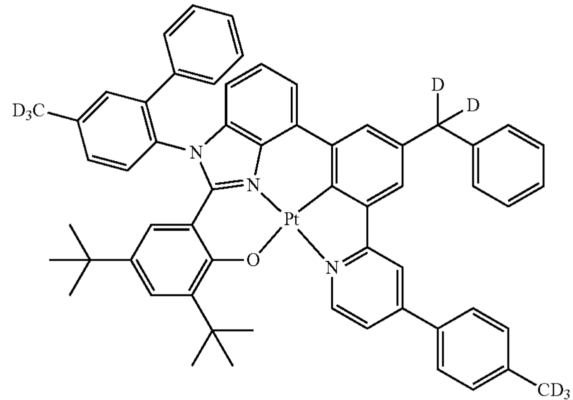
373
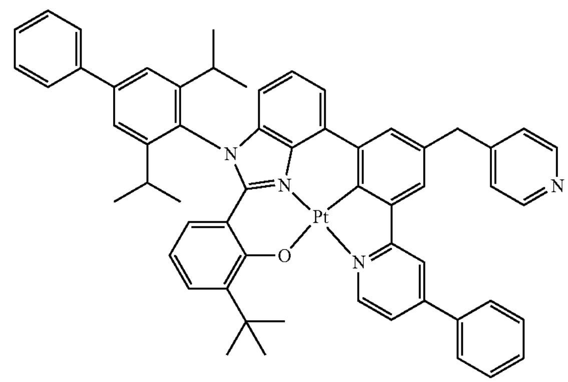
374
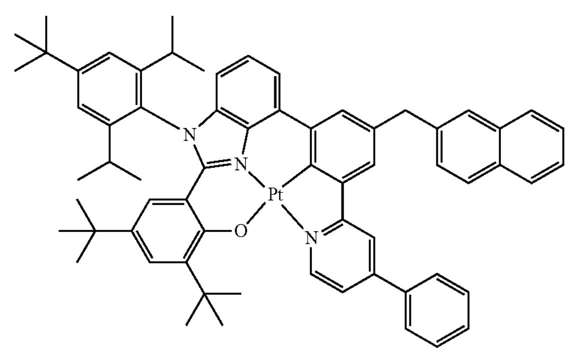
375
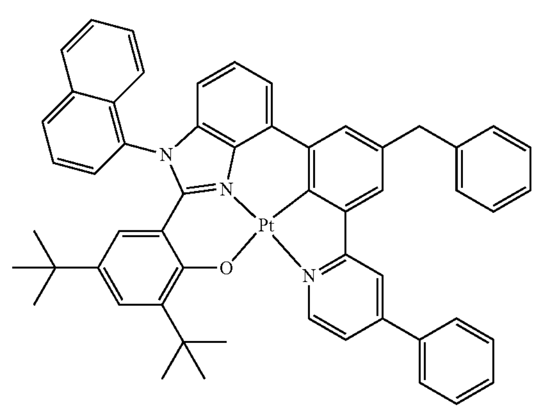

-continued
376
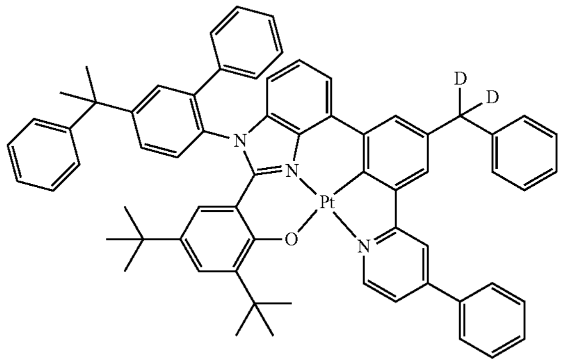
377
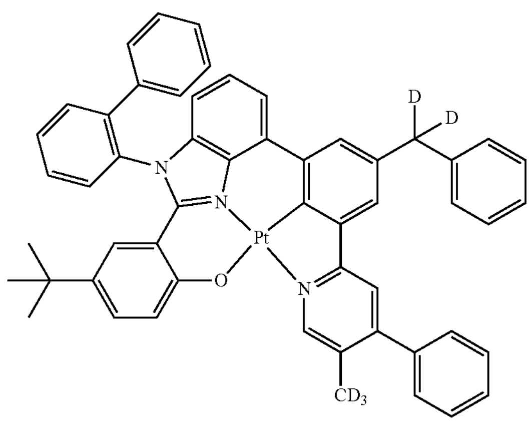
378
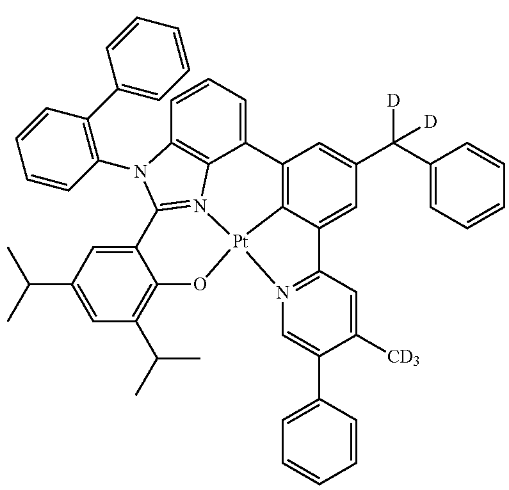
-continued
379
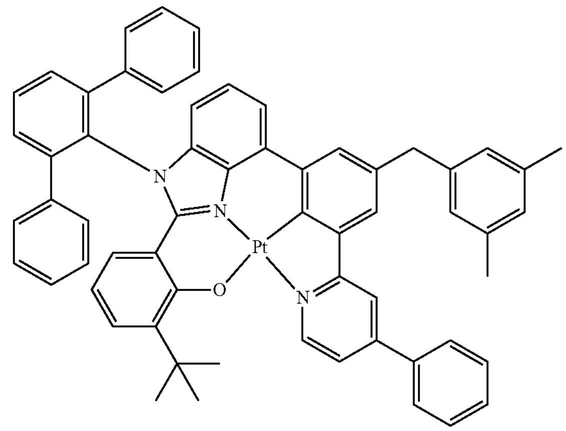
380
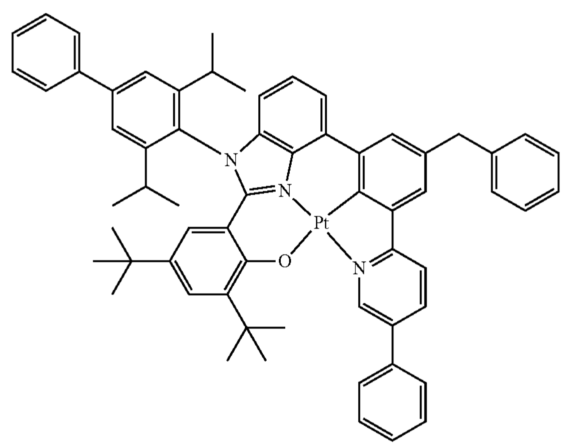
381
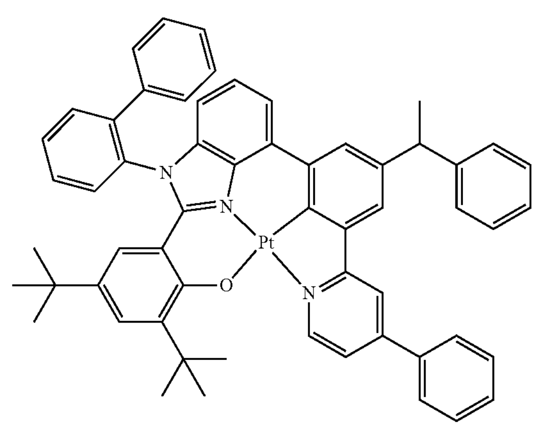

-continued
382
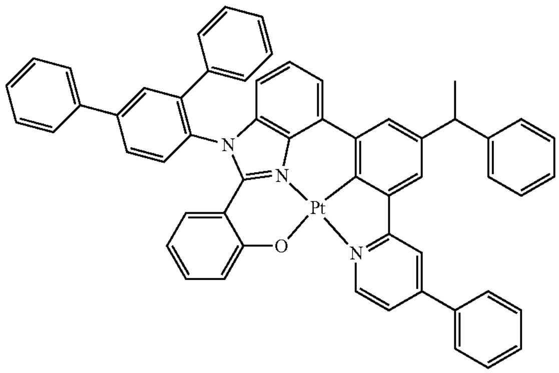
383
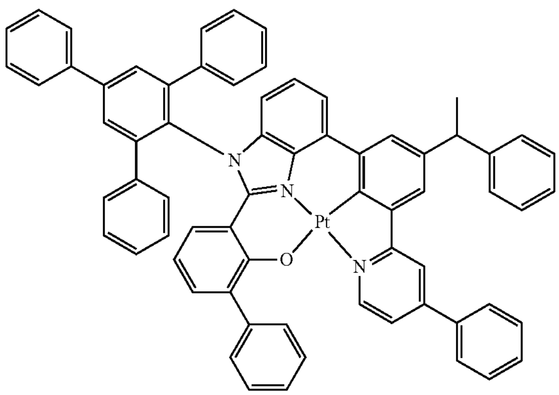
384
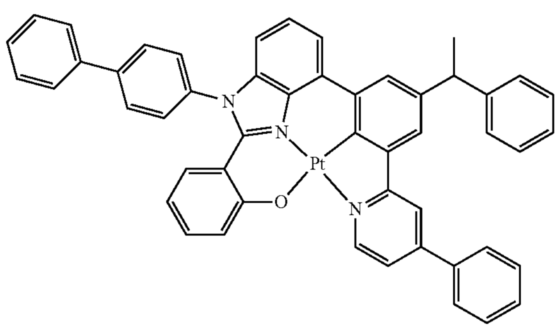
385
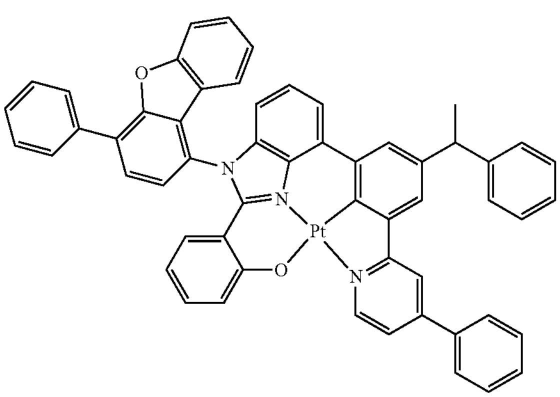
-continued
386
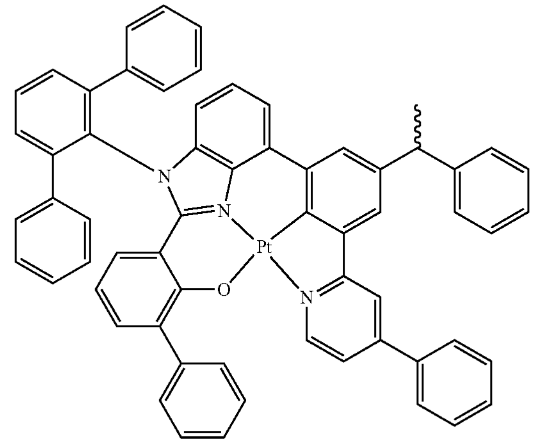
387
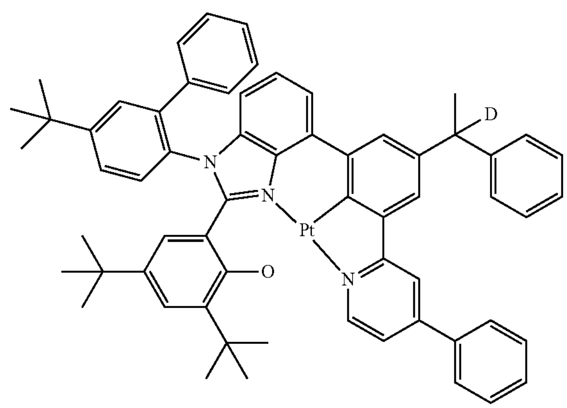
388
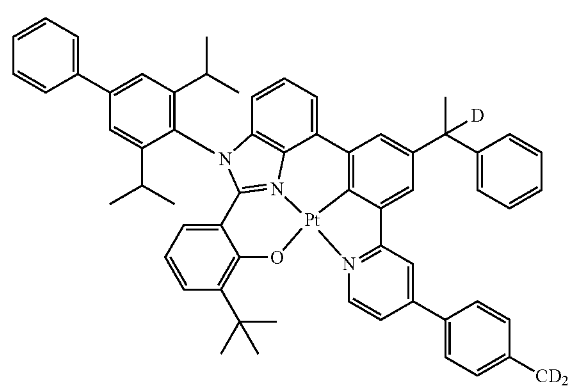

389
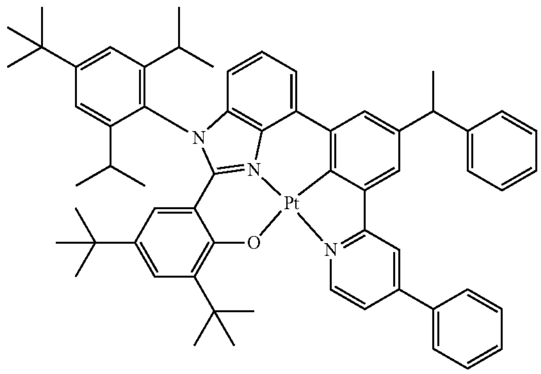
390
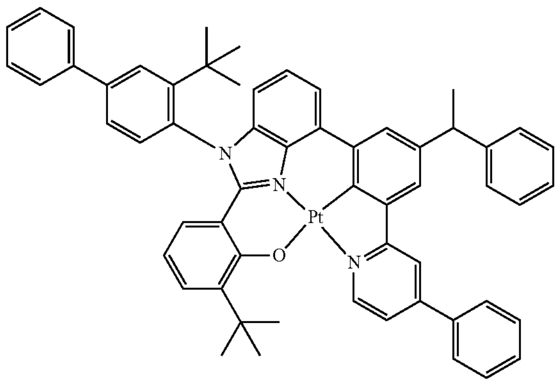
391
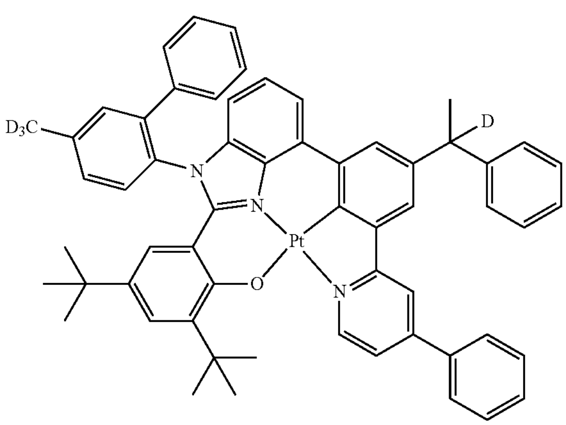
392
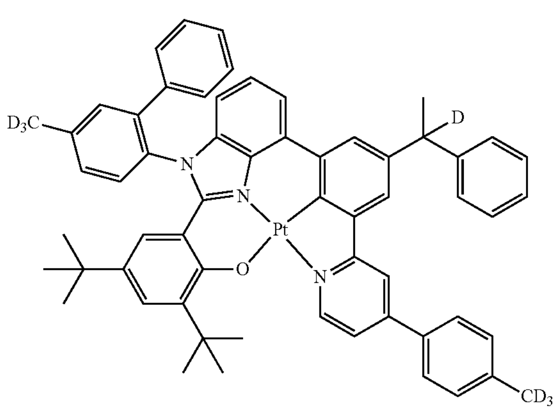
393
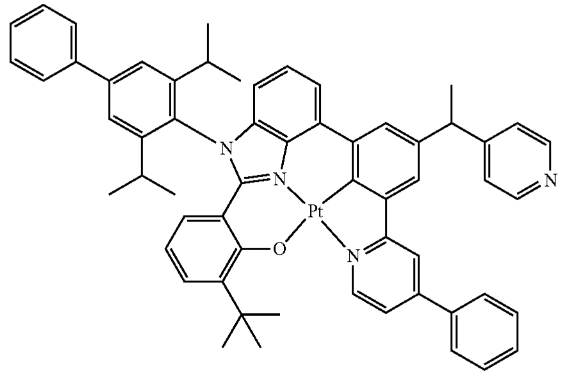
394
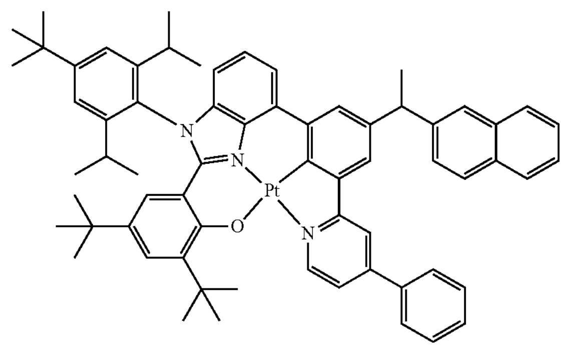
395
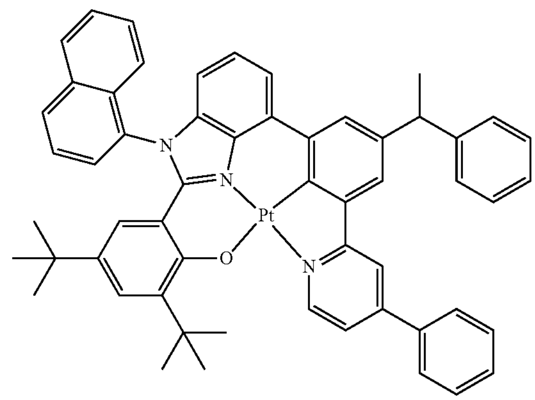
396
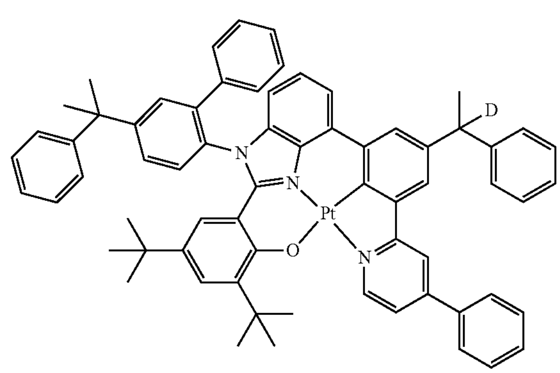

-continued
397
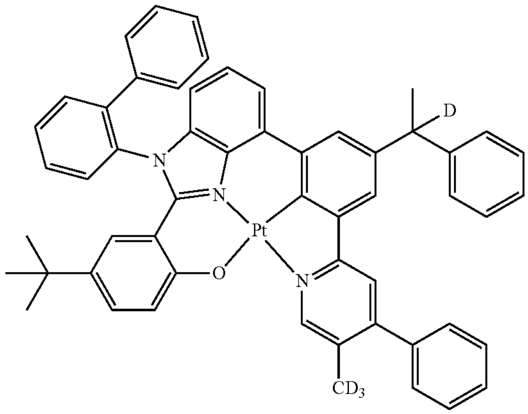
398
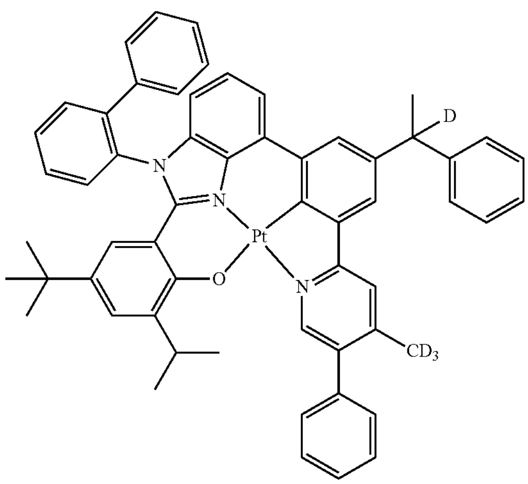
399
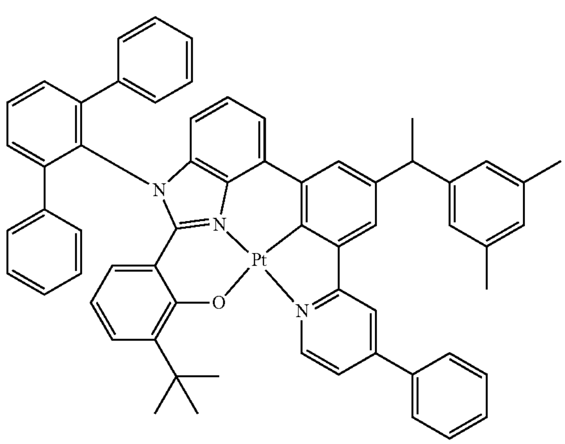
-continued
400
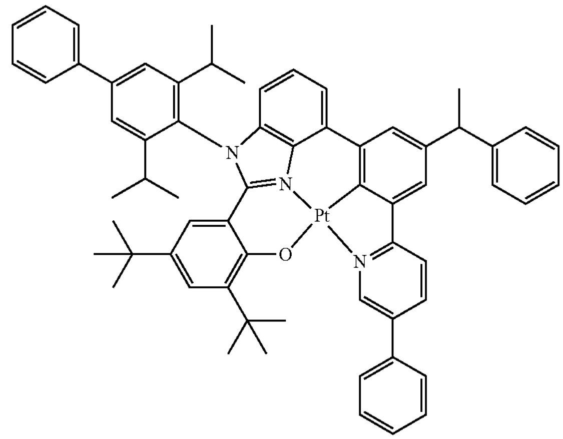
401
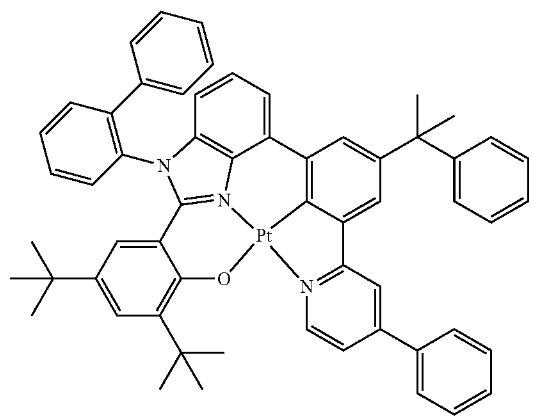
402
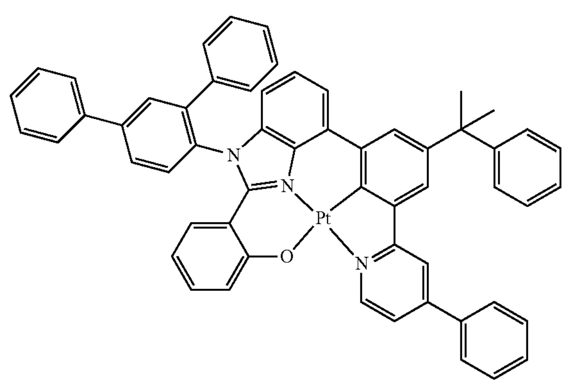

403
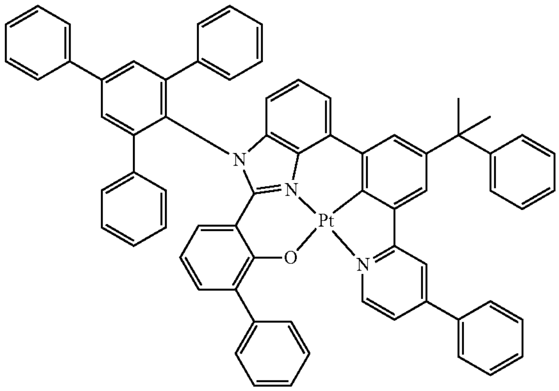
404
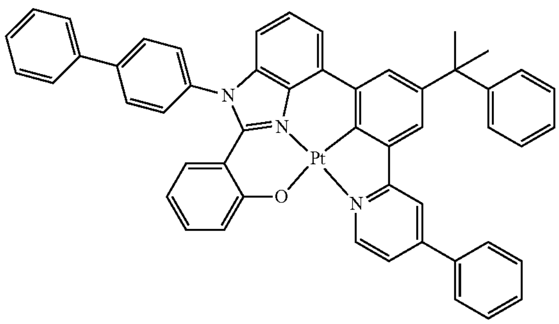
405
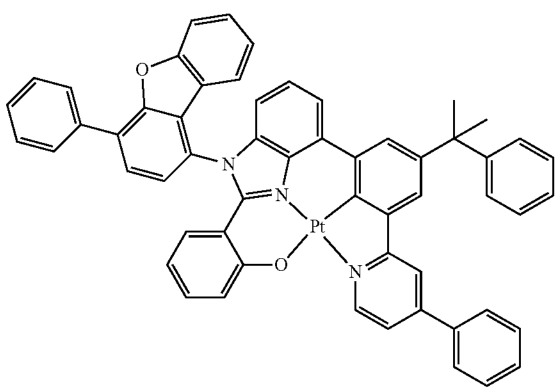
406
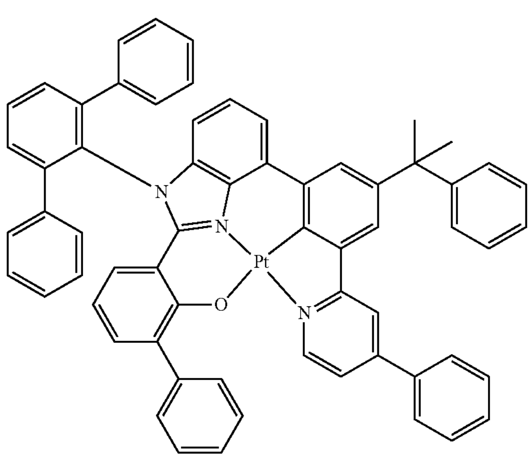
407
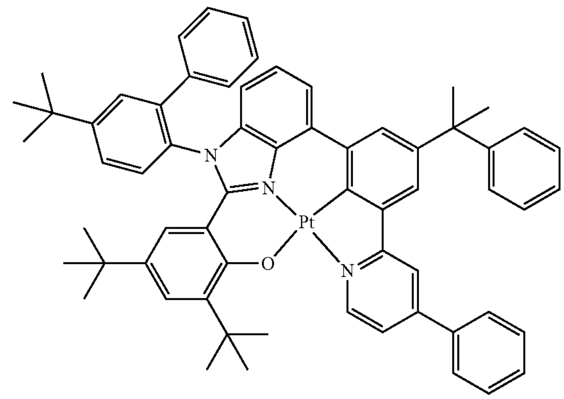
408
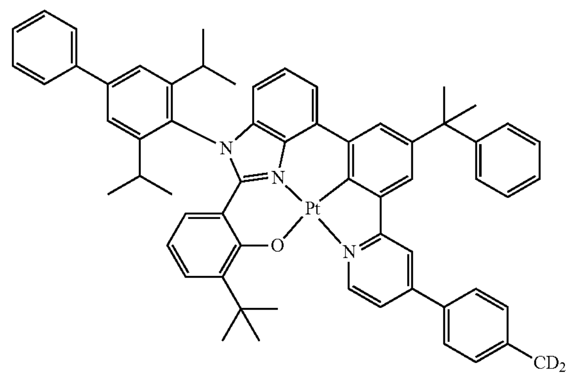
409
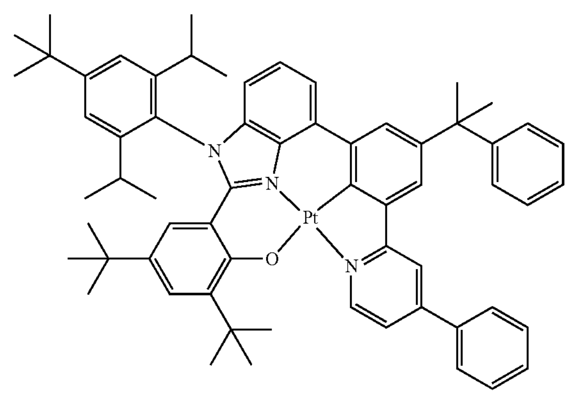
410
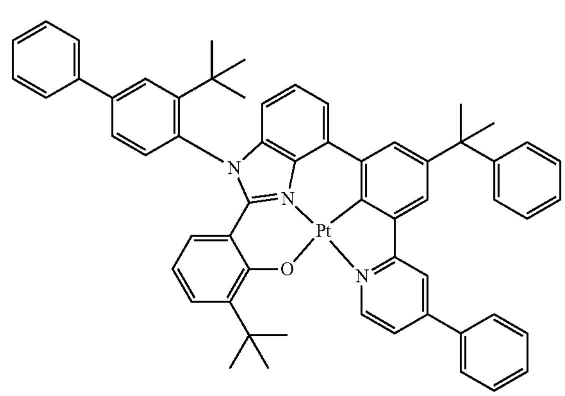

-continued
411
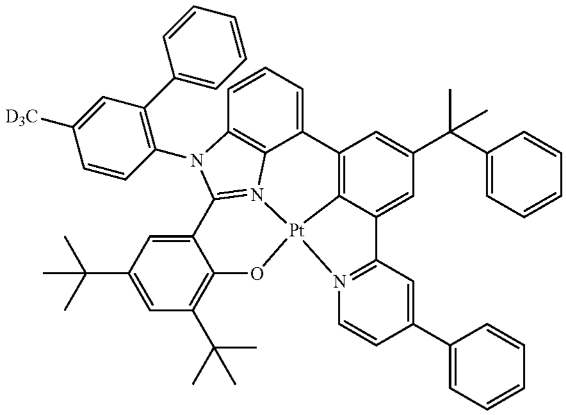
412
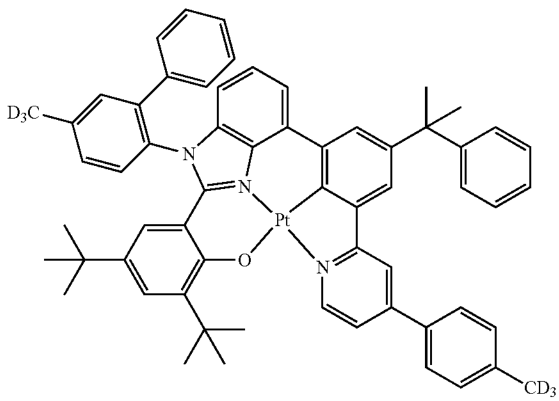
413
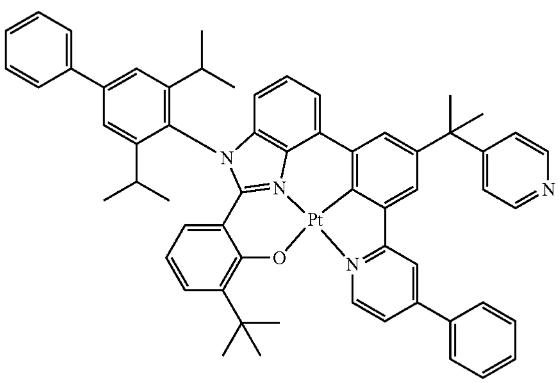
414
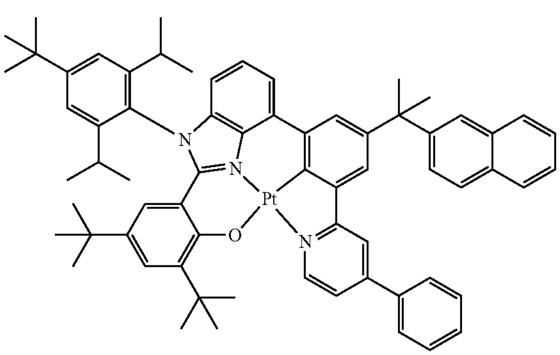
-continued
415
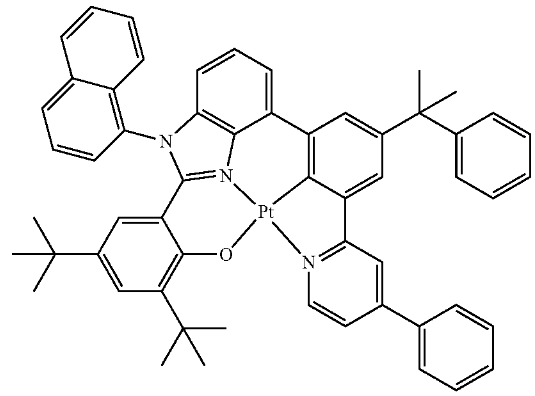
416
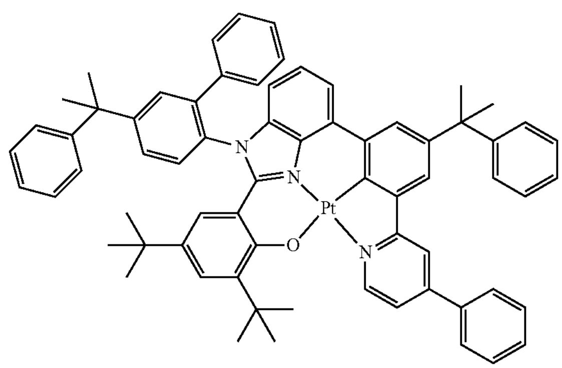
417
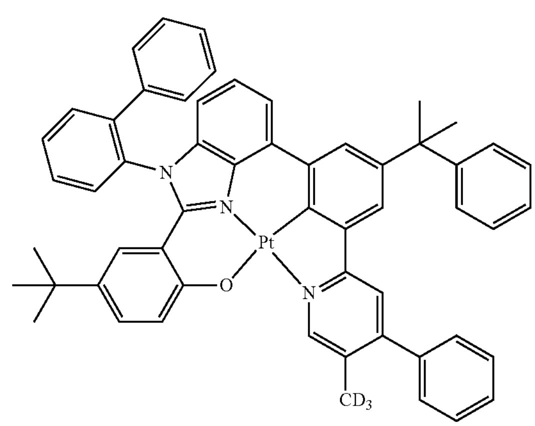

418
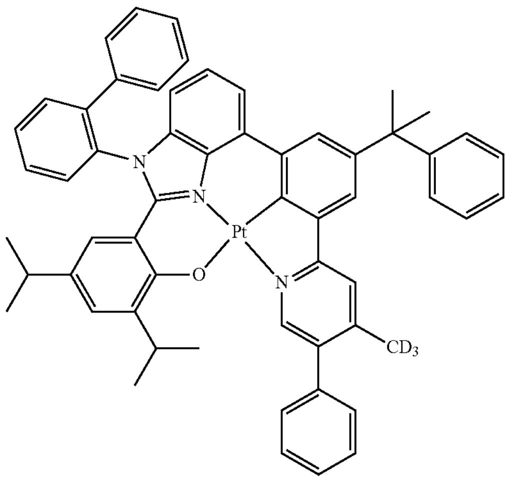
419
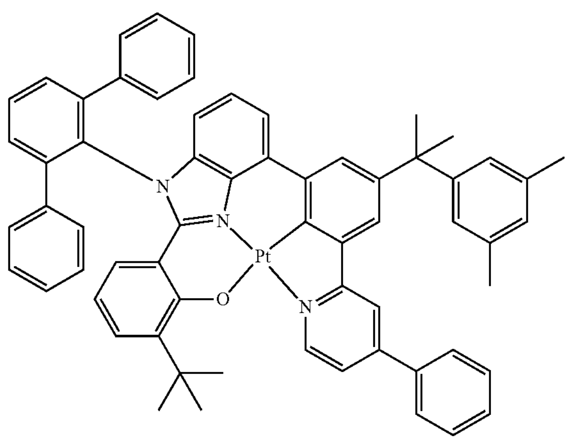
420
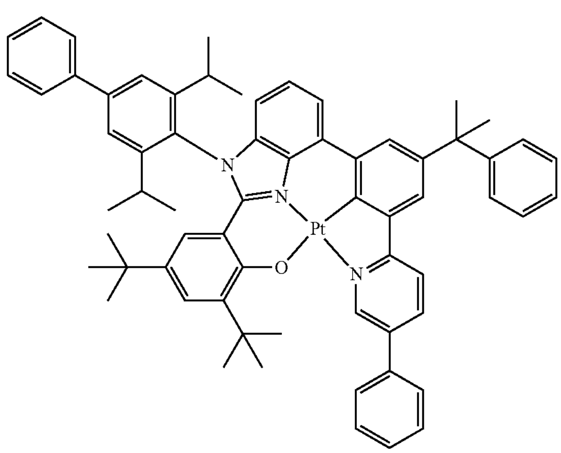
421
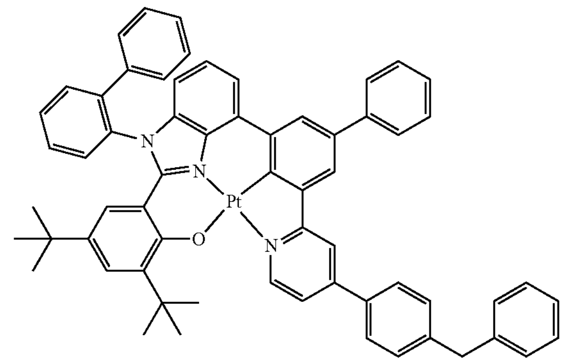
422
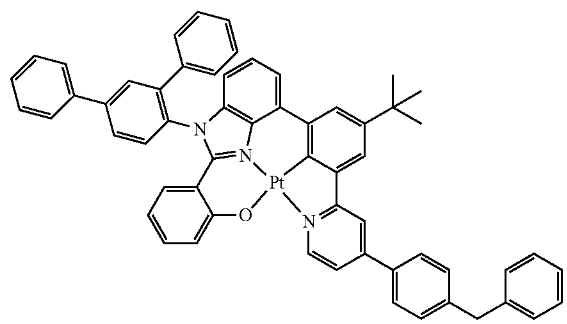
423
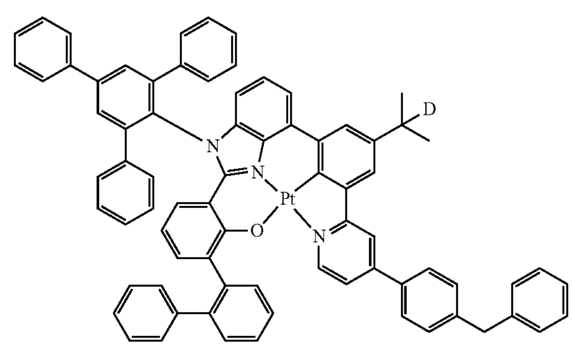
424
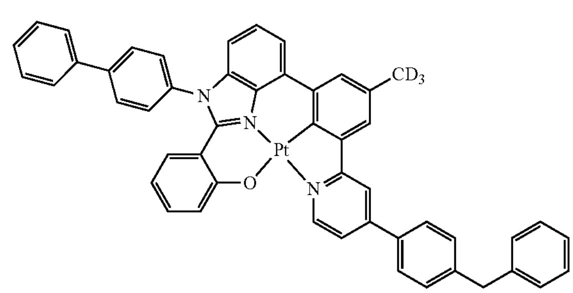

-continued
425
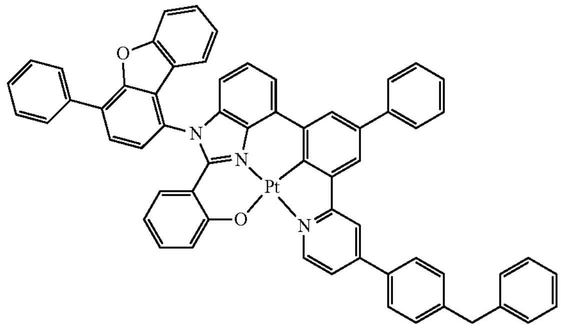
426
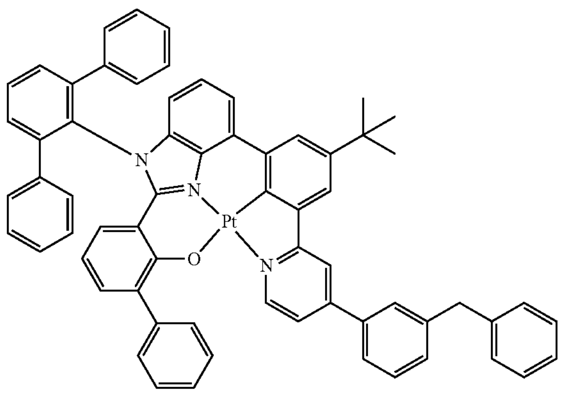
427
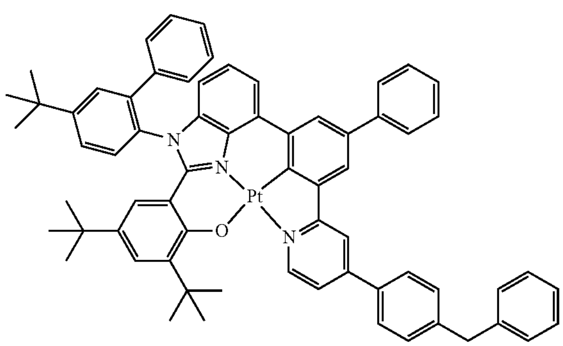
428
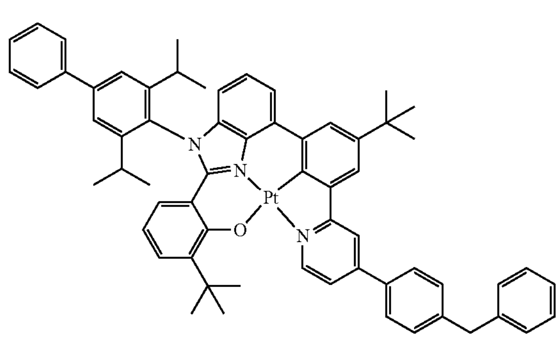
-continued
429
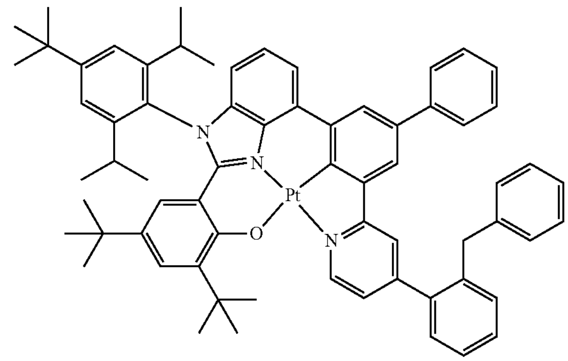
430
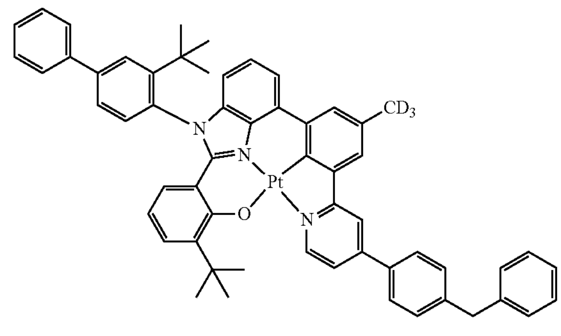
431
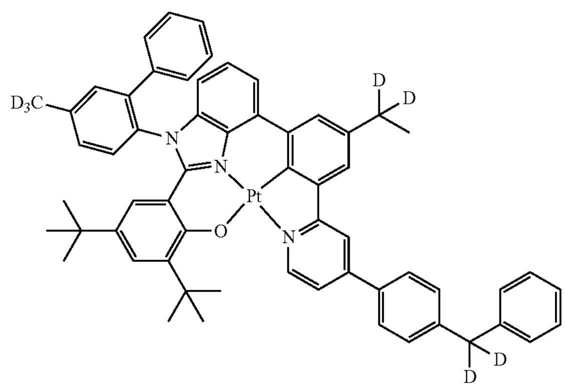
432
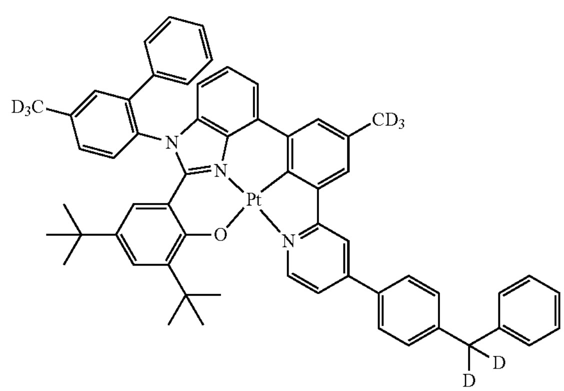

-continued
433
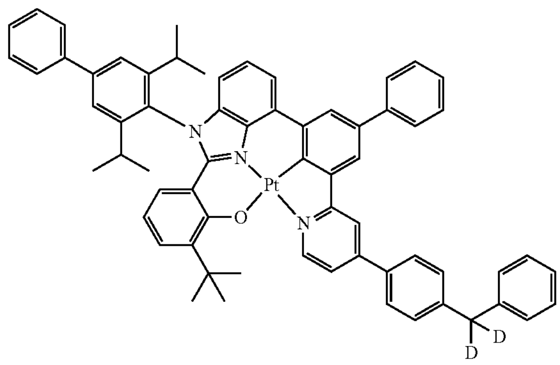
434
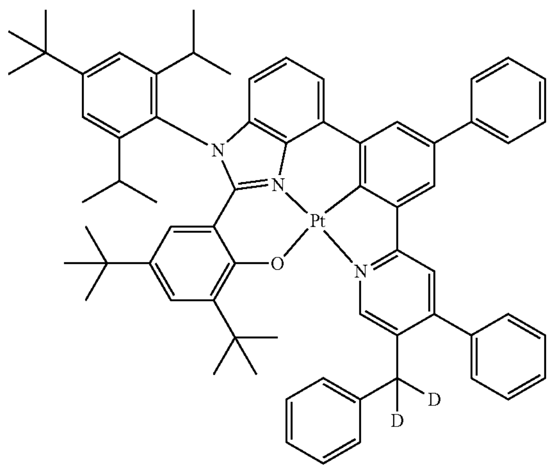
435
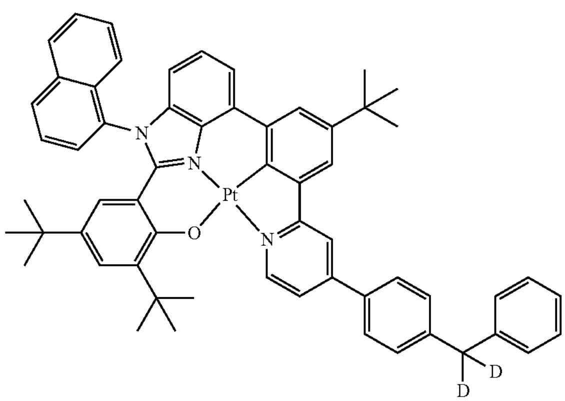
436
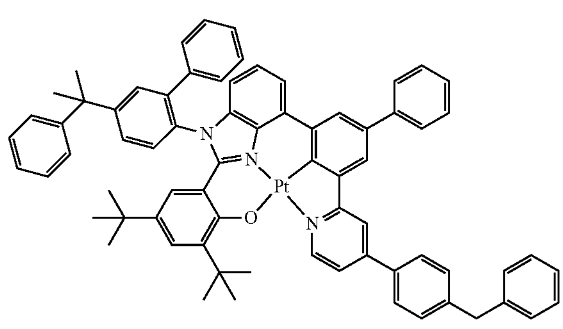
-continued
437
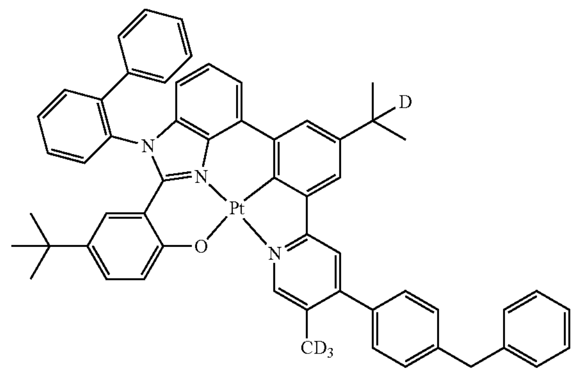
438
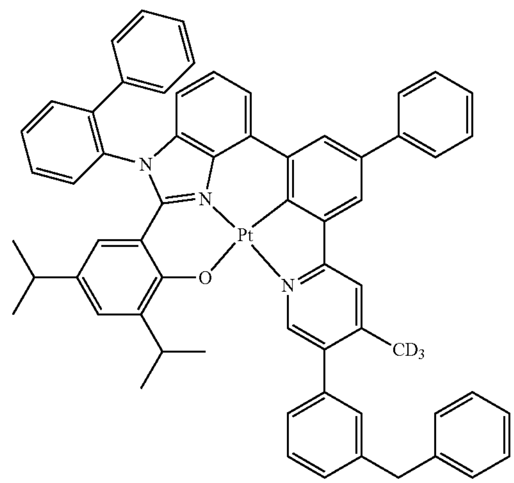
439
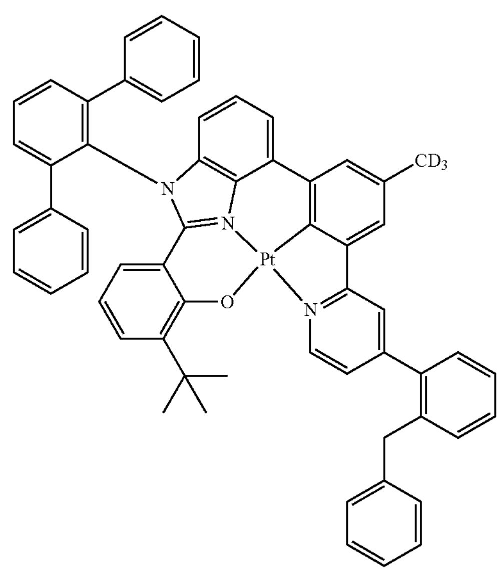

-continued
440
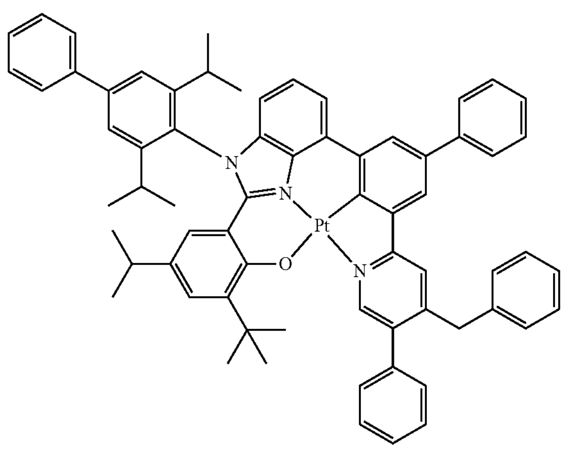
441
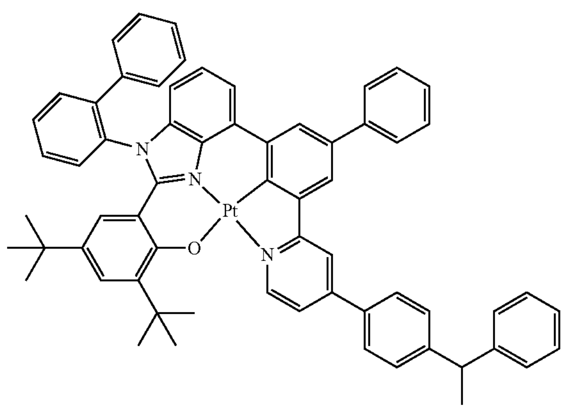
442
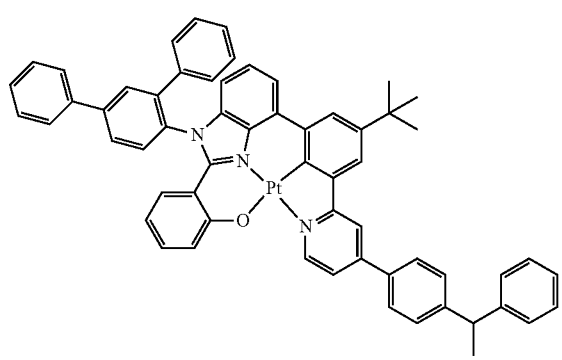
443
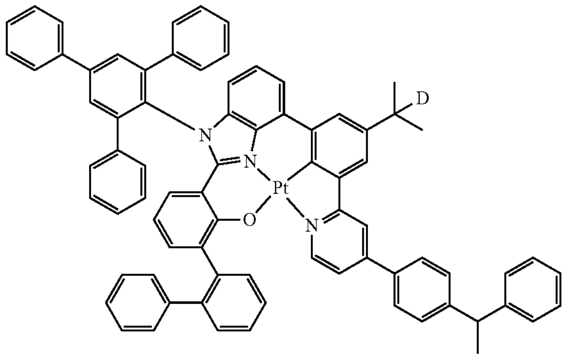
-continued
444
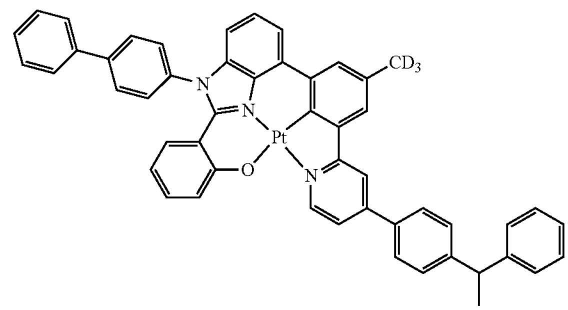
445
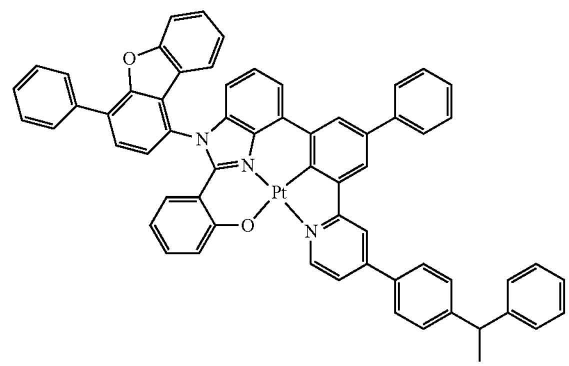
446
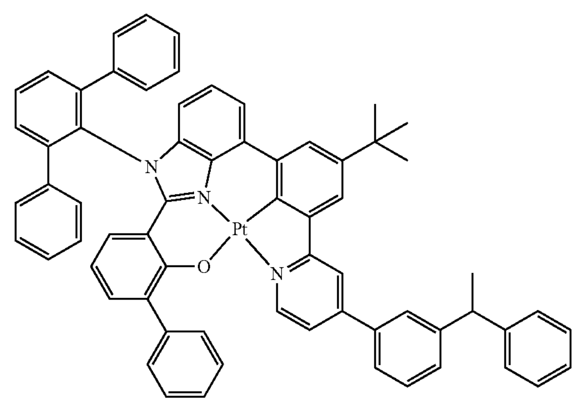
447
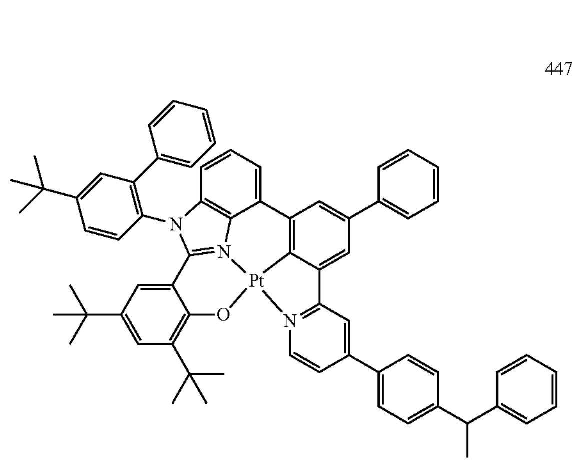

-continued
448
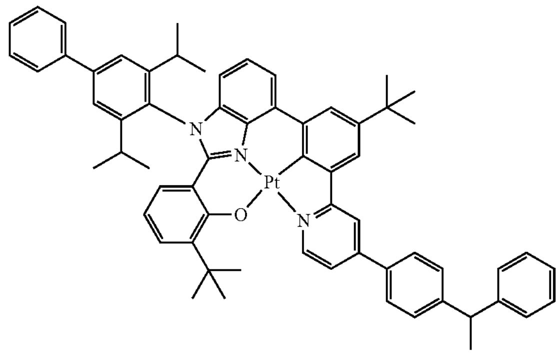
449
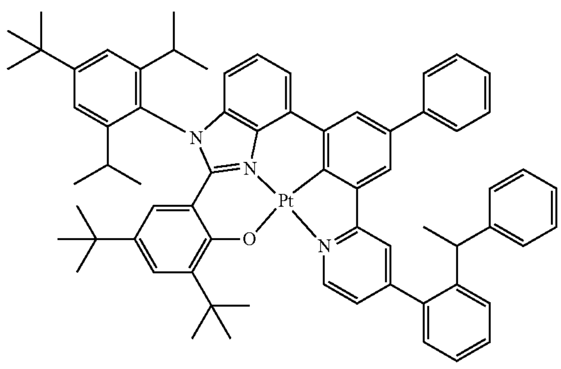
450
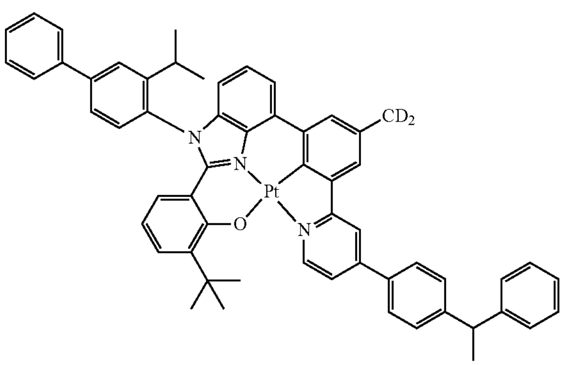
451
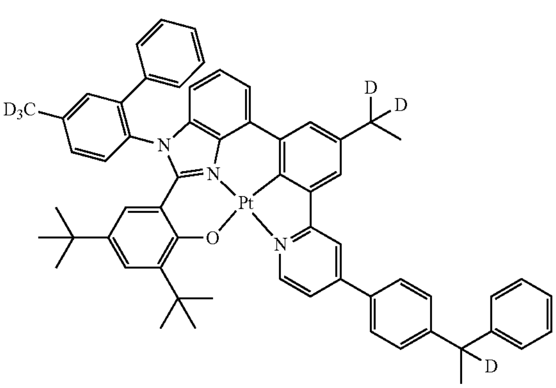
-continued
452
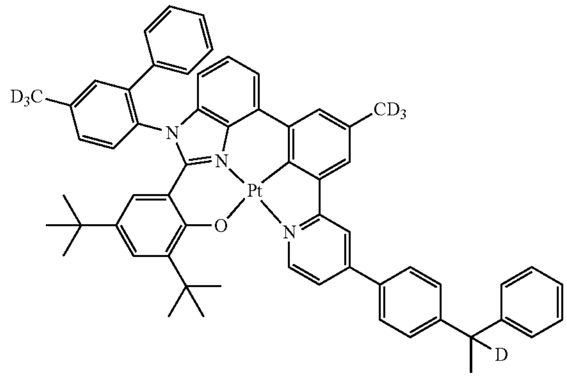
453
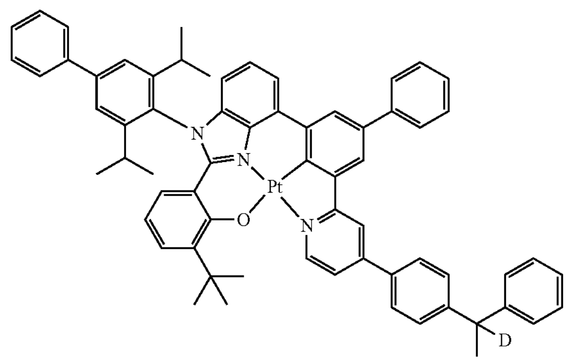
454
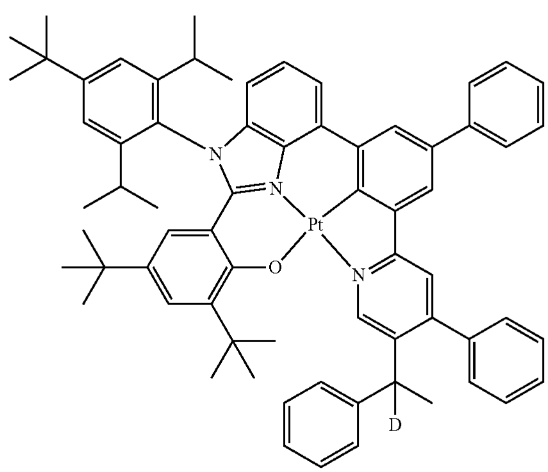

-continued
455
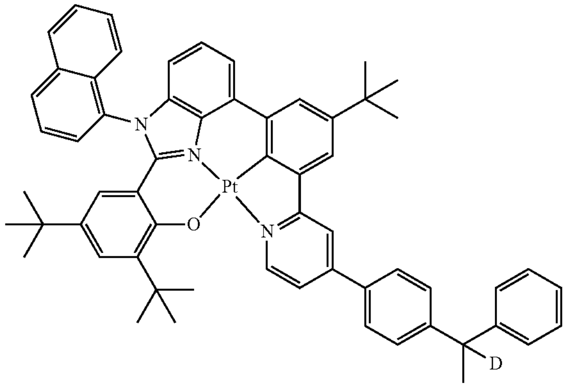
456
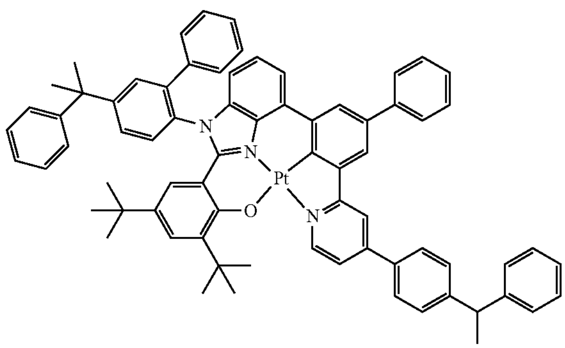
457
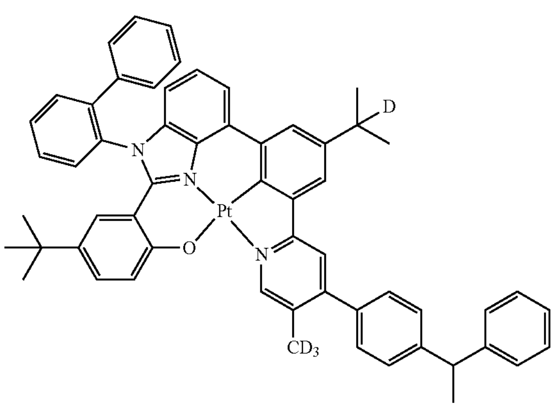
-continued
458
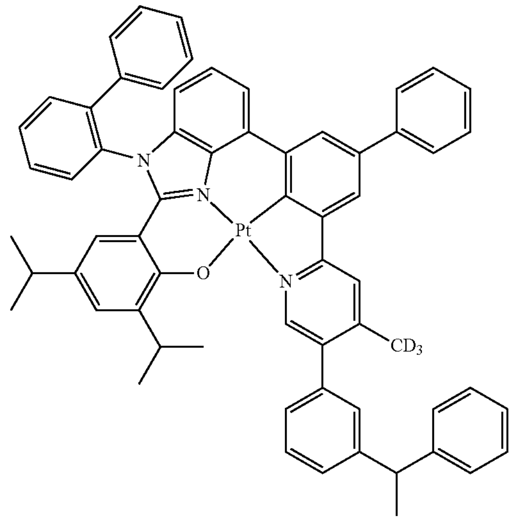
459
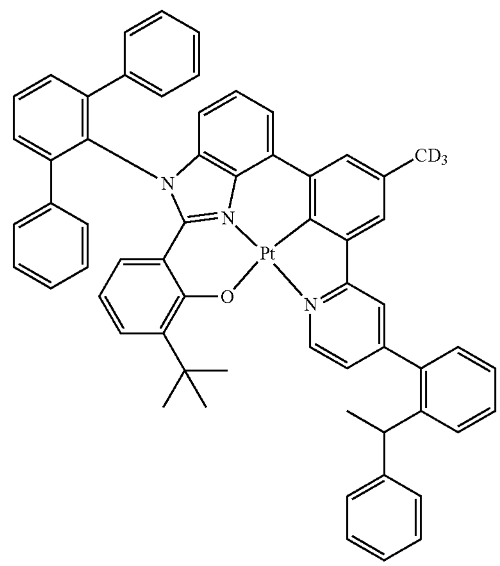
460
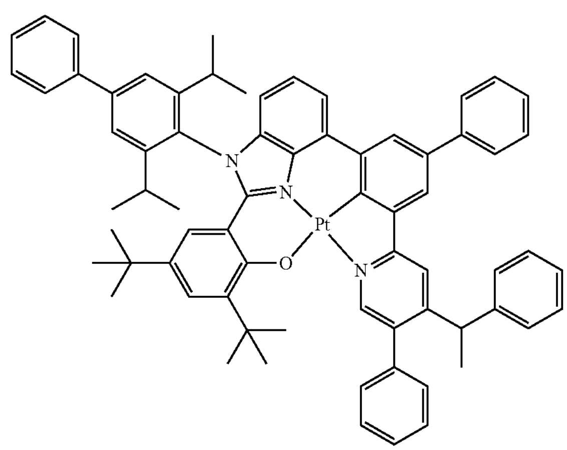

-continued
461
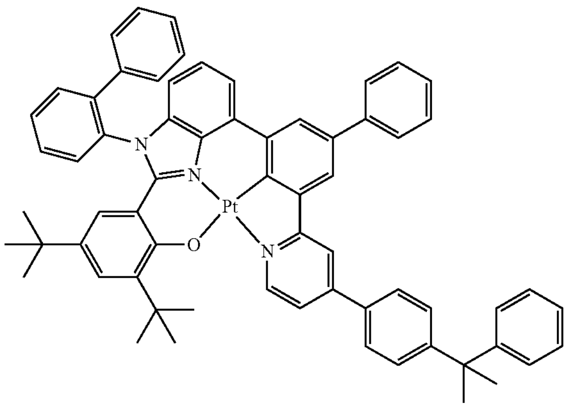
462
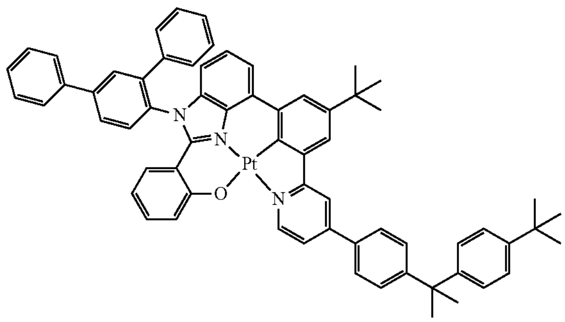
463
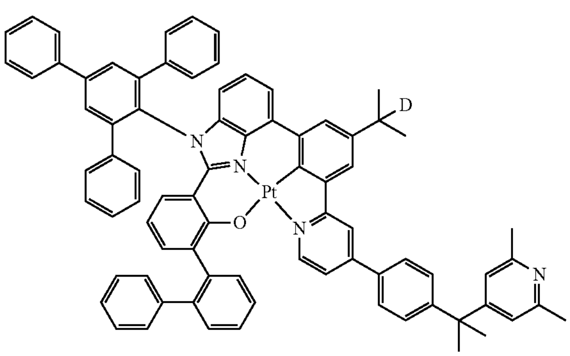
464
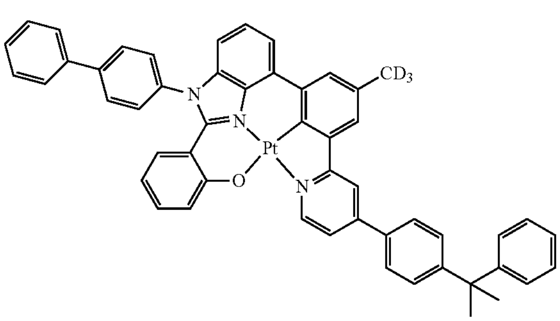
-continued
465
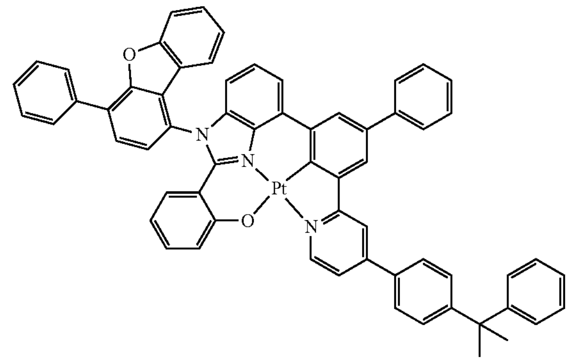
466
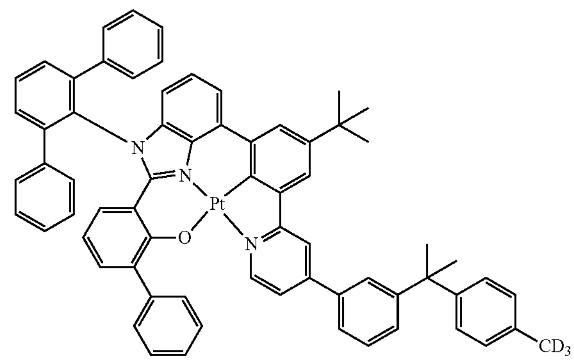
467
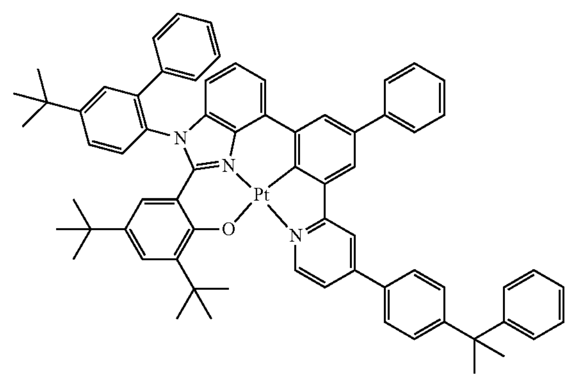
468
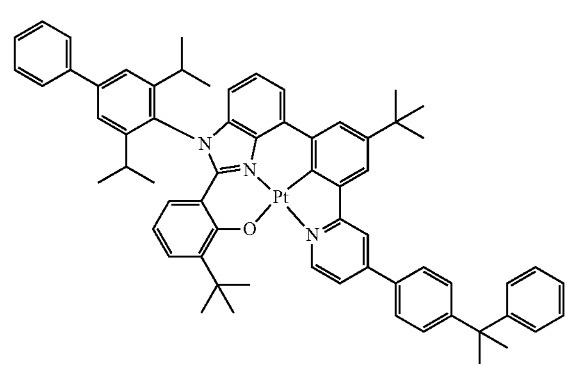

-continued
469
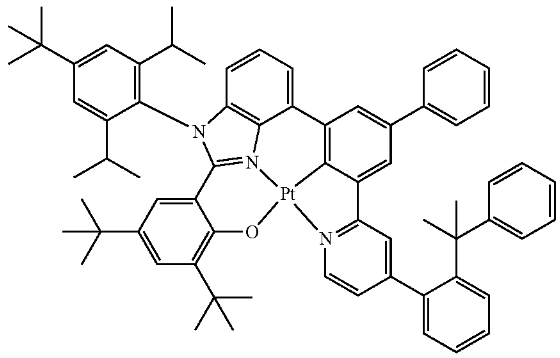
470
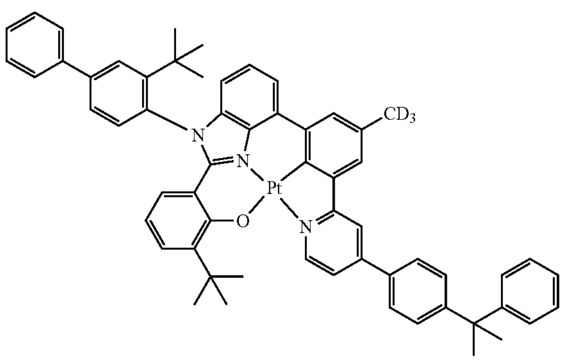
471
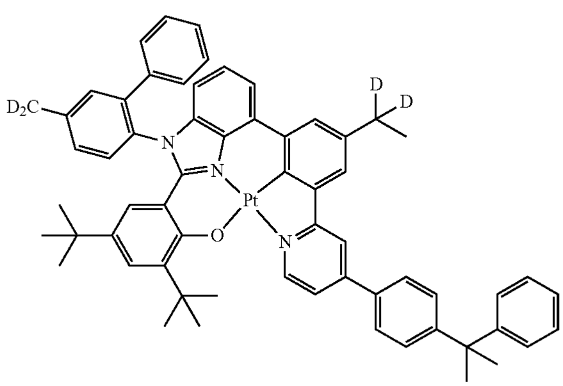
472
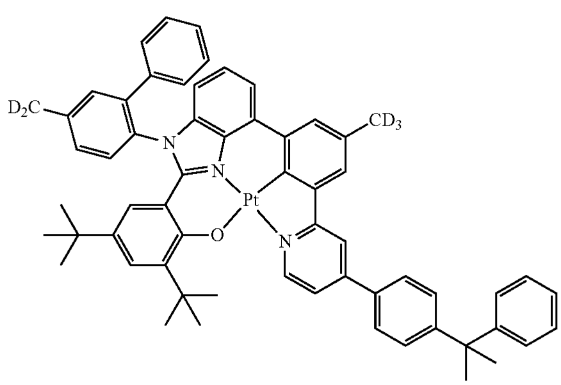
-continued
473
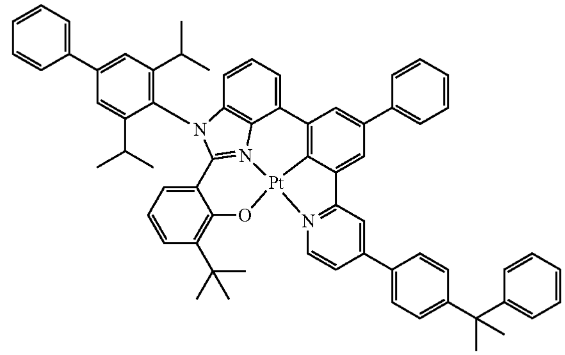
474
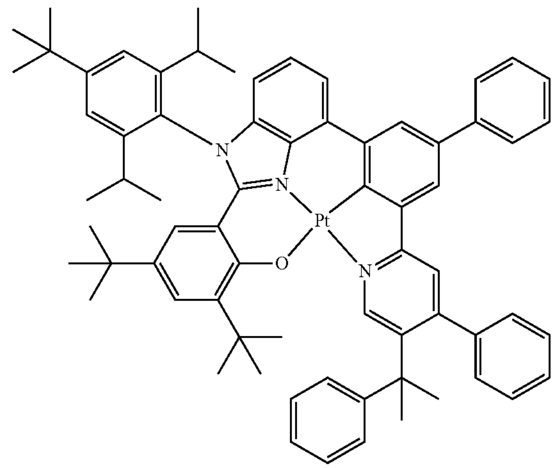
475
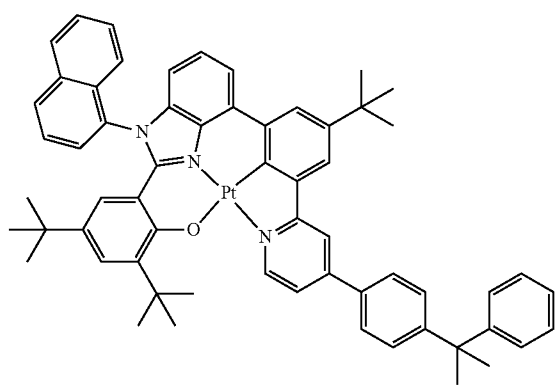
476
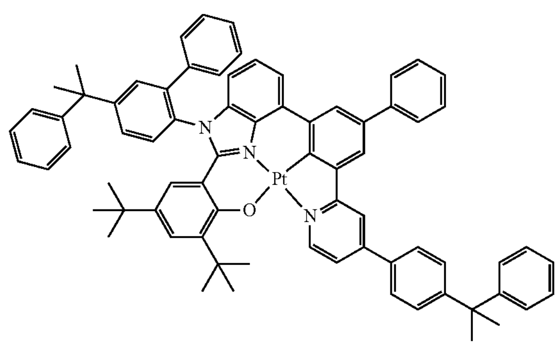

477
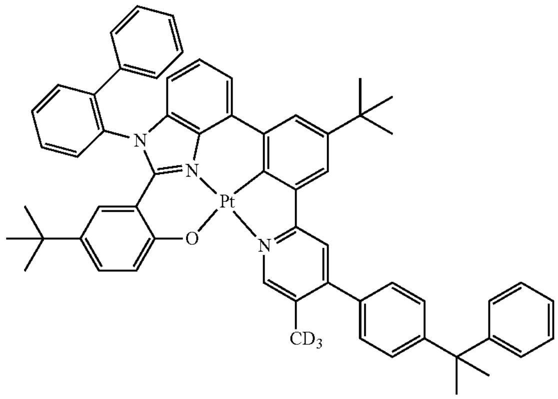
478
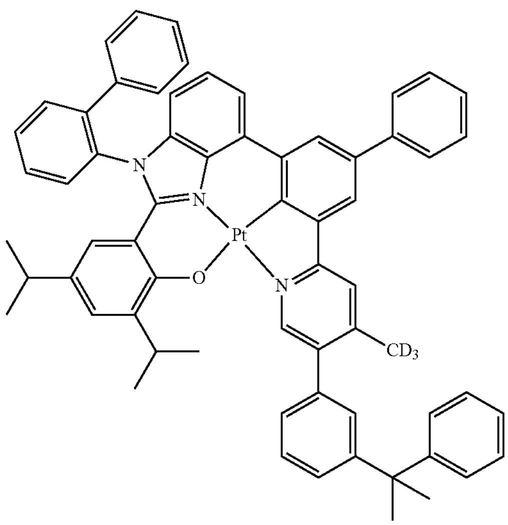
479
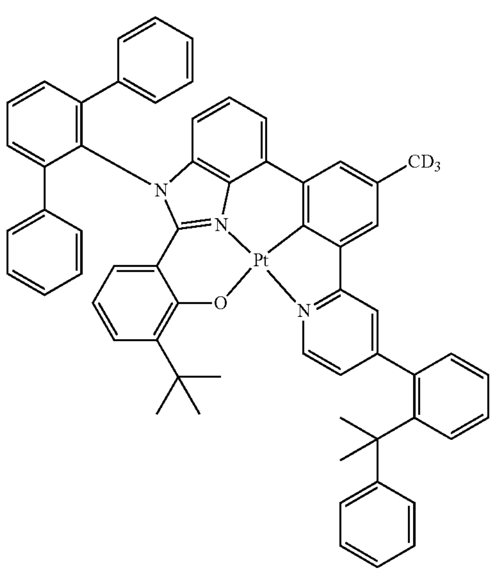
480
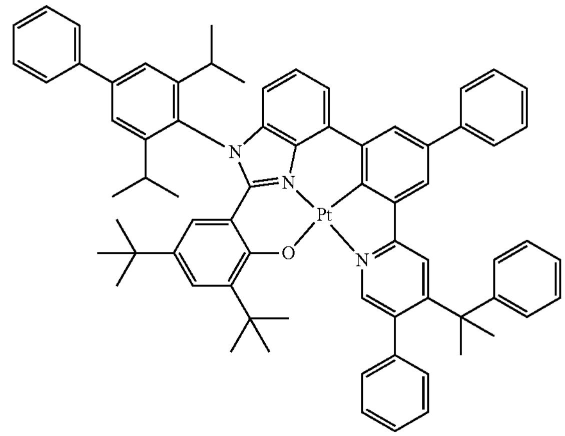
481
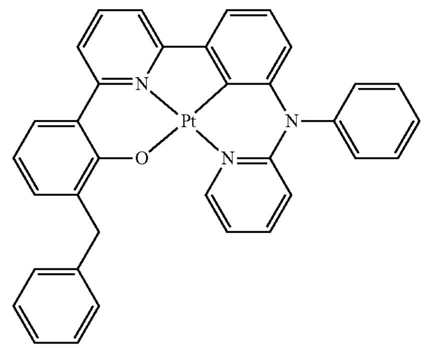
482
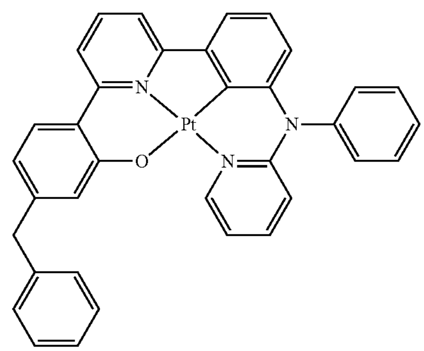
483
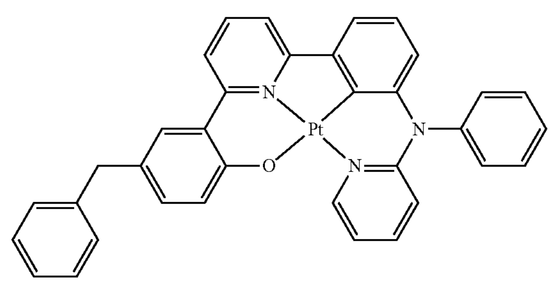

-continued
484
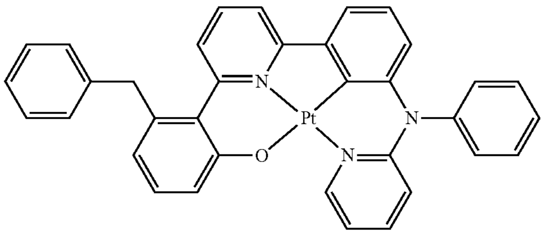
485
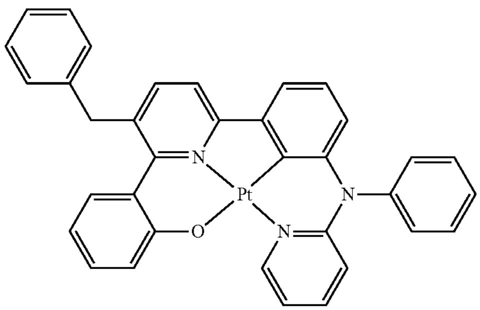
486
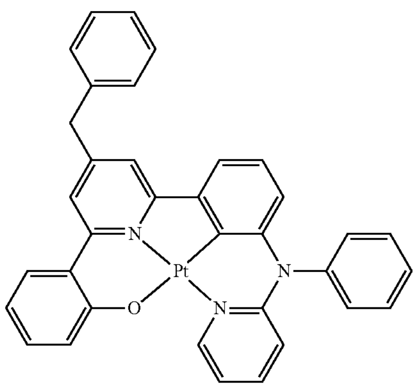
487
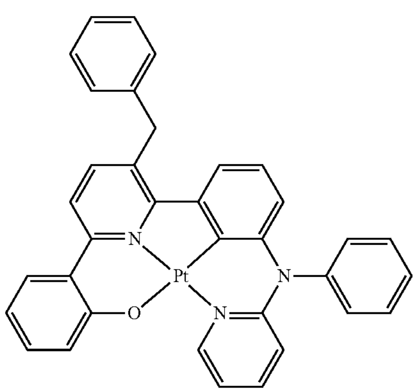
-continued
488
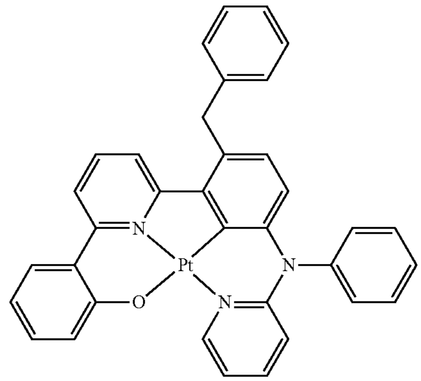
489
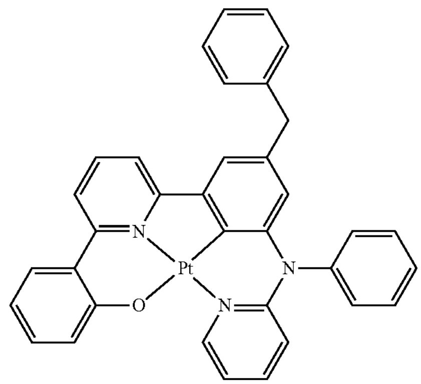
490
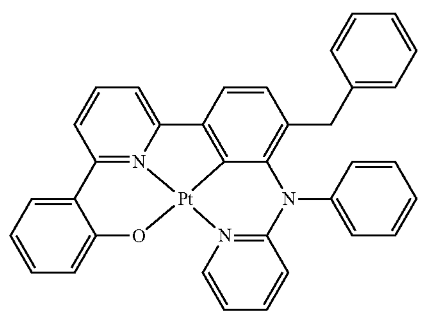
491
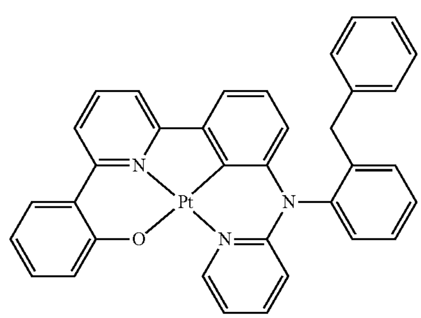

492
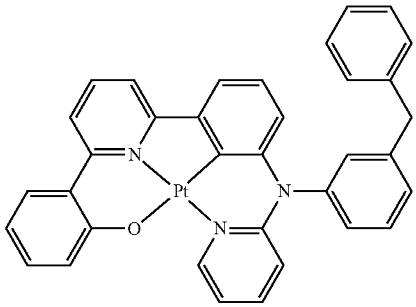
493
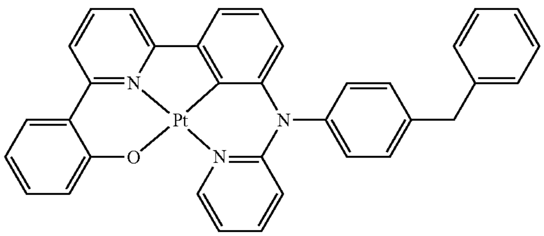
494
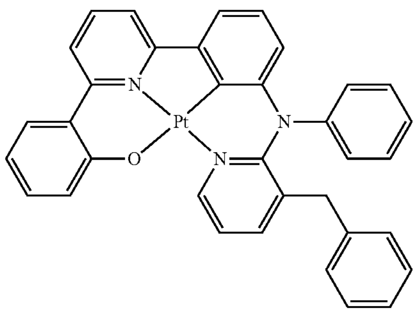
495
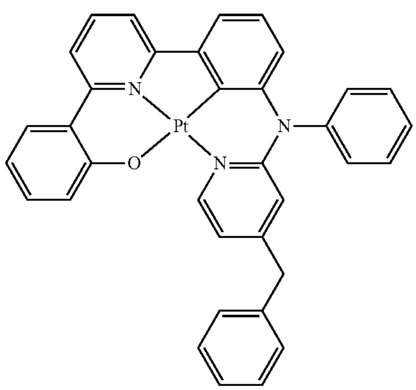
496
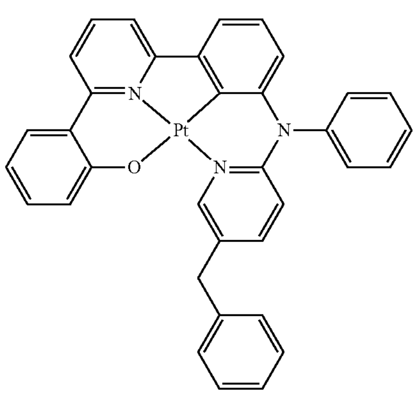
497
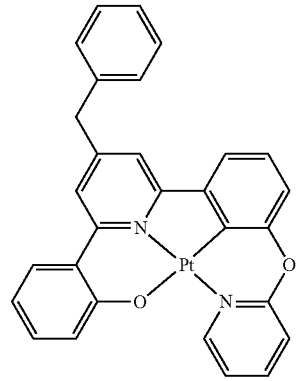
498
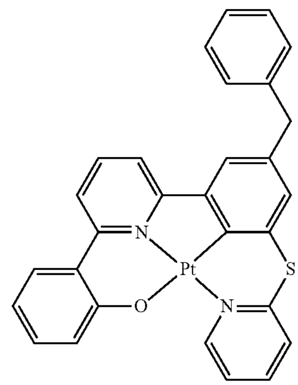
499
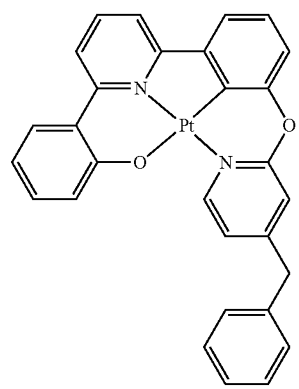
500
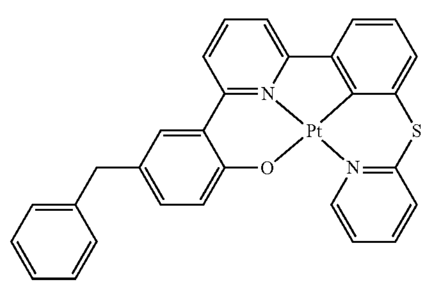

-continued
501
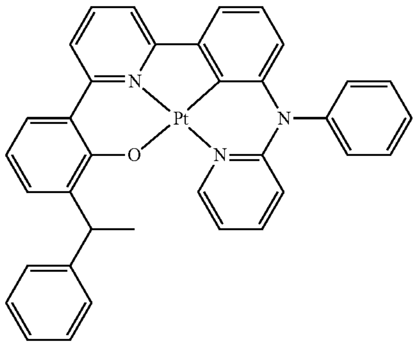
502
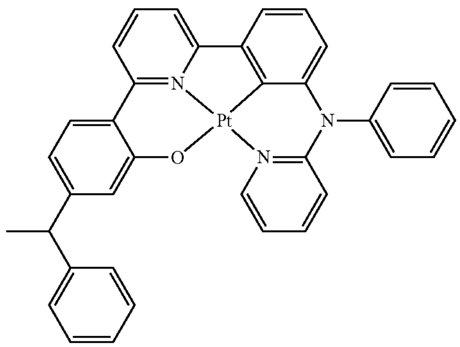
503
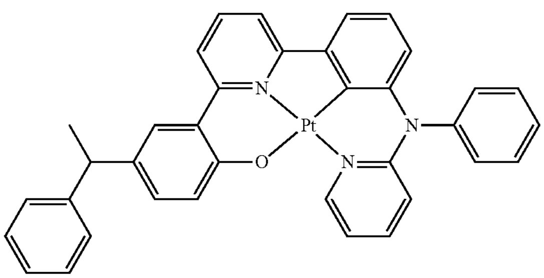
504
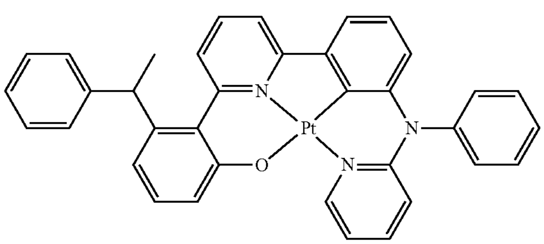
505
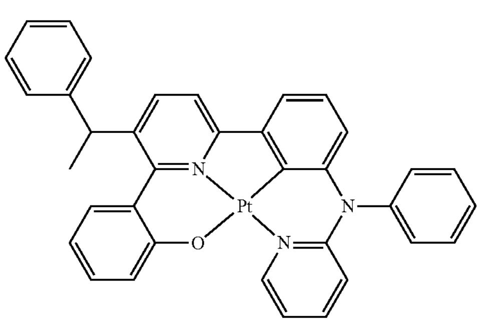
-continued
506
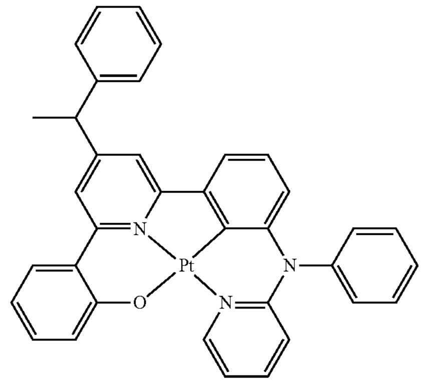
507
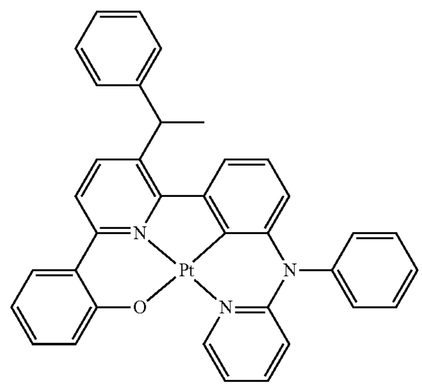
508
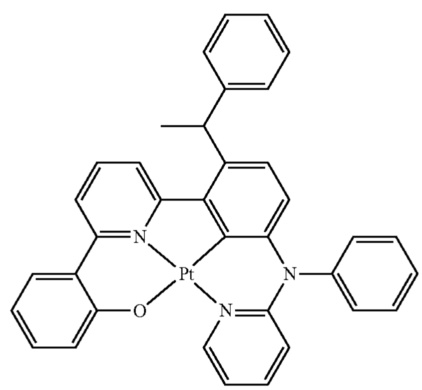
509
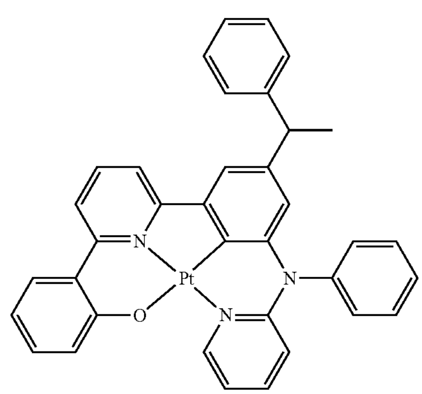

510
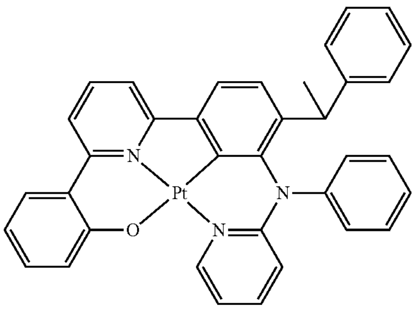
511
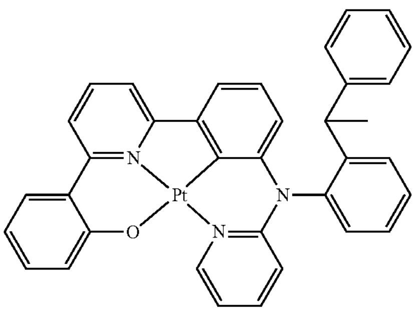
512
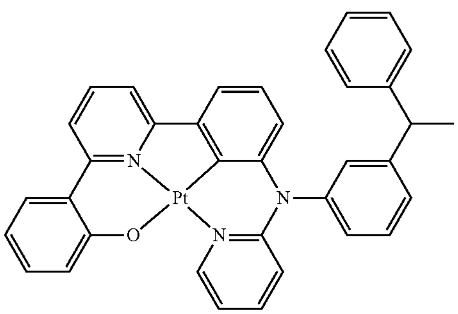
513
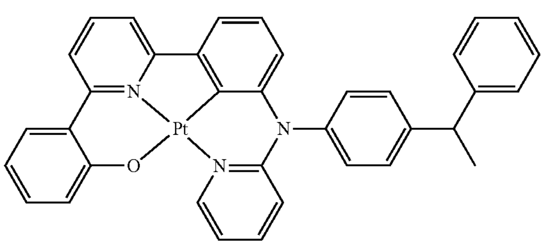
514
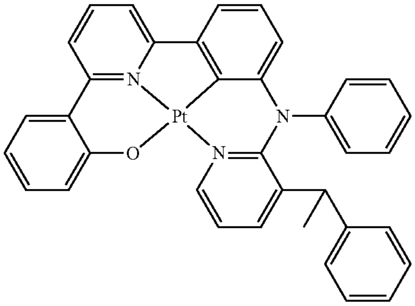
515
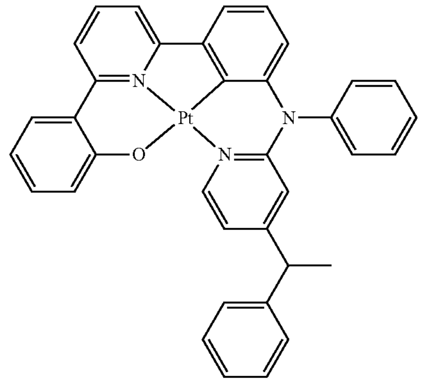
516
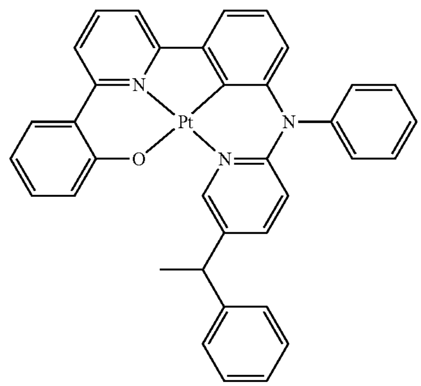
517
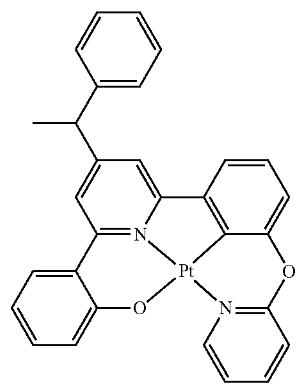
518
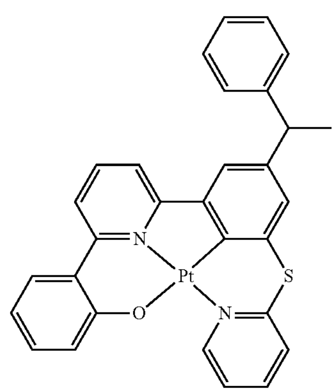

-continued
519
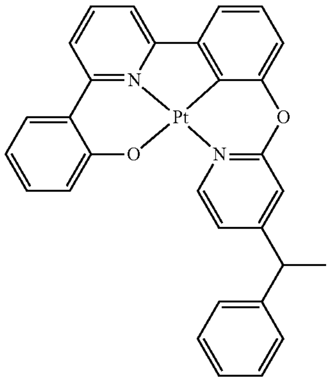
520
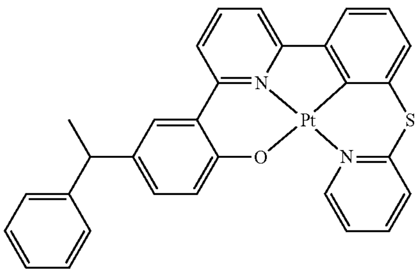
521
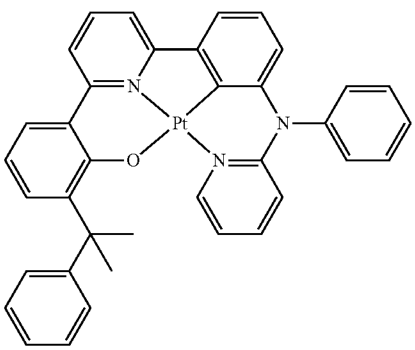
522
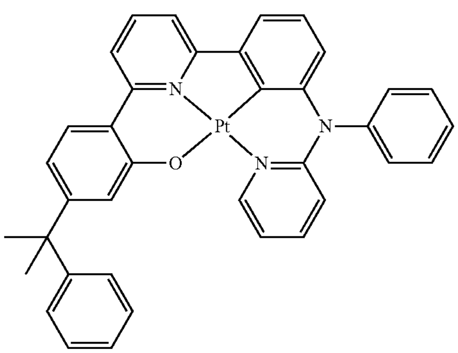
523
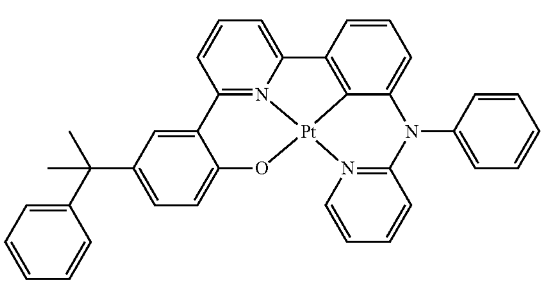
-continued
524
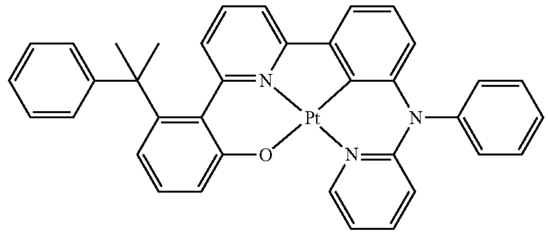
525
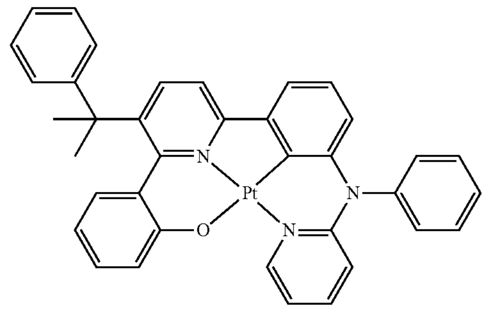
526
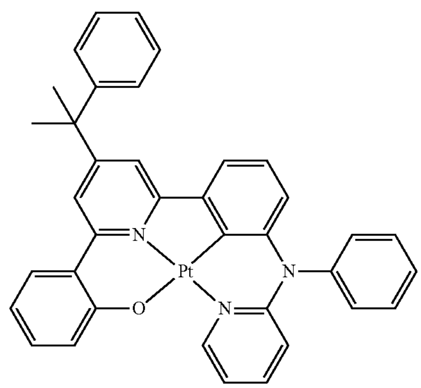
527
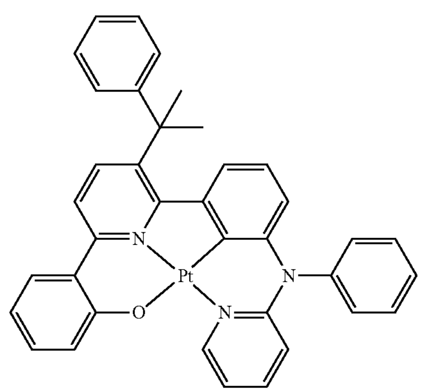

528
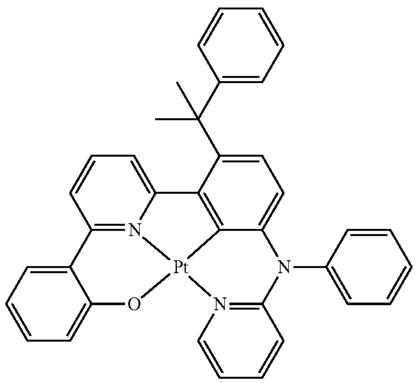
529
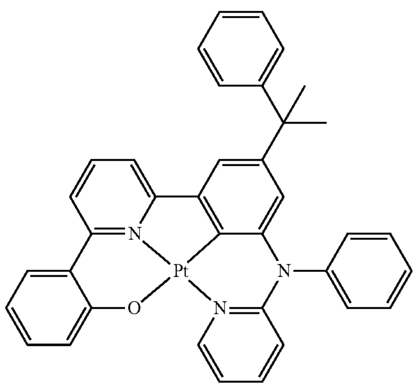
530
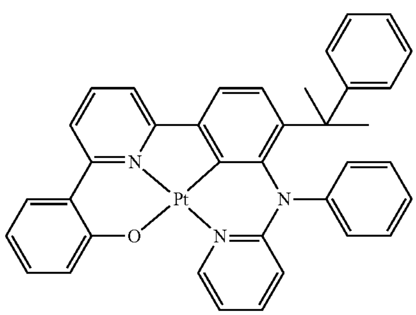
531
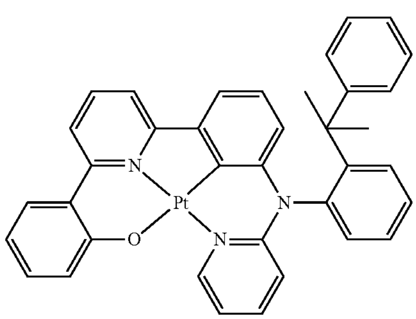
532
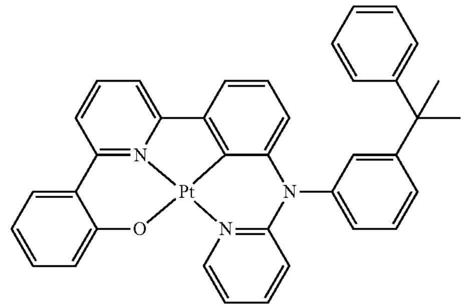
533
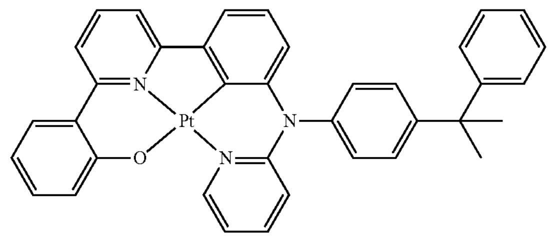
534
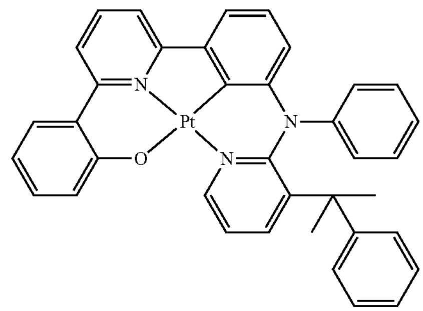
535
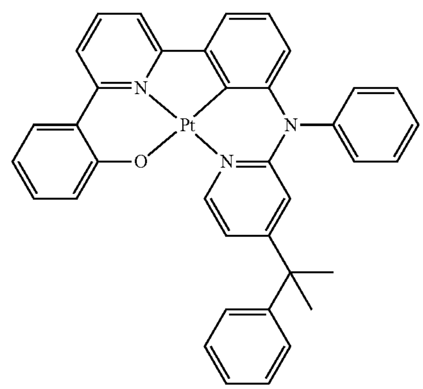
536
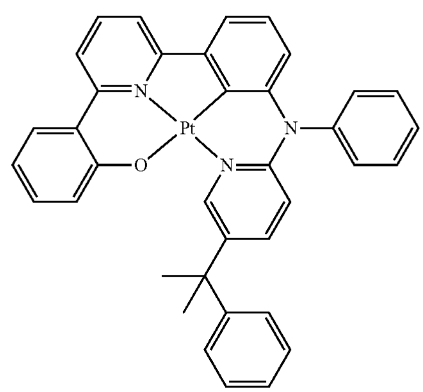

-continued
537
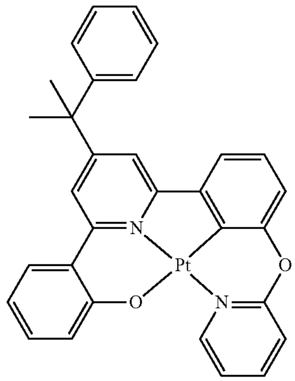
538
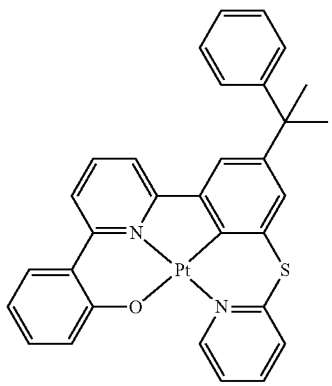
539
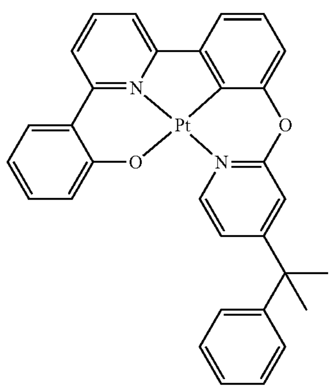
540
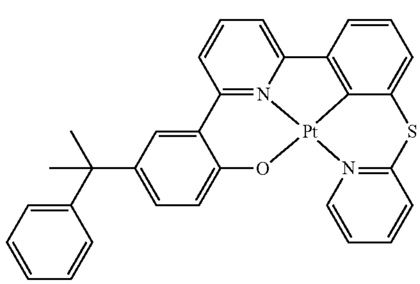
-continued
541
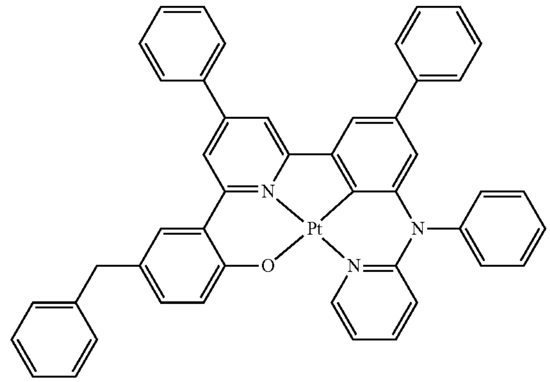
542
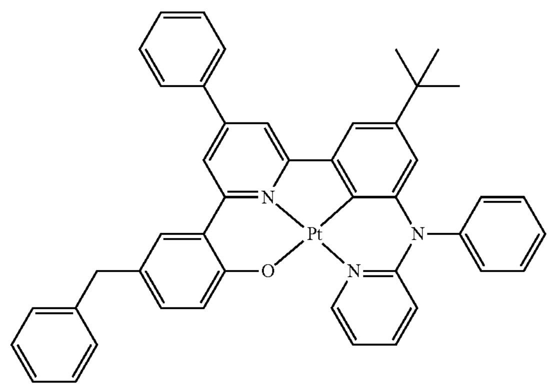
543
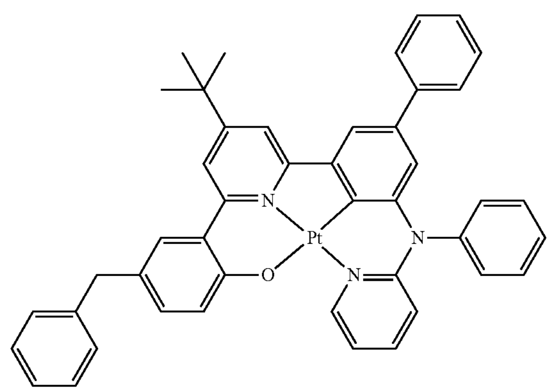
544
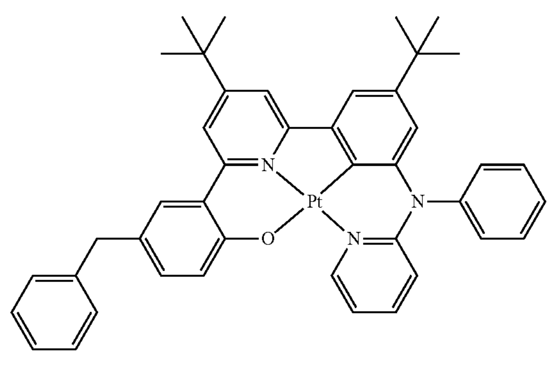

-continued
545
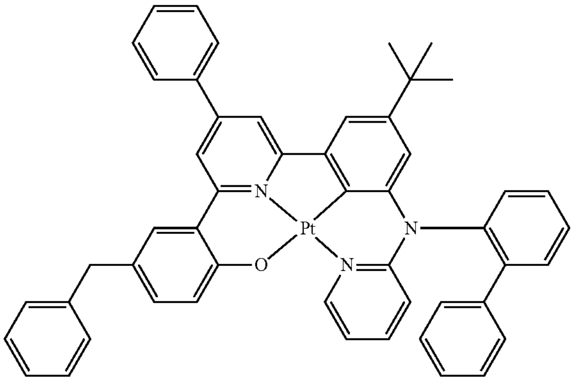
546
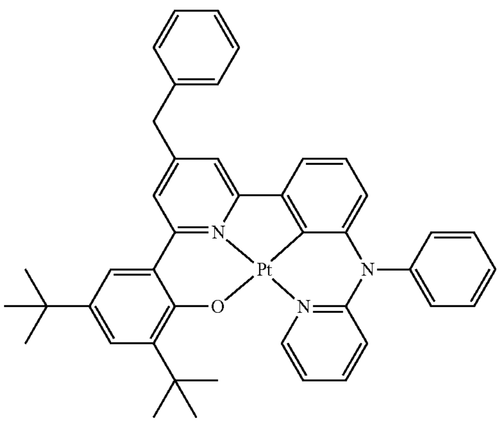
547
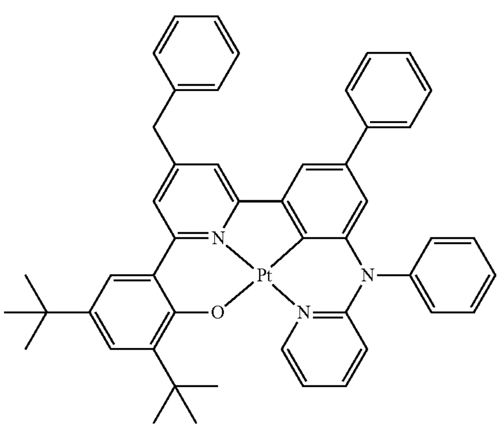
-continued
548
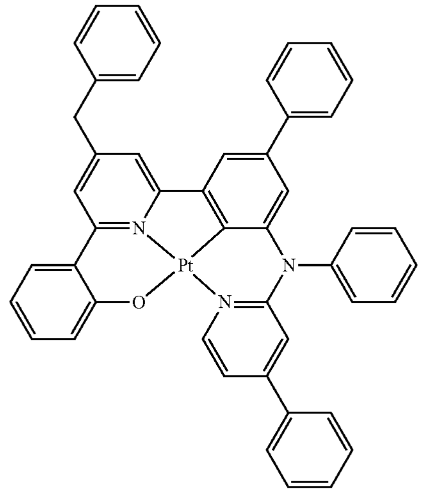
549
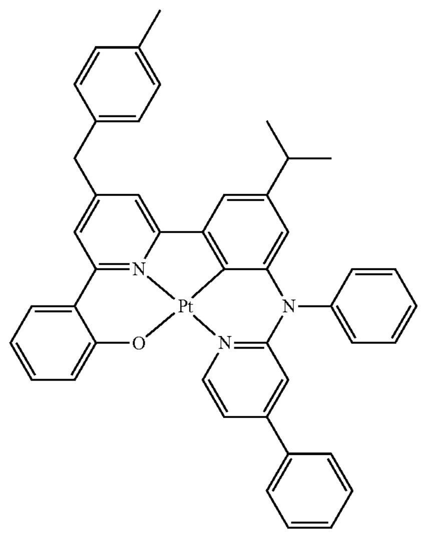
550
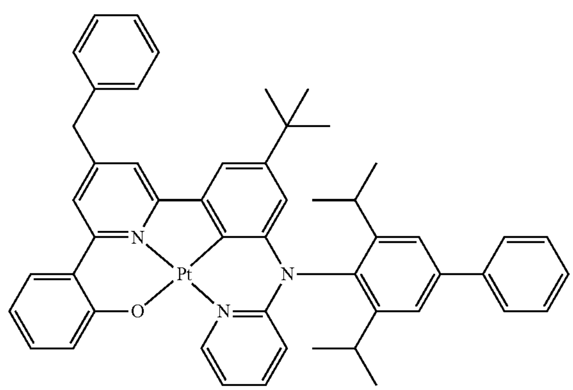

551
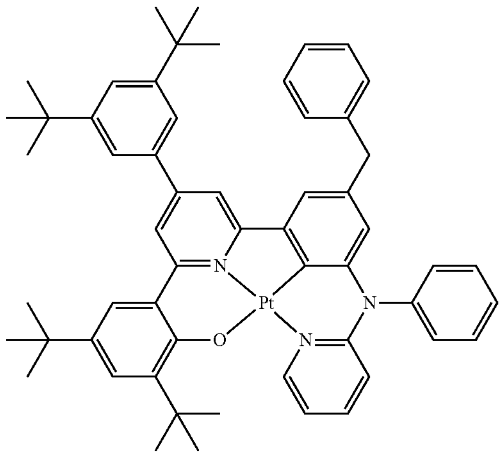
552
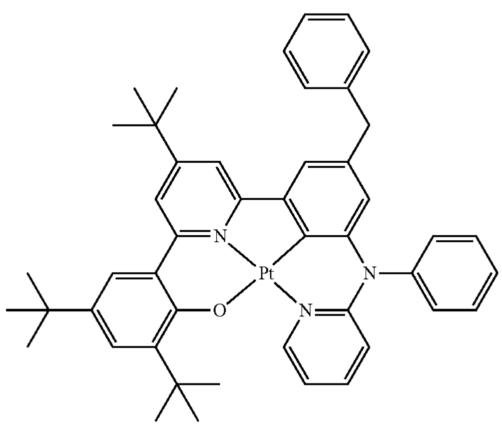
553
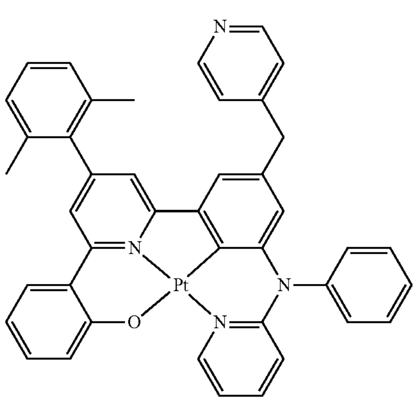
554
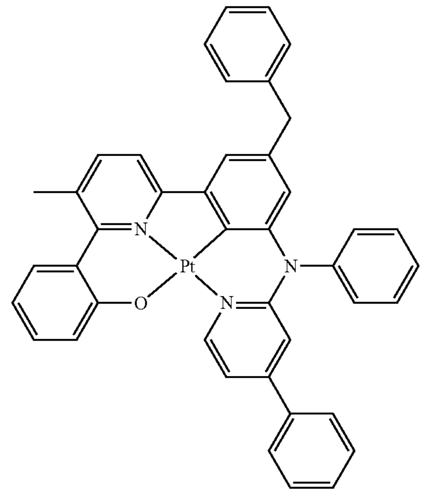
555
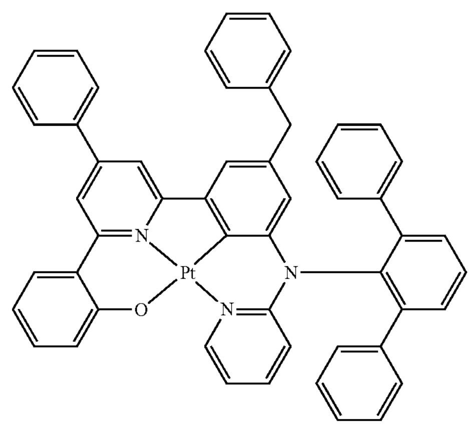
556
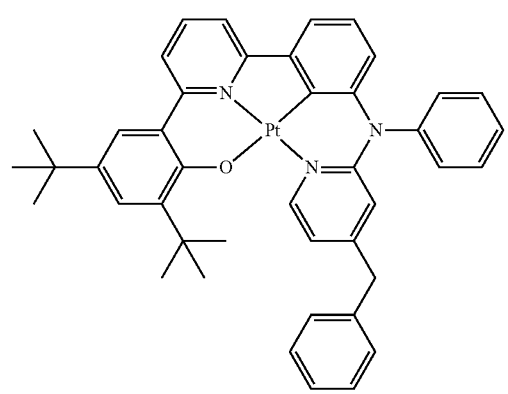

-continued
557
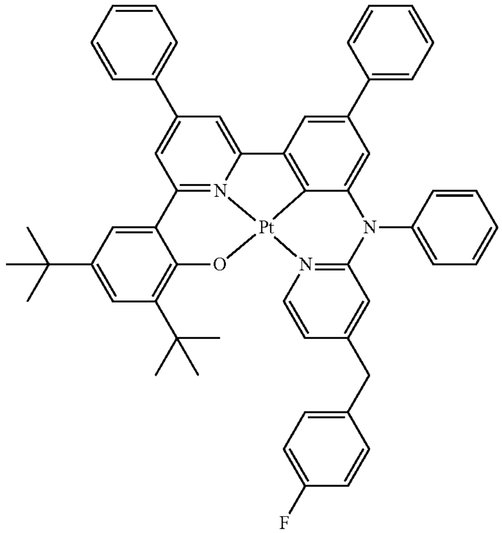
558
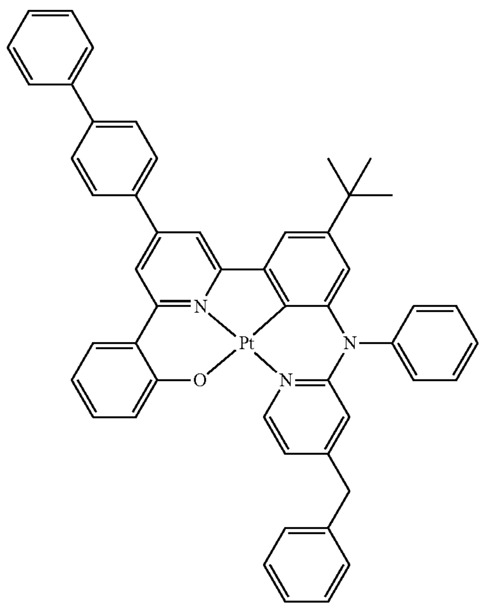
559
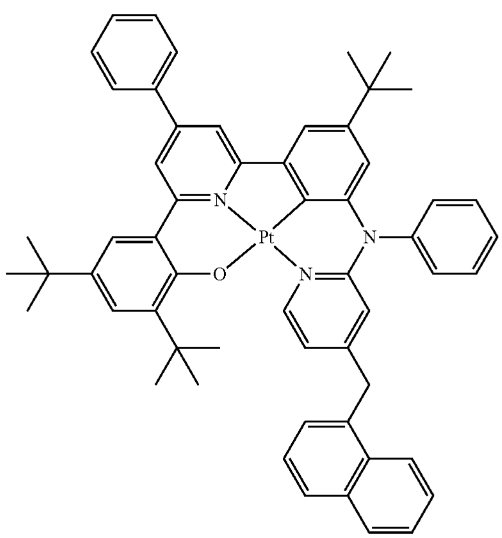
-continued
560
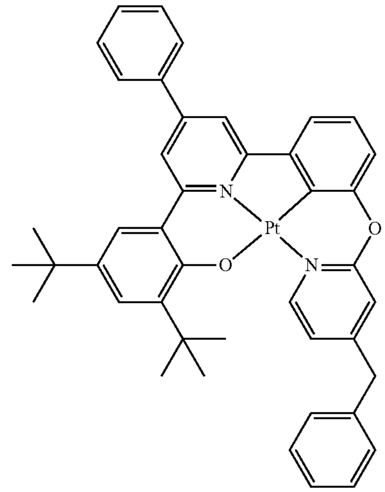
561
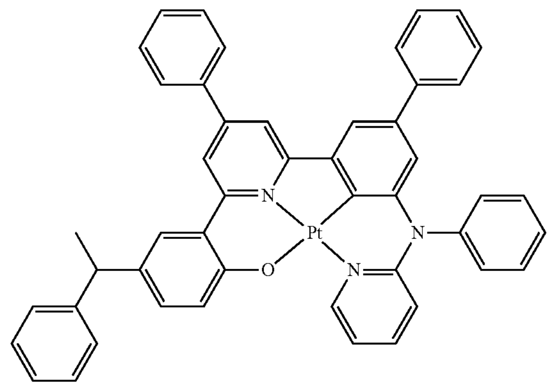
562
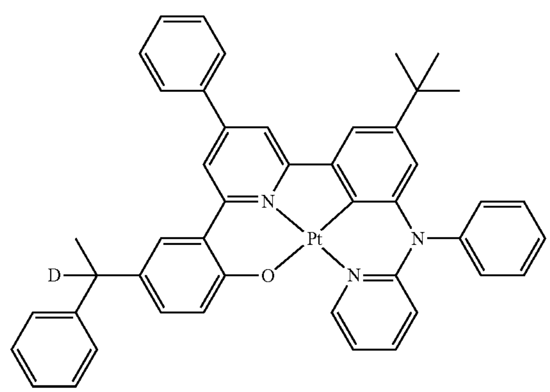

-continued
563
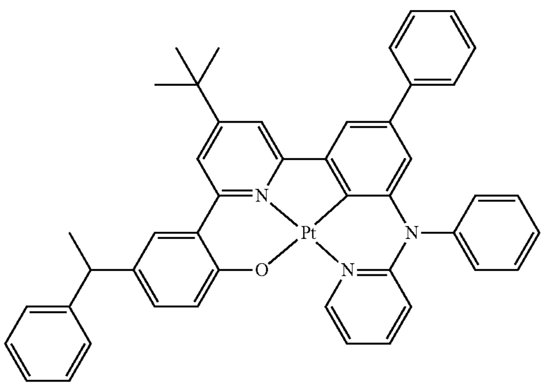
564
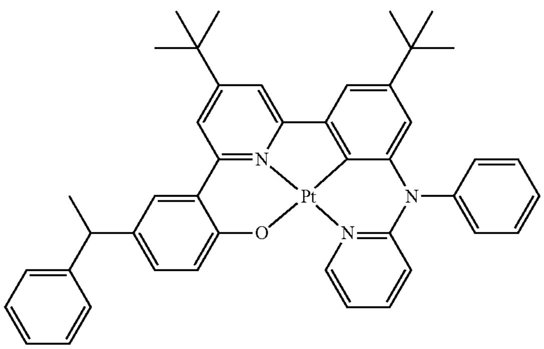
565
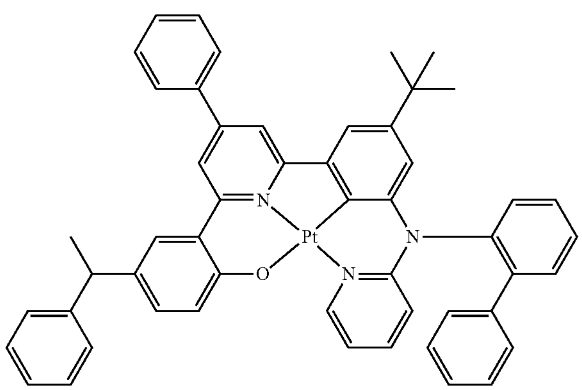
566
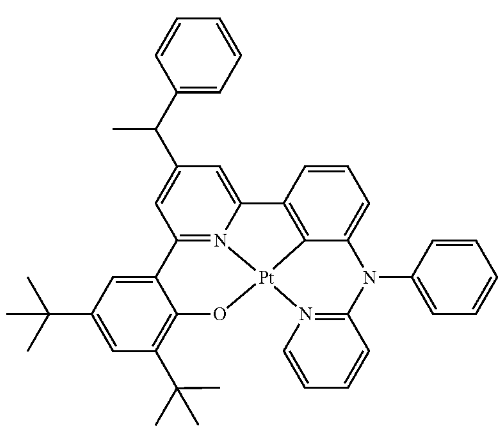
-continued
567
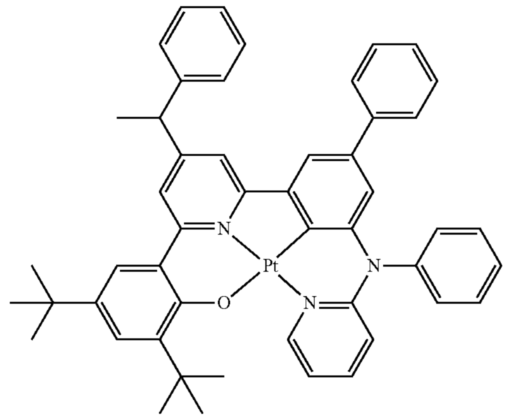
568
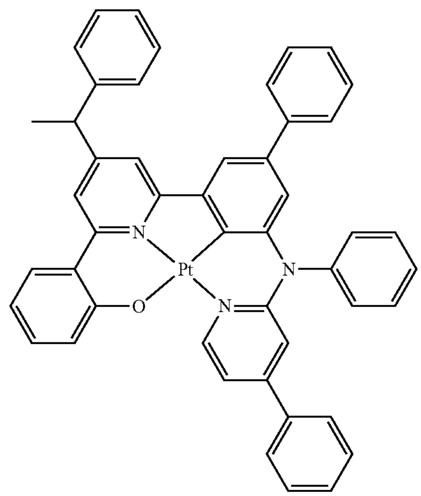
569
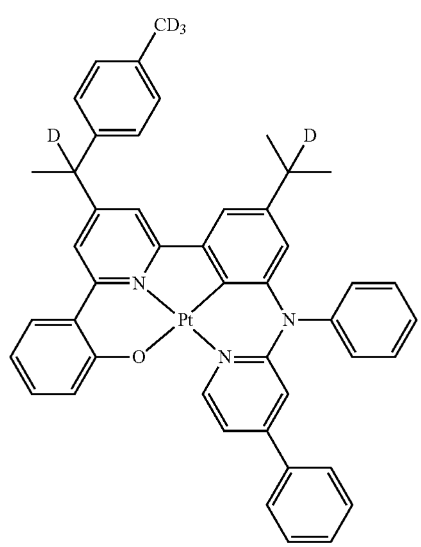

-continued
570
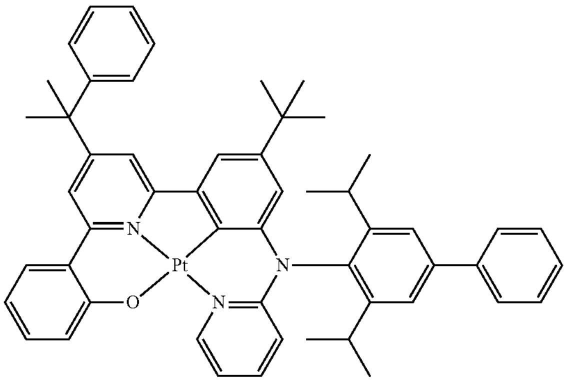
571
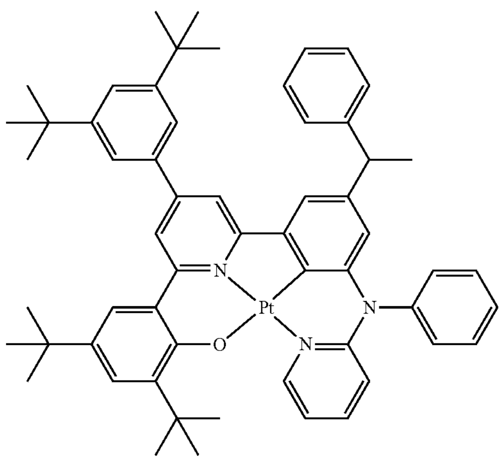
572
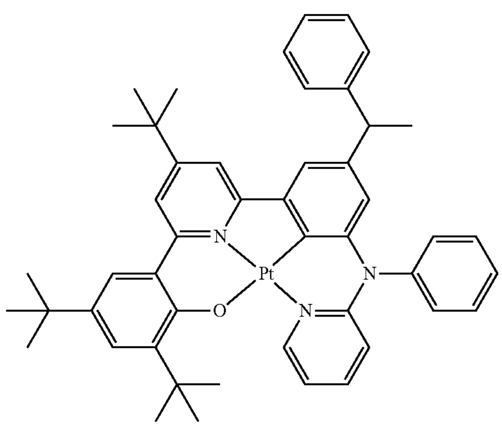
-continued
573
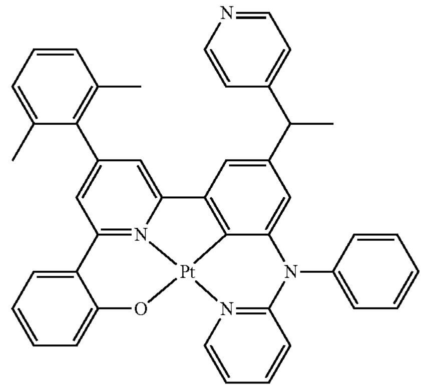
574
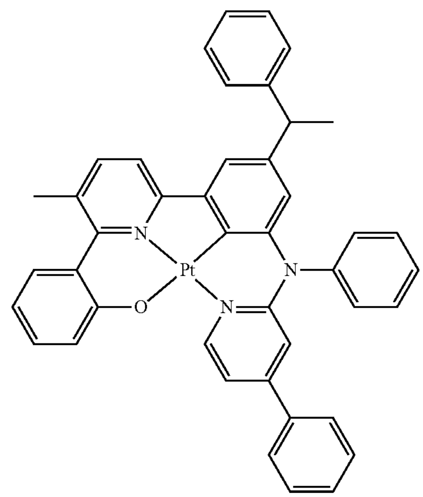
575
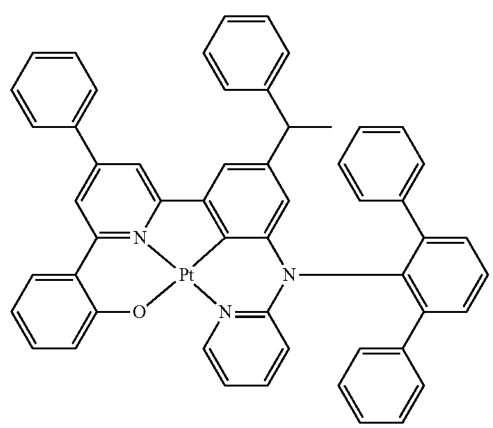

-continued
576
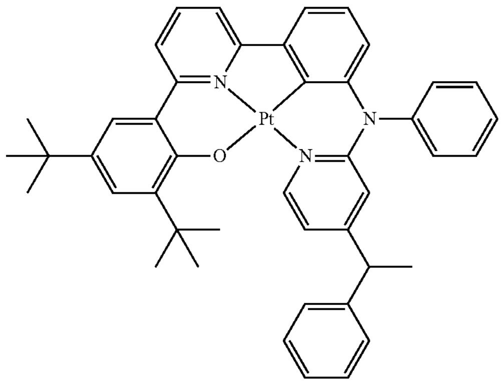
577
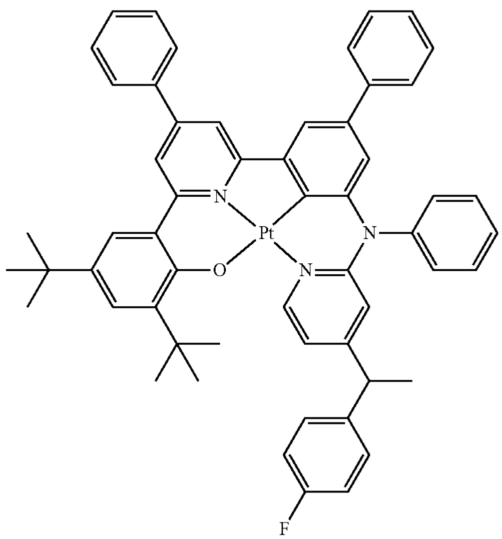
578
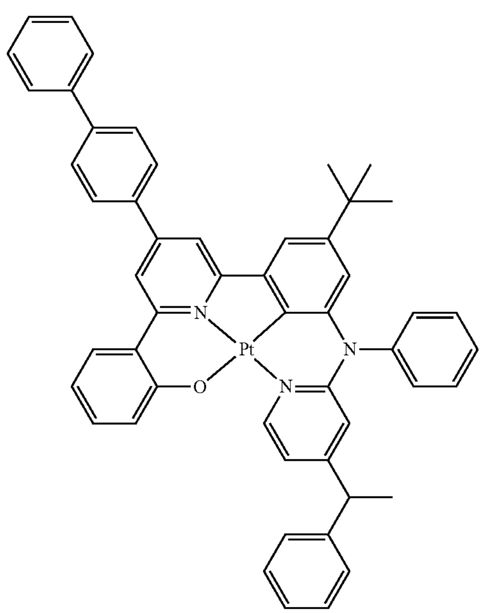
-continued
579
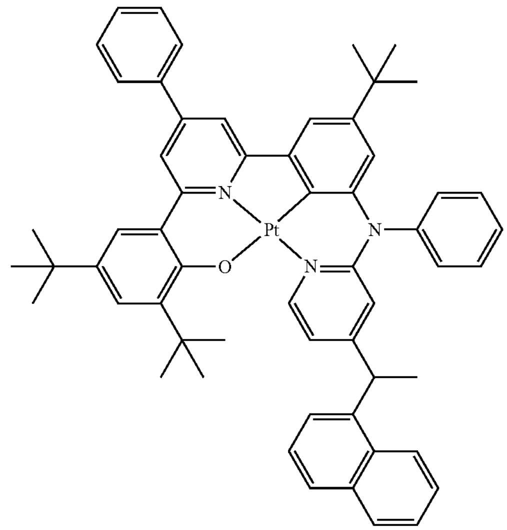
580
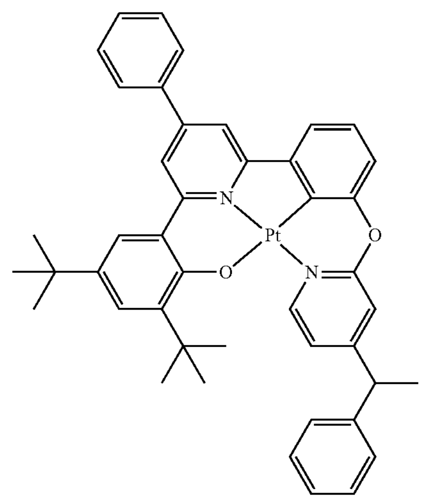
581
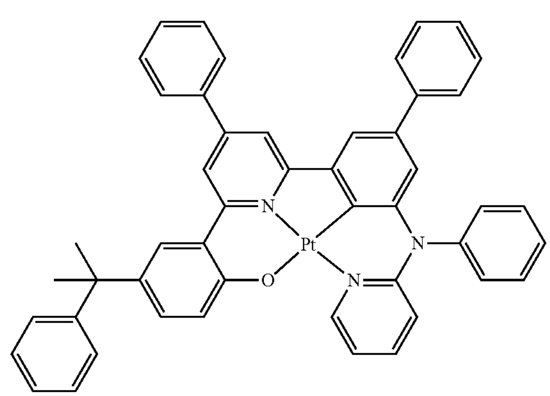

-continued
582
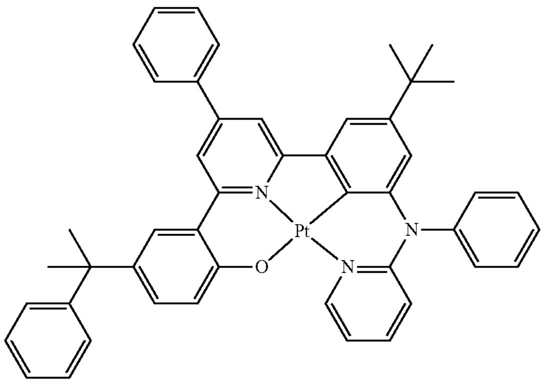
583
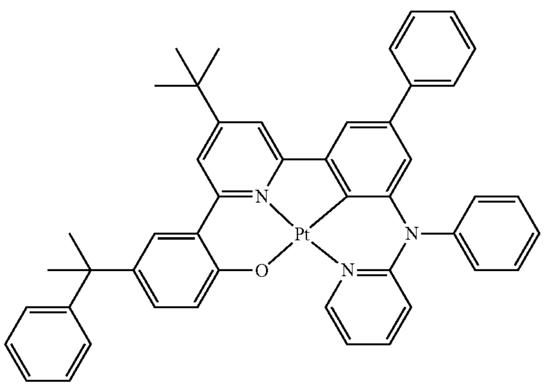
584
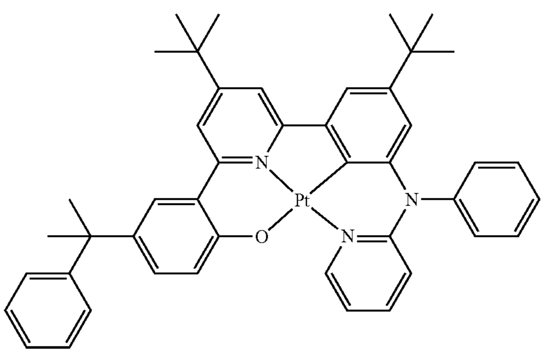
585
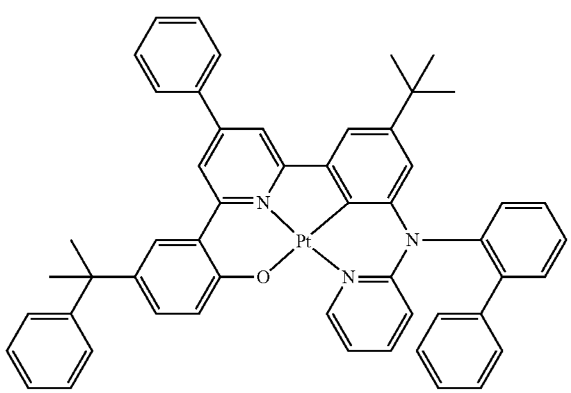
-continued
586
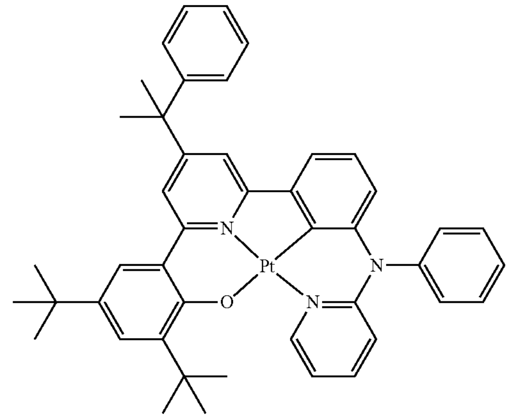
587
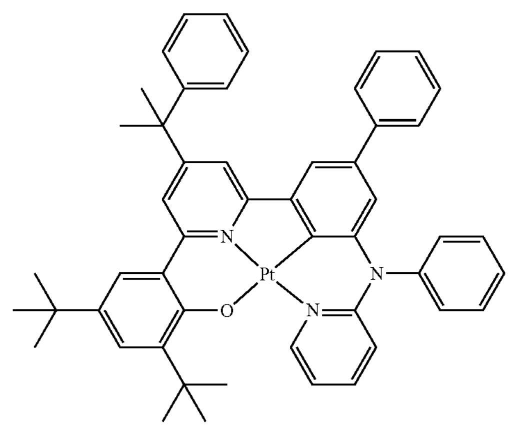
588
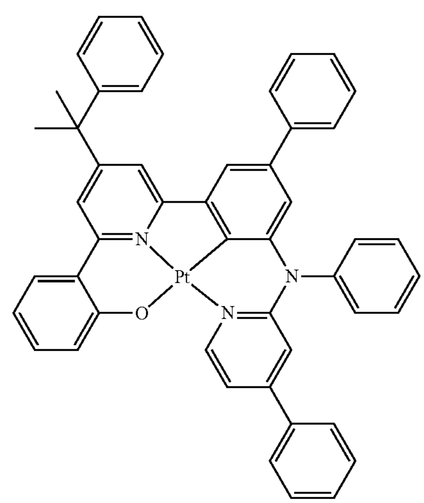

-continued
589
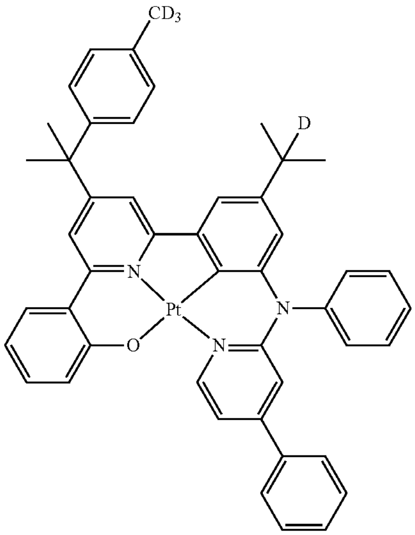
590
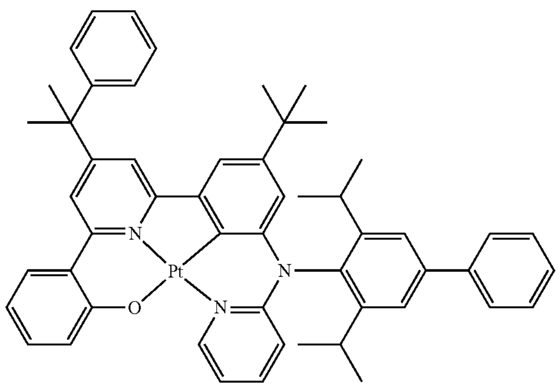
591
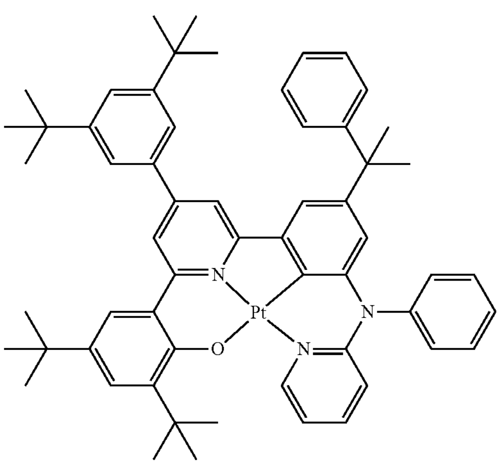
-continued
592
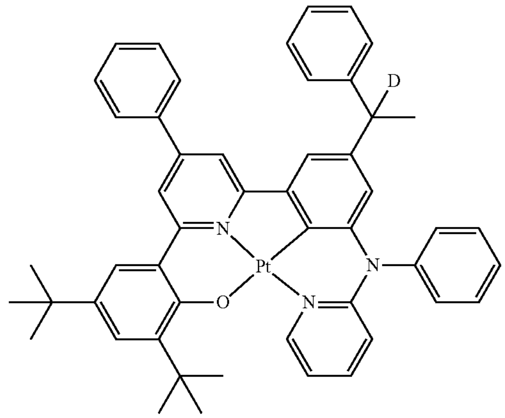
593
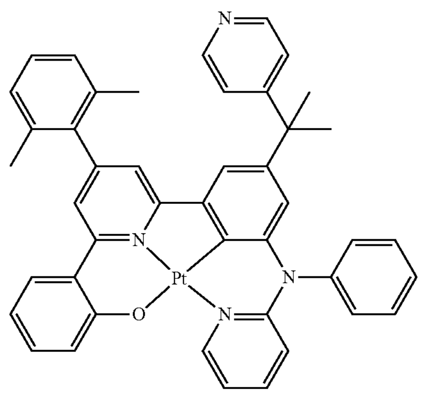
594
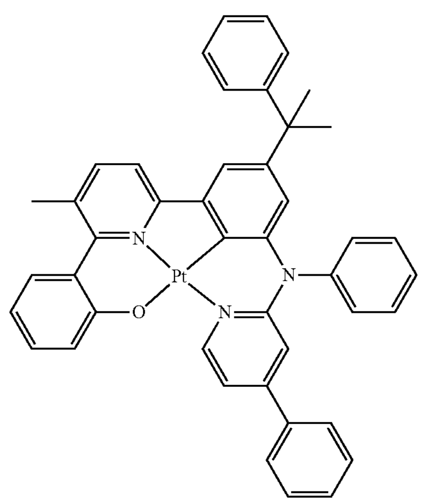

-continued
595
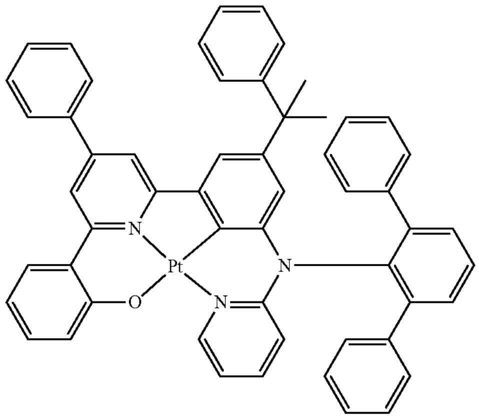
596
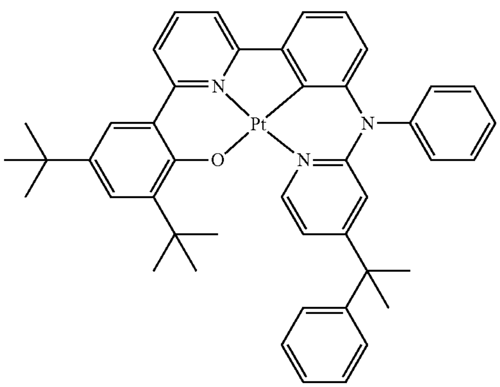
597
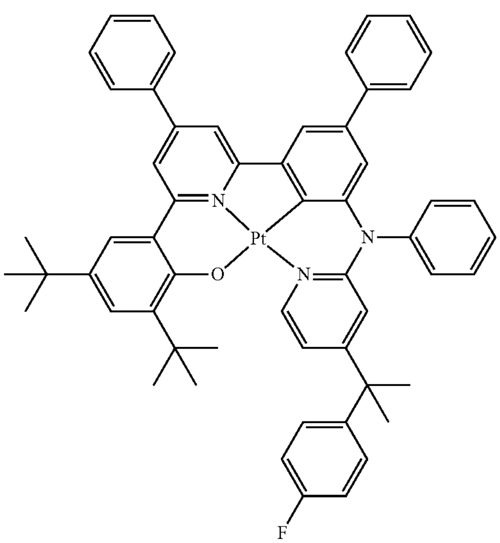
-continued
598
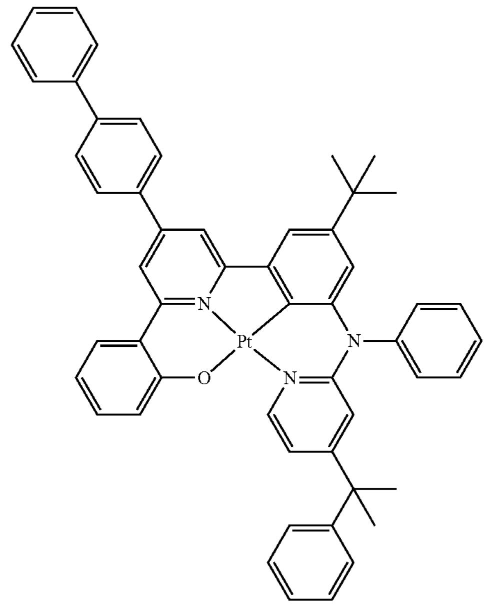
599
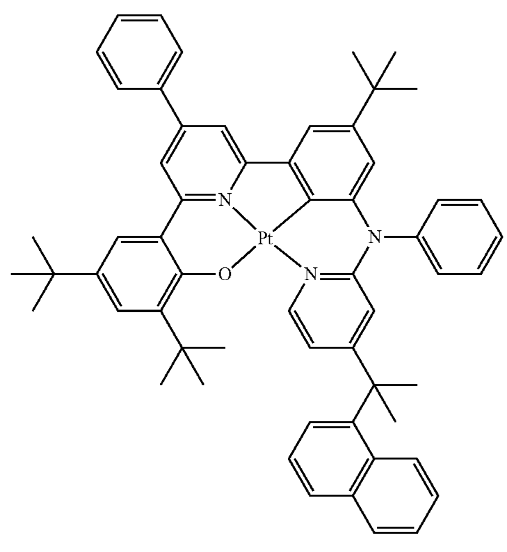
600
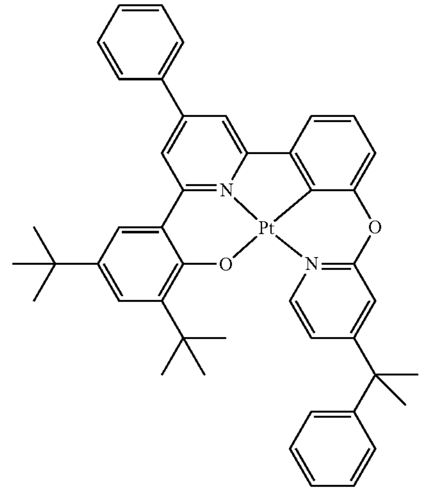

601
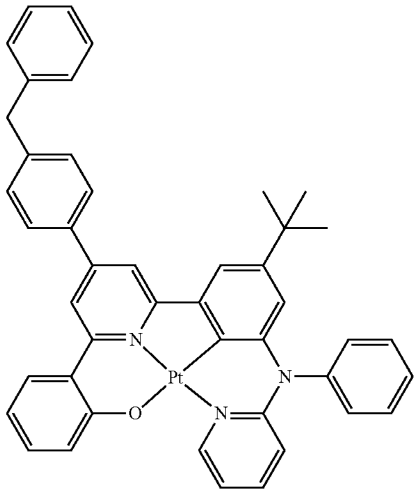
602
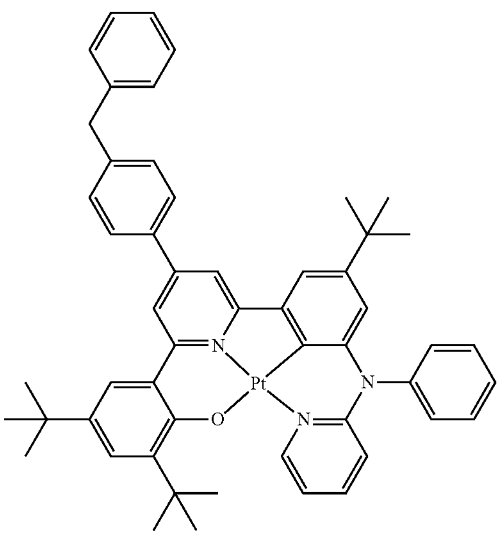
603
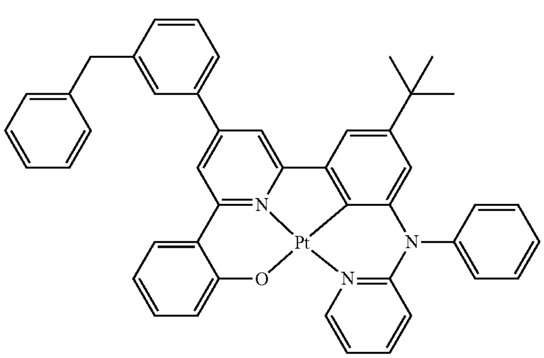
604
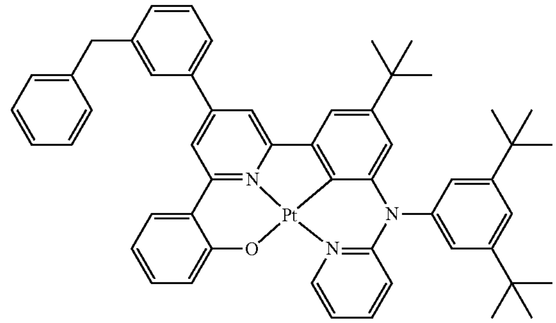
605
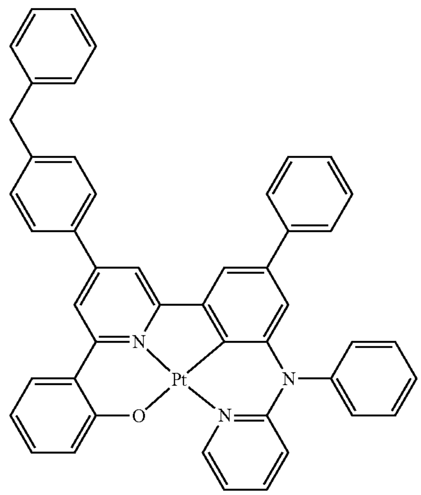
606
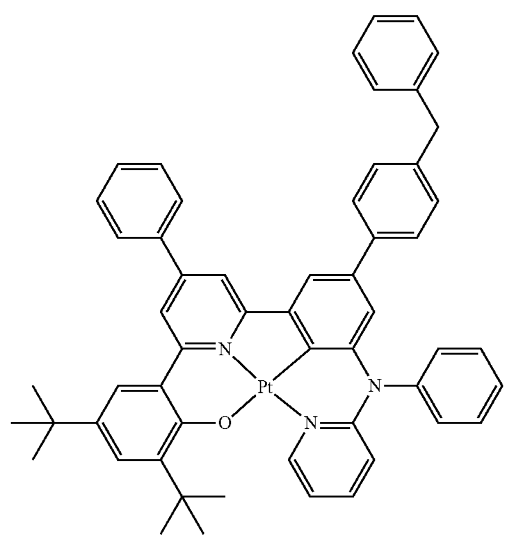

607
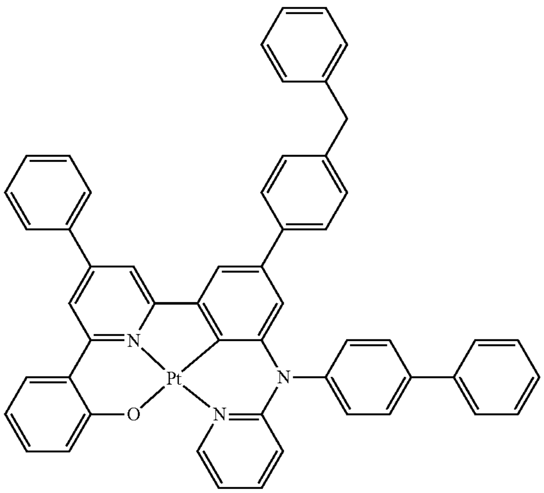
608
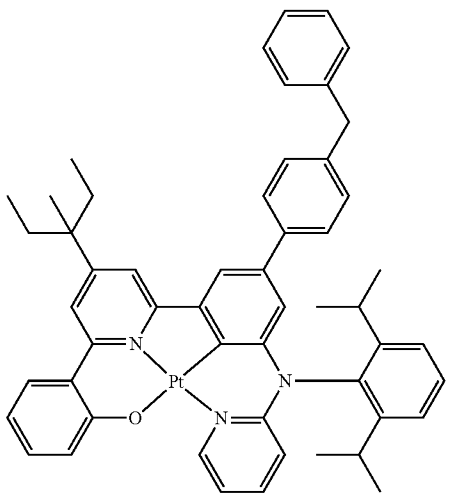
609
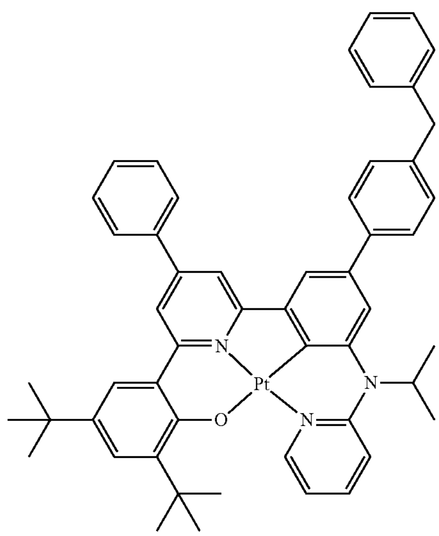
610
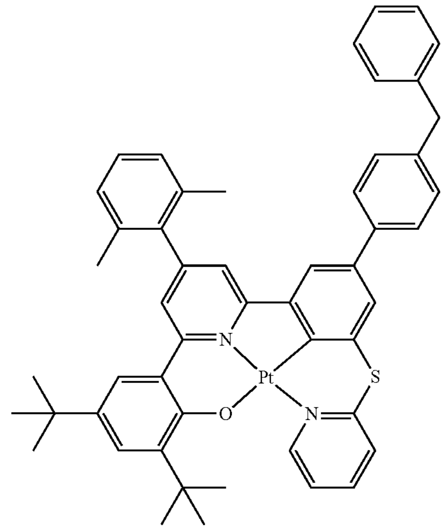
611
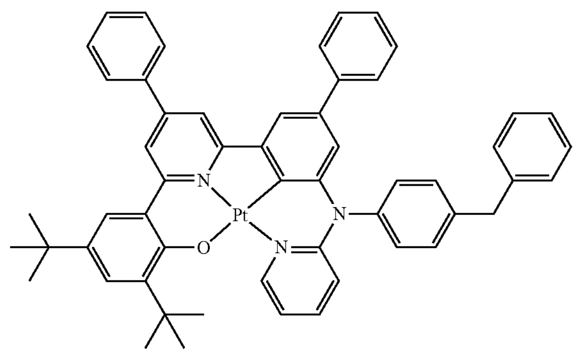
612
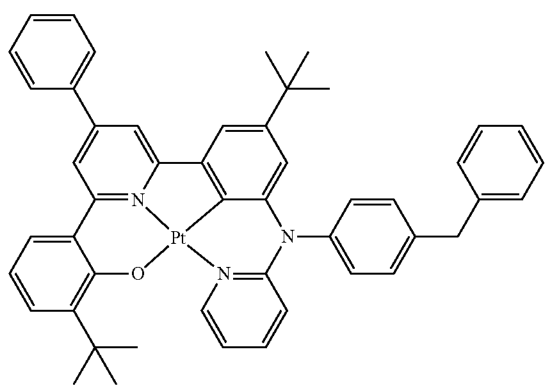

-continued
613
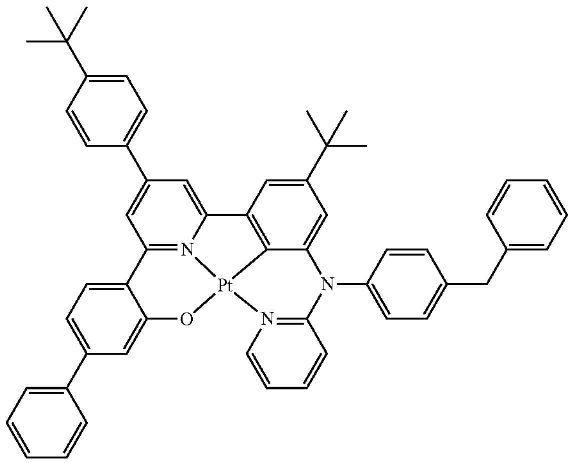
614
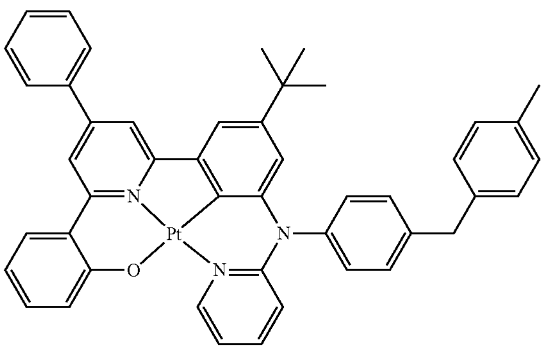
615
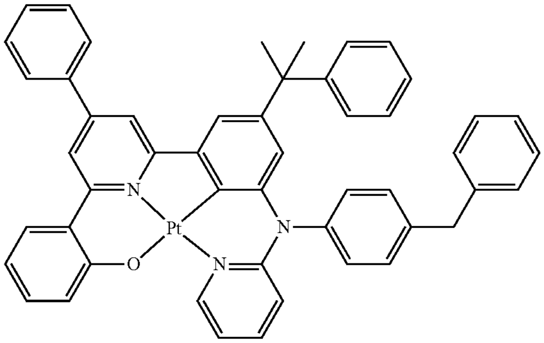
-continued
616
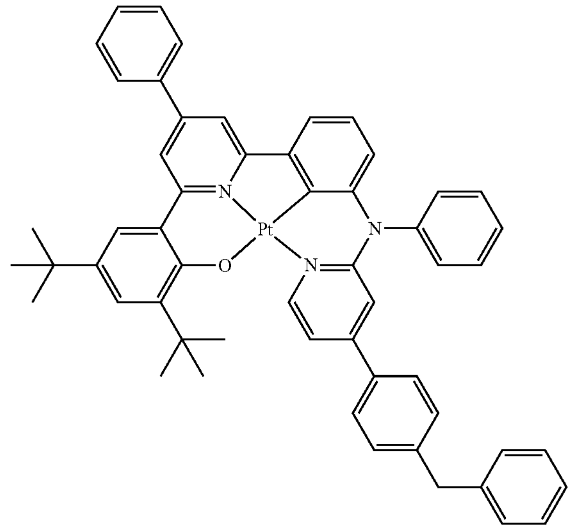
617
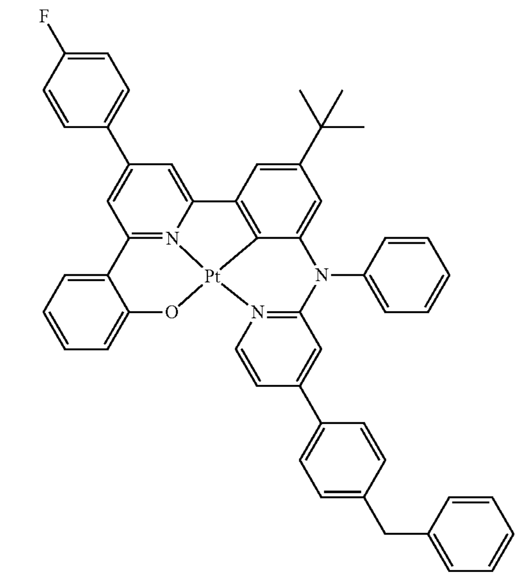
618
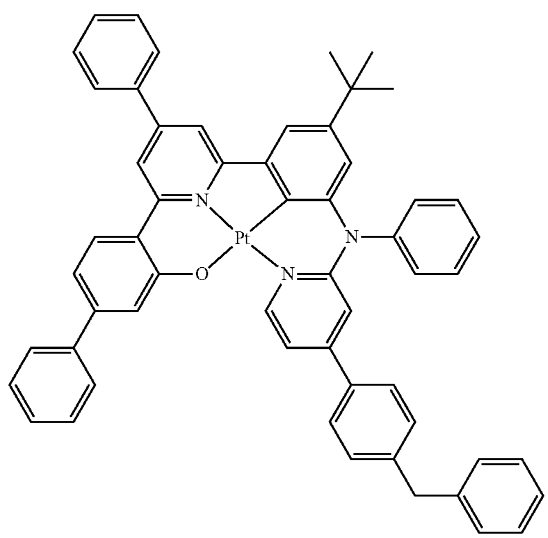

-continued
619
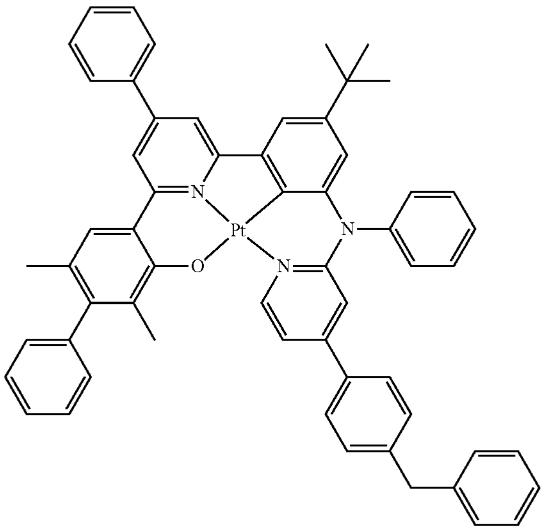
620
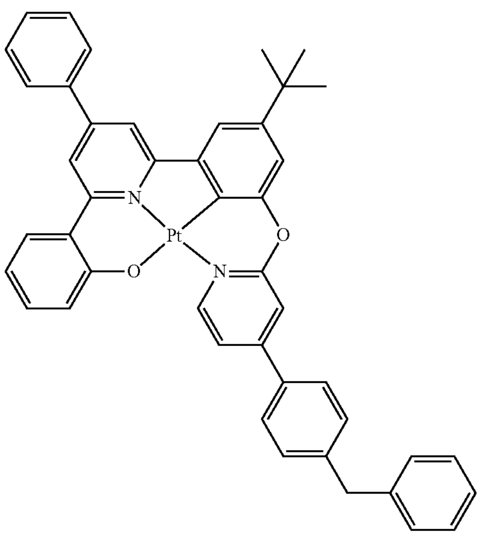
621
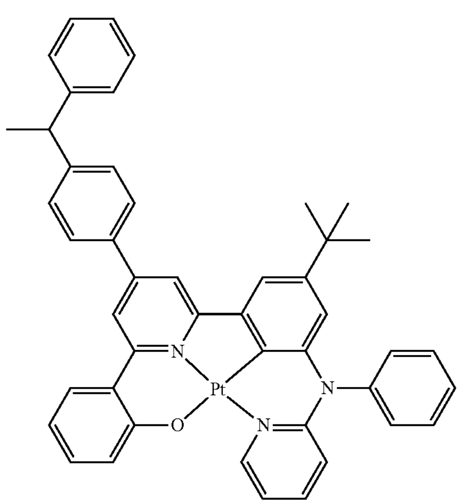
-continued
622
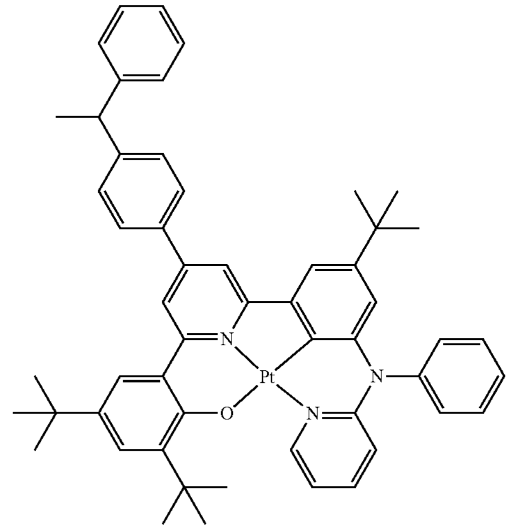
623
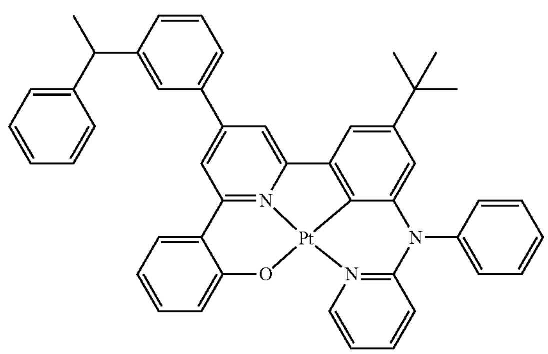
624
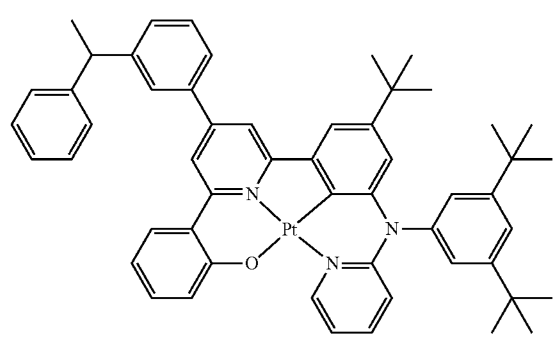

-continued
625
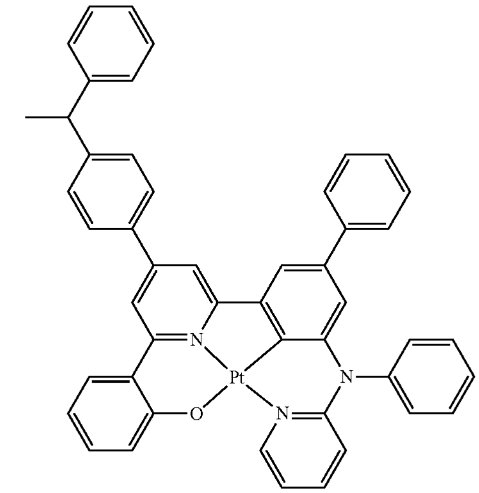
626
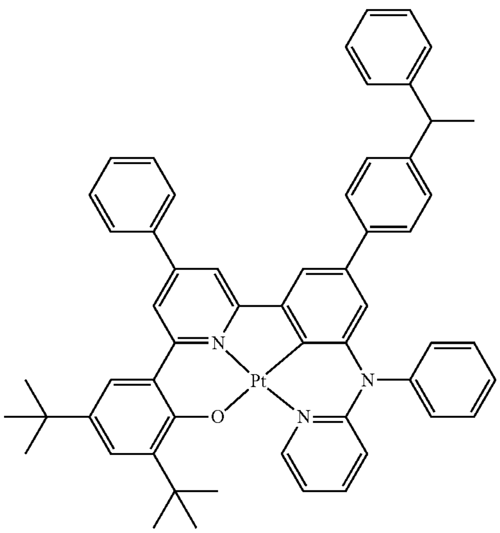
627
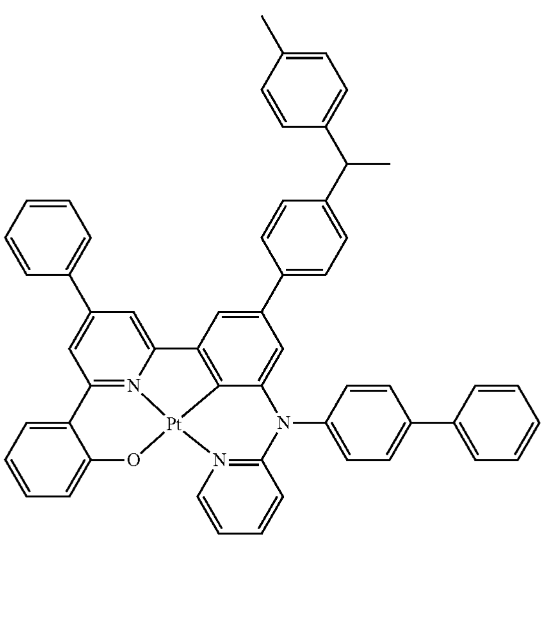
-continued
628
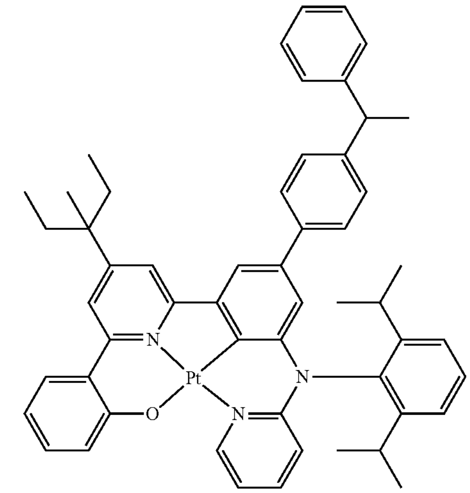
629
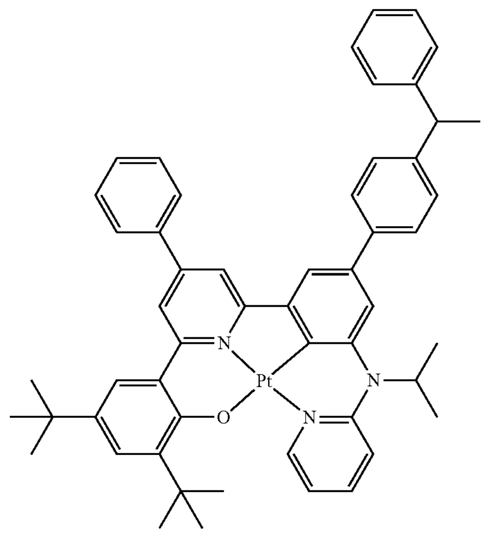
630
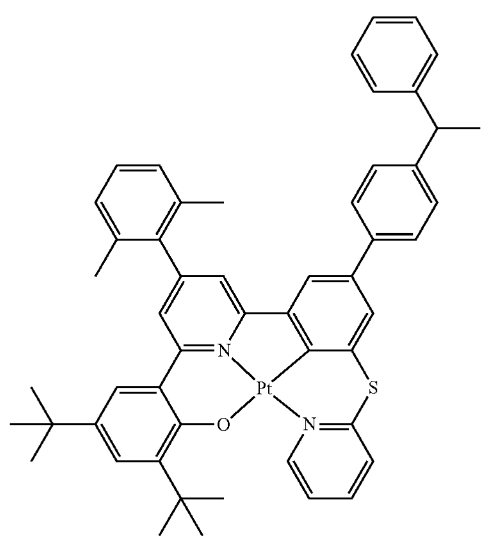

-continued
631
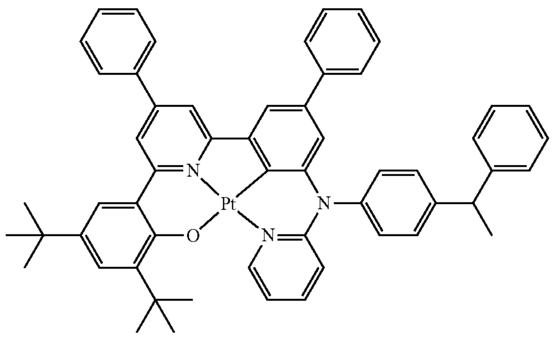
632
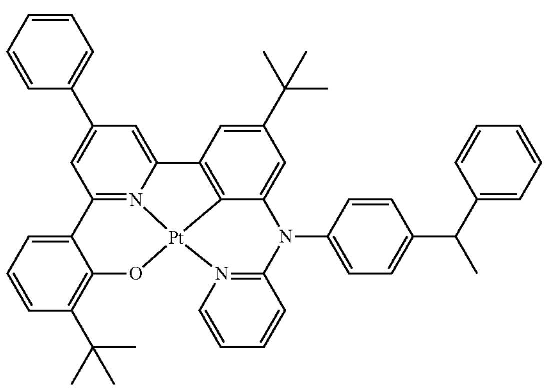
633
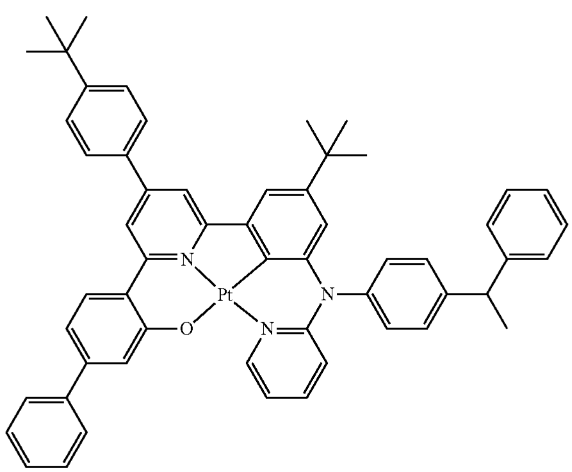
634
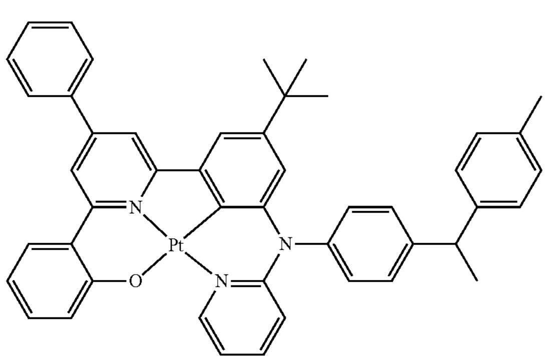
-continued
635
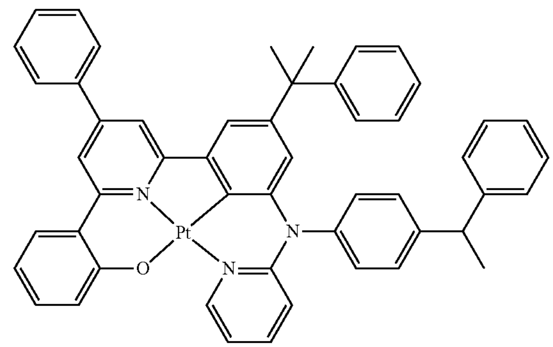
636
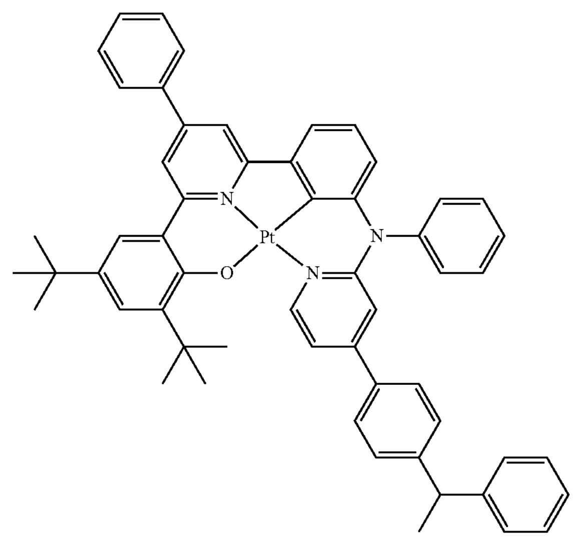
637
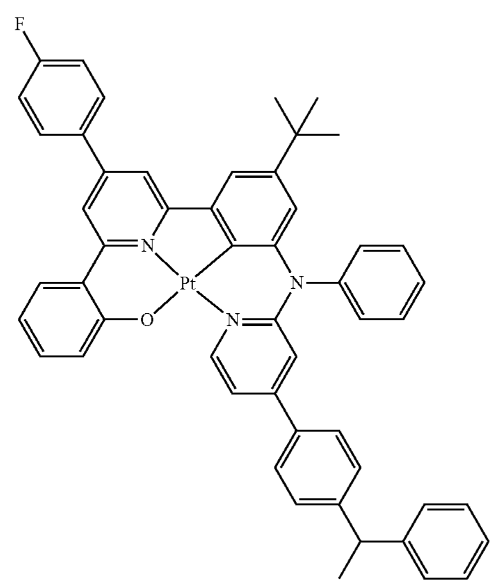

-continued
638
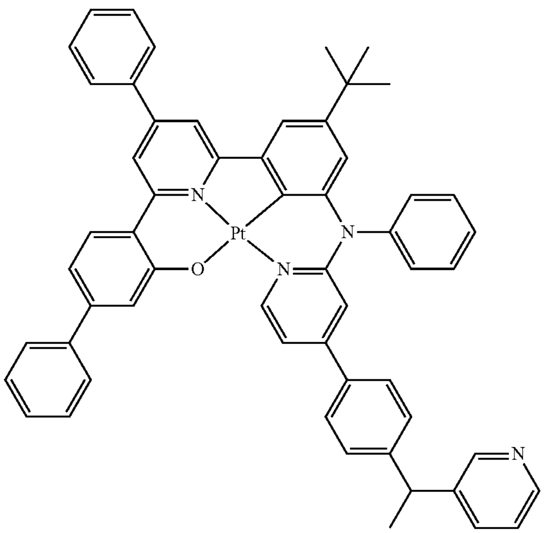
639
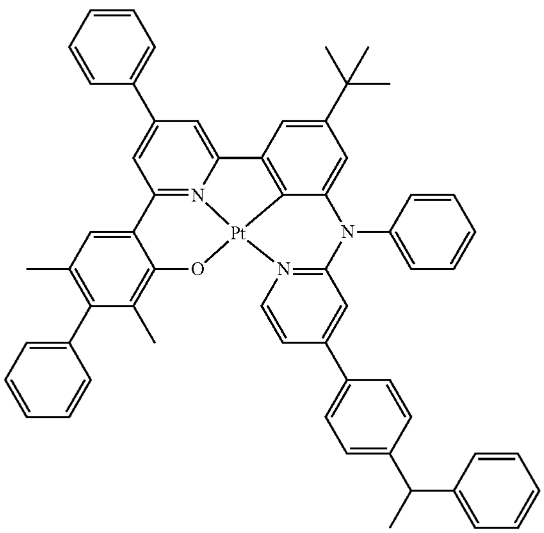
640
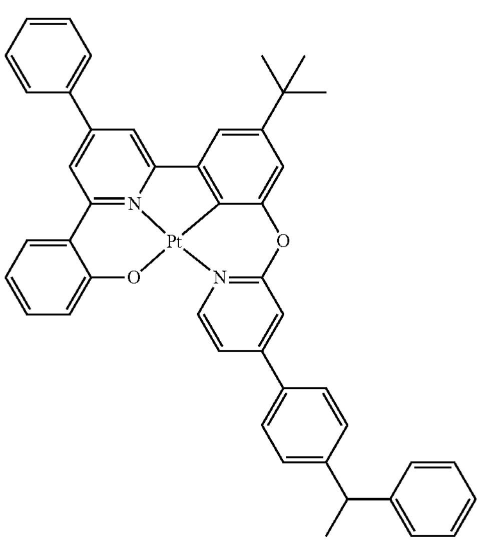
-continued
641
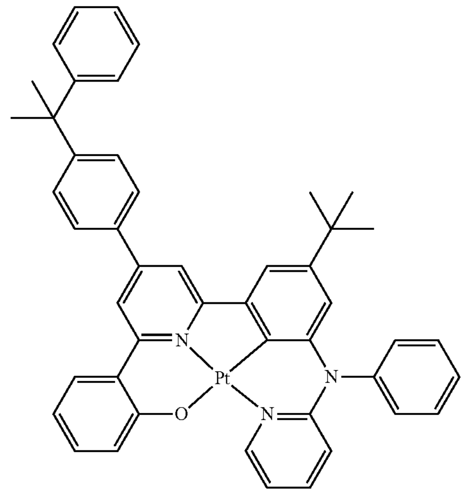
642
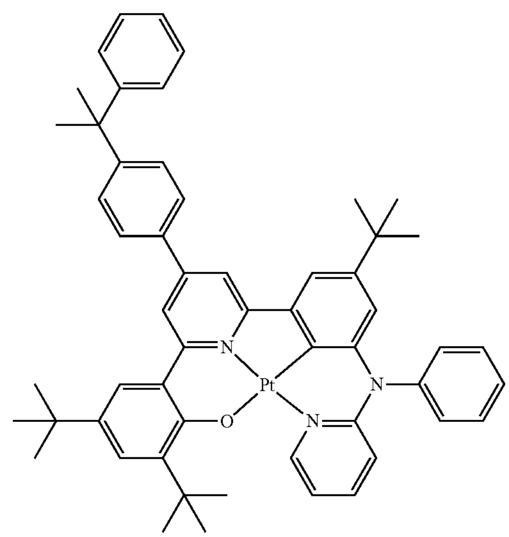
643
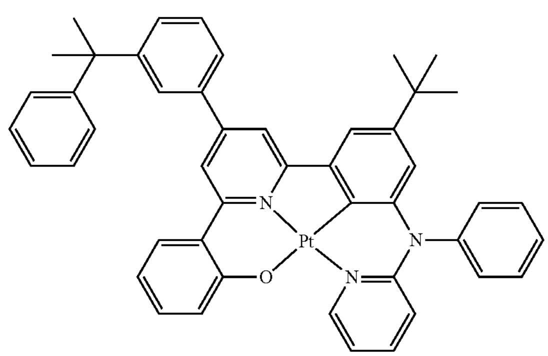

-continued
646
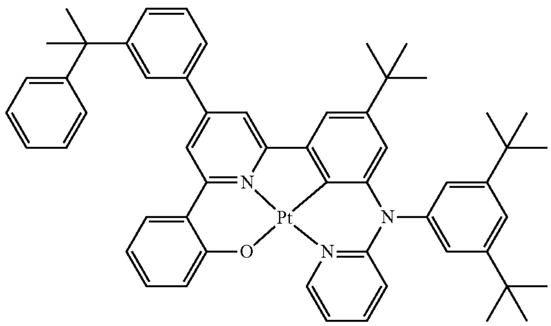
645
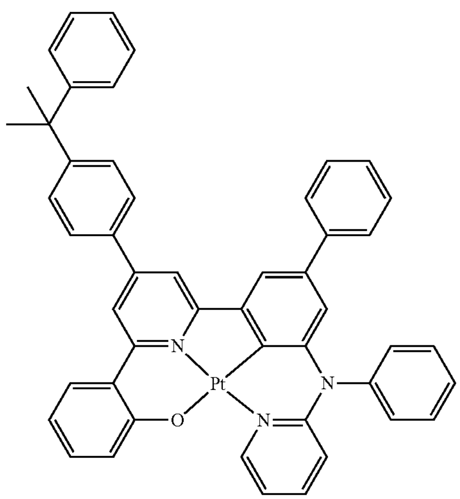
646
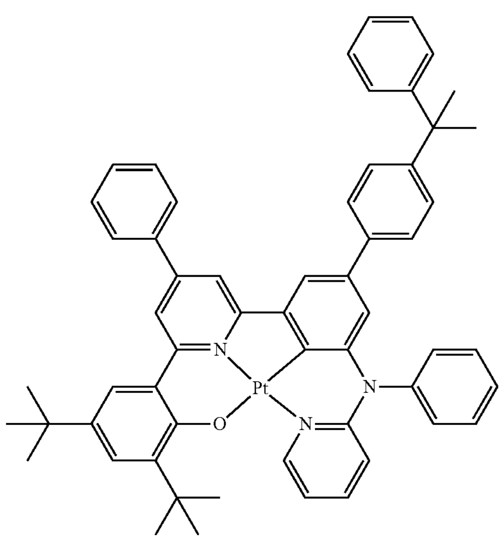
-continued
647
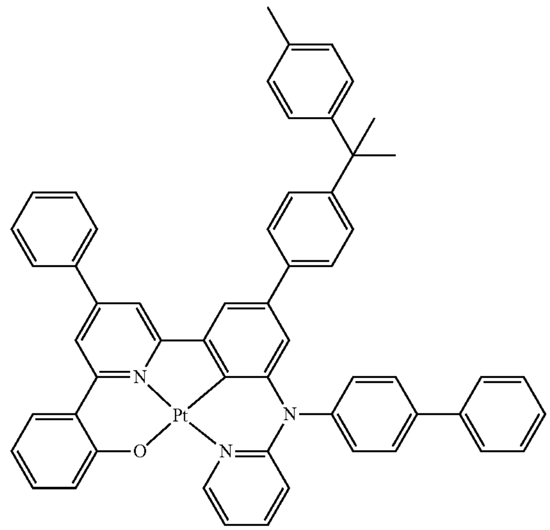
648
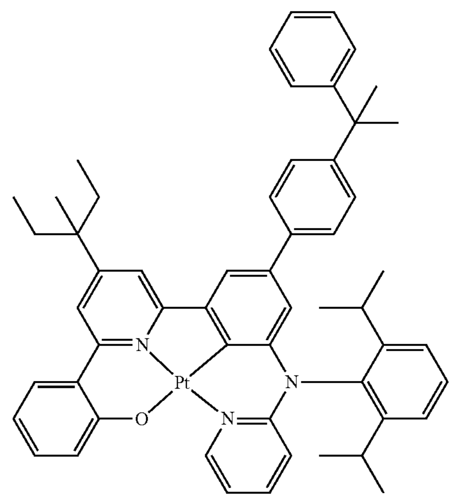
649
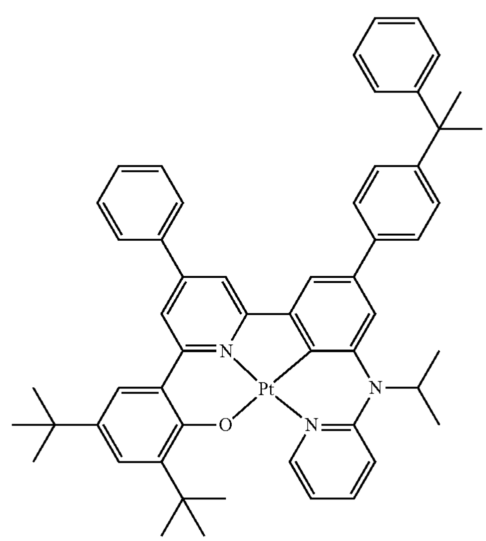

-continued
650
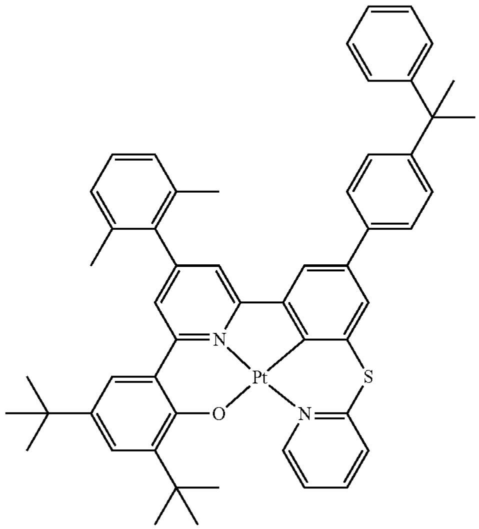
651
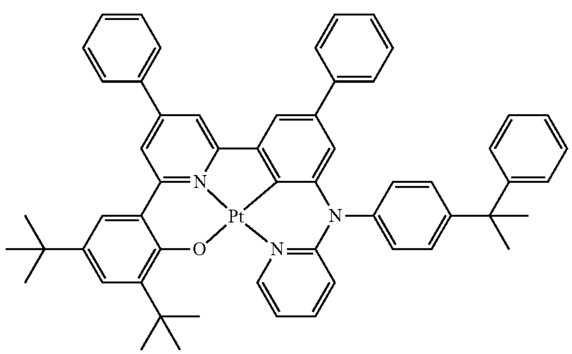
652
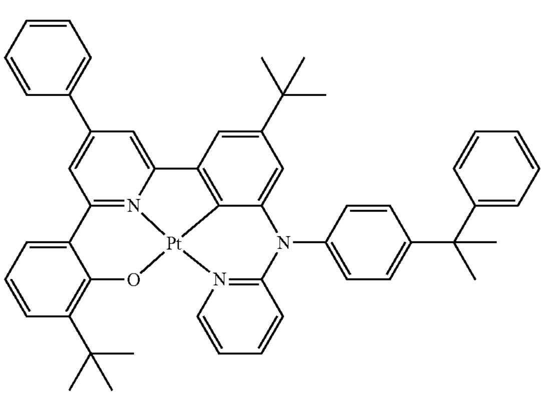
-continued
653
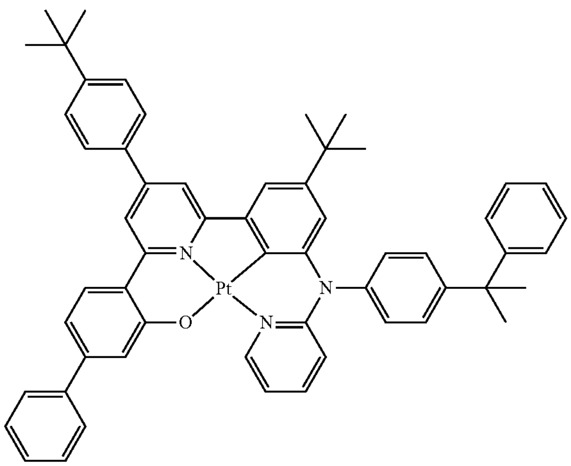
654
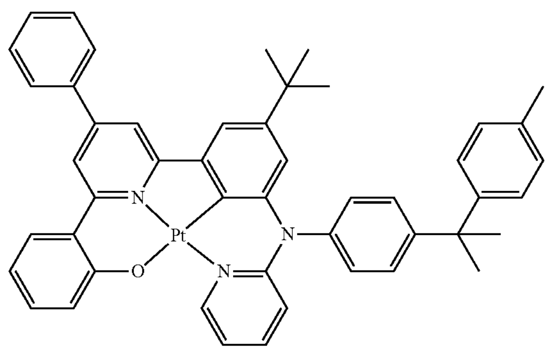
655
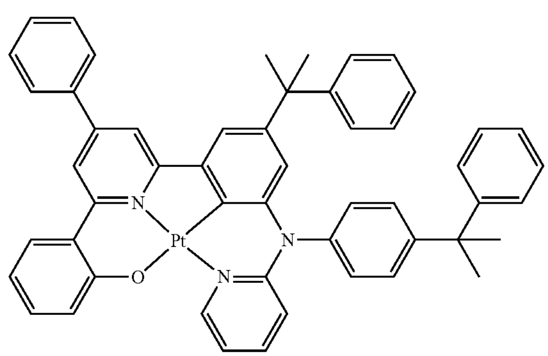

-continued
656
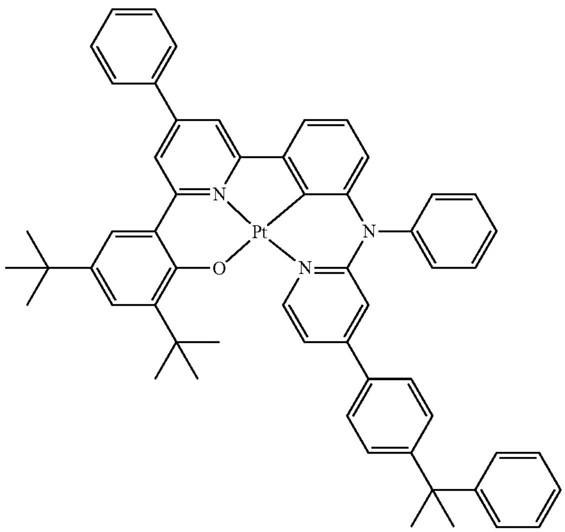
657
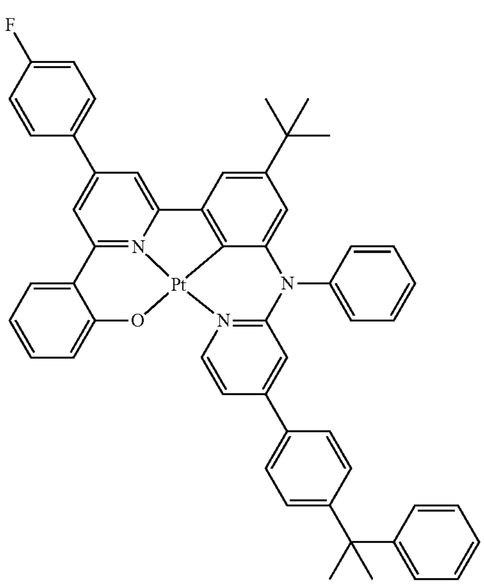
-continued
658
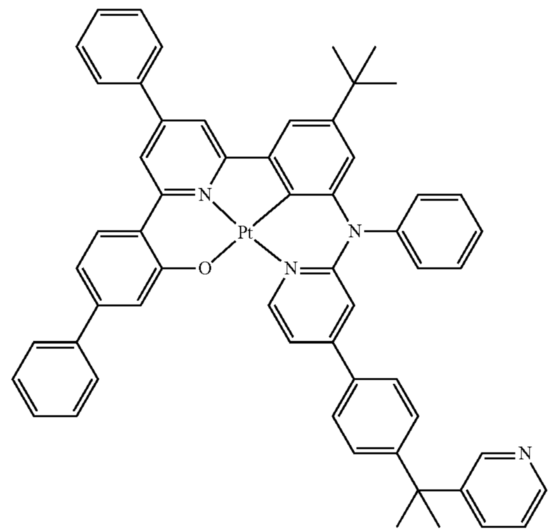
659
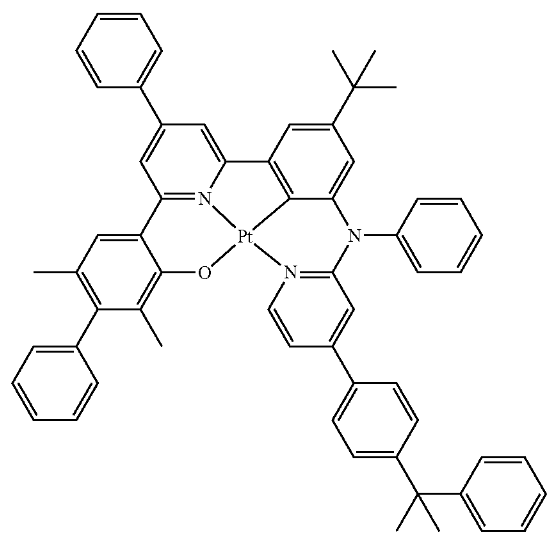
660
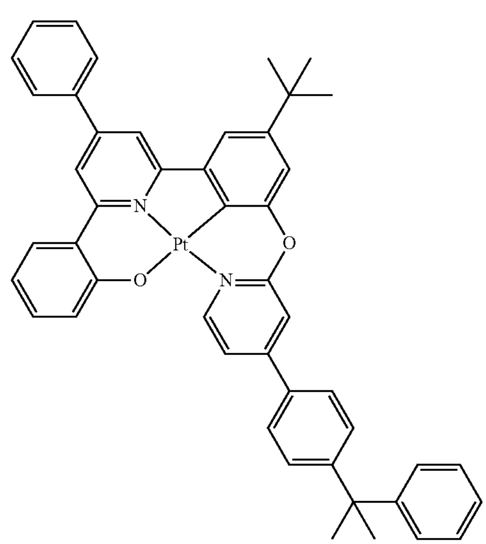

-continued
661
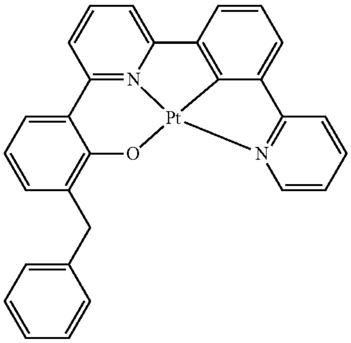
662
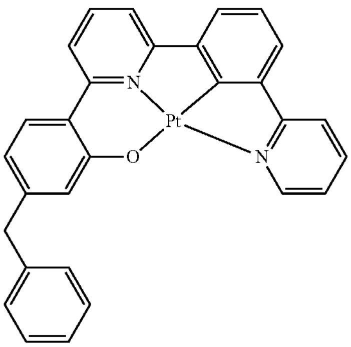
663
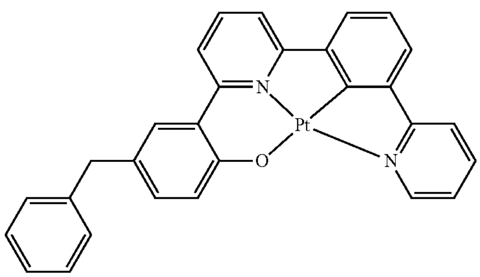
664
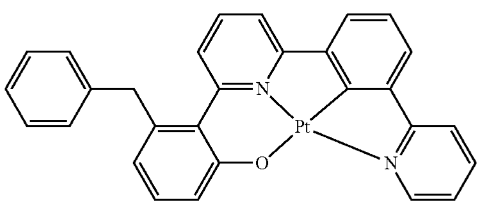
665
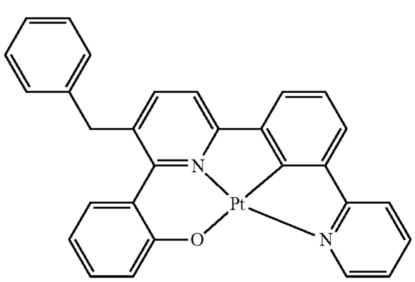
-continued
666
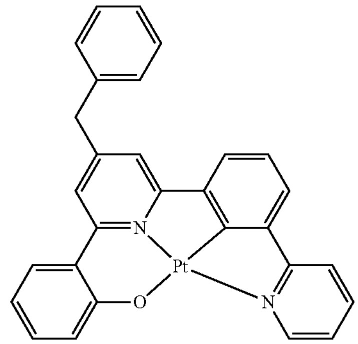
667
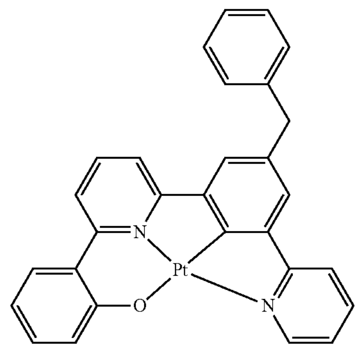
668
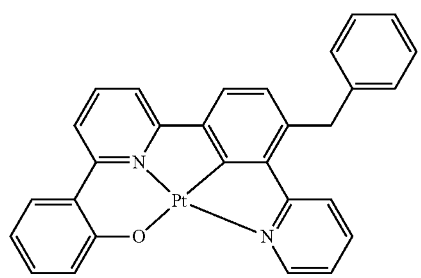
669
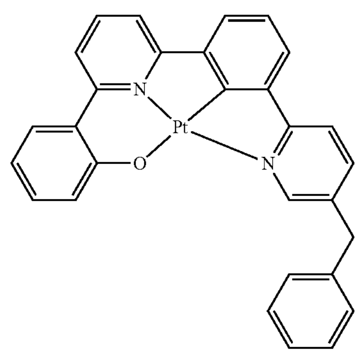

-continued
670
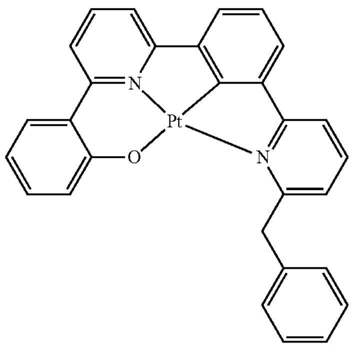
671
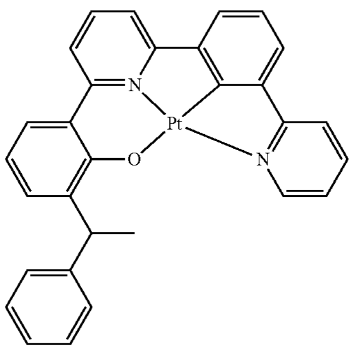
672
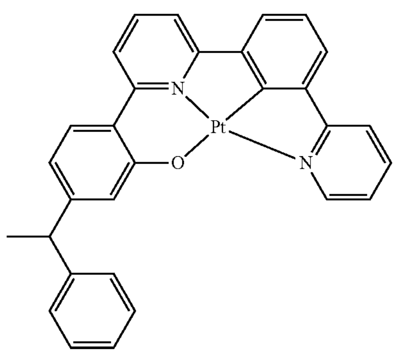
673
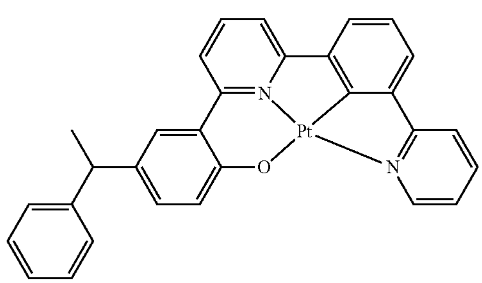
674
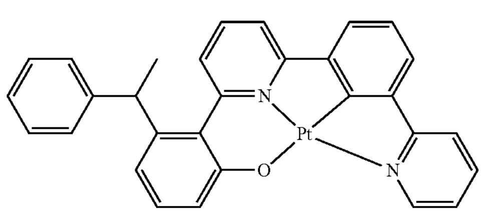
-continued
675
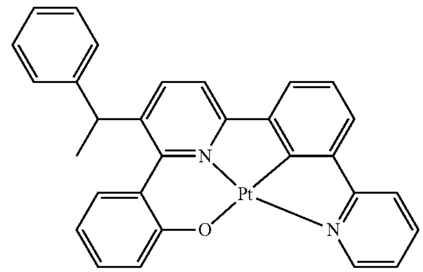
676
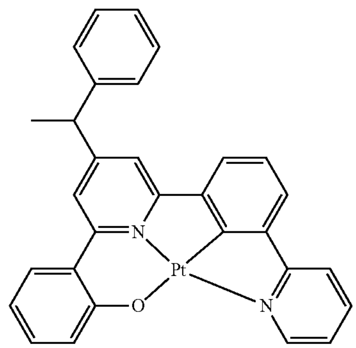
677
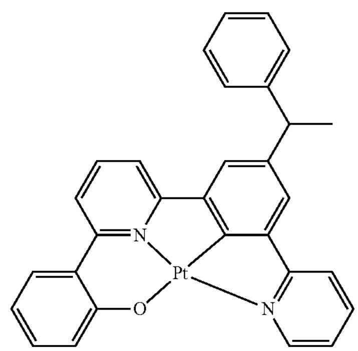
678
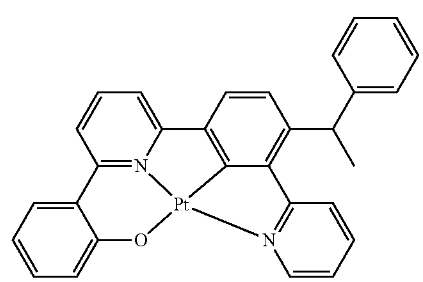
679
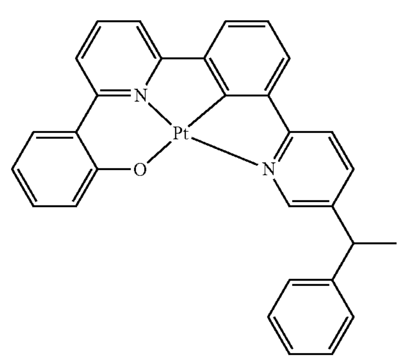

-continued
680
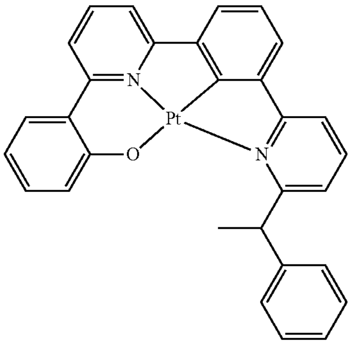
681
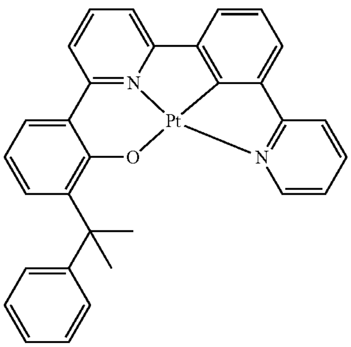
682
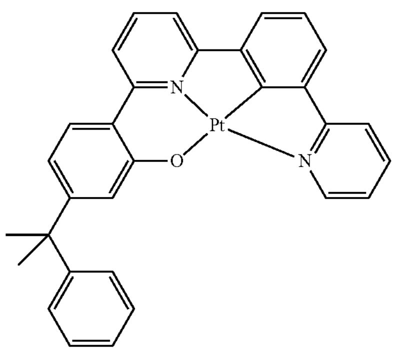
683
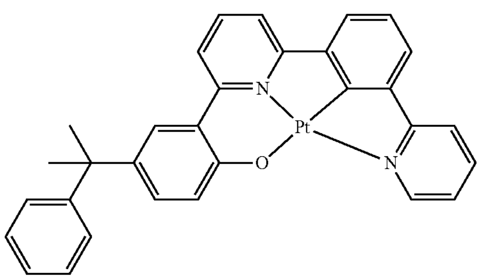
684
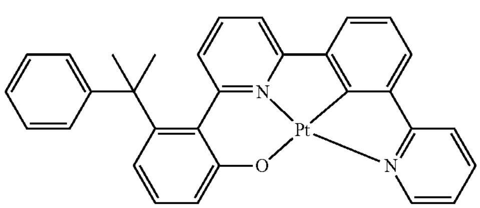
-continued
685
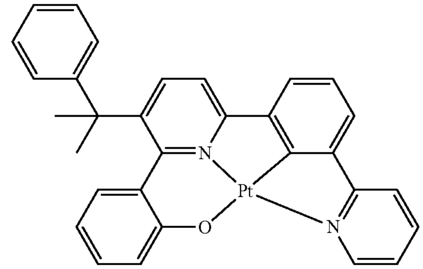
686
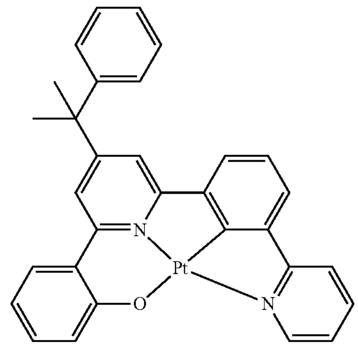
687
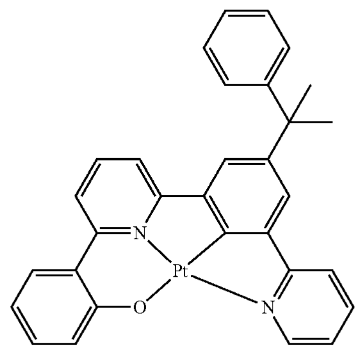
688
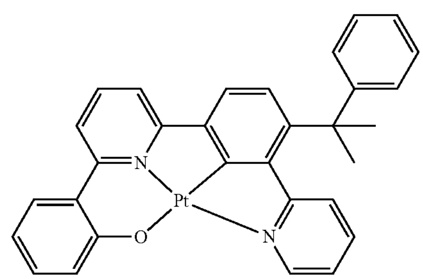
689
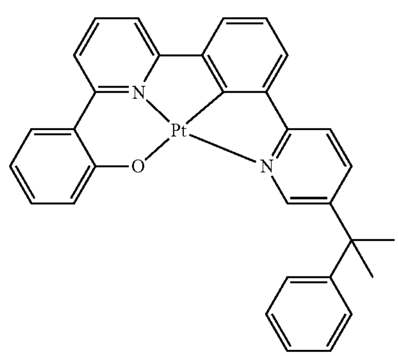

-continued
690
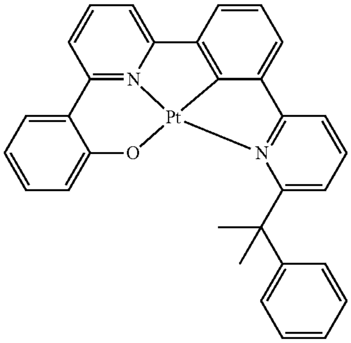
691
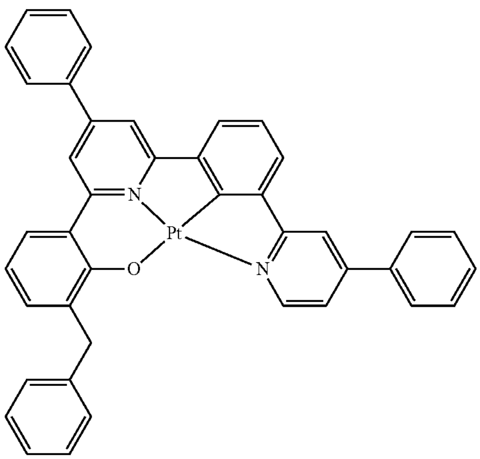
692
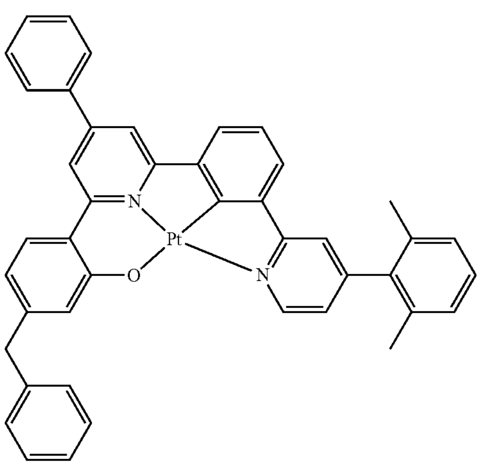
-continued
693
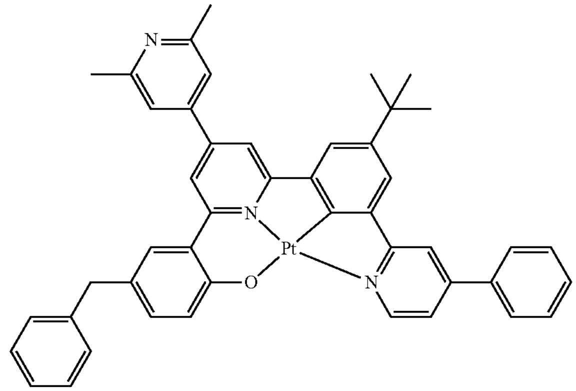
694
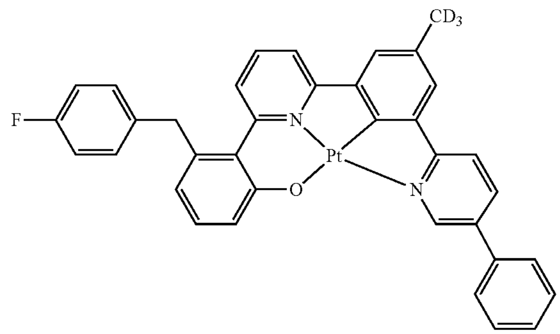
695
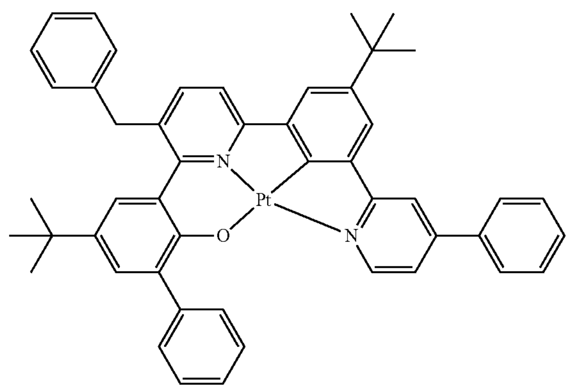
696
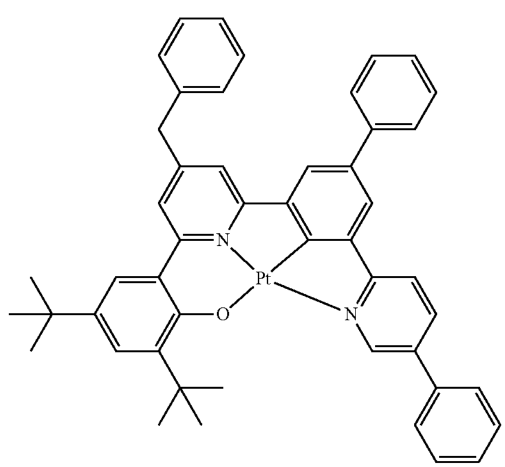

-continued
697
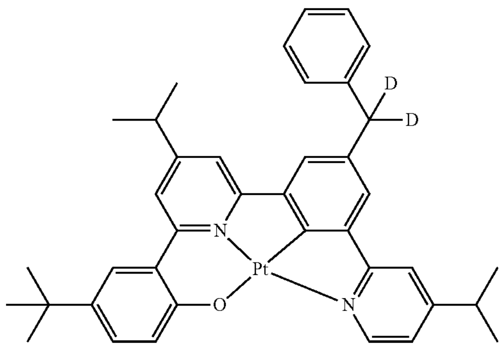
698
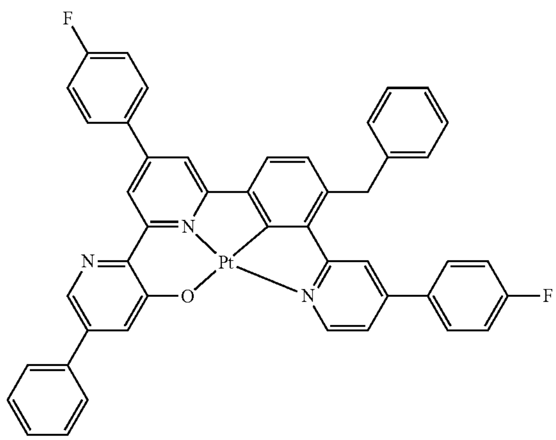
699
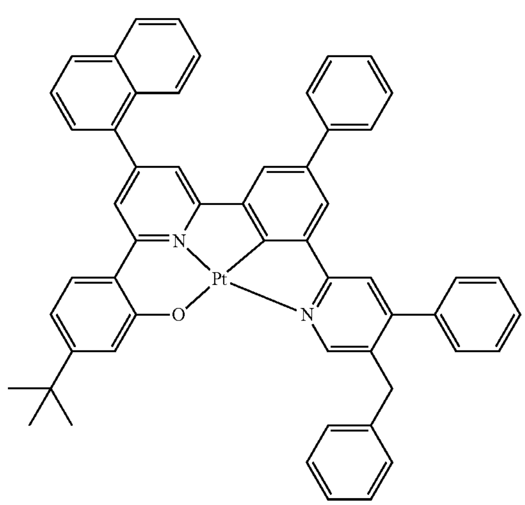
-continued
700
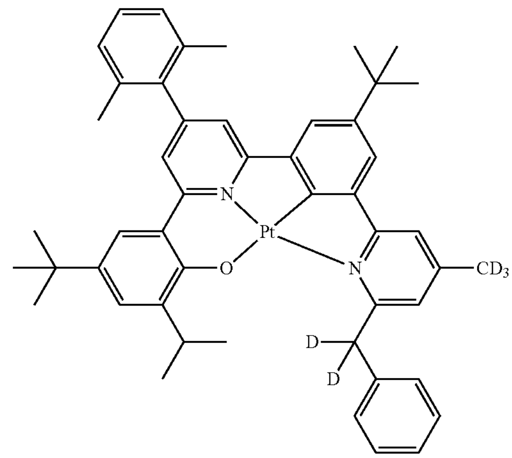
701
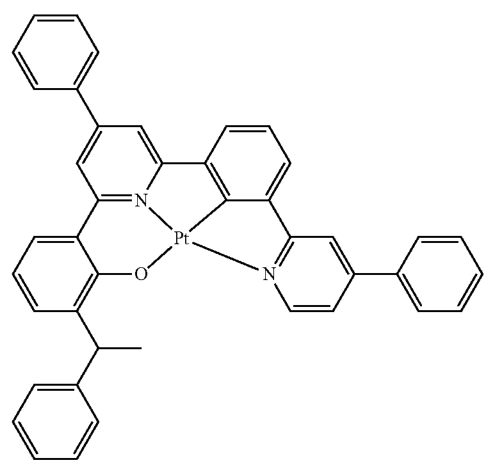
702
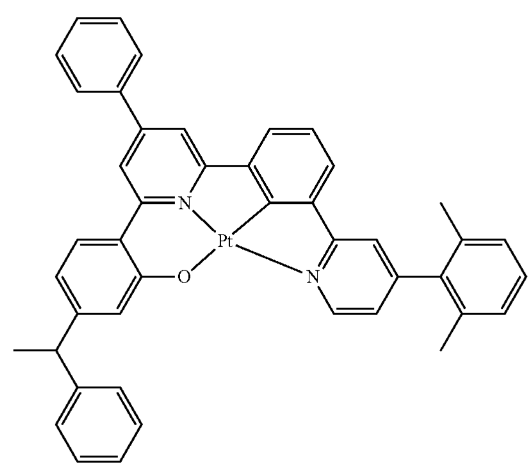

-continued
703
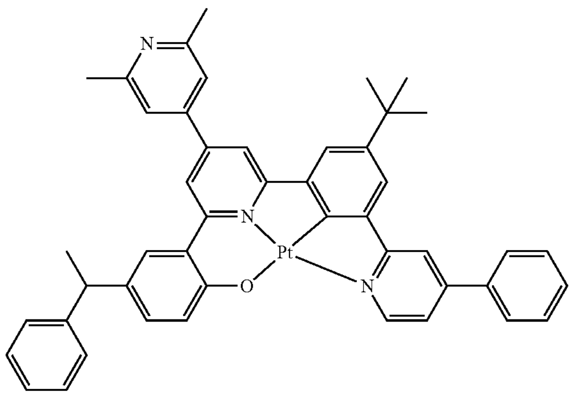
704
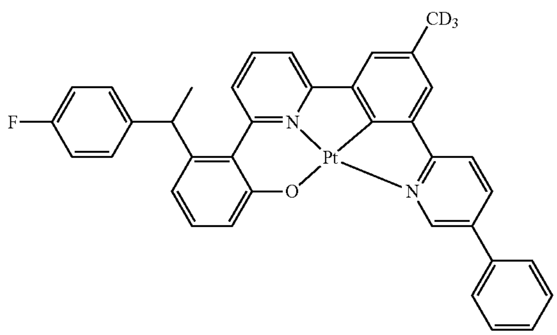
705
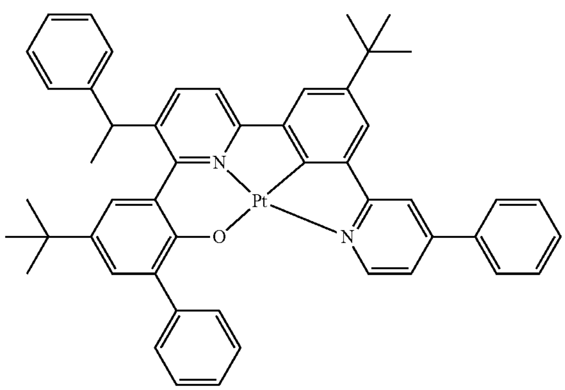
706
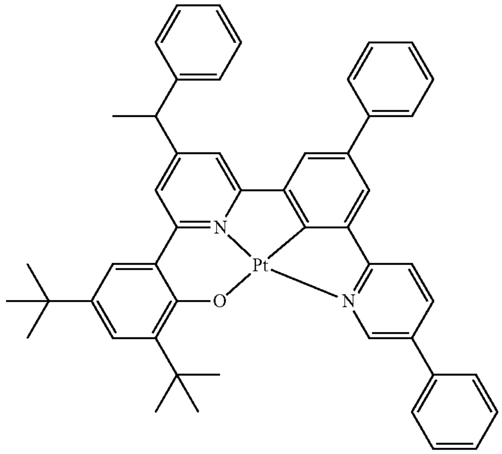
-continued
707
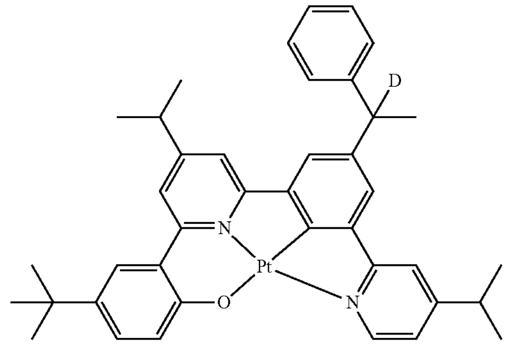
708
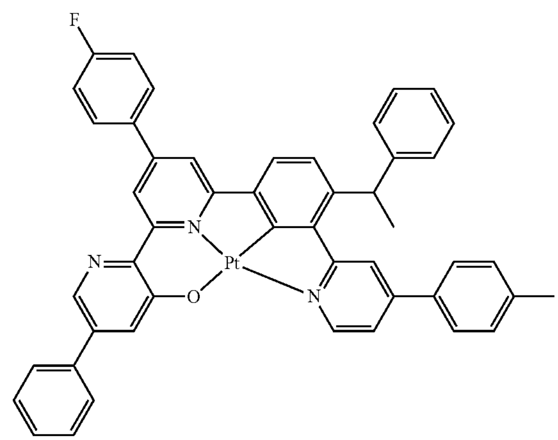
709
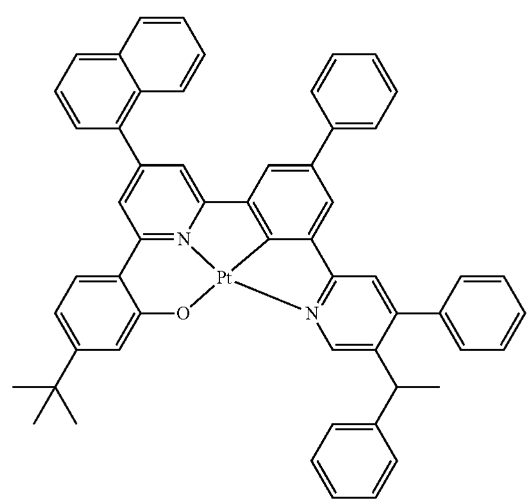

710
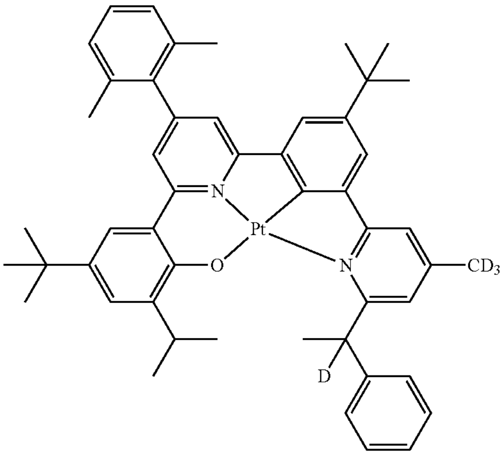
711
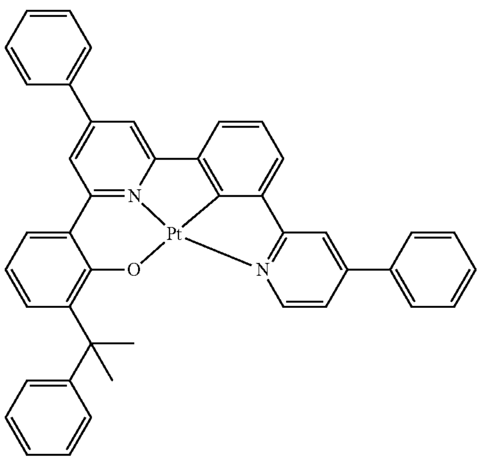
712
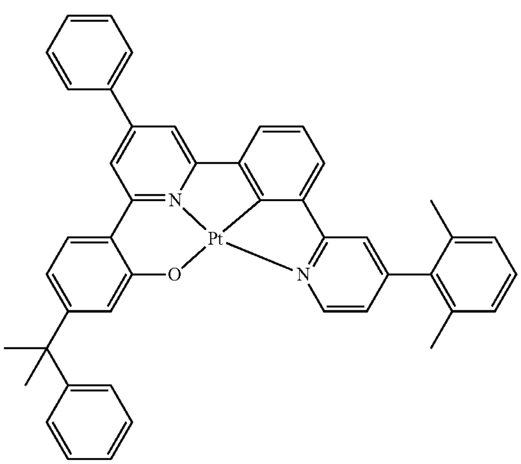
713
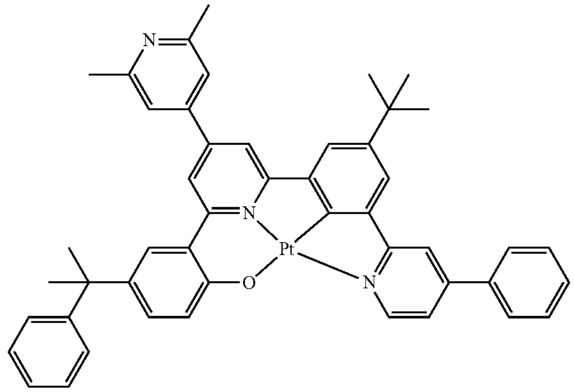
714
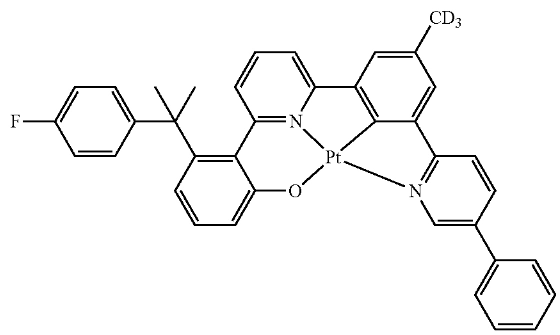
715
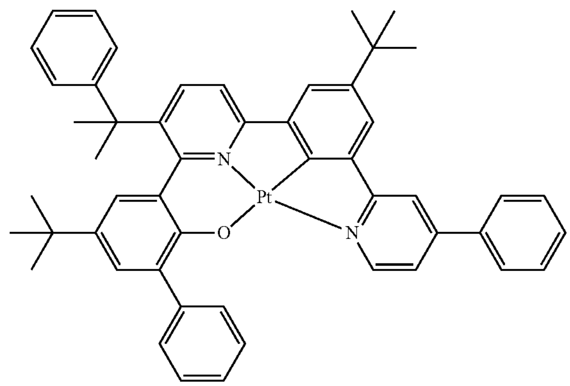
716
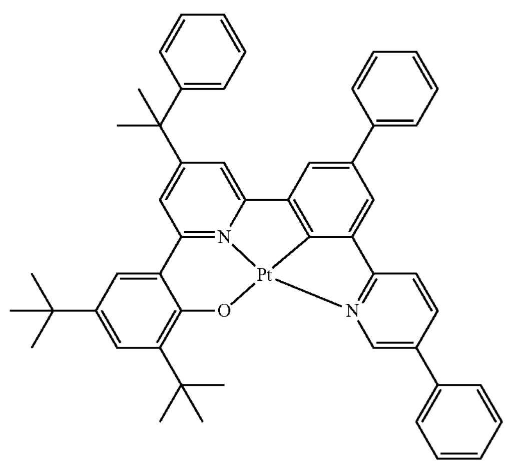

-continued
717
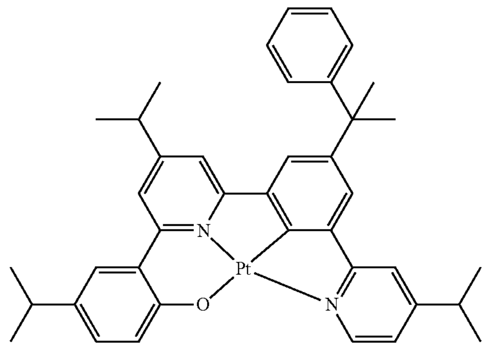
718
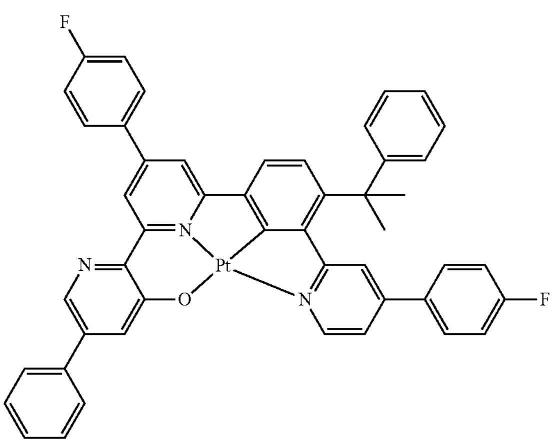
719
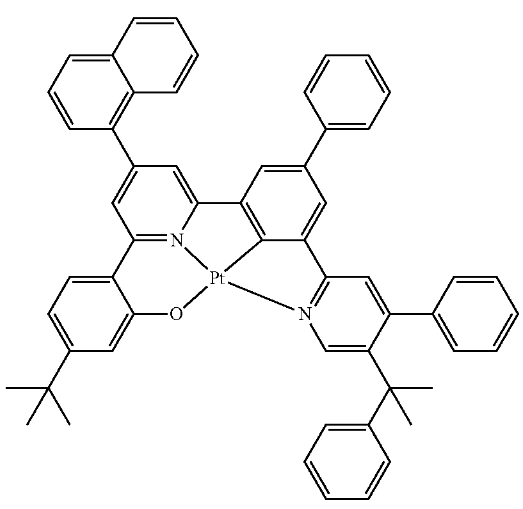
-continued
720
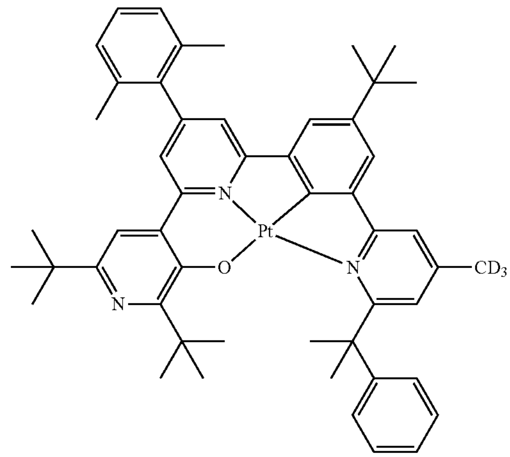
721
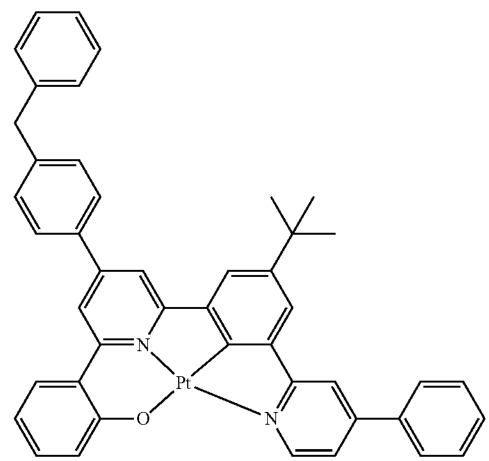
722
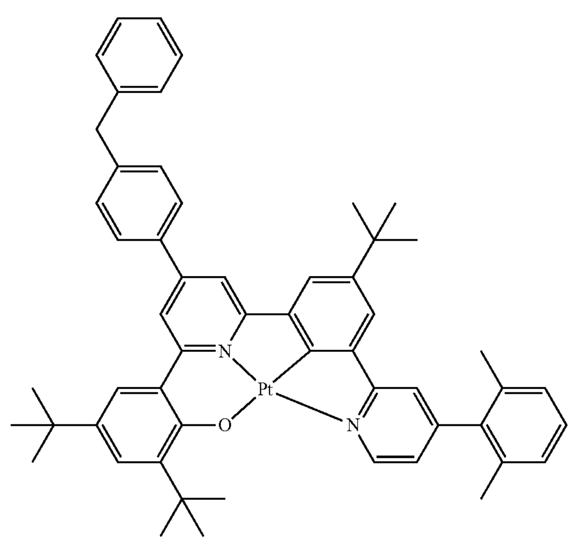

-continued
723
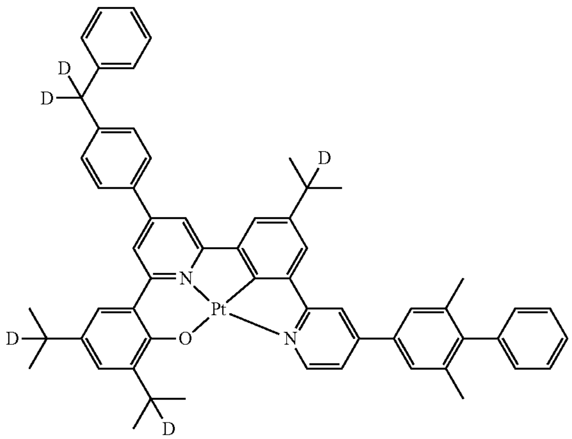
724
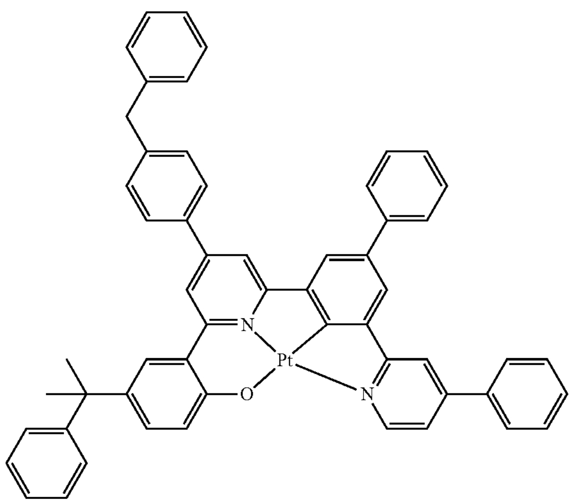
725
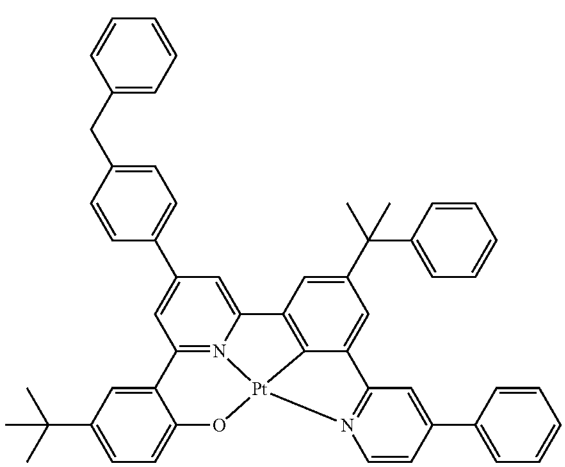
-continued
726
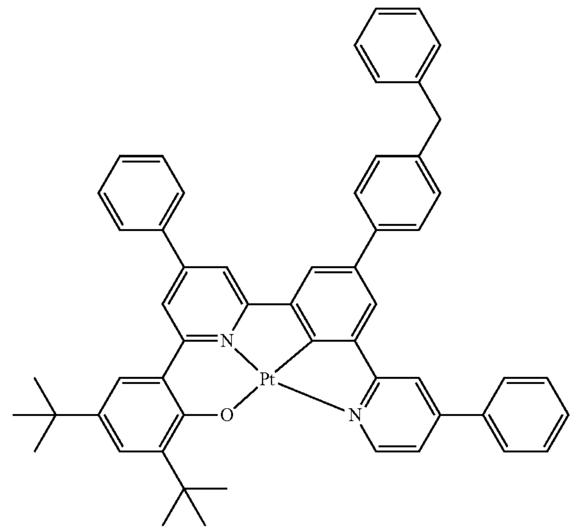
727
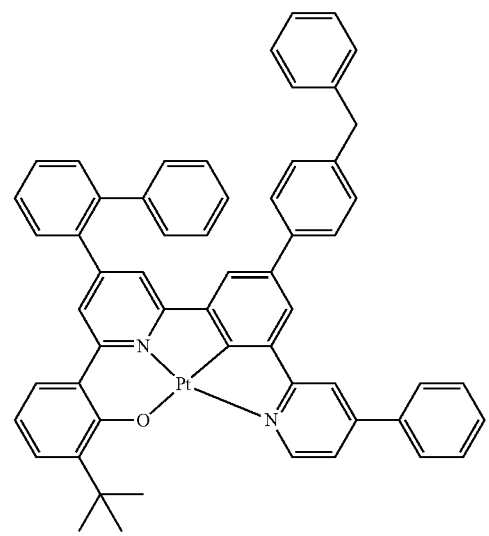
728
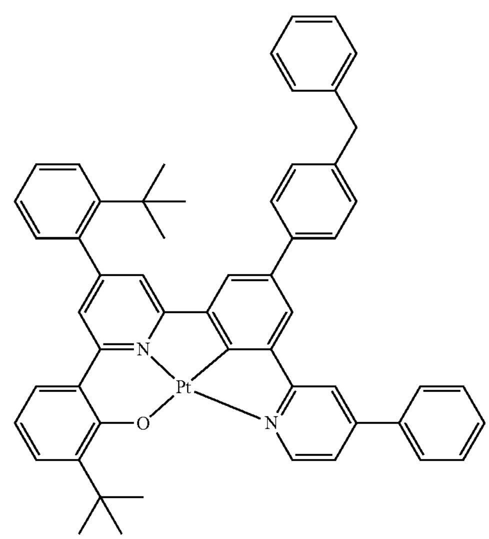

729
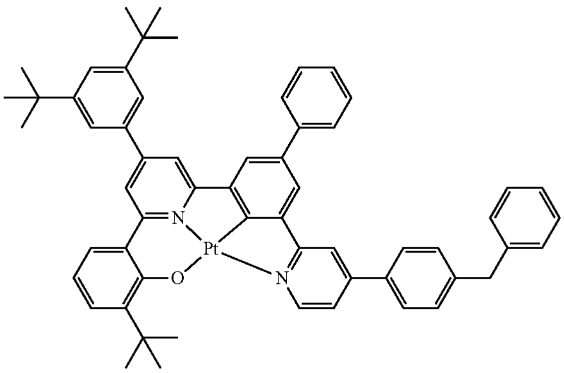
730
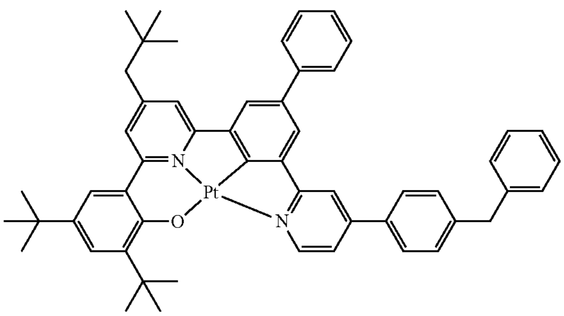
731
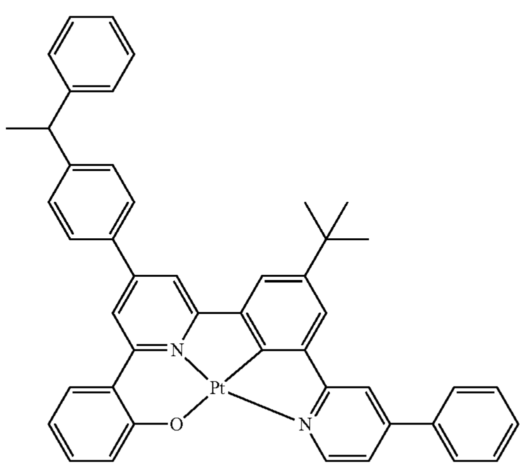
732
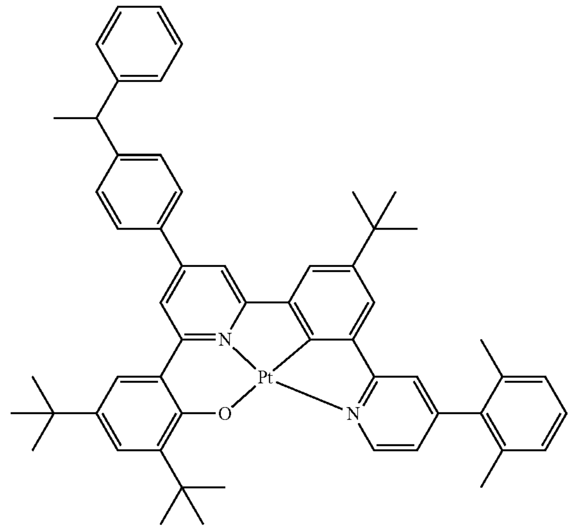
733
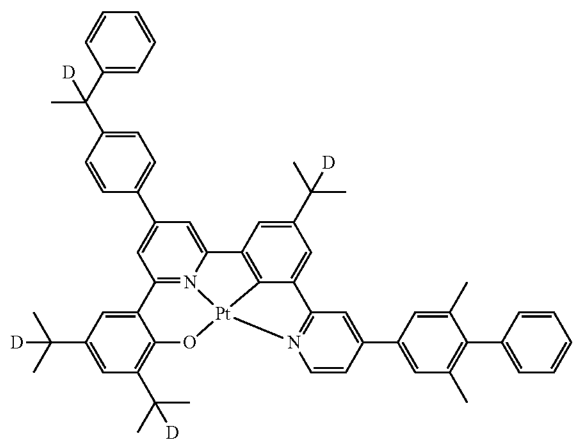
734
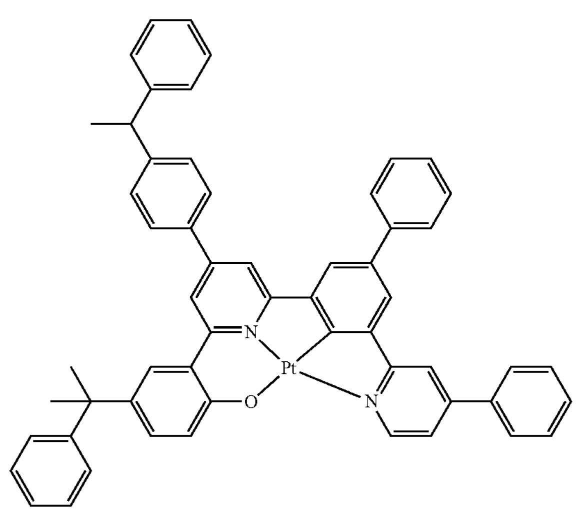

735
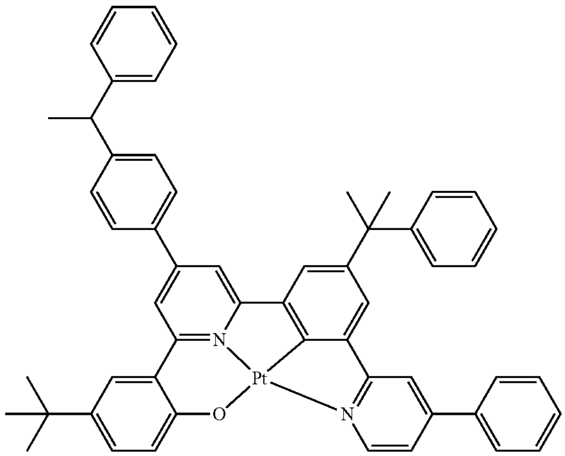
736
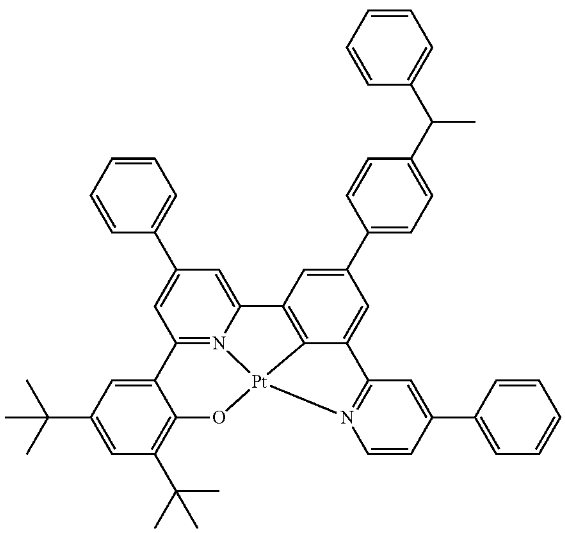
737
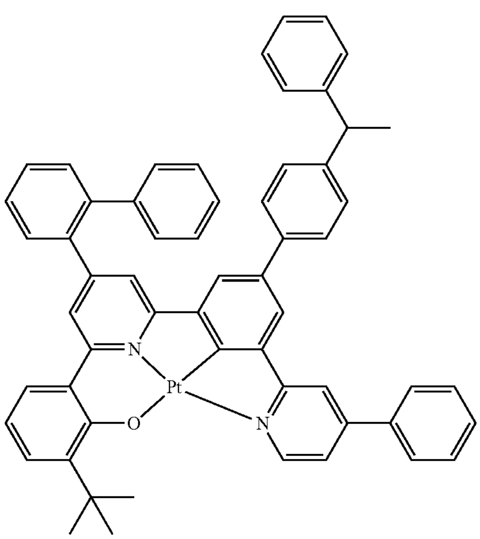
738
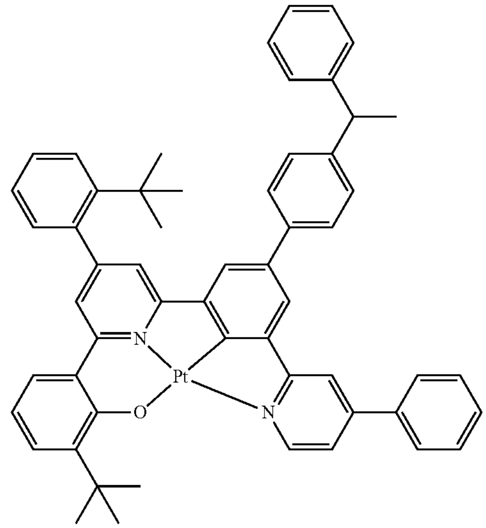
739
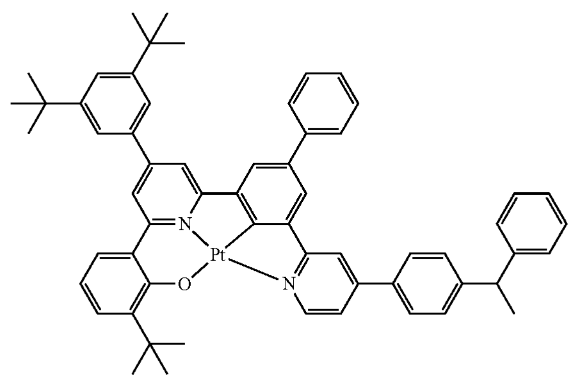
740
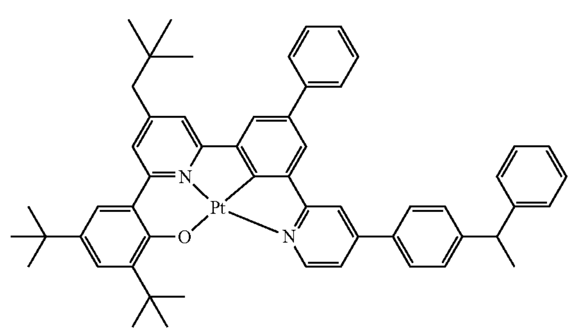

-continued
741
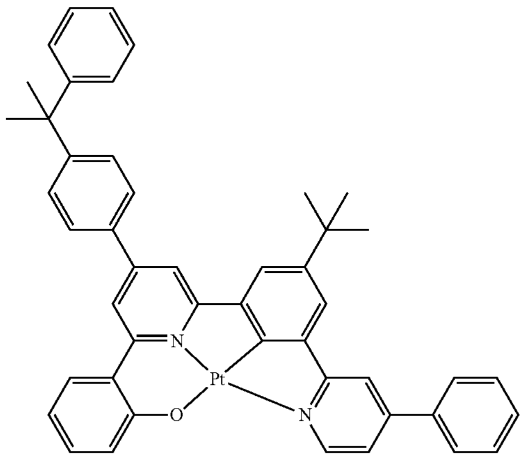
742
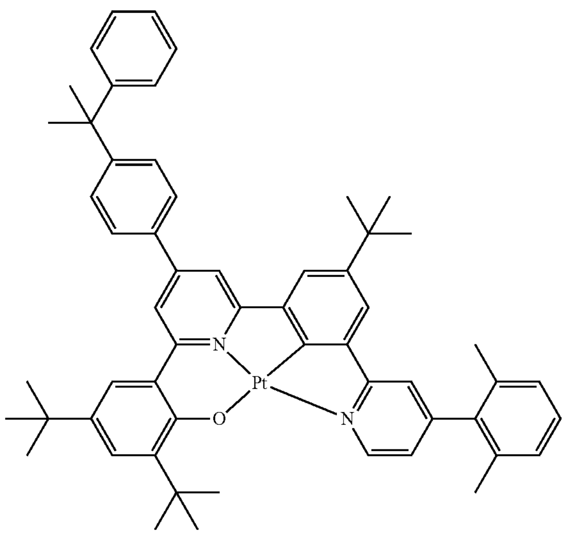
743
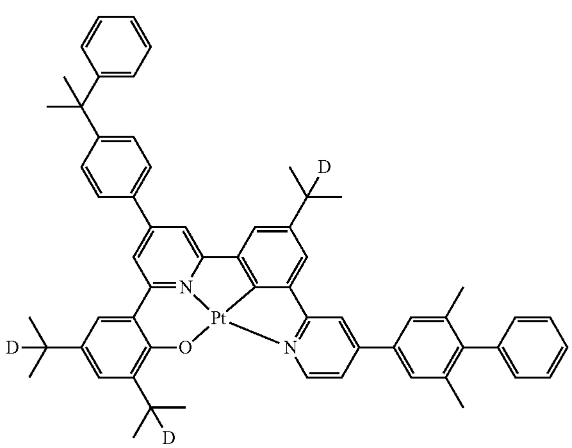
-continued
744
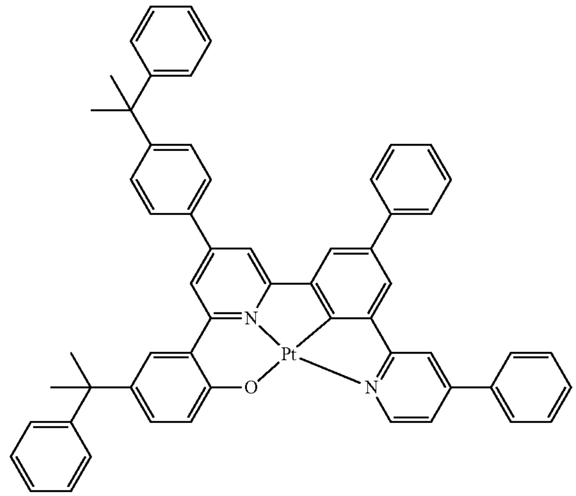
745
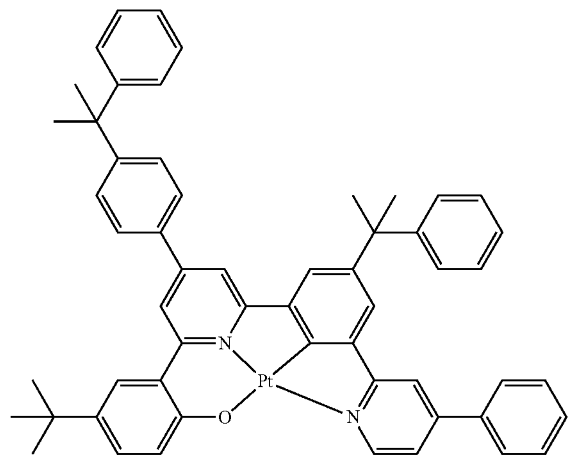
746
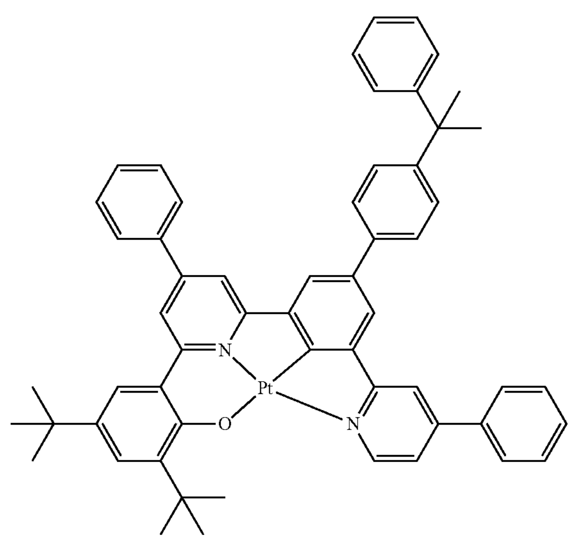

-continued

747

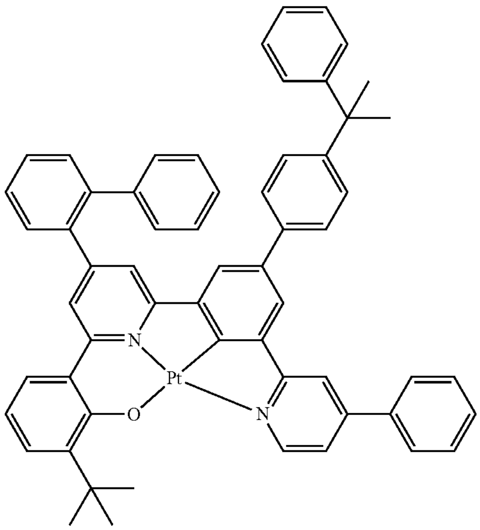

748

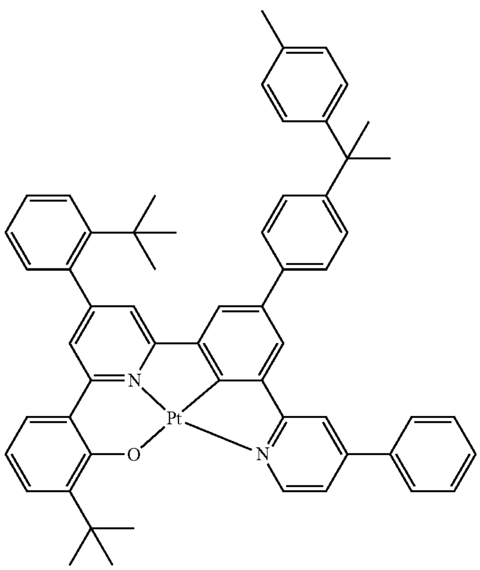

749

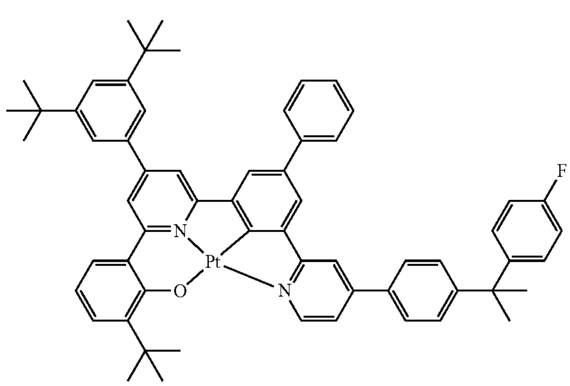

-continued

750

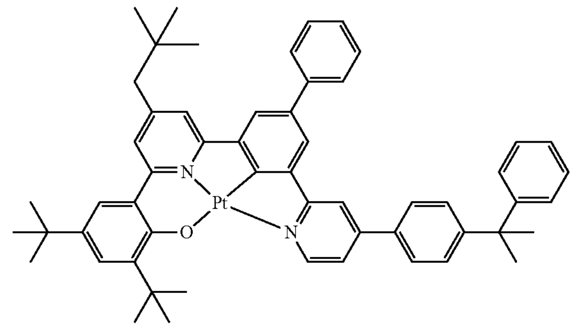

The organometallic compound represented by Formula 1 satisfies at least one of Condition 1 and Condition 2 as described in the present specification. In other words, the organometallic compound represented by Formula 1 includes, as a substituent, at least one group represented by Formula 51. Accordingly, the organometallic compound represented by Formula 1 may have improved planarity and orientation characteristics, and thus, an electronic device, for example, an organic light-emitting device, using the organometallic compound represented by Formula 1 may have improved characteristics in terms of luminescence efficiency and/or lifespan.

A highest occupied molecular orbital (HOMO) energy level, lowest unoccupied molecular orbital (LUMO) energy level, and $T_1$ energy level of the exemplary organometallic compound represented by Formula 1 were evaluated using the Gaussian 09 program with the molecular structure optimization obtained by B3LYP-based density functional theory (DFT), and results thereof are shown in Table 1. The energy levels in Table 1 are in electron volts (eV).

TABLE 1

| Compound No. | HOMO (eV) | LUMO (eV) | $T_1$(eV) |
|---|---|---|---|
| 317 | −4.710 | −1.707 | 2.388 |
| 351 | −4.790 | −1.735 | 2.369 |
| 592 | −4.535 | −1.612 | 2.138 |
| 741 | −4.689 | −1.877 | 2.120 |

From Table 1, it is confirmed that the organometallic compound represented by Formula 1 has such electric characteristics that are suitable for use as a dopant for an electric device, for example, an organic light-emitting device.

Synthesis methods of the organometallic compound represented by Formula 1 may be recognizable by one of ordinary skill in the art by referring to Synthesis Examples provided below.

Accordingly, the organometallic compound represented by Formula 1 is suitable for use as a material for an organic layer of an organic light-emitting device, for example, a dopant in an emission layer of the organic layer. Thus, according to another aspect, provided is an organic light-emitting device including: a first electrode; a second electrode; and an organic layer located between the first electrode and the second electrode and including an emission layer, and the organic layer includes at least one organometallic compound represented by Formula 1.

Because the organic light-emitting device includes an organic layer including the organometallic compound represented by Formula 1, the organic light-emitting device may have higher external quantum efficiency and long lifespan.

The organometallic compound represented by Formula 1 may be utilized between a pair of electrodes of an organic light-emitting device. In one or more embodiments, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, green light or blue light.

The expression "(an organic layer) includes at least one organometallic compounds represented by Formula 1" used herein may include a case in which "(an organic layer) includes identical organometallic compounds represented by Formula 1" and a case in which "(an organic layer) includes two or more different organometallic compounds represented by Formula 1".

In one or more embodiments, the organic layer may include, as the organometallic compound, a single Compound 1. In this embodiment, the single Compound 1 may be included in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region located between the first electrode and the emission layer and an electron transport region located between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to one or more embodiments. Hereinafter, a structure of an organic light-emitting device according to one or more embodiments of the present disclosure and a method of manufacturing an organic light-emitting device according to one or more embodiments of the present disclosure will be described in connection with FIGURE. The organic light-emitting device 10 includes a first electrode 11, an organic layer 15, and a second electrode 19, which are sequentially stacked.

A substrate may be additionally located under (e.g., below) the first electrode 11 or above (e.g., on top of) the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In one or more embodiments, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 angstroms per second (Å/sec) to about 100 Å/sec.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:
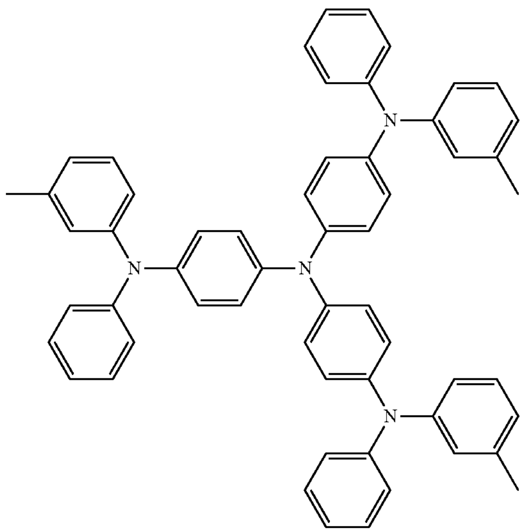
m-MTDATA
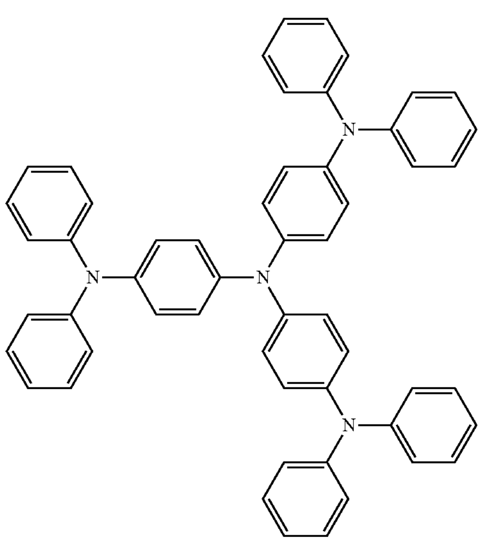
TDATA
-continued
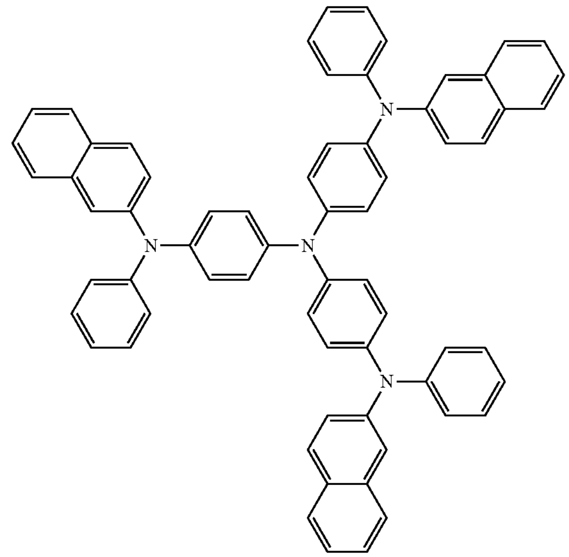
2-TNATA
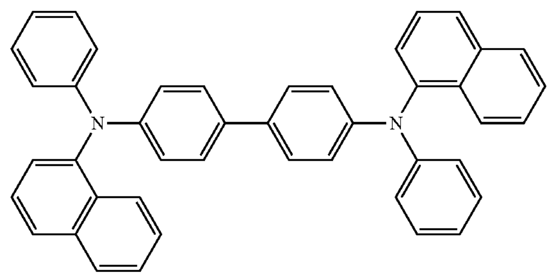
NPB
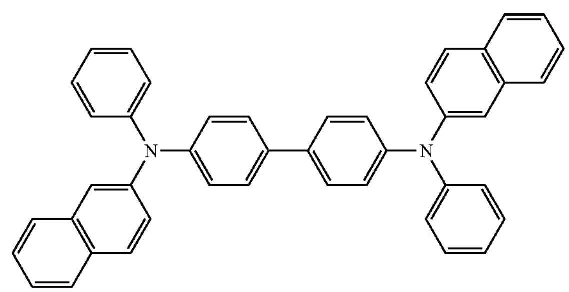
β-NPB
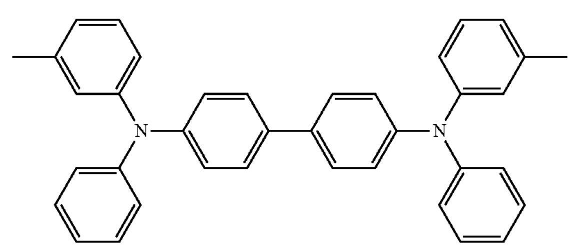
TPD -continued

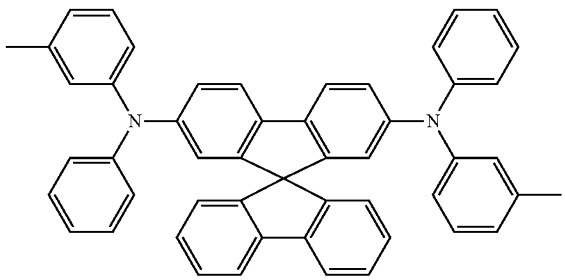

Spiro-TPD

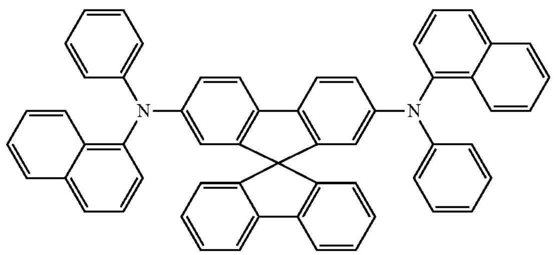

Spiro-NPB

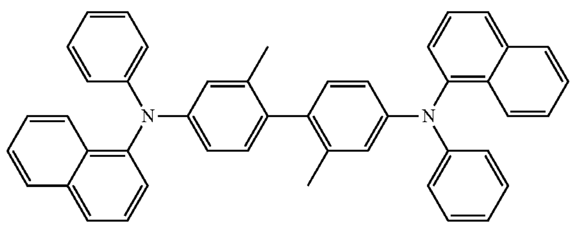

methylated NPB

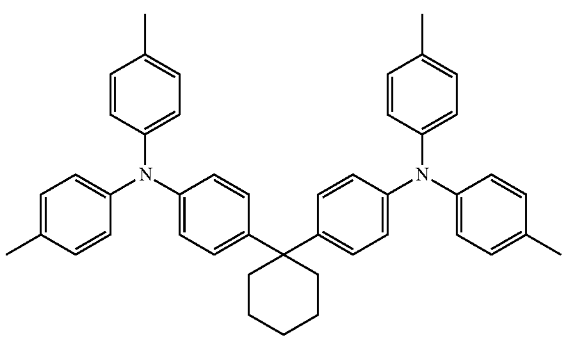

TAPC

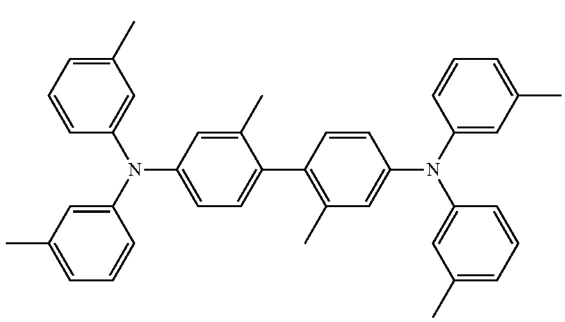

HMTPD

-continued

Formula 201

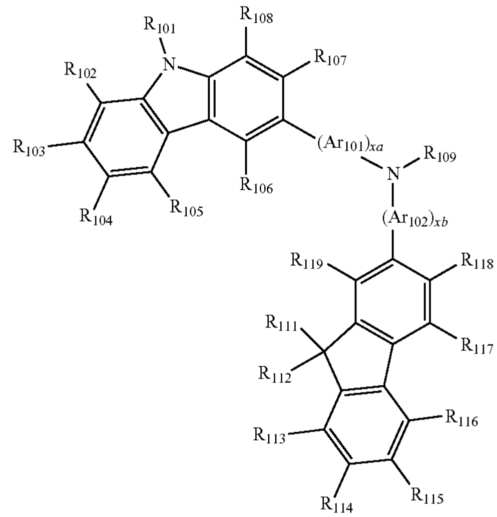

Formula 202

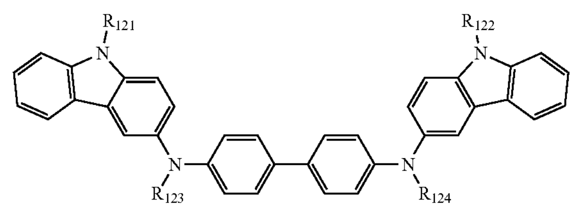

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. In one or more embodiments, xa may be 1, and xb may be 0.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{10}$ alkyl group, a $C_1$-$C_{10}$ alkoxy group, or a combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one or more embodiments, the compound represented by Formula 201 may be represented by Formula 201A:

Formula 201A

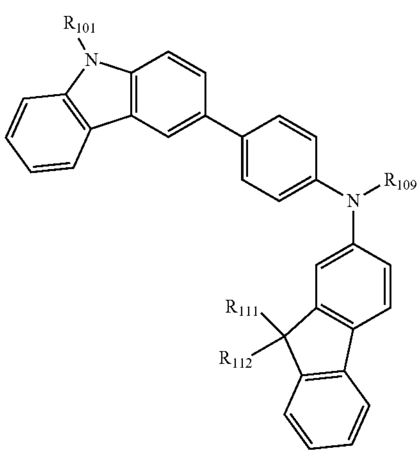

$R_{101}$, $R_{111}$, $R_{112}$, and $R_{109}$ in Formula 201A may each be the same as described above.

In one or more embodiments, the hole transport region may include one of Compounds HT1 to HT20 or a combination thereof:

HT1

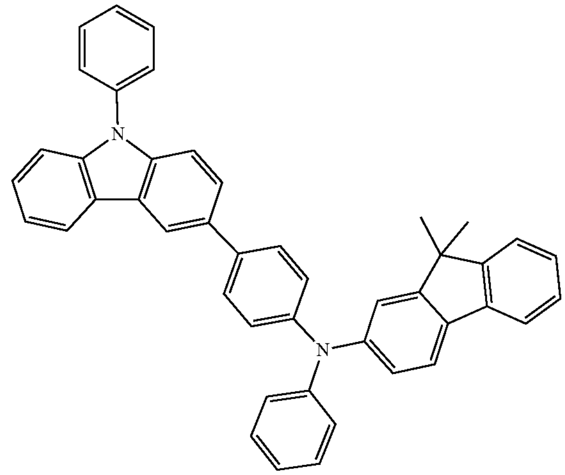

HT2

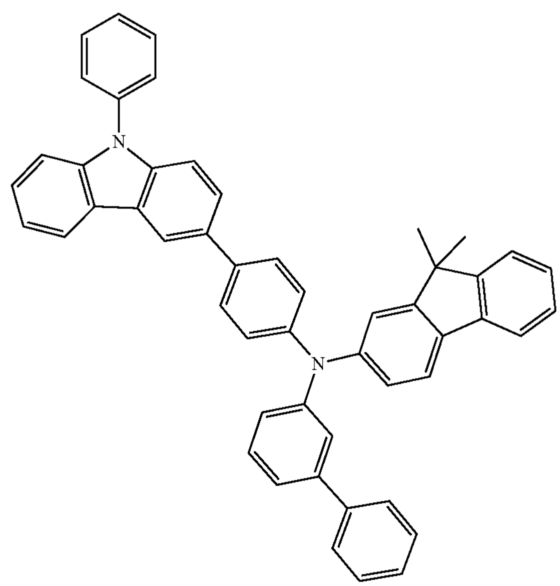

-continued
HT3
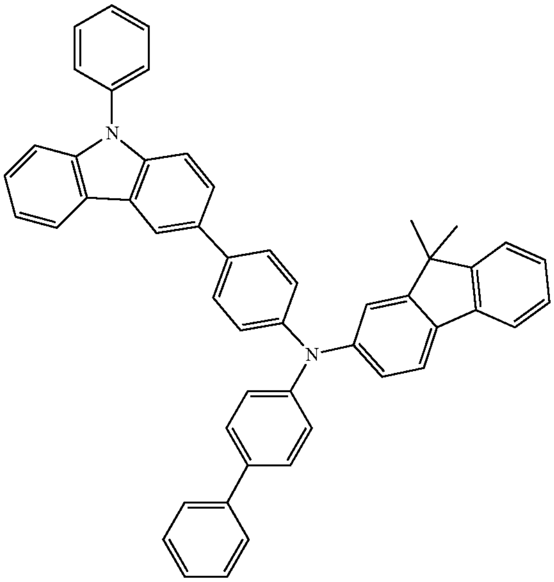
HT4
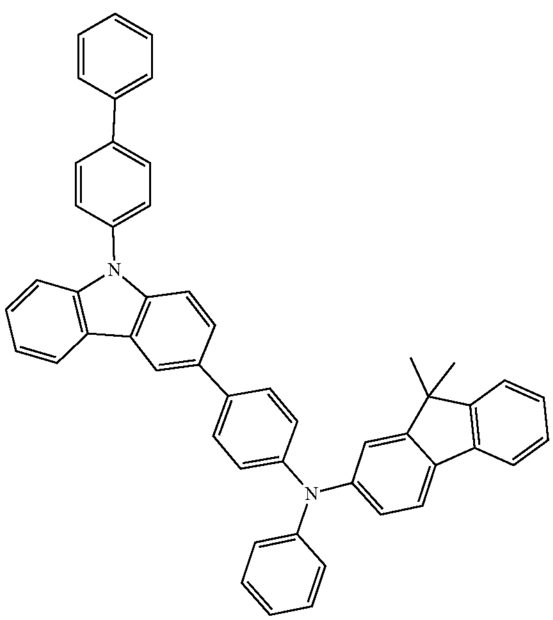
-continued
HT5
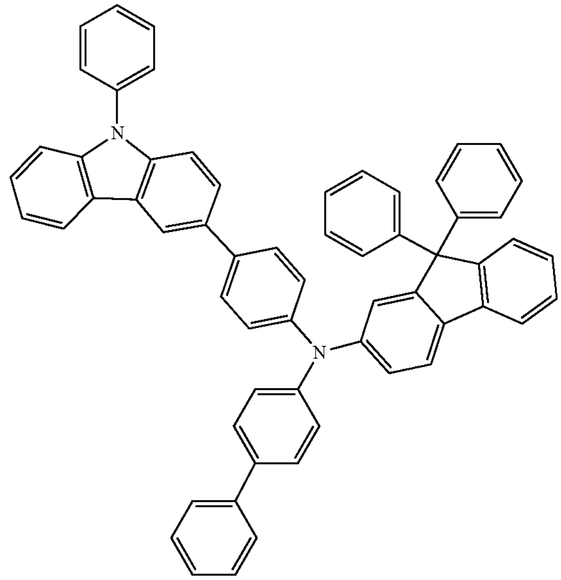
HT6
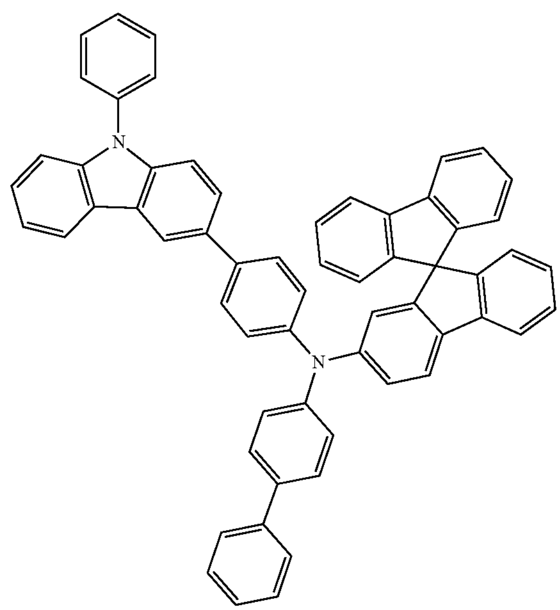

-continued
HT7
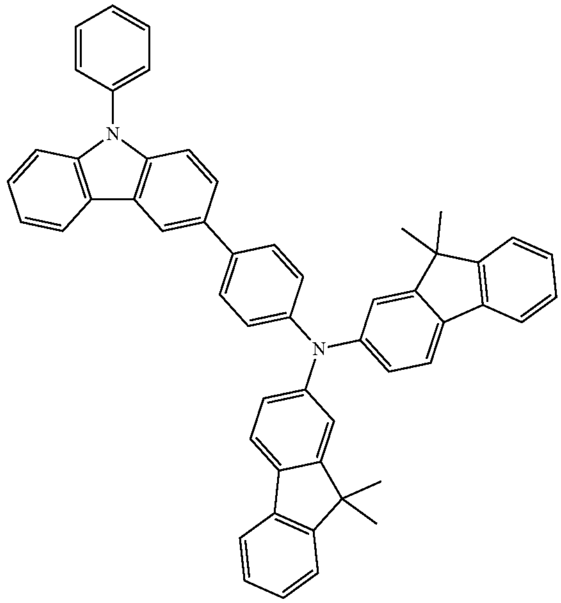
HT8
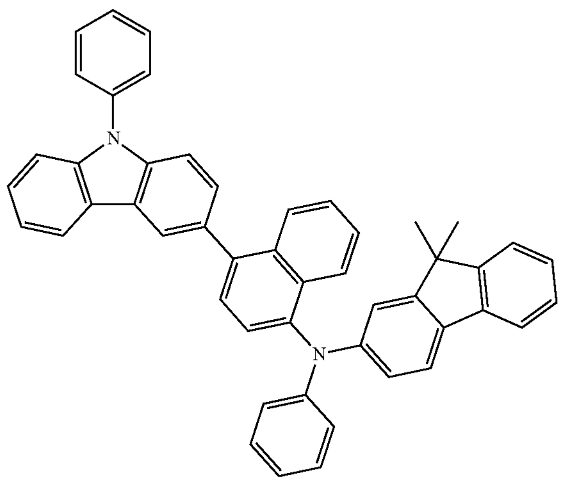
HT9
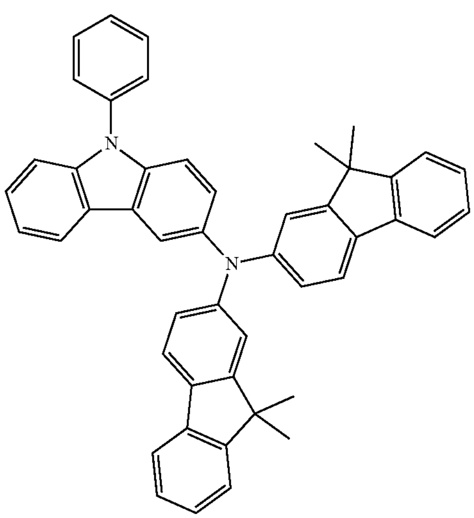
-continued
HT10
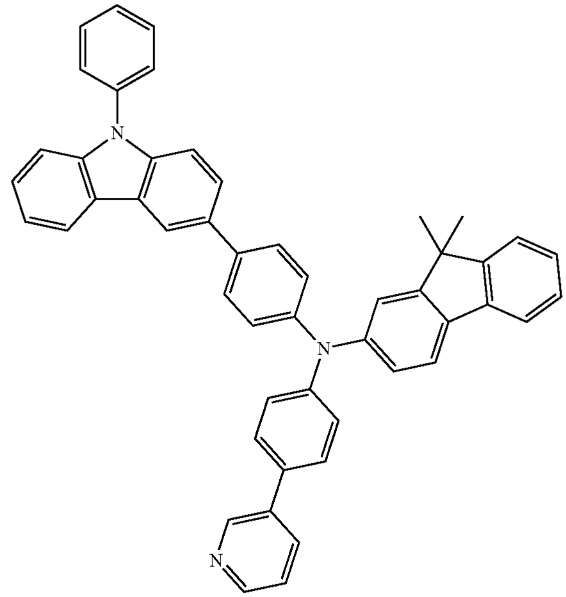
HT11
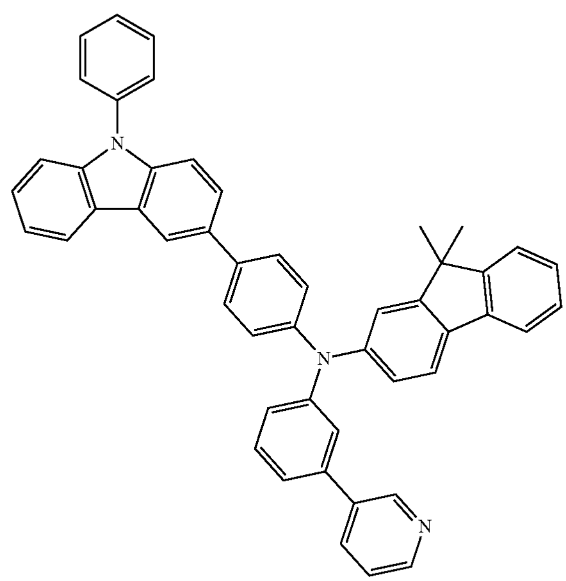

HT12
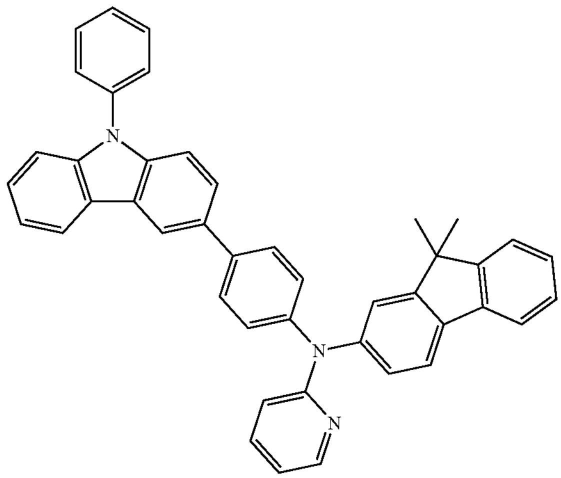
HT13
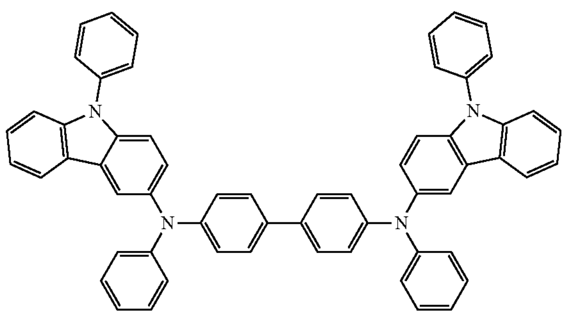
HT14
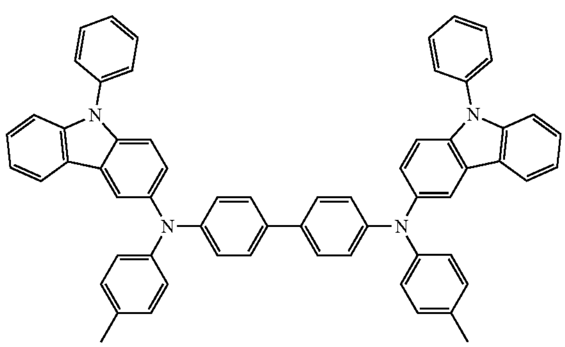
HT15
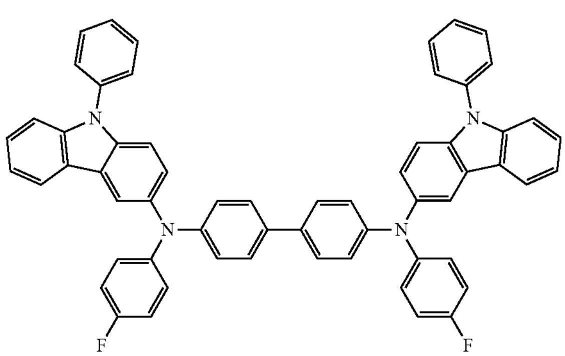
HT16
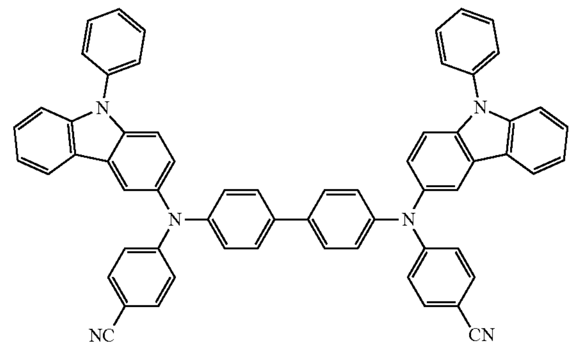
HT17
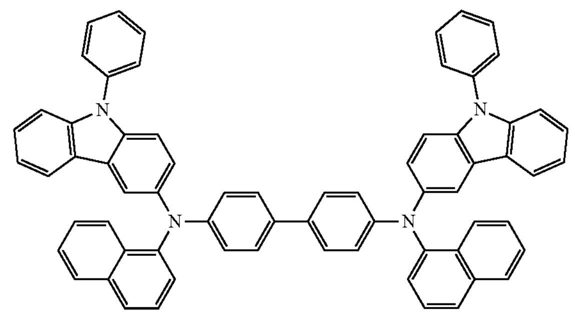
HT18
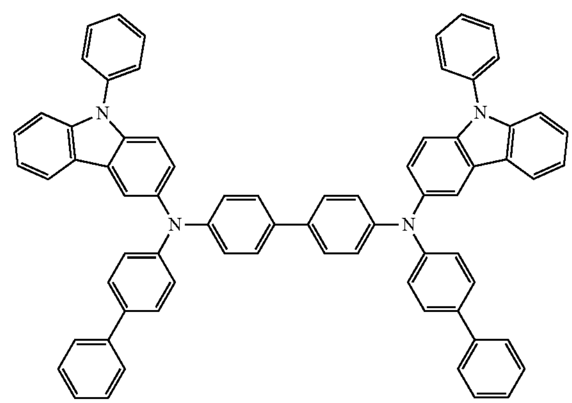
HT19
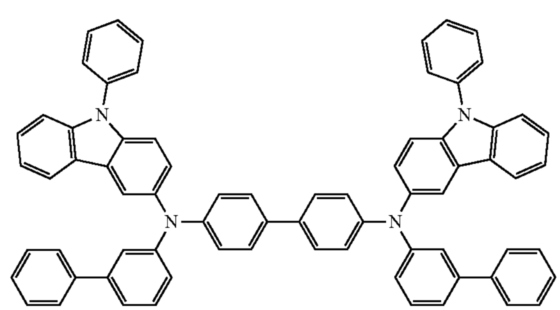

-continued

HT20

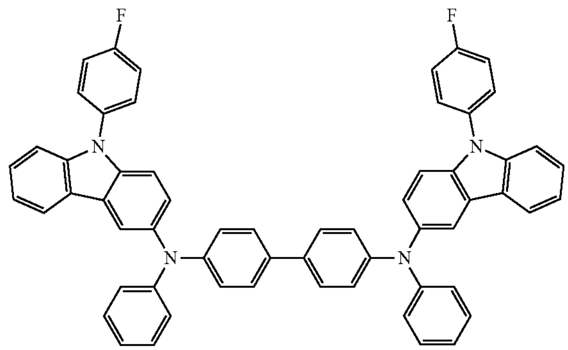

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generating material may be homogeneously or non-homogeneously dispersed in the hole transport region.

The charge-generation material may be, for example, a p-dopant. The p-dopant may be a quinone derivative, a metal oxide, a cyano group-containing compound, or a combination thereof. In one or more embodiments, the p-dopant may be: a quinone derivative such as tetracyanoquinodimethane (TCNQ), 2,3,5,6-tetrafluoro-tetracyano-1,4-benzoquinodimethane (F4-TCNQ), or F6-TCNNQ; metal oxide, such as tungsten oxide and molybdenum oxide; a cyano group-containing compound, such as Compound HT-D1; or a combination thereof.

HT-D1

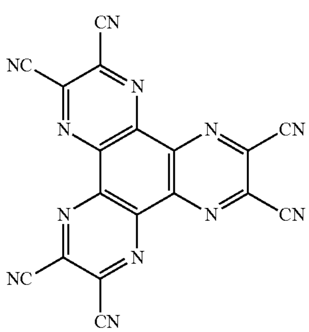

F4-TCNQ

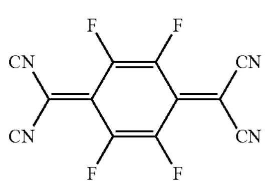

-continued

F6-TCNNQ

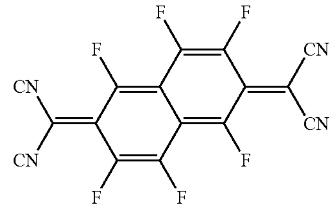

The hole transport region may further include a buffer layer.

The buffer layer may compensate for an optical resonance distance according to a wavelength of light emitted from the emission layer, and thus, efficiency of a formed organic light-emitting device may be improved.

In one or more embodiments, when the hole transport region includes an electron blocking layer, a material for forming the electron blocking layer may include a material that is used in the hole transport region as described above, a host material described below, or a combination thereof. In one or more embodiments, when the hole transport region includes an electron blocking layer, mCP described below, Compound H-H1 described below, or a combination thereof may be used as the material for forming the electron blocking layer.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary depending on a compound that is used to form the emission layer.

The emission layer may include a host and a dopant, and the dopant may include the organometallic compound represented by Formula 1 as described herein.

The host may include TPBi, TBADN, ADN (also referred to as "DNA"), CBP, CDBP, TCP, mCP, Compound H50, Compound H51, Compound H52, Compound H-H1, Compound H-H2, or a combination thereof:

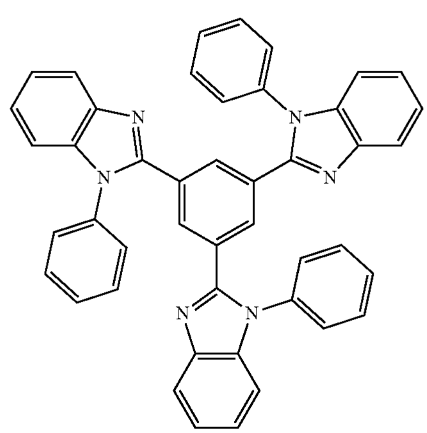

TPBi

-continued
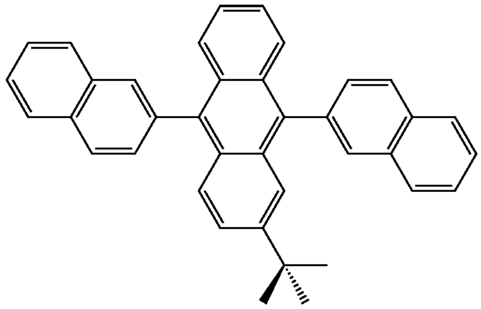
TBADN
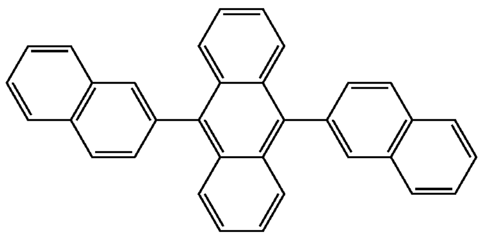
ADN
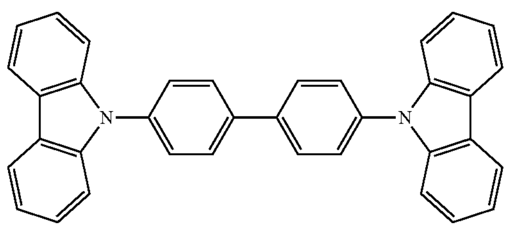
CBP
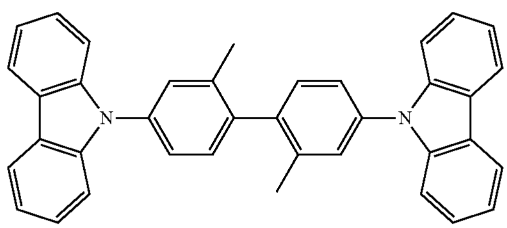
CDBP
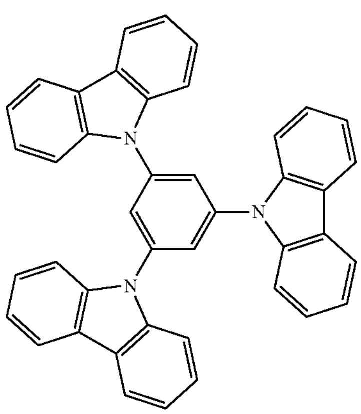
TCP
-continued
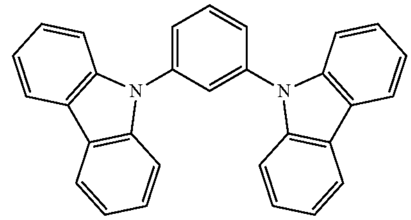
mCP
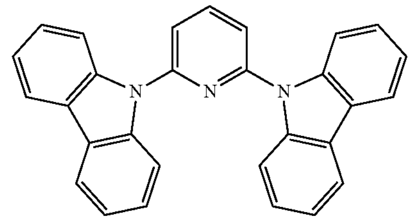
H50
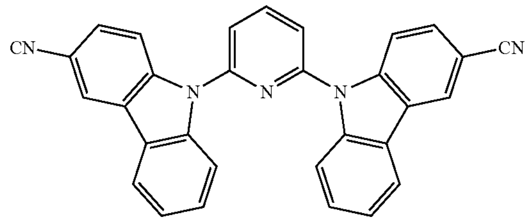
H51
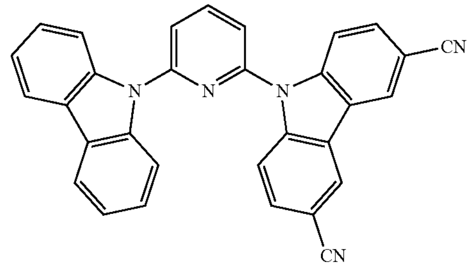
H52
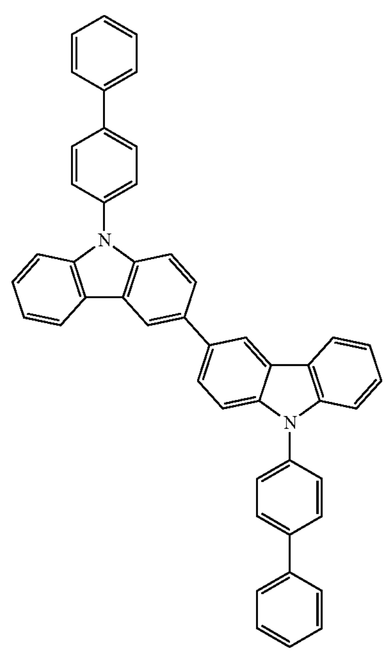
H-H1

-continued

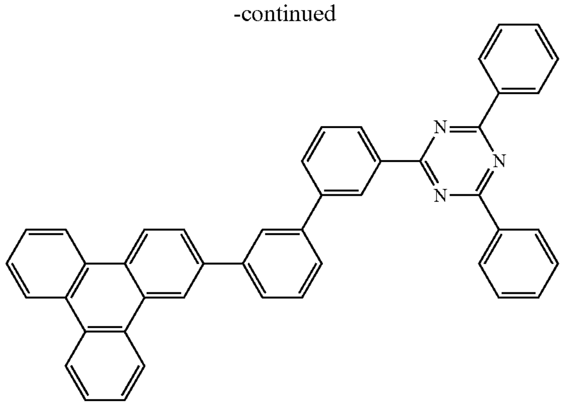

H-H2

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 20 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

In one or more embodiments, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or a combination thereof.

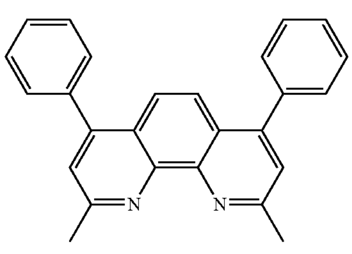

BCP

-continued

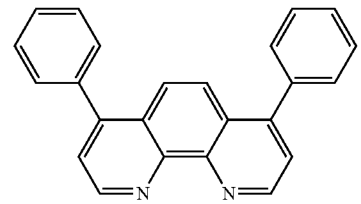

Bphen

A thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, $Alq_3$, BAlq, TAZ, NTAZ, or a combination thereof:

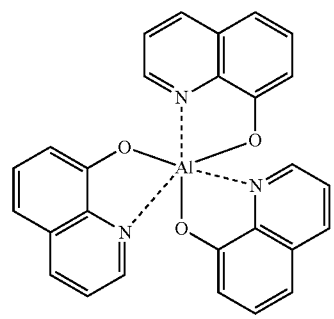

$Alq_3$

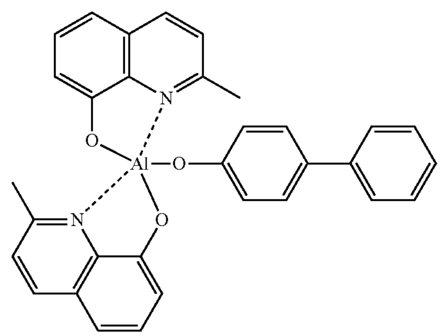

BAlq

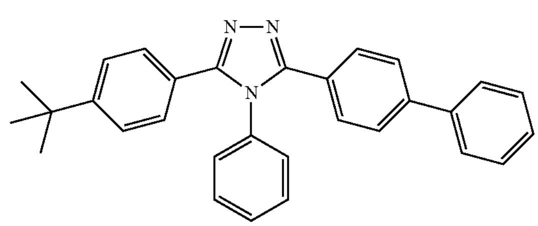

TAZ

-continued
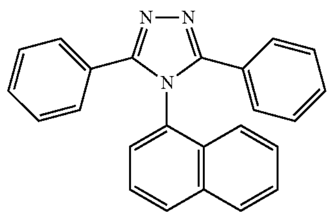
NTAZ
In one or more embodiments, the electron transport layer may include one of Compounds ET1 to ET25 or a combination thereof:
ET1
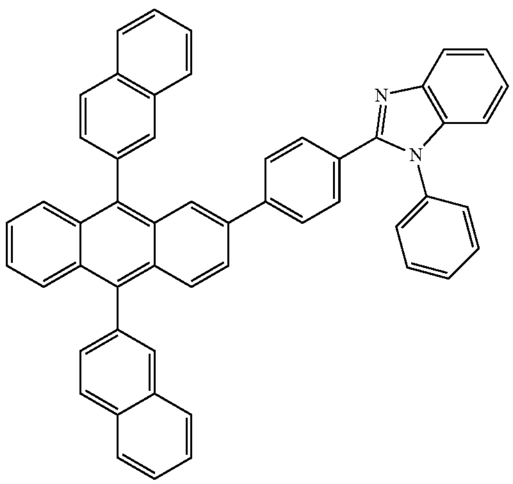
ET2
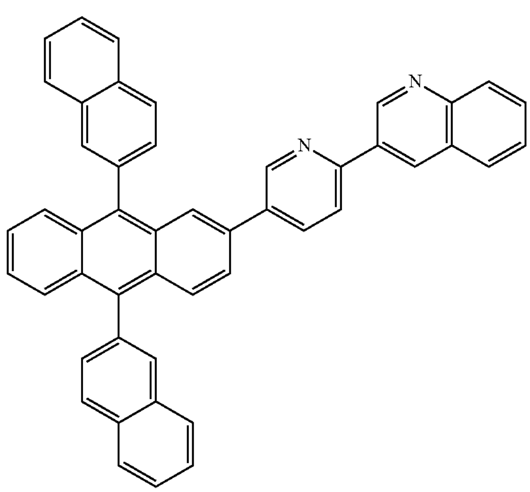
-continued
ET3
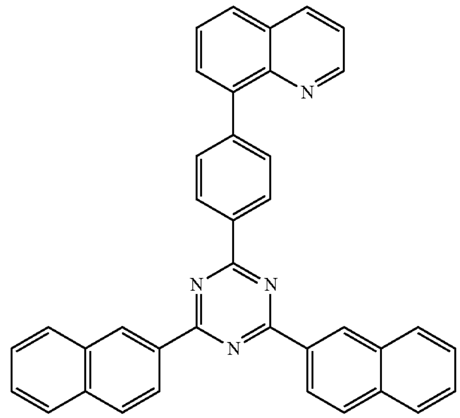
ET4
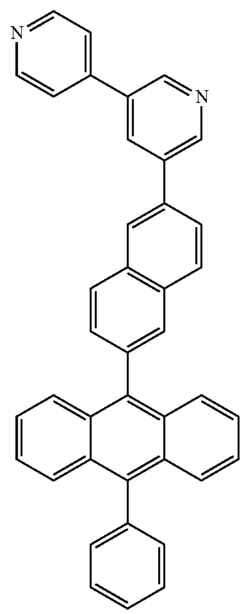
ET5
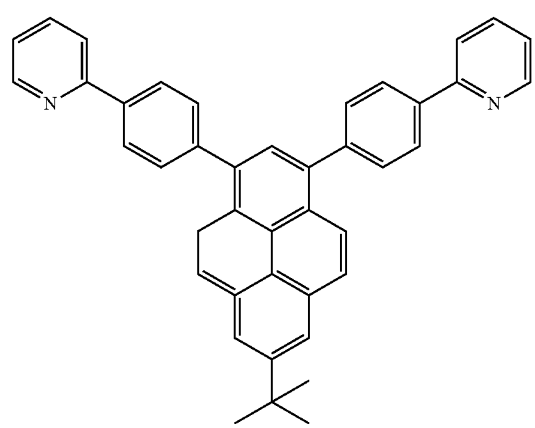

-continued
ET6
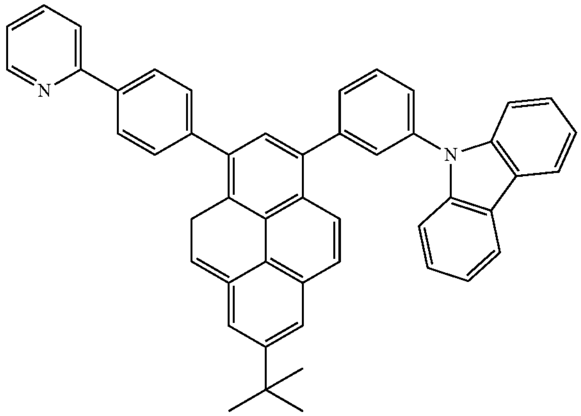
ET7
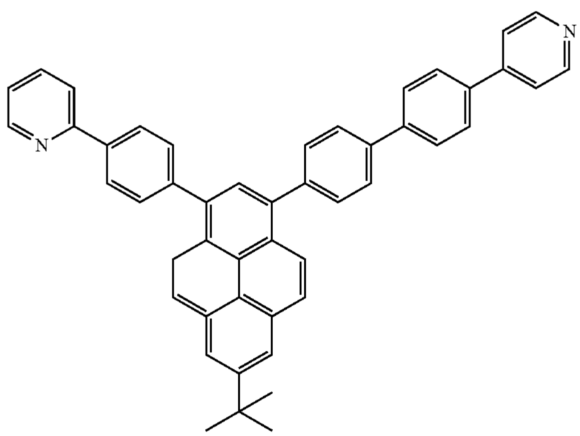
ET8
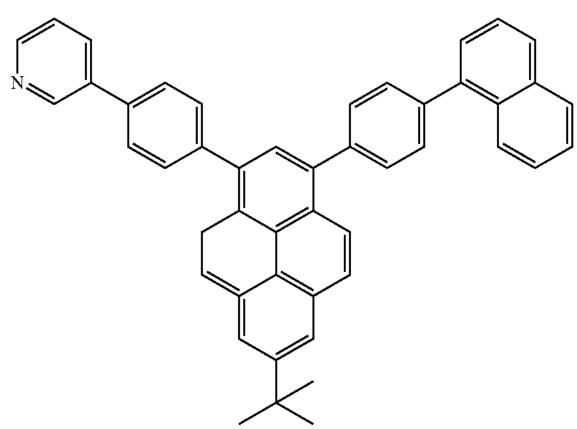
-continued
ET9
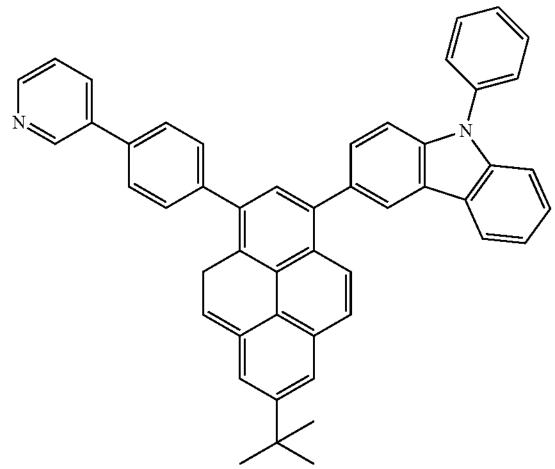
ET10
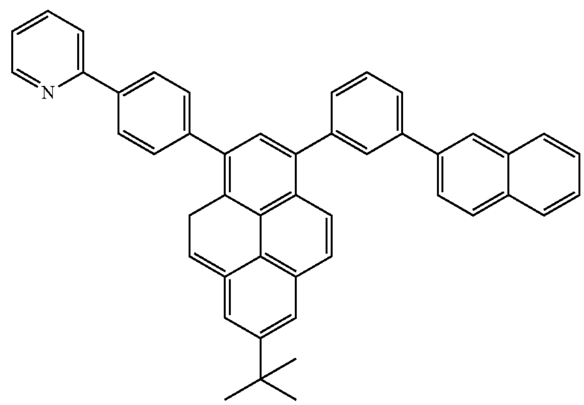
ET11
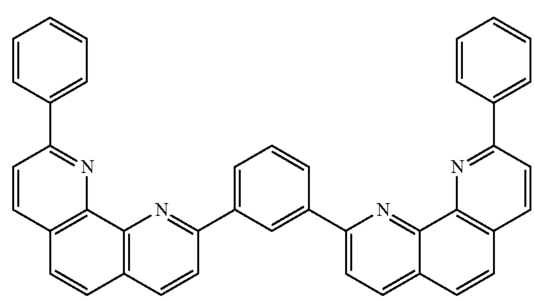
ET12
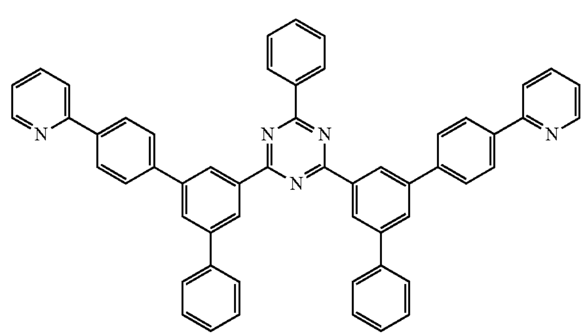

-continued
ET13
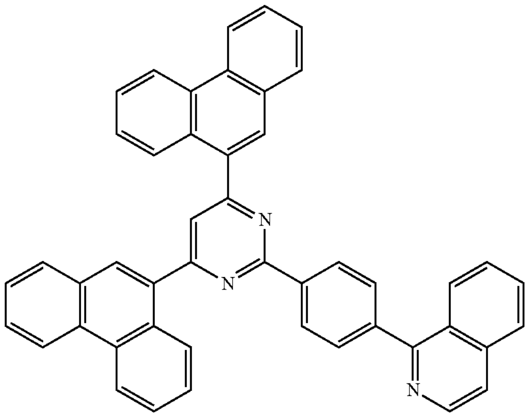
ET14
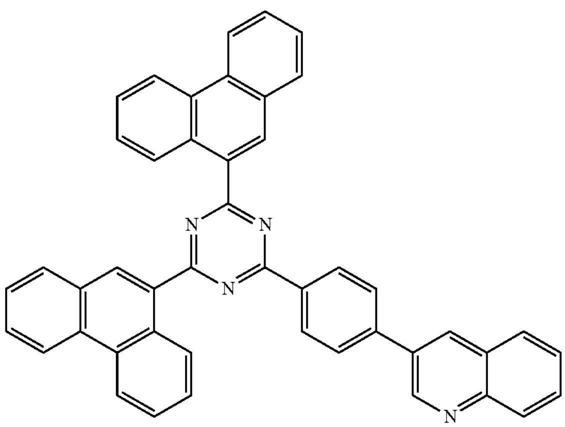
ET15
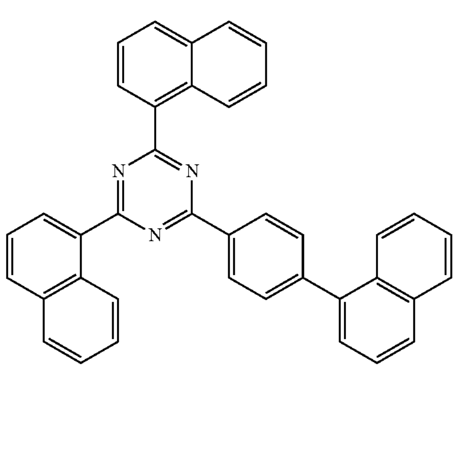
-continued
ET16
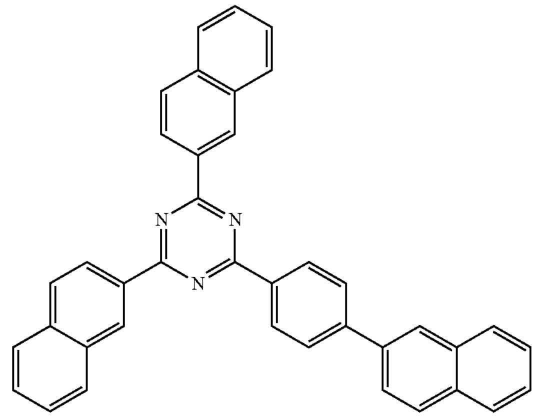
ET17
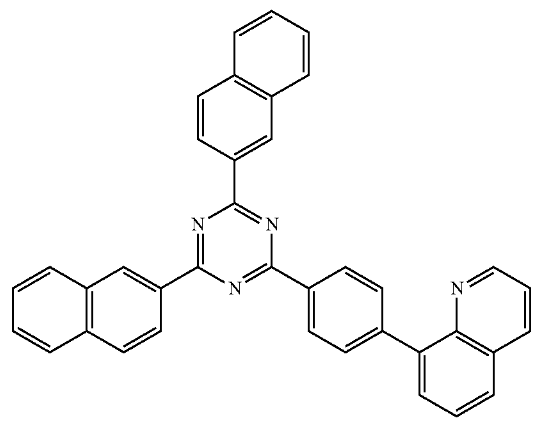
ET18
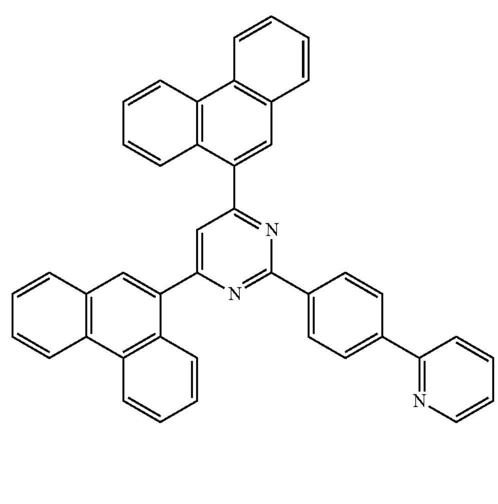

-continued
ET19
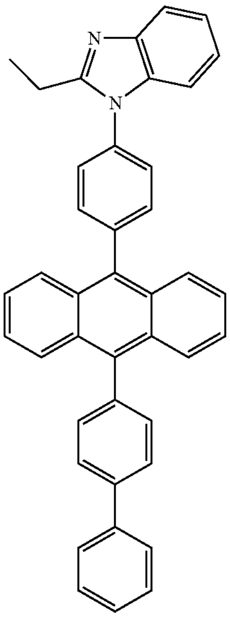
ET20
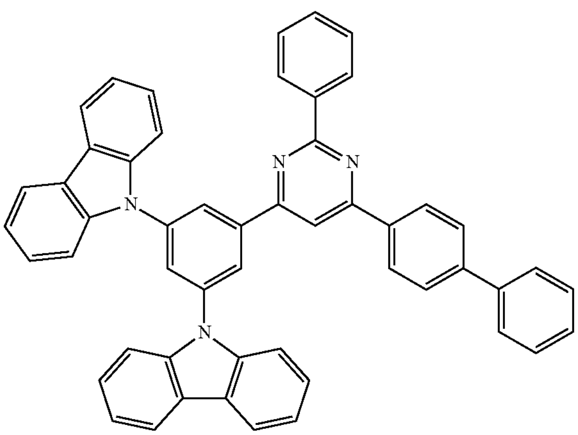
ET21
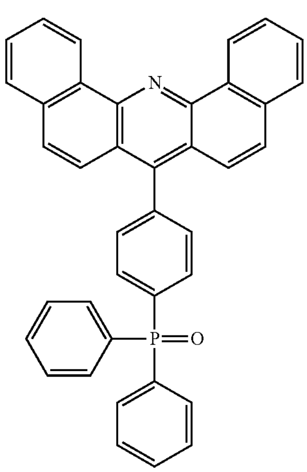
-continued
ET22
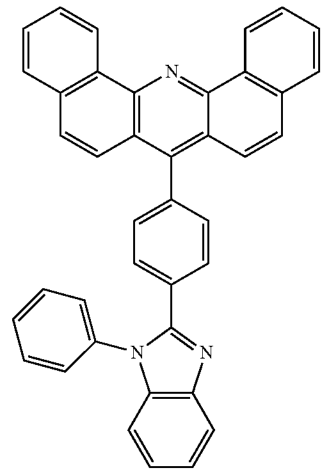
ET23
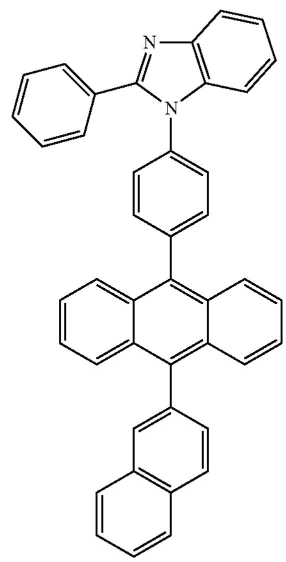
ET24
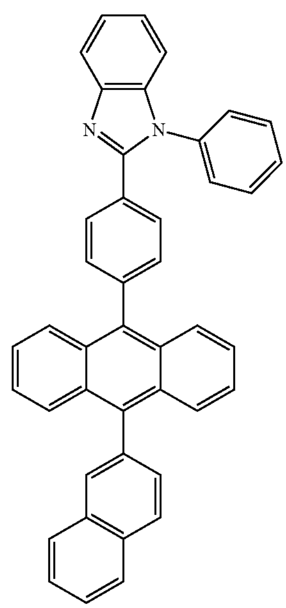

-continued

ET25

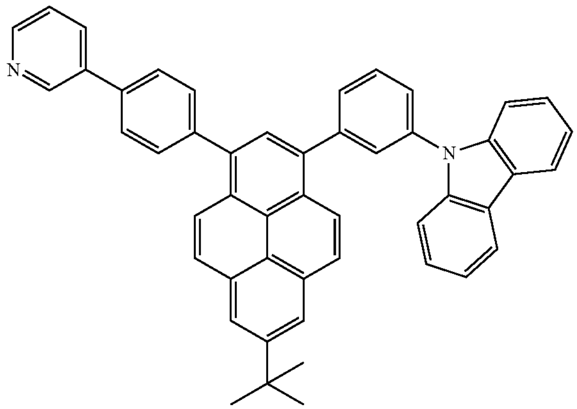

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 or ET-D2:

ET-D1

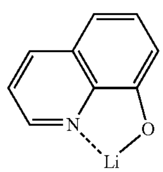

ET-D2

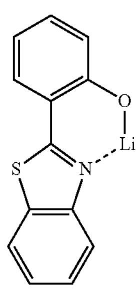

Also, the electron transport region may include an electron injection layer that promotes the flow of electrons from the second electrode 19 thereinto.

The electron injection layer may include LiF, NaCl, CsF, $Li_2O$, BaO, Compound ET-D1, Compound ET-D2, or a combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

According to another aspect, provided is a diagnostic composition including at least one organometallic compound represented by Formula 1.

The organometallic compound represented by Formula 1 may provide high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group—as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof may include a methoxy group, an ethoxy group, a propoxy group, a butoxy group, or a pentoxy group.

The term "$C_1$-$C_{60}$ alklythio group" used herein refers to a monovalent group represented by —$SA_{101}$ (wherein $A_{101}$ is the $C_1$-$C_{60}$ alkyl group).

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group may include a cyclopropyl group, a cyclobutyl group, a cyclopentyl, a cyclohexyl group, a cycloheptyl group, a cyclooctyl group, an adamantanyl group, a norbornanyl group (or a bicyclo [2.2.1]heptyl group), a bicyclo[1.1.1]pentyl group, a bicyclo [2.1.1]hexyl group, and a bicyclo[2.2.2]octyl group.

The term "$C_1$-$C_{10}$ heterocycloalkyl group" as used herein refers to a monocyclic group that includes at least one heteroatom selected from N, O, P, Si, S, Se, Ge, and B as a ring-forming atom instead of a carbon atom, and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, and B as a ring-forming atom instead of a carbon atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_6$ heteroaryl group" as used herein refers to a monovalent group having at least one heteroatom selected from N, O, P, Si, S, Se, Ge, and B as a ring-forming atom instead of a carbon atom, and a cyclic aromatic system having 1 to 60 carbon atoms, and the term "$C_1$-$C_{60}$ heteroarylene group" as used herein refers to a divalent group having at least one heteroatom selected from N, O, P, Si, S, Se, Ge, and B as a ring-forming atom instead of a carbon atom, and a cyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The $C_2$-$C_{60}$ heteroaryl alkyl group used herein refers to a $C_1$-$C_{60}$ alkyl group substituted with at least one $C_1$-$C_{60}$ heteroaryl group.

The term "$C_6$-$C_{60}$ aryloxy group" as used herein indicates a group of formula —$OA_{102}$ (wherein $A_{102}$ indicates the $C_6$-$C_{60}$ aryl group), the $C_6$-$C_{60}$ arylthio group indicates a group of formula —$SA_{103}$ (wherein $A_{103}$ indicates the $C_6$-$C_{60}$ aryl group), and the $C_1$-$C_{60}$ alkylthio group indicates a group of formula —$SA_{104}$ (wherein $A_{104}$ indicates the $C_1$-$C_{60}$ alkyl group).

The term "$C_1$-$C_{60}$ heteroaryloxy group" as used herein indicates a group of formula —$OA_{102a0}$ (wherein $A_{102a}$ indicates the $C_1$-$C_{60}$ heteroaryl group), and the $C_1$-$C_{60}$ heteroarylthio group indicates a group of formula —$SA_{103a}$ (wherein $A_{103a}$ indicates the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and non-aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, P, Si, S, Se, Ge, or B, other than carbon atoms, as a ring-forming atom, and non-aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of a substituted or unsubstituted $C_5$-$C_{30}$ carbocyclic group may include an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each unsubstituted or substituted with at least one $R_{10a}$.

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B instead of a carbon ring atom, other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may include, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (, each unsubstituted or substituted with at least one $R_{10a}$).

In one or more embodiments, examples of the terms "$C_5$-$C_{30}$ carbocyclic group" and "$C_1$-$C_{30}$ heterocyclic group" as used herein may include i) a first ring, ii) a second ring, iii) a condensed cyclic group in which two or more first rings are condensed with each other, iv) a condensed cyclic group in which two or more second rings are condensed with each other, or v) a condensed cyclic group in which one or more first rings and one or more second rings are condensed with each other, the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the "fluorinated $C_1$ alkyl group (that is, the fluorinated methyl group)" may include —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" as used herein respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group," as used herein each refer to the respective group wherein at least one ring-forming carbon atom is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, $—P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, $—P(Q_{28})(Q_{29})$, or a combination thereof;

$—N(Q_{31})(Q_{32})$, $—Si(Q_{33})(Q_{34})(Q_{35})$, $—B(Q_{36})(Q_{37})$, $—P(=O)(Q_{38})(Q_{39})$, or $—P(Q_{38})(Q_{39})$; or a combination thereof.

$Q_1$ to $Q_9$, $Q_{11}$ to $Q_{19}$, $Q_{21}$ to $Q_{29}$, and $Q_{31}$ to $Q_{39}$ described herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_2$-$C_{60}$ heteroaryl alkyl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or a combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 317)

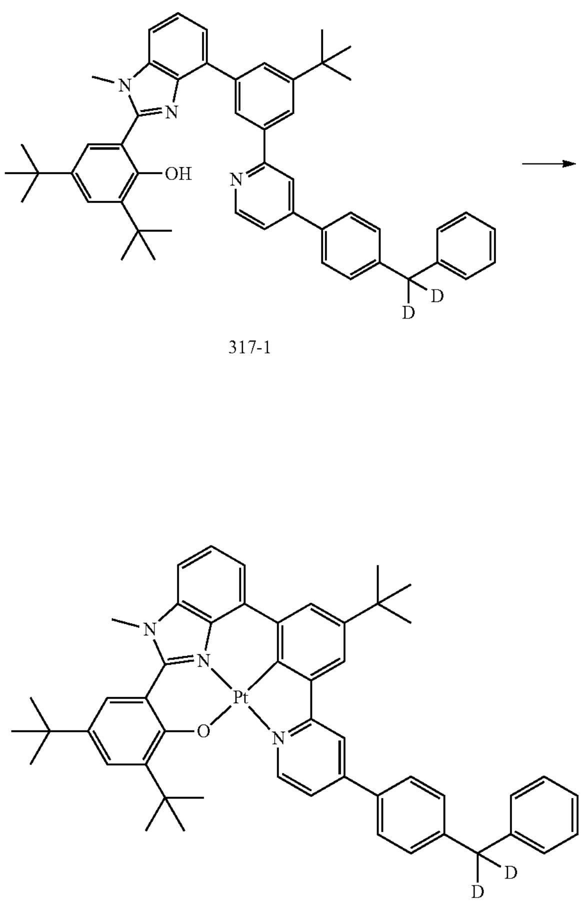

317-1

317

Compound 317-1 (7.9 grams (g), 11.0 millimoles (mmol)) and $K_2PtCl_4$ (5.5 g, 13.2 mmol) were mixed with 100 milliliters (mL) of acetic acid, the mixture was stirred while refluxing for 18 hours to proceed with the reaction, and then temperature was lowered to room temperature. A solid generated therefrom was filtered, and a column chromatography was performed using methylene chloride (MC) and hexane, to thereby obtain 4.2 g (yield: 42%) of Compound 317.

High resolution mass spectrometry-matrix assisted laser desorption ionization (HRMS (MALDI)) calcd for $C_{50}H_{49}D_2N_3OPt$: m/z 906.3805 Found: 906.3811.

Synthesis Example 2 (Compound 351)

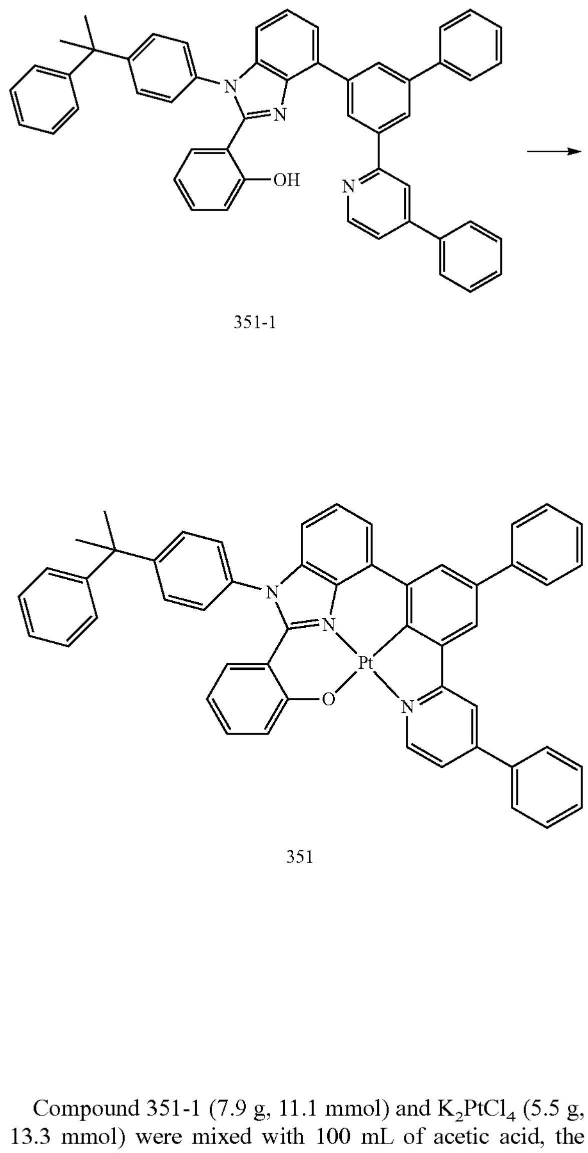

351-1

351

Compound 351-1 (7.9 g, 11.1 mmol) and $K_2PtCl_4$ (5.5 g, 13.3 mmol) were mixed with 100 mL of acetic acid, the mixture was stirred while refluxing for 18 hours to proceed with the reaction, and then temperature was lowered to room temperature. A solid generated therefrom was filtered, and a column chromatography was performed using MC and hexane, to thereby obtain 3.8 g (yield: 38%) of Compound 351.

HRMS(MALDI) calcd for $C_{51}H_{37}N_3OPt$: m/z 902.2584 Found: 902.2589.

Synthesis Example 3 (Compound 592)

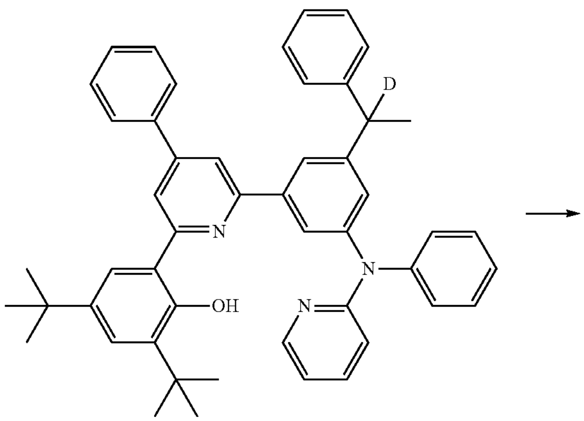

592-1

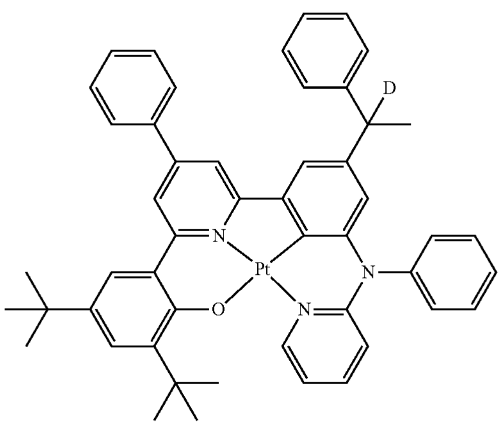

592

Compound 592-1 (7.9 g, 11.1 mmol) and $K_2PtCl_4$ (5.5 g, 13.3 mmol) were mixed with 100 mL of acetic acid, the mixture was stirred while refluxing for 18 hours to proceed with the reaction, and then temperature was lowered to room temperature. A solid generated therefrom was filtered, and a column chromatography was performed using MC and hexane, to thereby obtain 3.1 g (yield: 31%) of Compound 592.

HRMS(MALDI) calcd for $C_{50}H_{46}DN_3OPt$: m/z 901.3430 Found: 901.3420.

Synthesis Example 4 (Compound 741)

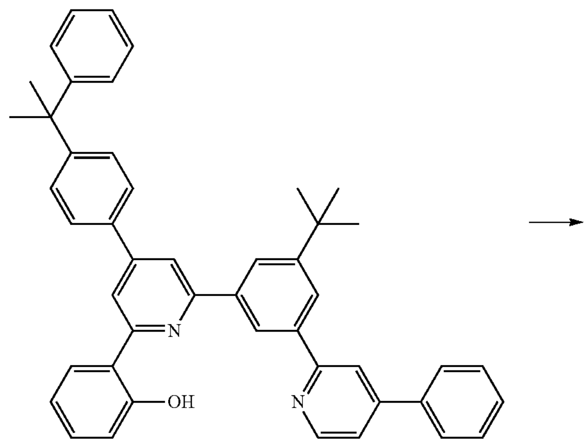

741-1

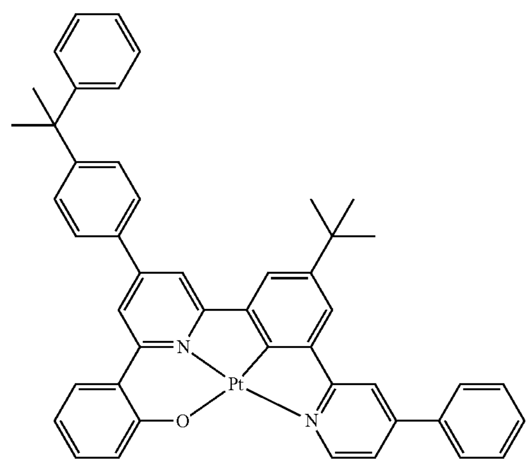

741

Compound 741-1 (3.9 g, 5.9 mmol) and $K_2PtCl_4$ (3.0 g, 7.1 mmol) were mixed with 50 mL of acetic acid, the mixture was stirred while refluxing for 18 hours to proceed with the reaction, and then temperature was lowered to room temperature. A solid generated therefrom was filtered, and a column chromatography was performed using MC and hexane, to thereby obtain 2.1 g (yield: 42%) of Compound 741.

HRMS(MALDI) calcd for $C_{47}H_{40}N_2OPt$: m/z 843.2788 Found: 843.2795.

Synthesis Example A (Compound A)

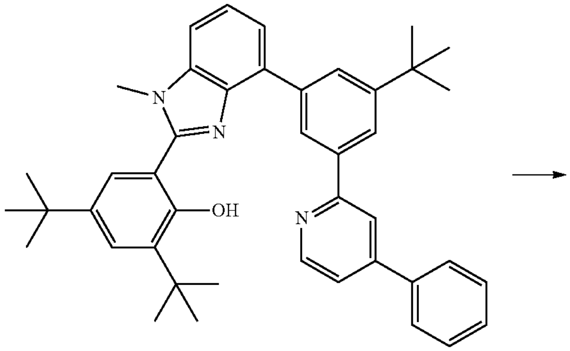

A-1

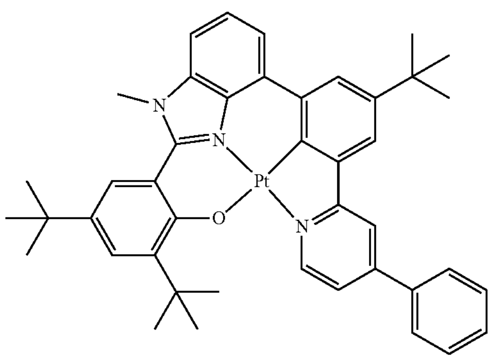

A 0.5 g (yield: 40%) of Compound A was obtained in the same manner as in Synthesis Example 1, except that Compound A-1 was used instead of Compound 317-1.

HRMS(MALDI) calcd for $C_{43}H_{45}N_3OPt$: m/z 814.3210 Found: 814.3205.

Synthesis Example B (Compound B)

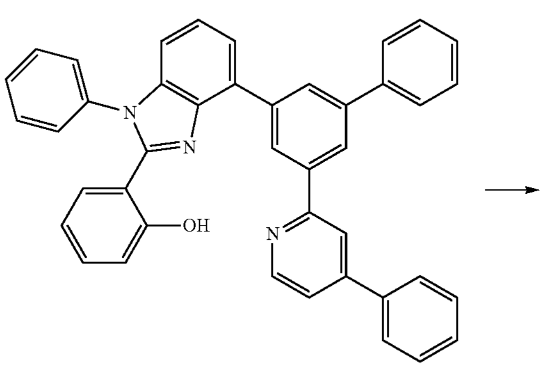

B-1

-continued

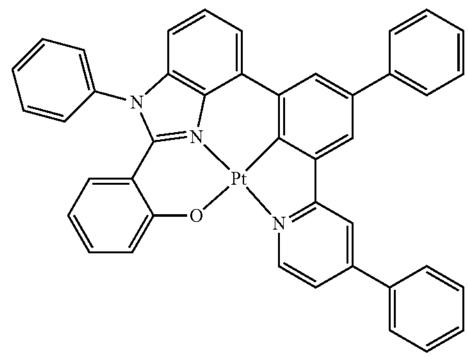

B 0.4 g (yield: 36%) of Compound B was obtained in the same manner as in Synthesis Example 2, except that Compound B-1 was used instead of Compound 351-1.

HRMS(MALDI) calcd for $C_{42}H_{27}N_3OPt$: m/z 784.1802 Found: 784.1796.

Synthesis Example C (Compound C)

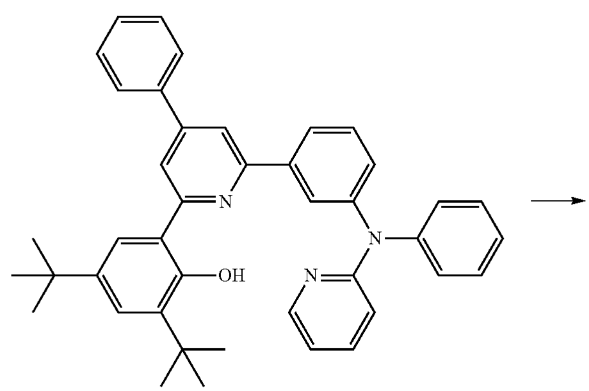

C-1

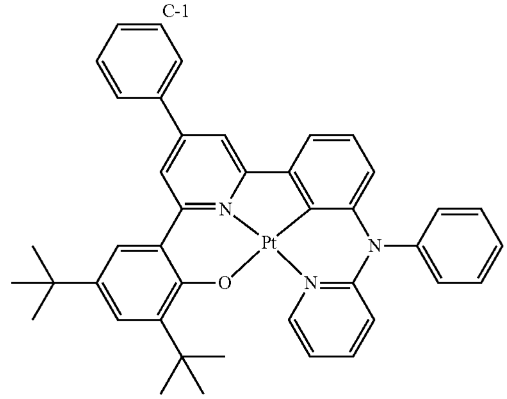

C 0.6 g (yield: 45%) of Compound C was obtained in the same manner as in Synthesis Example 3, except that Compound C-1 was used instead of Compound 592-1.

HRMS(MALDI) calcd for $C_{42}H_{39}N_3OPt$: m/z 796.2741 Found: 796.2744.

Synthesis Example D (Compound D)

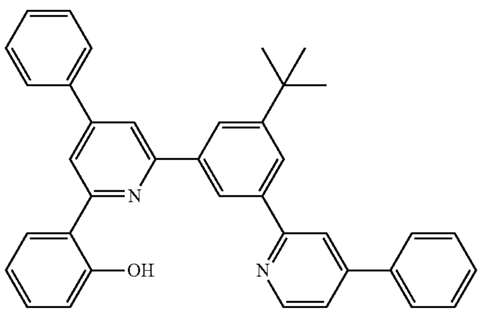

D-1

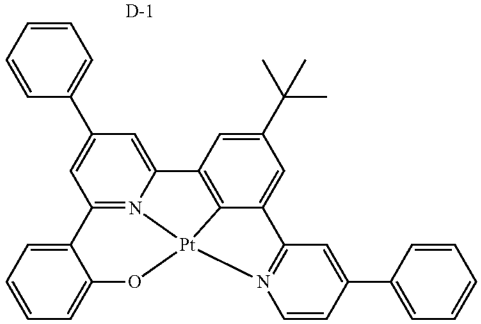

D 0.2 g (yield: 22%) of Compound D was obtained in the same manner as in Synthesis Example 4, except that Compound D-1 was used instead of Compound 741-1.

HRMS(MALDI) calcd for $C_{38}H_{30}N_2OPt$: m/z 725.2006 Found: 725.2001

Example 1

An ITO (as an anode)-patterned glass substrate was cut to a size of 50 millimeters (mm)×50 mm×0.5 mm, sonicated with isopropyl alcohol and purified water (deionized water), each for 5 minutes, and then cleaned by irradiation of ultraviolet rays thereto and exposure to ozone for 30 minutes. The resultant glass substrate was loaded onto a vacuum deposition apparatus.

HT3 and F6TCNNQ were vacuum-code posited on the anode at a weight ratio of 98:2 to form a hole injection layer having a thickness of 100 Å, and HT3 was vacuum-deposited on the hole injection layer to form a hole transport layer having a thickness of 1,350 Å. H-H1 was vacuum-deposited on the hole transport layer to form an electron blocking layer having a thickness of 300 Å.

Next, H-H1, H-H2, and Compound 317 (dopant) were co-deposited on the electron blocking layer at a weight ratio of 42.5:42.5:15 to form an emission layer having a thickness of 400 Å.

Then, ET3 and ET-D1 were co-deposited on the emission layer at a volume ratio of 50:50 to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

HT3

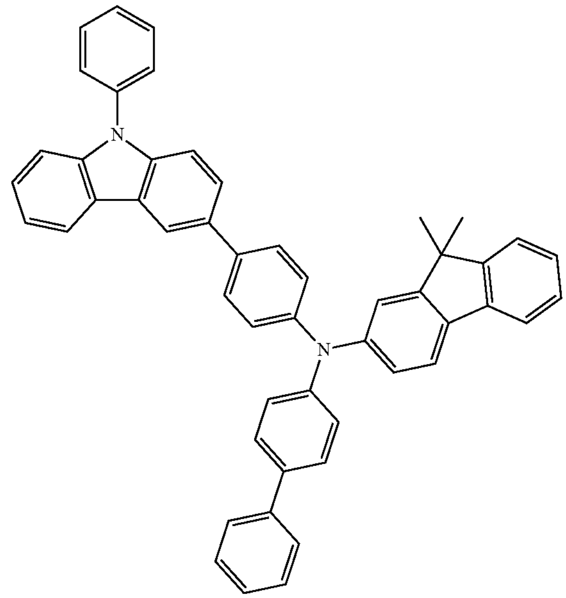

F6-TCNNQ

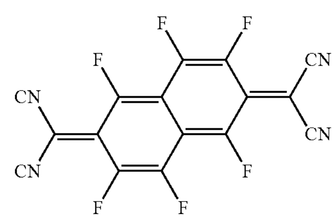

H-H1

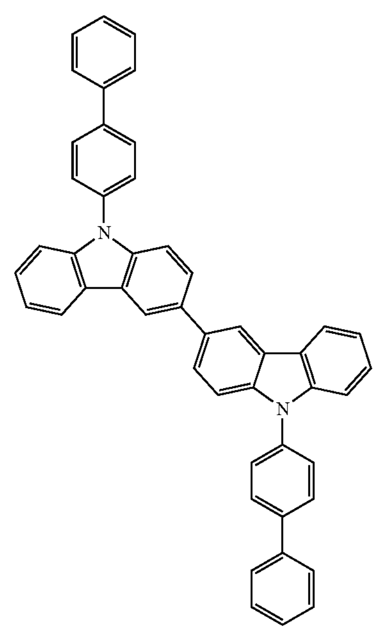

-continued

H-H2

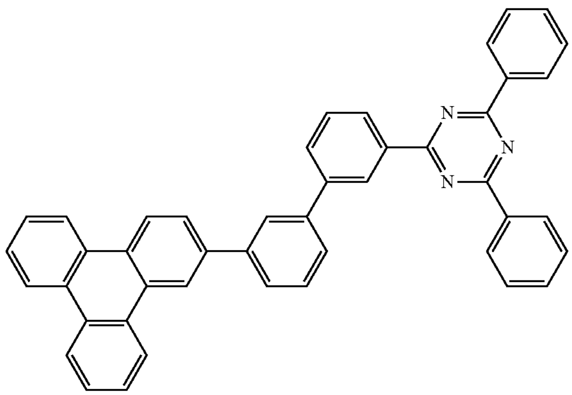

ET3

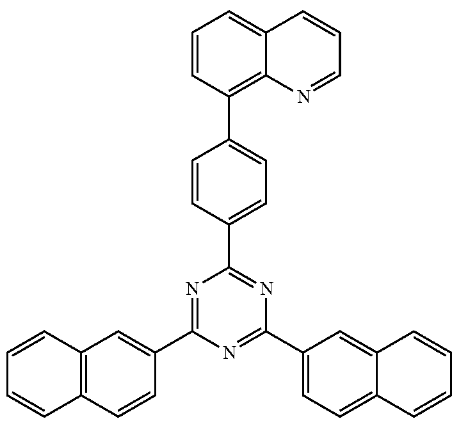

ET-D1

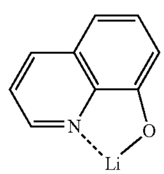

Examples 2 to 4 and Comparative Examples A to D

Organic light-emitting devices were manufactured in the same manner as in Example 1, except that Compounds shown in Table 2 were each used instead of Compound 317 as a dopant in forming an emission layer.

Evaluation Example 1: Characterization of Organic Light-Emitting Device

With respect to each of the organic light-emitting devices manufactured in Examples 1 to 4 and Comparative Examples A to D, a maximum value of external quantum efficiency ($EQE_{max}$) (%) and lifespan ($LT_{97}$)(relative value, %) were evaluated, and results thereof are shown in Table 2. A current-voltage meter (Keithley 2400) and a luminance meter (Minolta Cs-1,000A) were used as apparatuses for evaluation, and the lifespan ($LT_{97}$) (at 18,000 candela per square meter (cd/m$^2$) or nit) was obtained by measuring the amount of time (hours) that elapsed until luminance was reduced to 97% of the initial luminance of 100%, and the results are expressed as a relative value (%).

Table 2

| | Dopant Compound in emission layer | $EQE_{max}$ (%) | $LT_{97}$ (relative value, %) |
|---|---|---|---|
| Example 1 | 317 | 100% | 100% |
| Comparative Example A | A | 94% | 82% |
| Example 2 | 351 | 94% | 83% |
| Comparative Example B | B | 89% | 73% |
| Example 3 | 592 | 90% | 65% |
| Comparative Example C | C | 84% | 41% |
| Example 4 | 741 | 100% | 55% |
| Comparative Example D | D | 96% | 45% |

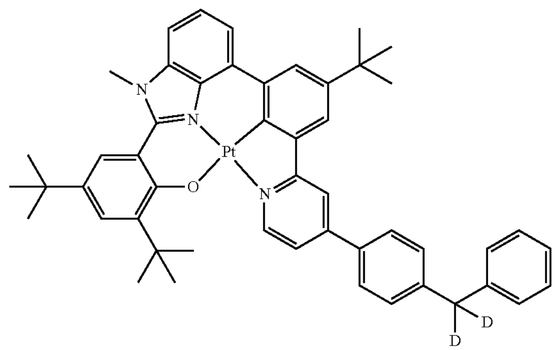

317

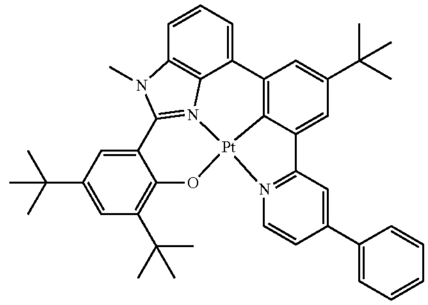

A

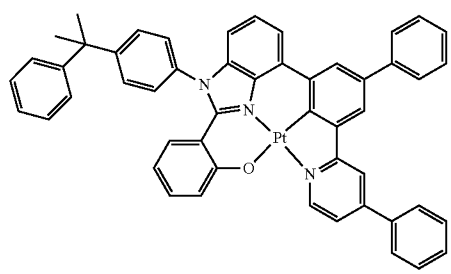

351

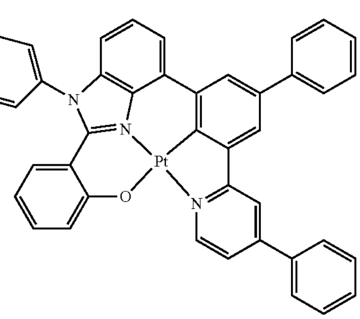

-continued

| | Dopant Compound in emission layer | $EQE_{max}$ (%) | $LT_{97}$ (relative value, %) |
|---|---|---|---|

B

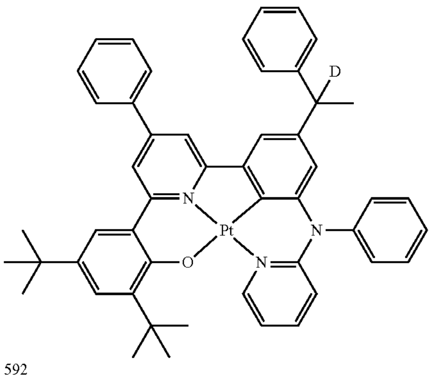

592

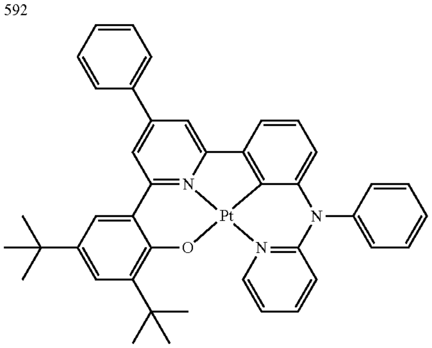

C

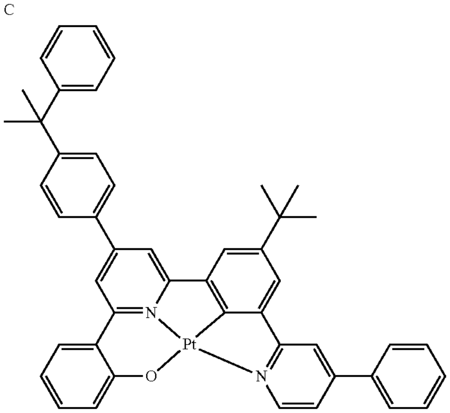

741

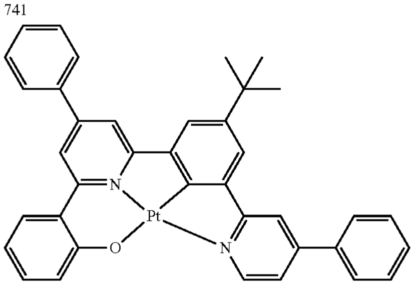

D

From Table 2, it is seen that each of the organic light-emitting devices of Examples 1 to 4 has higher external quantum efficiency and improved lifespan characteristics, compared to each of the organic light-emitting devices of Comparative Examples A to D.

The organometallic compound as described herein has excellent thermal stability and electrical characteristics. Accordingly, an electronic device, for example, an organic light-emitting device, using the organometallic compound may have improved external quantum efficiency and improved lifespan characteristics, and may emit light having a relatively small full width at half maximum (FWHM).

It should be understood that the exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the FIGURE, it will be understood by a person having ordinary skill in the art that various changes in form and details may be made without departing from the spirit and scope as defined by the following claims.

What is claimed is:

1. An organometallic compound represented by Formula 1:

Formula 1

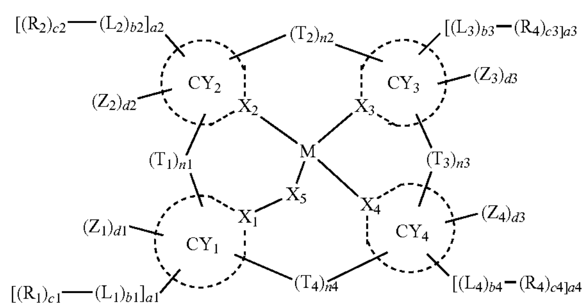

wherein, in Formula 1,

M is a transition metal, $X_1$ to $X_4$ in Formula 1 are each independently C or N, $X_5$ in Formula 1 is O, S, N(R'), or C(R')(R"), wherein, a bond between $X_5$ and M in Formula 1 is a covalent bond, and one of a bond between $X_2$ and M in Formula 1, a bond between $X_3$ and M in Formula 1, and a bond between $X_4$ and M in Formula 1 is a covalent bond, and the other two are each a coordinate bond, ring $CY_1$ to ring $CY_4$ in Formula 1 are each independently a $C_5$-$C_{30}$ carbocyclic group or a $C_1$-$C_{30}$ heterocyclic group, $T_1$ to $T_4$ in Formula 1 are each independently a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(═O)—*', *—S(═O)—*', *—S(═O)$_2$—*', *—C($R_{5a}$)═*', *═C($R_{5a}$)—*', *—C($R_{5a}$)—C($R_{5b}$)—*', *—C(═S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, each of n1 and n2 in Formula 1 is 1, n3 and n4 in Formula 1 are each independently 0 or 1, wherein at least three of n1 to n4 are each 1, when n3 in Formula 1 is 0, $T_3$ is not present, and when n4 in Formula 1 is 0, $T_4$ is not present, $Z_1$ to $Z_4$ in Formula 1 are each independently a group represented by Formula 51, Formula 51

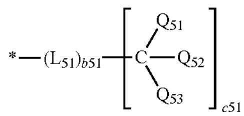

d1 to d4 in Formula 1 are each independently an integer from 0 to 20, $L_1$ to $L_4$ and $L_{51}$ in Formulae 1 and 51 are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b1 to b4 and b51 in Formulae 1 and 51 are each independently an integer from 1 to 10, $R_1$ to $R_4$, $R_{5a}$, $R_{5b}$, R', R", and $Q_{51}$ to $Q_{53}$ in Formulae 1 and 51 each independently a group represented by Formula 51, hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that none of $Q_{51}$ to $Q_{53}$ is a group represented by Formula 51, at least one of $Q_{51}$ to $Q_{53}$ in Formula 51 is independently a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, c1 to c4 and a1 to a4 in Formula 1 are each independently an integer from 0 to 20, c51 in Formula 51 is an integer from 1 to 20, Formula 1 satisfies at least one of Condition 1 and Condition 2, Condition 1 a sum of d1 to d4 in Formula 1 is 1 or more,

Condition 2 at least one of $T_1$ to $T_4$ in Formula 1 is *—$N(R_{5a})$—*', *—$B(R_{5a})$—*', *—$P(R_{5a})$—*', *—$C(R_{5a})(R_{5b})$—*', *—$Si(R_{5a})(R_{5b})$—*', *—$Ge(R_{5a})(R_{5b})$—*', *—$C(R_{5a})$=*', *=$C(R_{5a})$—*', or *—$C(R_{5a})$=$C(R_{5b})$—*', and at least one of $R_{5a}$ and $R_{5b}$ is a group represented by Formula 51, provided that, when i) ring $CY_2$ is a benzimidazole group, ii) d1, d3 and d4 are 0, and iii) d2 is 1 or more, then each $Z_2$ is independently a group represented by Formula 51, wherein each $L_{51}$ is independently a single bond, a monocyclic $C_5$-$C_8$ carbocyclic group that is unsubstituted or substituted with at least one $R_{10b}$, or a $C_1$-$C_{30}$ heterocyclic group that is unsubstituted or substituted with at least one $R_{10b}$, and the $R_{10b}$ is i) deuterium; ii) —F; iii) a cyano group; or iv) a $C_1$-$C_{20}$ alkyl group that is unsubstituted or substituted with deuterium, —F, a cyano group, or a combination thereof, two or more of a plurality of $R_1$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_3$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_4$(s) in Formula 1 are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of $R_1$ to $R_4$, $R_{5a}$ and one or more of $R_1$ to $R_4$, Rob and one or more of $R_1$ to $R_4$, or $R_{5a}$ and $R_{5b}$ are each optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is the same as defined in connection with $R_1$,

* and *' each indicate a binding site to a neighboring atom, and the substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently:

hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group, and wherein a group represented by

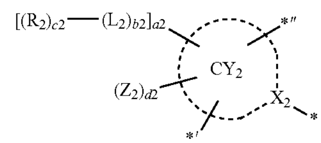

is a group represented by one of Formulae CY2-1 to CY2-16 or ZCY2-1 to ZCY2-19:

CY2-1

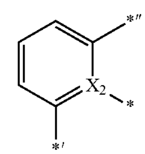

CY2-2

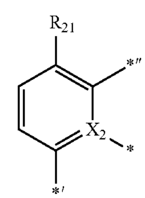

CY2-3

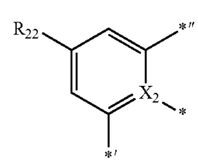

CY2-4

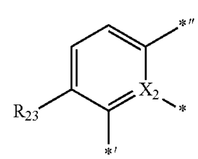

-continued
CY2-5
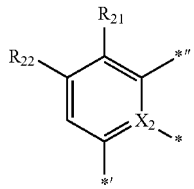
CY2-6
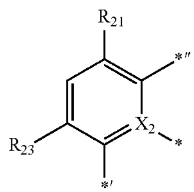
CY2-7
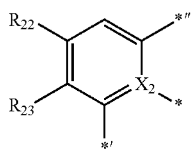
CY2-8
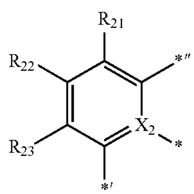
CY2-9
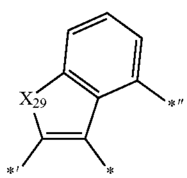
CY2-10
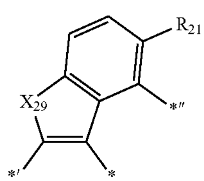
CY2-11
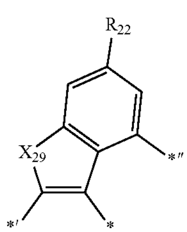
CY2-12
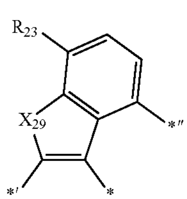
-continued
CY2-13
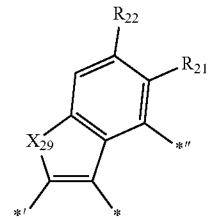
CY2-14
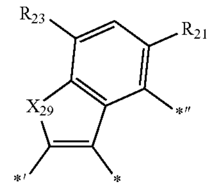
CY2-15
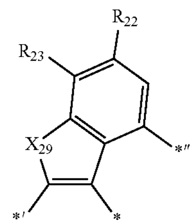
CY2-16
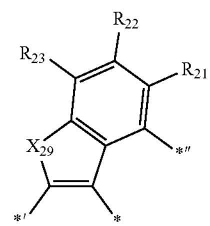
ZCY2-1
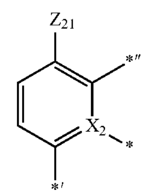
ZCY2-2
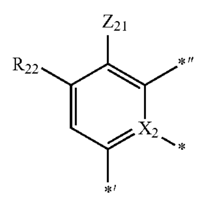
ZCY2-3
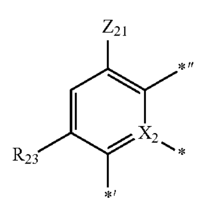

-continued
ZCY2-4
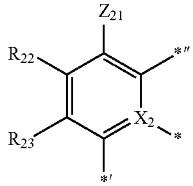
ZCY2-5
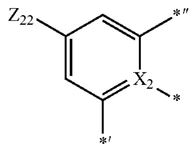
ZCY2-6
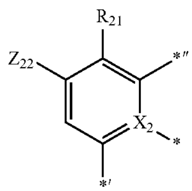
ZCY2-7
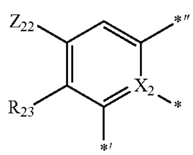
ZCY2-8
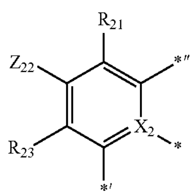
ZCY2-9
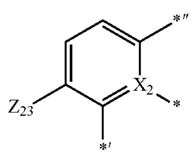
ZCY2-10
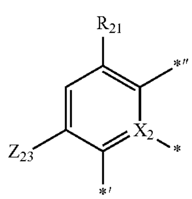
ZCY2-11
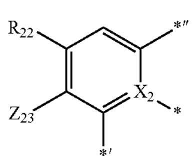
ZCY2-12
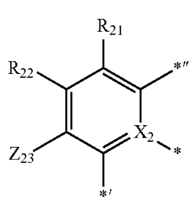
-continued
ZCY2-13
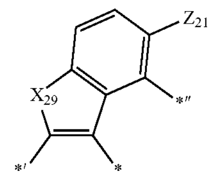
ZCY2-14
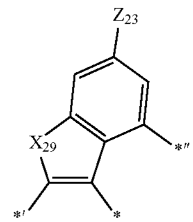
ZCY2-15
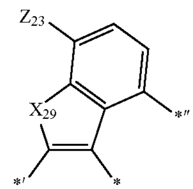
ZCY2-16
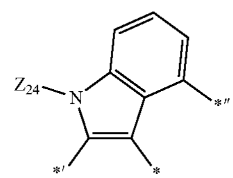
ZCY2-17
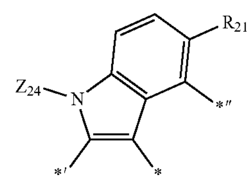
ZCY2-18
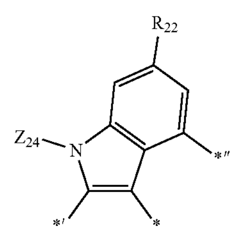
ZCY2-19
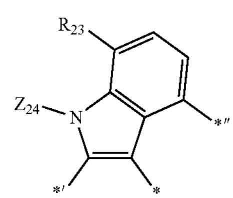
wherein, in Formulae CY2-1 to CY2-16 and ZCY2-1 to ZCY2-19,
$X_{29}$ is O, S, N-[$(L_2)_{b2}$-$(R_2)_{c2}$], $C(R_{29a})(R_{29b})$, or $Si(R_{29a})(R_{29b})$,
$Z_{21}$ to $Z_{24}$ are each independently as defined in connection with $Z_2$,
$R_{21}$ to $R_{23}$, $R_{29a}$, and $R_{29}$ are each independently as defined in connection with $R_2$, provided that each of $R_{21}$ to $R_{23}$ is not hydrogen, and

*' indicates a binding site to $T_1$ in Formula 1, * indicates a binding site to M in Formula 1, and *" indicates a binding site to $T_2$ in Formula 1.

2. The organometallic compound of claim 1, wherein M in Formula 1 is Pt, Pd, or Au.

3. The organometallic compound of claim 1, wherein $X_2$ is N, and ring $CY_2$ is a pyridine group.

4. The organometallic compound of claim 1, wherein $T_1$ and $T_2$ in Formula 1 are each a single bond, and $T_3$ in Formula 1 is a single bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', or *—O—*'.

5. The organometallic compound of claim 1, wherein n1 to n3 in Formula 1 are each 1, and n4 in Formula 1 is 0.

6. The organometallic compound of claim 1, wherein the organometallic compound satisfies at least one of Condition 1A and Condition 2A:

Condition 1A in Formula 1, i) d1 is 1, and each of d2, d3, and d4 is 0;

ii) d2 is 1, and each of d1, d3, and d4 is 0;

iii) d3 is 1, and each of d1, d2, and d4 is 0;

iv) d4 is 1, and each of d1, d2, and d3 is 0;

v) each of d1 and d2 is 1, and each of d3 and d4 is 0;

vi) each of d2 and d3 is 1, and each of d1 and d4 is 0; or vii) each of d2 and d4 is 1, and each of d1 and d3 is 0, Condition 2A in Formula 1, n3 is 1, and i) $T_3$ is *—N($R_{5a}$)—*', *—B($R_{5a}$)—*', *—P($R_{5a}$)—*', *—C($R_{5a}$)=*', or *=C($R_{5a}$)—*', wherein $R_{5a}$ is a group represented by Formula 51; or ii) $T_3$ is *—C($R_{5a}$)($R_{5b}$)—*', *—Si($R_{5a}$)($R_{5b}$)—*', *—Ge($R_{5a}$)($R_{5b}$)—*', or *—C($R_{5a}$)=C($R_{5b}$)—*', wherein at least one of $R_{5a}$ and $R_{5b}$ is a group represented by Formula 51.

7. The organometallic compound of claim 1, wherein a group represented by *—C($Q_{51}$)($Q_{52}$)($Q_{53}$) in Formula 51 is a group represented by one of Formulae 51-1 to 51-25:

51-1

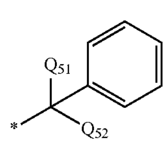

51-2

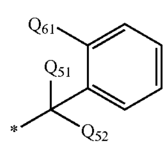

51-3

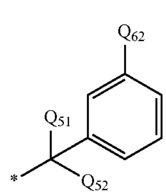

-continued 51-4

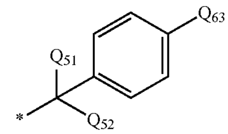

51-5

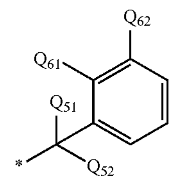

51-6

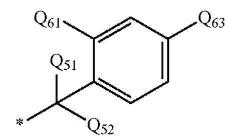

51-7

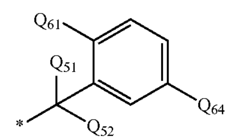

51-8

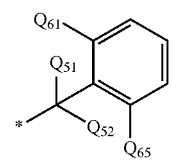

51-9

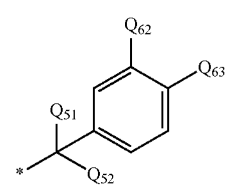

51-10

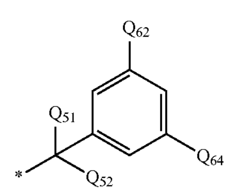

51-11

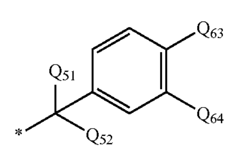

51-12

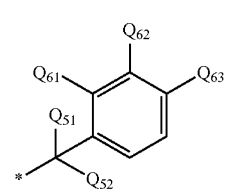

-continued 51-13

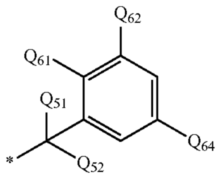

51-14

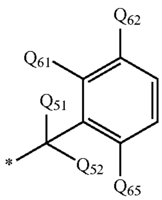

51-15

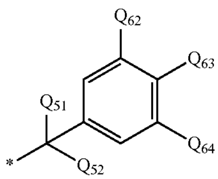

51-16

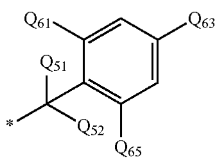

51-17

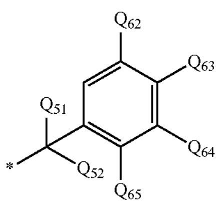

51-18

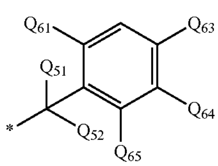

51-19

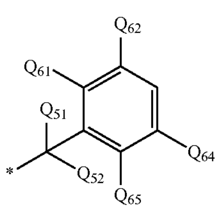

51-20

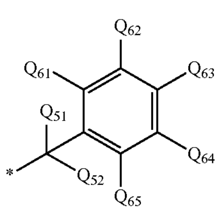

-continued 51-21

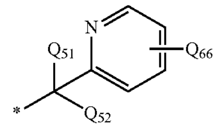

51-22

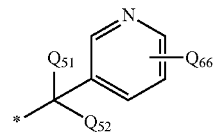

51-23

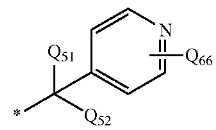

51-24

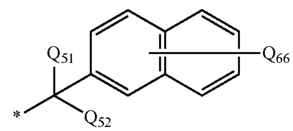

51-25

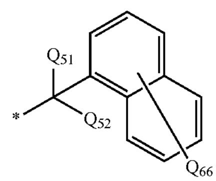

wherein, $Q_{51}$ and $Q_{52}$ in Formulae 51-1 to 51-25 are as defined in claim 1, $Q_{61}$ to $Q_{66}$ in Formulae 51-1 to 51-25 are each independently as defined in connection with $R_{10a}$ in claim 1, provided that none of $Q_{61}$ to $Q_{65}$ in Formulae 51-1 to 51-25 is hydrogen, and

* in Formulae 51-1 to 51-25 indicates a binding site to $L_{51}$ in Formula 51.

8. The organometallic compound of claim 1, wherein $L_{51}$ in Formula 51 is a single bond.

9. The organometallic compound of claim 1, wherein a group represented by Formula 51 is a group represented by one of Formulae 51(1) to 51(19):

51(1)

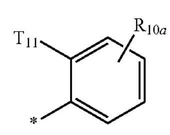

51(2)

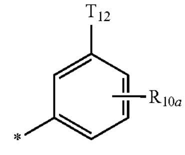

51(3)

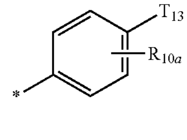

-continued
51(4)
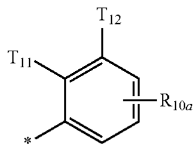
51(5)
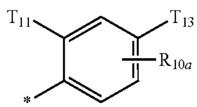
51(6)
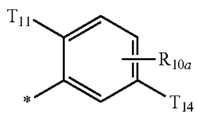
51(7)
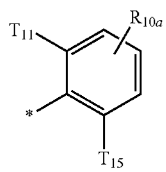
51(8)
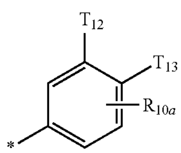
51(9)
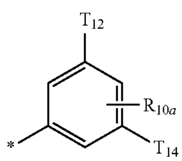
51(10)
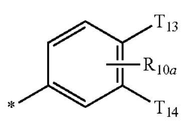
51(11)
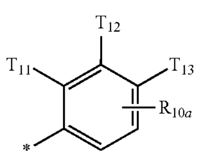
51(12)
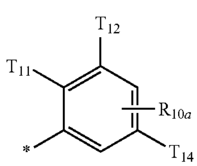
51(13)
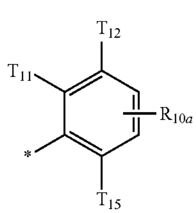
-continued
51(14)
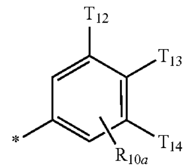
51(15)
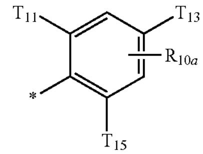
51(16)
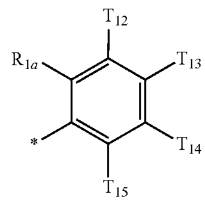
51(17)
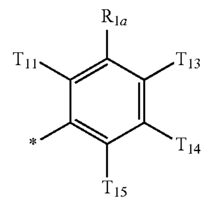
51(18)
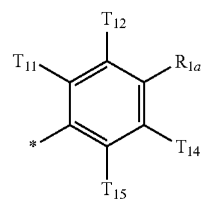
51(19)
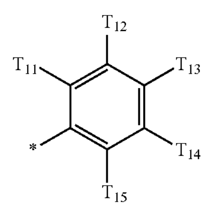
wherein,
$T_{11}$ to $T_{15}$ in Formulae 51(1) to 51(19) are each a group represented by *—$C(Q_{51})(Q_{52})(Q_{53})$ in Formula 51,
$T_{11}$ to $T_{15}$ in Formulae 51(1) to 51(19) are identical to or different from each other,
$R_{10a}$ in Formulae 51(1) to 51(19) is as defined in connection with $R_1$ in claim 1, and
* in Formulae 51(1) to 51(19) indicates a binding site to a neighboring atom.

10. The organometallic compound of claim 1, wherein, in Formula 1,
n4 is 0, and
a group represented by
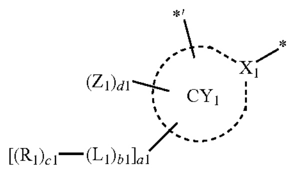
is a group represented by one of Formulae CY1-1 to CY1-18 or ZCY1-1 to ZCY1-32:
CY1-1
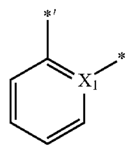
CY1-2
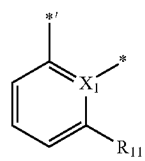
CY1-3
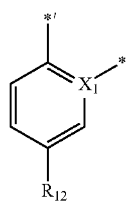
CY1-4
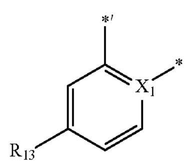
CY1-5
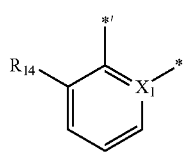
CY1-6
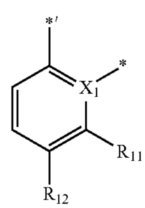
CY1-7
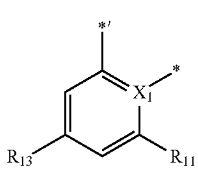
-continued
CY1-8
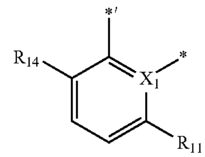
CY1-9
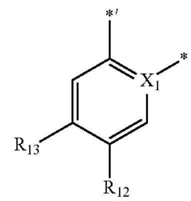
CY1-10
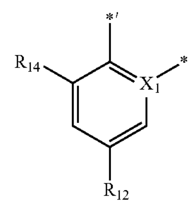
CY1-11
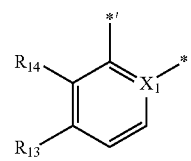
CY1-12
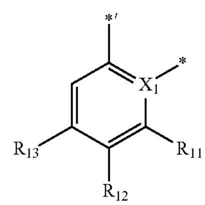
CY1-13
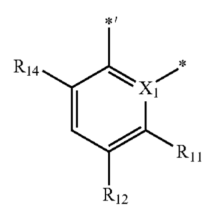
CY1-14
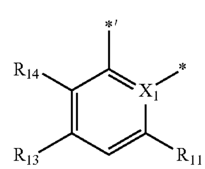
CY1-15
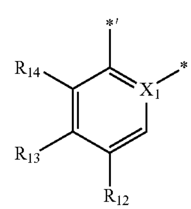

-continued
CY1-16
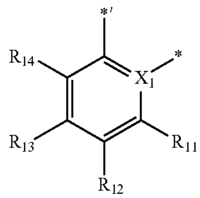
CY1-17
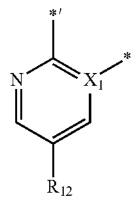
CY1-18
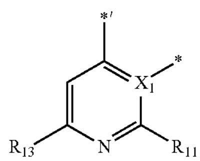
ZCY1-1
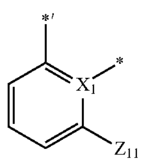
ZCY1-2
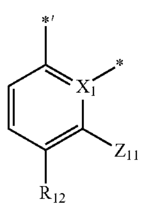
ZCY1-3
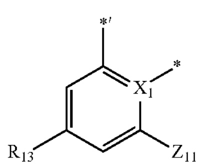
ZCY1-4
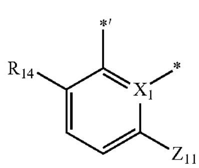
ZCY1-5
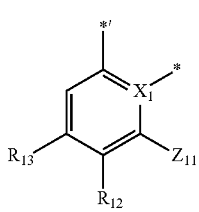
-continued
ZCY1-6
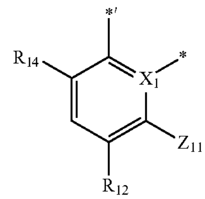
ZCY1-7
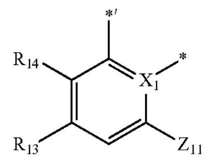
ZCY1-8
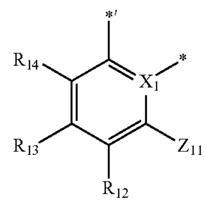
ZCY1-9
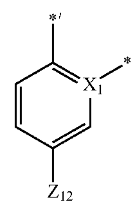
ZCY1-10
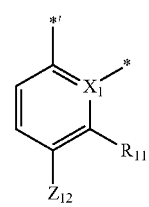
ZCY1-11
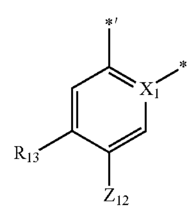
ZCY1-12
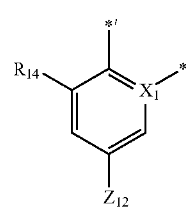
ZCY1-13
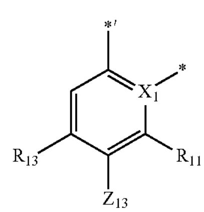

-continued
ZCY1-14
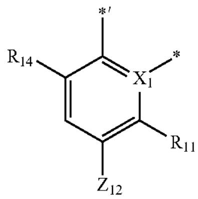
ZCY1-15
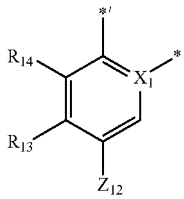
ZCY1-16
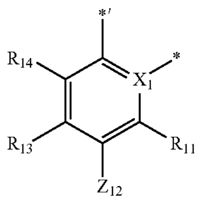
ZCY1-17
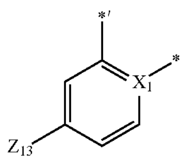
ZCY1-18
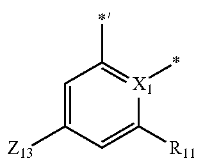
ZCY1-19
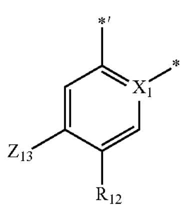
ZCY1-20
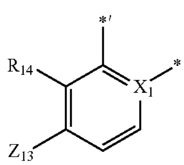
ZCY1-21
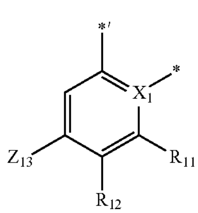
-continued
ZCY1-22
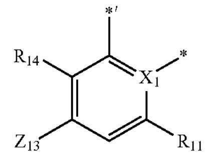
ZCY1-23
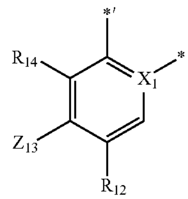
ZCY1-24
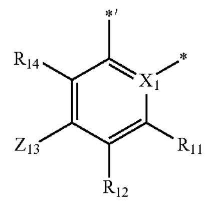
ZCY1-25
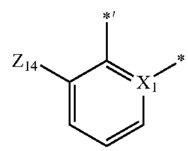
ZCY1-26
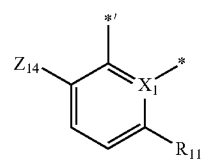
ZCY1-27
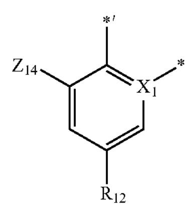
ZCY1-28
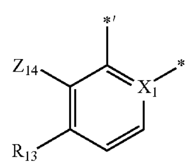
ZCY1-29
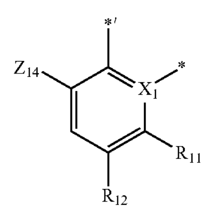

-continued

ZCY1-30

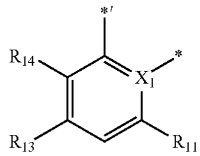

ZCY1-31

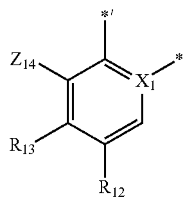

ZCY1-32

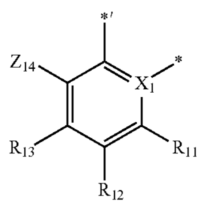

wherein, in Formulae CY1-1 to CY1-18 and ZCY1-1 to ZCY1-32, $X_1$ is as defined in claim 1, $R_{11}$ to $R_{14}$ are each independently as defined in connection with $R_1$ in claim 1, provided that each of $R_{11}$ to $R_{14}$ is not hydrogen, $Z_{11}$ to $Z_{14}$ are each independently as defined in connection with $Z_1$ in claim 1,

* indicates a binding site to $X_5$ in Formula 1, and

*' indicates a binding site to $T_1$ in Formula 1.

11. The organometallic compound of claim 1, wherein, in Formula 1, each of n2 and n3 is 1, and a group represented by

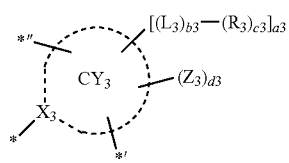

is a group represented by one of Formulae CY3-1 to CY3-13 or ZCY3-1 to ZCY3-12:

CY3-1

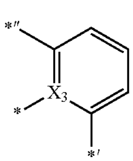

CY3-2

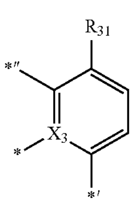

-continued

CY3-3

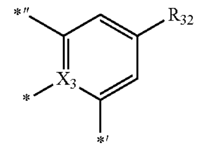

CY3-4

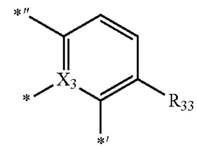

CY3-5

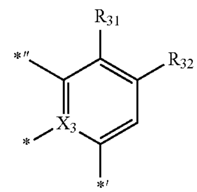

CY3-6

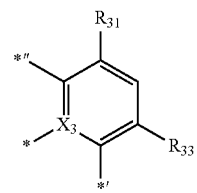

CY3-7

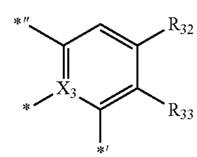

CY3-8

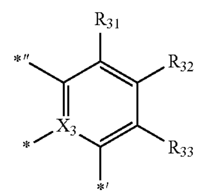

CY3-8

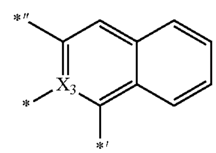

CY3-9

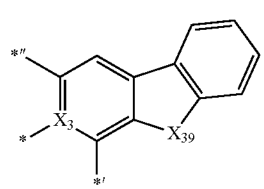

CY3-10

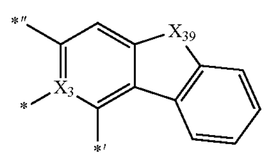

-continued
CY3-11
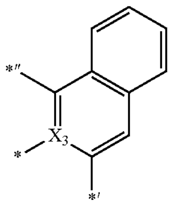
CY3-12
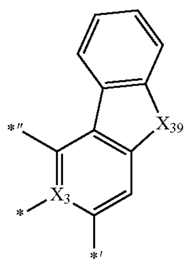
CY3-13
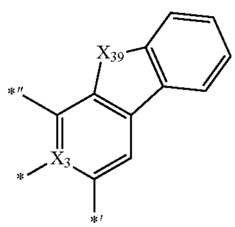
ZCY3-1
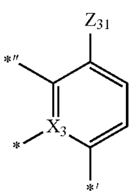
ZCY3-2
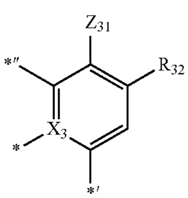
ZCY3-3
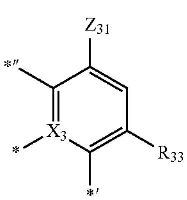
ZCY3-4
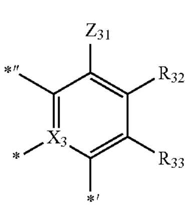
-continued
ZCY3-5
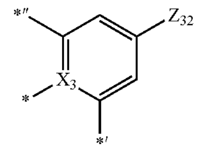
ZCY3-6
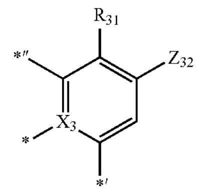
ZCY3-7
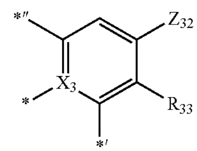
ZCY3-8
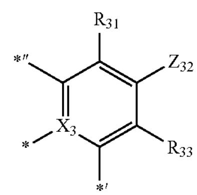
ZCY3-9
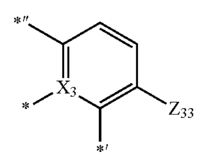
ZCY3-10
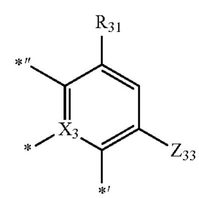
ZCY3-11
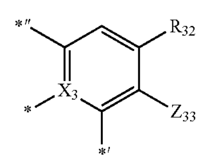
ZCY3-12
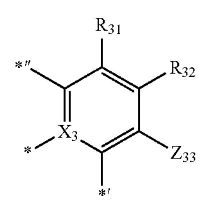
wherein, in Formulae CY3-1 to CY3-13 and ZCY3-1 to ZCY3-12,
$X_3$ is as defined in claim 1,
$X_{39}$ is O, S, N-[$(L_3)_{b3}$-$(R_3)_{c3}$], $C(R_{39a})(R_{39b})$, or $Si(R_{39a})(R_{39b})$,
$L_3$, b3, $R_3$, and c3 are each independently as defined in claim 1, $R_{31}$ to $R_{33}$, $R_{39a}$, and $R_{39b}$ are each independently as defined in connection with $R_3$ in claim 1, provided that each of $R_{31}$ to $R_{33}$ is not hydrogen, $Z_{31}$ to $Z_{33}$ are each independently as defined in connection with $Z_3$ in claim 1,

*" indicates a binding site to $T_2$ in Formula 1,

*indicates a binding site to M in Formula 1, and

*' indicates a binding site to $T_3$ in Formula 1.

12. The organometallic compound of claim 1, wherein, in Formula 1, n3 is 1 and n4 is 0, and a group represented by

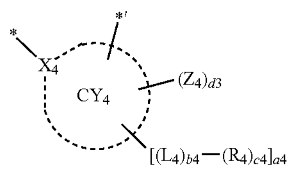

is a group represented by one of Formulae CY4-1 to CY4-16 or ZCY4-1 to ZCY4-32:

CY4-1

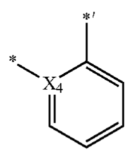

CY4-2

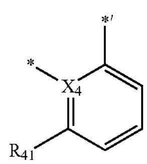

CY4-3

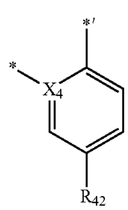

CY4-4

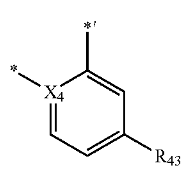

CY4-5

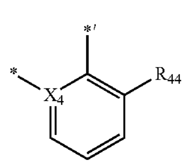

-continued

CY4-6

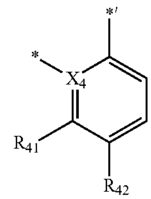

CY4-7

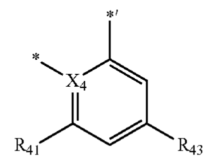

CY4-8

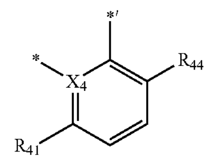

CY4-9

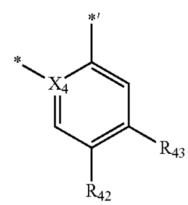

CY4-10

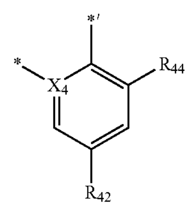

CY4-11

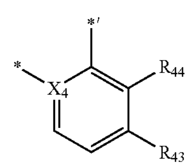

CY4-12

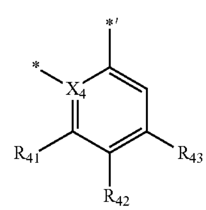

CY4-13

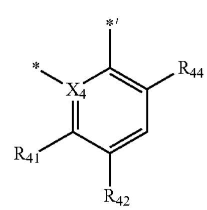

-continued
CY4-14
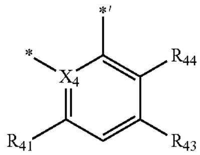
CY4-15
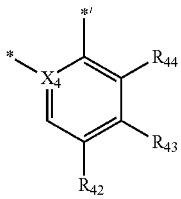
CY4-16
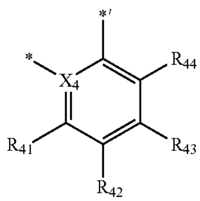
ZCY4-1
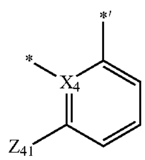
ZCY4-2
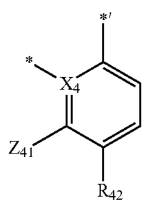
ZCY4-3
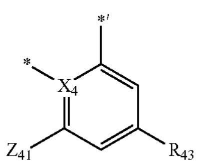
ZCY4-4
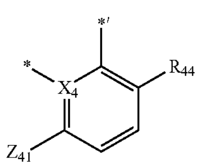
ZCY4-5
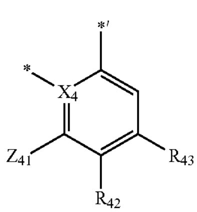
-continued
ZCY4-6
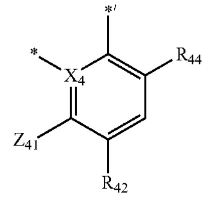
ZCY4-7
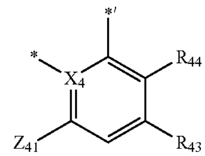
ZCY4-8
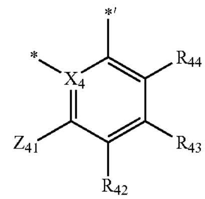
ZCY4-9
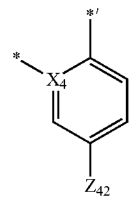
ZCY4-10
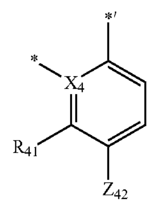
ZCY4-11
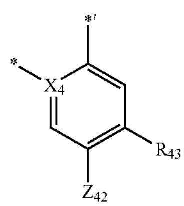
ZCY4-12
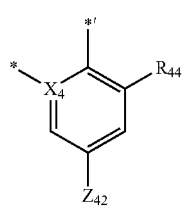
ZCY4-13
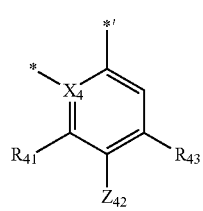

-continued
ZCY4-14
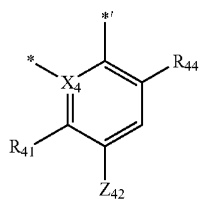
ZCY4-15
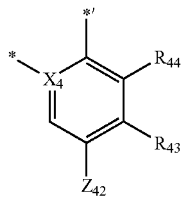
ZCY4-16
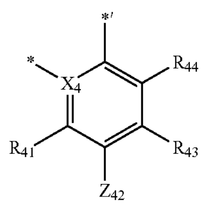
ZCY4-17
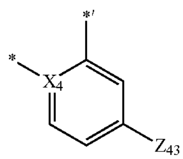
ZCY4-18
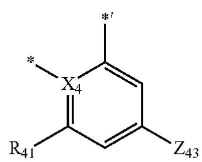
ZCY4-19
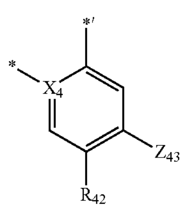
ZCY4-20
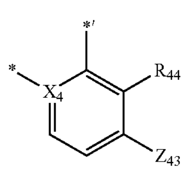
ZCY4-21
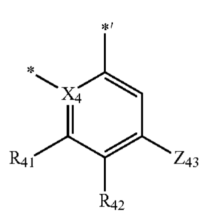
-continued
ZCY4-22
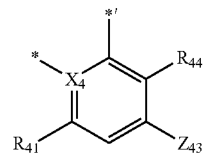
ZCY4-23
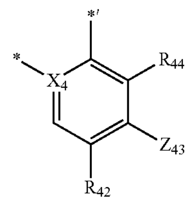
ZCY4-24
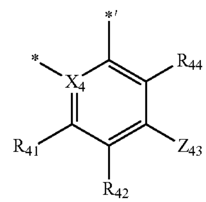
ZCY4-25
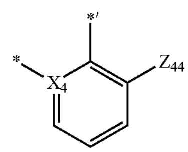
ZCY4-26
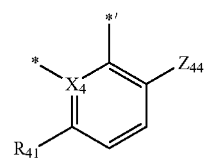
ZCY4-27
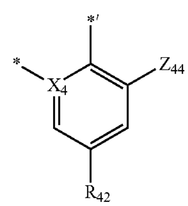
ZCY4-28
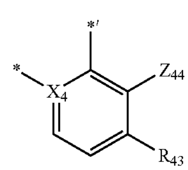
ZCY4-29
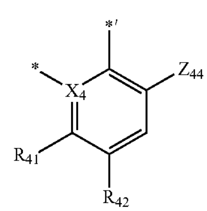

-continued

ZCY4-30

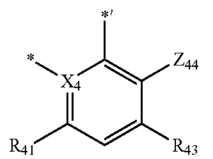

ZCY4-31

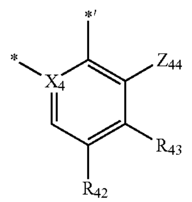

ZCY4-32

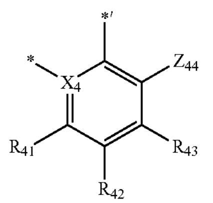

wherein, in Formulae CY4-1 to CY4-16 and ZCY4-1 to ZCY4-32, $X_4$ is as defined in claim 1, $R_{41}$ to $R_{44}$ are each independently as defined in connection with $R_4$ in claim 1, provided that each of $R_{41}$ to $R_{44}$ is not hydrogen, $Z_{41}$ to $Z_{44}$ are each independently as defined in connection with $Z_4$ in claim 1,

*' indicates a binding site to $T_3$ in Formula 1, and

*is a binding site to M in Formula 1.

13. The organometallic compound of claim 1, wherein the organometallic compound is represented by one of Formulae 1-1 to 1-4:

1-1

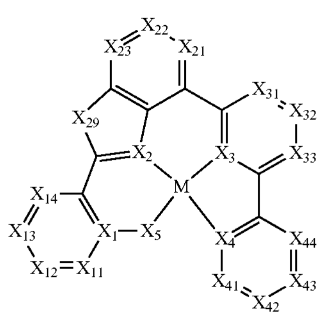

1-2

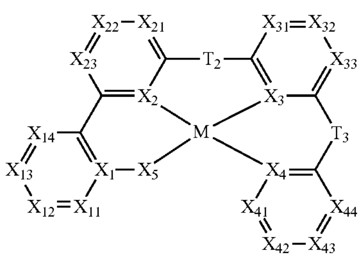

-continued 1-3

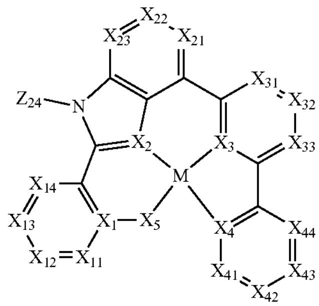

1-4

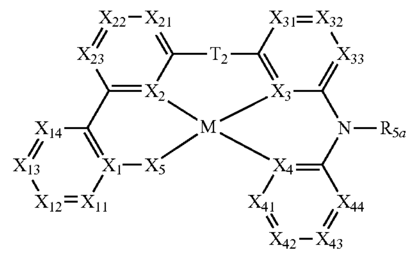

wherein, in Formulae 1-1 to 1-4,

M, $X_1$ to $X_5$, $T_2$, and $T_3$ are each independently as defined in claim 1, $X_{11}$ is N, $C(R_{11})$, or $C(Z_{11})$, $X_{12}$ is N, $C(R_{12})$, or $C(Z_{12})$, $X_{13}$ is N, $C(R_{13})$, or $C(Z_{13})$, and $X_{14}$ is N, $C(R_{14})$, or $C(Z_{14})$, $R_{11}$ to $R_{14}$ are each independently as defined in connection with $R_1$ in claim 1, $Z_{11}$ to $Z_{14}$ are each independently as defined in connection with $Z_1$ in claim 1, two or more of $R_{11}$ to $R_{14}$ are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $X_{21}$ is N, $C(R_{21})$, or $C(Z_{21})$, $X_{22}$ is N, $C(R_{22})$, or $C(Z_{22})$, $X_{23}$ is N, $C(R_{23})$, or $C(Z_{23})$, $X_{29}$ is O, S, N—$[(L_2)_{b2}$-$(R_2)_{c2}]$, $C(R_{29a})(R_{29b})$, or $Si(R_{29a})(R_{29b})$, $L_2$, b2, $R_2$, and c2 are each independently as defined in claim 1, $R_{21}$ to $R_{23}$, $R_{29a}$, and $R_{29b}$ are each independently as defined in connection with $R_2$ in claim 1, $Z_{21}$ to $Z_{24}$ are each independently as defined in connection with $Z_2$ in claim 1, two or more of $R_{21}$ to $R_{23}$ are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $X_{31}$ is N, $C(R_{31})$, or $C(Z_{31})$, $X_{32}$ is N, $C(R_{32})$, or $C(Z_{32})$, $X_{33}$ is N, $C(R_{33})$, or $C(Z_{33})$, $R_{31}$ to $R_{33}$ are each independently as defined in connection with $R_3$ in claim 1, $Z_{31}$ to $Z_{33}$ are each independently as defined in connection with $Z_3$ in claim 1, two or more of $R_{31}$ to $R_{33}$ are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $X_{41}$ is N, $C(R_{41})$, or $C(Z_{41})$, $X_{42}$ is N, $C(R_{42})$, or $C(Z_{42})$, $X_{43}$ is N, $C(R_{43})$, or $C(Z_{43})$, $X_{44}$ is N, $C(R_{44})$, or $C(Z_{44})$, $R_{41}$ to $R_{44}$ are each independently as defined in connection with $R_4$ in claim 1, $Z_{41}$ to $Z_{44}$ are each independently as defined in connection with $Z_4$ in claim 1, two or more of $R_{41}$ to $R_{44}$ are optionally bonded together to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, wherein Formulae 1-1 and 1-2 each include one of $Z_{11}$ to $Z_{14}$, one of $Z_{21}$ to $Z_{23}$, one of $Z_{31}$ to $Z_{33}$, one of $Z_{41}$ to $Z_{44}$, or a combination thereof, and $R_{5a}$ in Formula 1-4 is a group represented by Formula 51.

14. The organometallic compound of claim 13, wherein i) the organometallic compound is represented by Formula 1-1 or 1-2, and Formulae 1-1 and 1-2 each satisfy at least one of Condition (1') to Condition (3');

ii) the organometallic compound is represented by Formula 1-3 or 1-4; or iii) the organometallic compound is represented by Formula 1-3 or 1-4, and Formulae 1-3 and 1-4 each satisfy at least one of Condition (1') to Condition (3'):

Condition (1')

$X_{22}$ is $C(Z_{22})$

Condition (2')

$X_{32}$ is $C(Z_{32})$

Condition (3')

$X_{43}$ is $C(Z_{43})$, wherein, $Z_{22}$, $Z_{32}$, and $Z_{43}$ are each independently as defined in claim 13.

15. An organic light-emitting device, comprising:

a first electrode;

a second electrode; and an organic layer located between the first electrode and the second electrode, wherein the organic layer comprises an emission layer, and wherein the organic layer comprises the at least one organometallic compound of claim 1.

16. The organic light-emitting device of claim 15, wherein the first electrode is an anode, the second electrode is a cathode, the organic layer further comprises a hole transport region located between the first electrode and the emission layer, and an electron transport region located between the emission layer and the second electrode, the hole transport region comprises a hole injection layer, a hole transport layer, an electron blocking layer, or a combination thereof, and the electron transport region comprises a hole blocking layer, an electron transport layer, an electron injection layer, or a combination thereof.

17. The organic light-emitting device of claim 15, wherein the at least one organometallic compound is included in the emission layer.

18. The organic light-emitting device of claim 17, wherein the emission layer further comprises a host, and an amount of the host is greater than an amount of the at least one organometallic compound in the emission layer.

19. An electronic apparatus, comprising the organic light-emitting device of claim 15.

* * * * *